US012707174B2

(12) United States Patent
Ito et al.

(10) Patent No.: US 12,707,174 B2
(45) Date of Patent: Aug. 11, 2026

(54) THREE-DIMENSIONALLY STRUCTURED IMAGING DEVICE

(71) Applicant: SONY SEMICONDUCTOR SOLUTIONS CORPORATION, Kanagawa (JP)

(72) Inventors: Daisuke Ito, Kanagawa (JP); Kazuyuki Tomida, Kanagawa (JP); Masaki Haneda, Kanagawa (JP); Tsuyoshi Suzuki, Kanagawa (JP); Takaaki Minami, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 55 days.

(21) Appl. No.: 18/780,908

(22) Filed: Jul. 23, 2024

(65) Prior Publication Data

US 2024/0381008 A1 Nov. 14, 2024

Related U.S. Application Data

(63) Continuation of application No. 17/620,359, filed as application No. PCT/JP2020/024448 on Jun. 22, 2020, now Pat. No. 12,052,525.

(30) Foreign Application Priority Data

Jun. 26, 2019 (JP) ................................ 2019-118647

(51) Int. Cl.
*H04N 25/79* (2023.01)
*H04N 25/778* (2023.01)
(Continued)

(52) U.S. Cl.
CPC .......... *H04N 25/79* (2023.01); *H04N 25/778* (2023.01); *H04N 25/78* (2023.01);
(Continued)

(58) Field of Classification Search
CPC ...... H04N 25/79; H04N 25/778; H04N 25/78; H10F 39/8037; H10F 39/809; H10F 39/811; H10F 39/12; H01L 21/768; H01L 23/532
See application file for complete search history.

(56) References Cited

U.S. PATENT DOCUMENTS

2002/0117691 A1 8/2002 Choi et al.
2013/0033632 A1 2/2013 Kishi
(Continued)

FOREIGN PATENT DOCUMENTS

CN 102917184 A 2/2013
CN 103140926 A 6/2013
(Continued)

OTHER PUBLICATIONS

International Search Report and Written Opinion of PCT Application No. PCT/JP2020/024448, issued on Sep. 1, 2020, 06 pages of English Translation and 07 pages of ISRWO.
(Continued)

*Primary Examiner* — Gevell V Selby
(74) *Attorney, Agent, or Firm* — CHIP LAW GROUP

(57) ABSTRACT

Provided is an imaging device that includes a first substrate including a sensor pixel that performs photoelectric conversion, a second substrate including a pixel circuit that outputs a pixel signal on a basis of electric charges outputted from the sensor pixel, and a third substrate including a processing circuit that performs signal processing on the pixel signal. The first substrate, the second substrate, and the third substrate are stacked in this order, and a low-permittivity region is provided in at least any region around a circuit that reads electric charges from the sensor pixel and outputs the pixel signal.

20 Claims, 130 Drawing Sheets

(51) Int. Cl.
*H04N 25/78* (2023.01)
*H10F 39/00* (2025.01)

(52) U.S. Cl.
CPC ....... *H10F 39/8037* (2025.01); *H10F 39/809* (2025.01); *H10F 39/811* (2025.01)

(56) References Cited

U.S. PATENT DOCUMENTS

| | | | | |
|---|---|---|---|---|
| 2013/0105871 | A1 | 5/2013 | Inui | |
| 2013/0175652 | A1 | 7/2013 | Yamazaki et al. | |
| 2017/0040371 | A1 | 2/2017 | Izuhara | |
| 2017/0180664 | A1* | 6/2017 | Kishi | H04N 25/78 |
| 2018/0108690 | A1 | 4/2018 | Yanagita et al. | |
| 2018/0152657 | A1 | 5/2018 | Miyazawa | |
| 2018/0323231 | A1 | 11/2018 | Saito | |
| 2018/0366505 | A1 | 12/2018 | Ogawa et al. | |
| 2019/0148457 | A1 | 5/2019 | Lee et al. | |
| 2019/0149758 | A1 | 5/2019 | Nakamura | |
| 2019/0181168 | A1 | 6/2019 | Kawashima | |
| 2020/0105813 | A1* | 4/2020 | Hashiguchi | H04N 25/70 |
| 2020/0105814 | A1 | 4/2020 | Hashiguchi et al. | |
| 2020/0243594 | A1* | 7/2020 | Tanaka | H10F 39/8053 |
| 2021/0134873 | A1* | 5/2021 | Kwon | H10F 39/809 |
| 2022/0216246 | A1* | 7/2022 | Hashiguchi | H04N 25/70 |

FOREIGN PATENT DOCUMENTS

| | | | |
|---|---|---|---|
| CN | 104428897 | A | 3/2015 |
| CN | 104429057 | A | 3/2015 |
| CN | 109328395 | A | 2/2019 |
| CN | 110494981 | A | 11/2019 |
| DE | 112017004206 | T5 | 5/2019 |
| DE | 112018001859 | T5 | 12/2019 |
| EP | 2622637 | A1 | 8/2013 |
| EP | 3506342 | A1 | 7/2019 |
| JP | 2010-245506 | A | 10/2010 |
| JP | 2012-015400 | A | 1/2012 |
| JP | 2012-079861 | A | 4/2012 |
| JP | 2014-022561 | A | 2/2014 |
| JP | 2015-032687 | A | 2/2015 |
| JP | 2019-009154 | A | 1/2019 |
| KR | 10-2019-0040934 | A | 4/2019 |
| KR | 10-2019-0131485 | A | 11/2019 |
| TW | 201839967 | A | 11/2018 |
| WO | 2012/001939 | A1 | 1/2012 |
| WO | 2012/042782 | A1 | 4/2012 |
| WO | 2014/007004 | A1 | 1/2014 |
| WO | 2018/037667 | A1 | 3/2018 |
| WO | 2018/186194 | A1 | 10/2018 |

OTHER PUBLICATIONS

Non-Final Office Action for U.S. Appl. No. 17/620,359, issued on Nov. 8, 2023, 07 pages.

Notice of Allowance for U.S. Appl. No. 17/620,359, issued on Apr. 15, 2024, 02 pages.

Notice of Allowance for U.S. Appl. No. 17/620,359, issued on Mar. 7, 2024, 07 pages.

International Preliminary Report on Patentability of PCT Application No. PCT/JP2020/024448, issued on Jan. 6, 2020, 06 pages of English Translation and 04 pages of IPRP.

* cited by examiner

[FIG. 1]
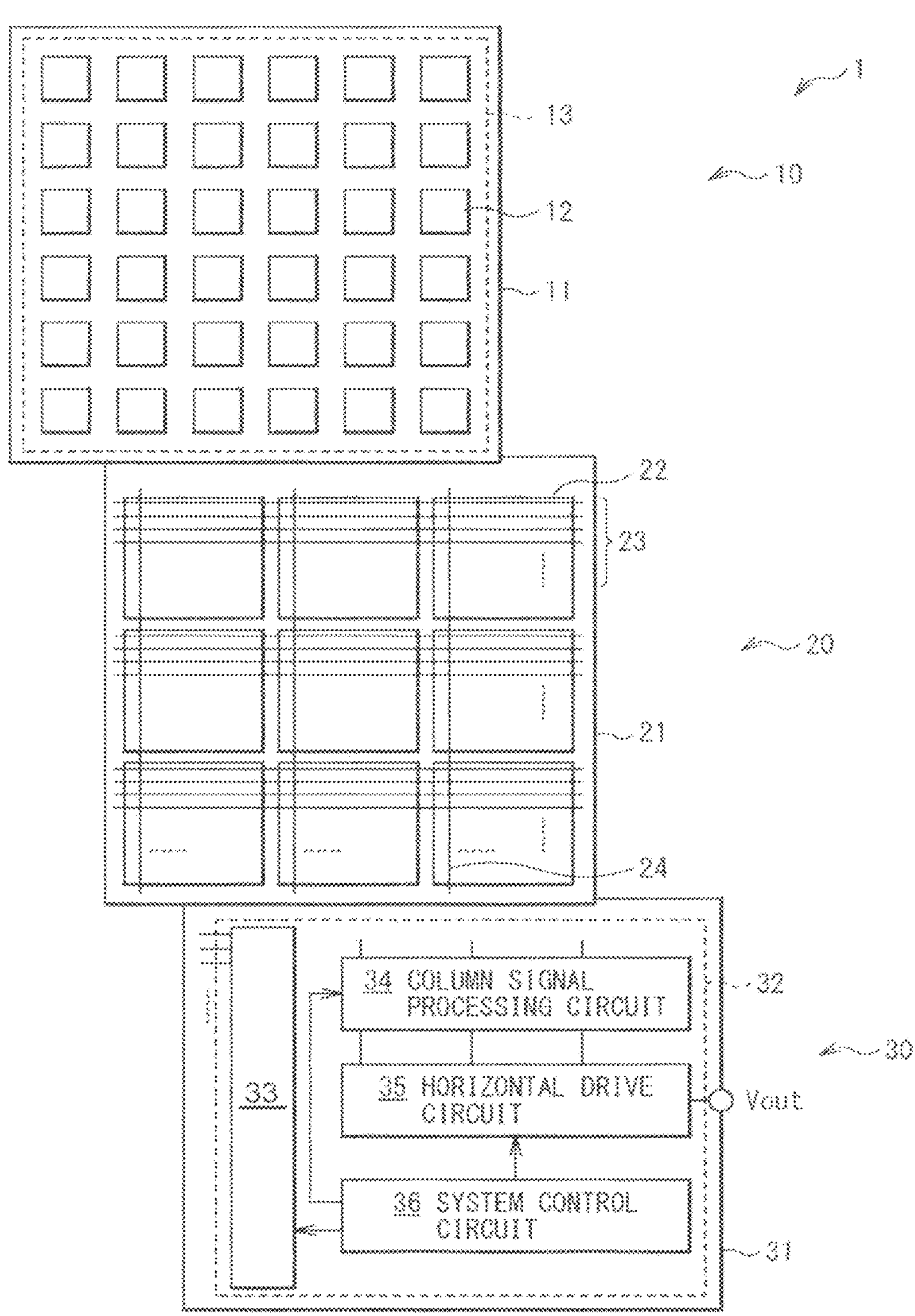

[FIG. 2]
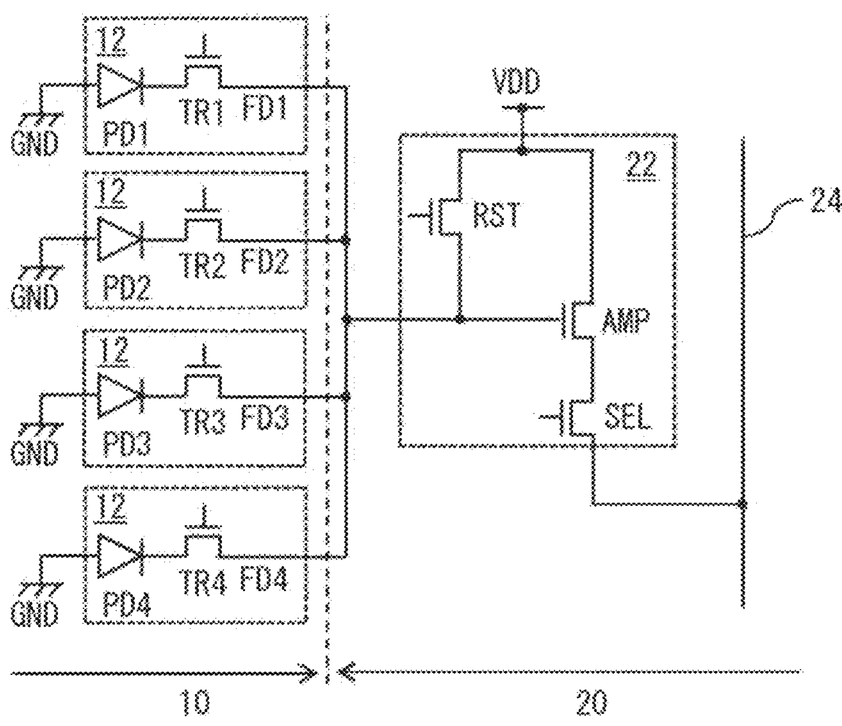

[FIG. 3]
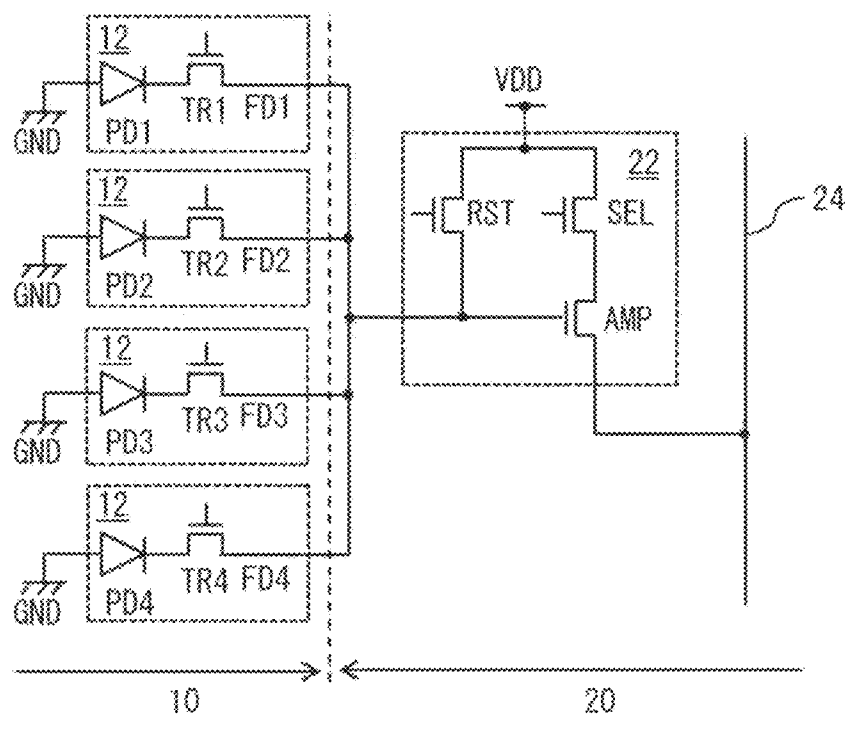

[FIG. 4]
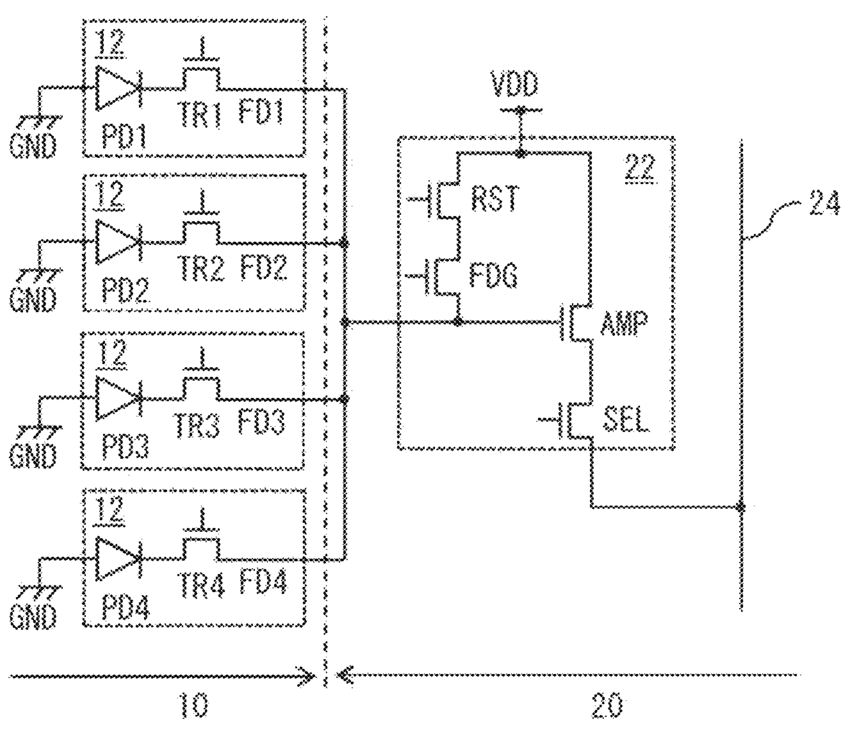

[FIG. 5]
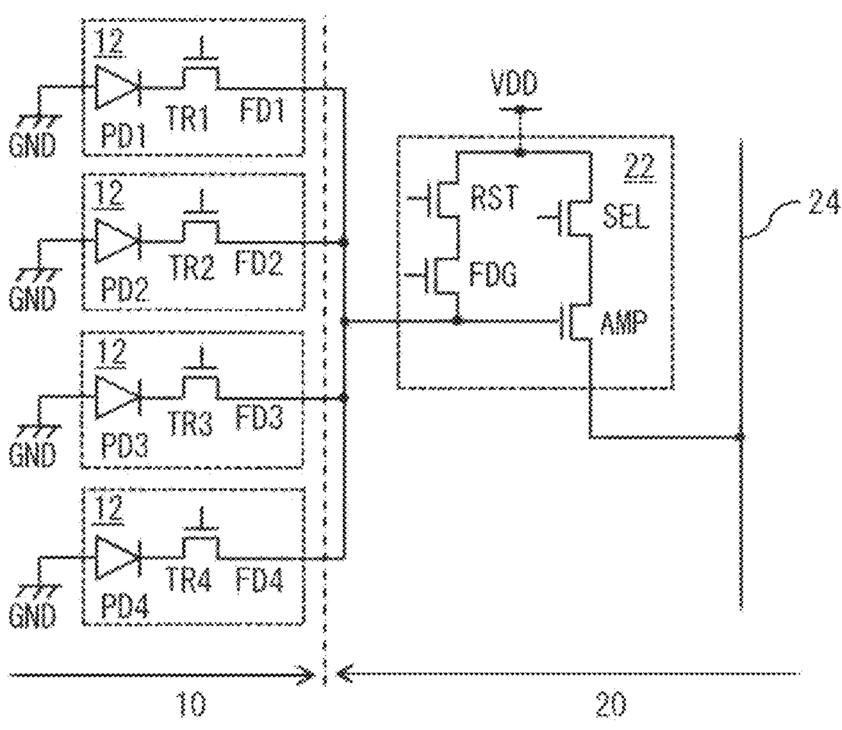

[FIG. 6]
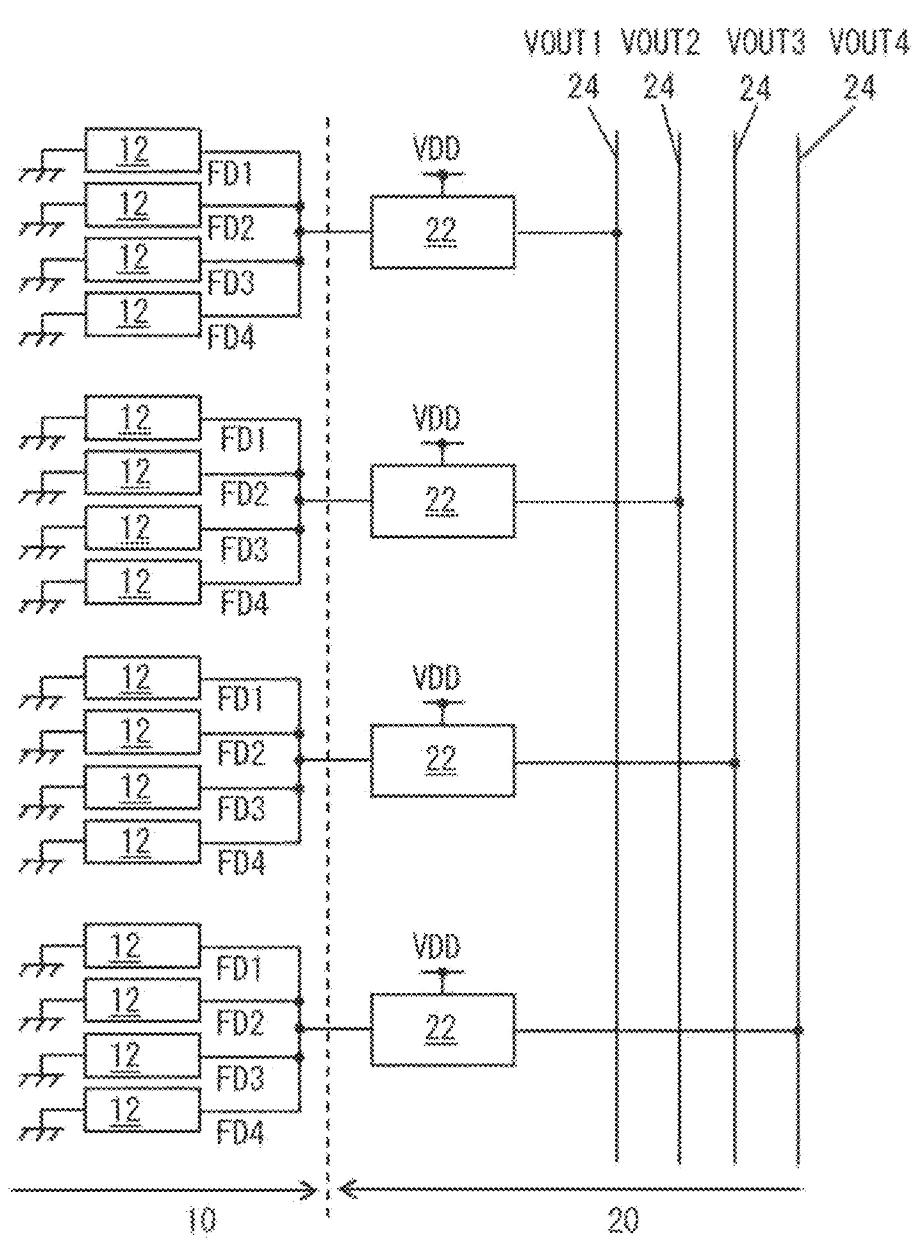

[FIG. 7]
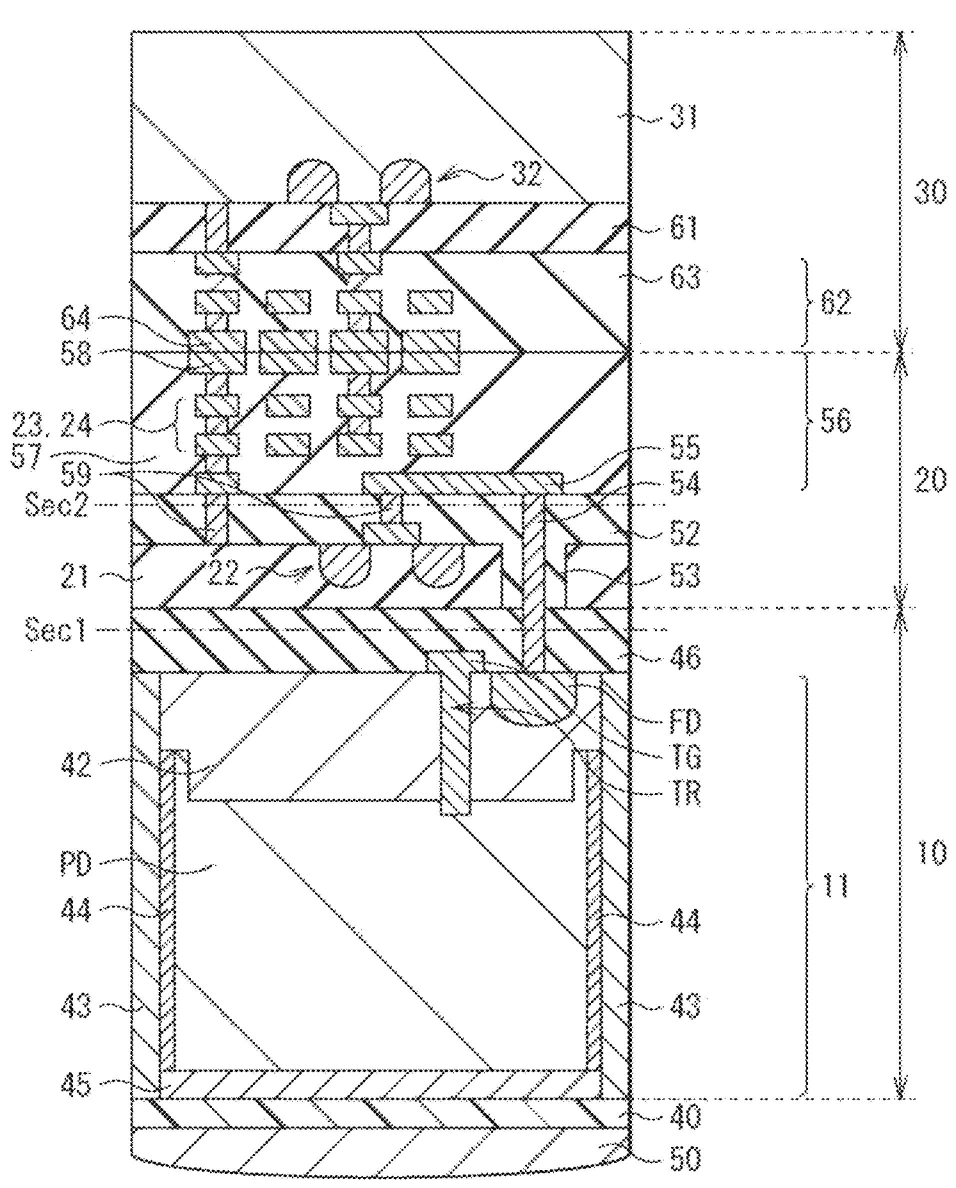

[FIG. 8]
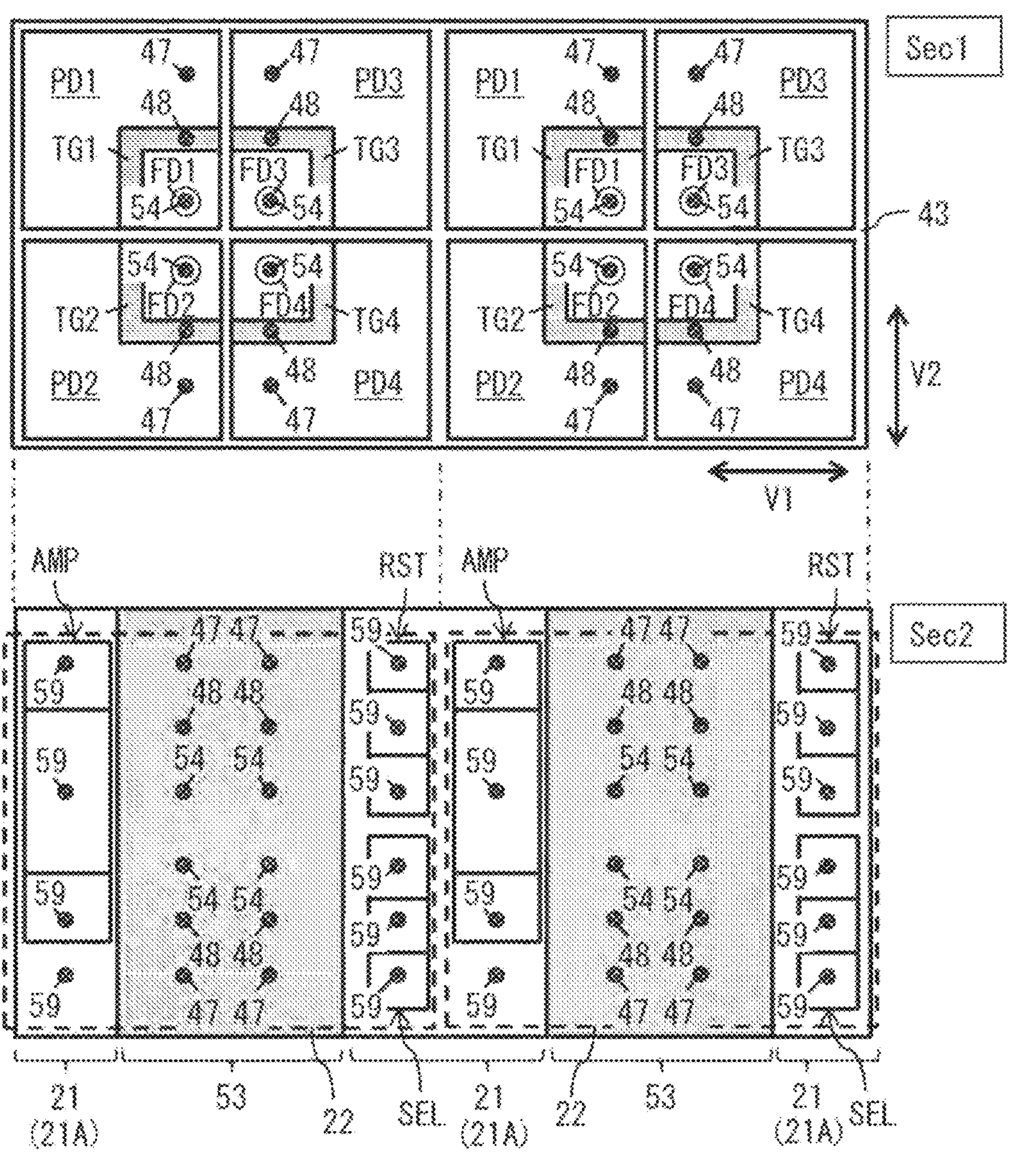

[FIG. 9]
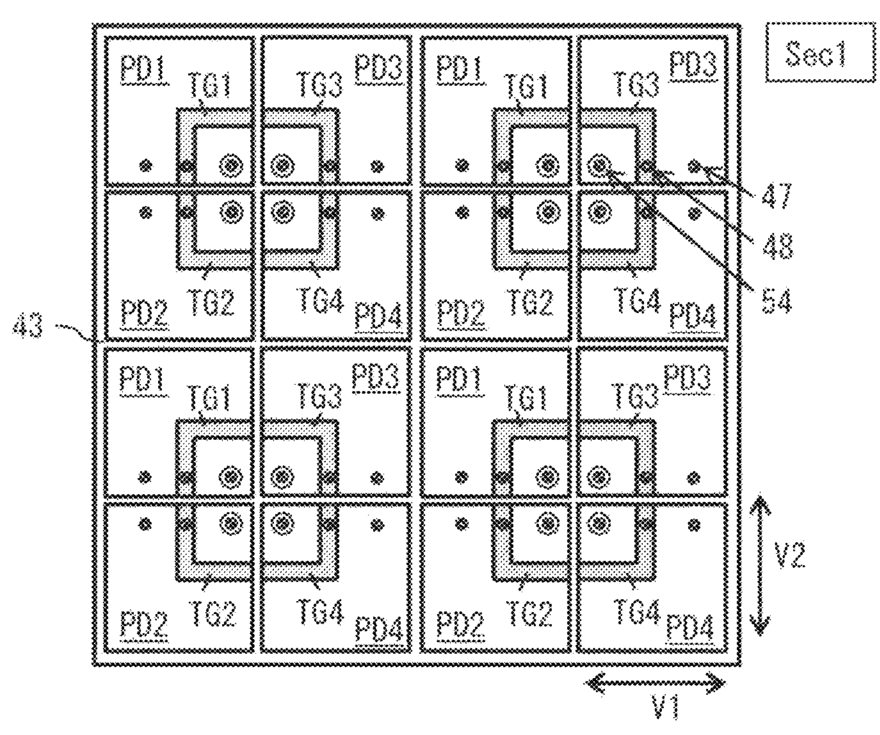
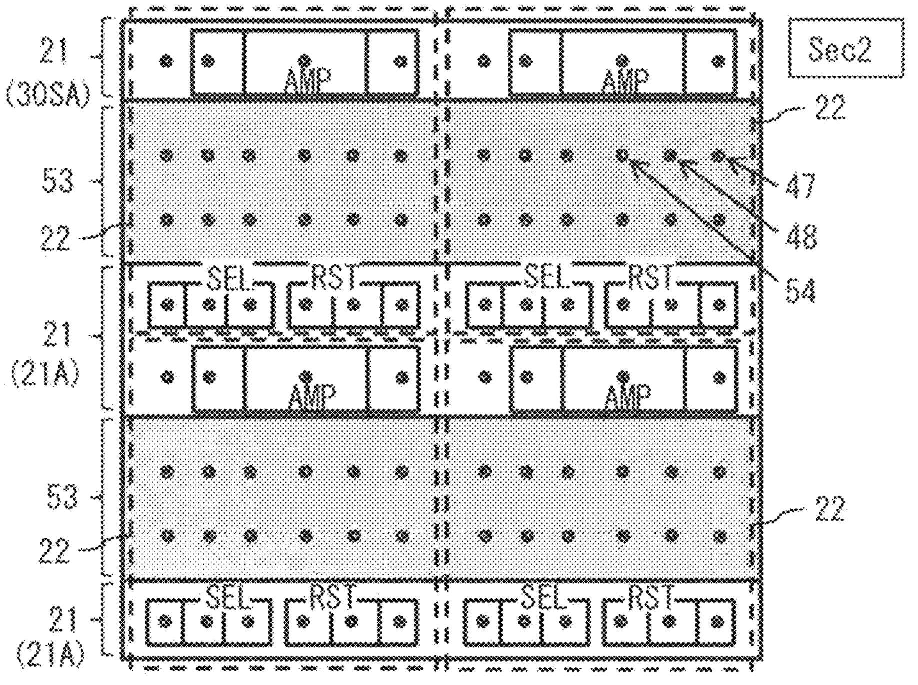

[FIG. 10]
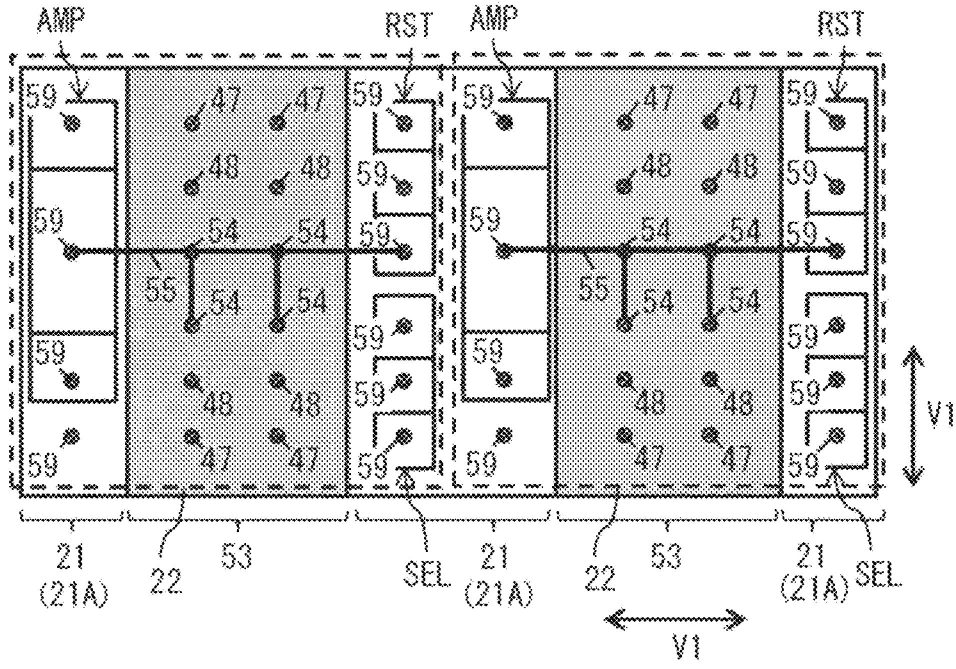
[FIG. 11]
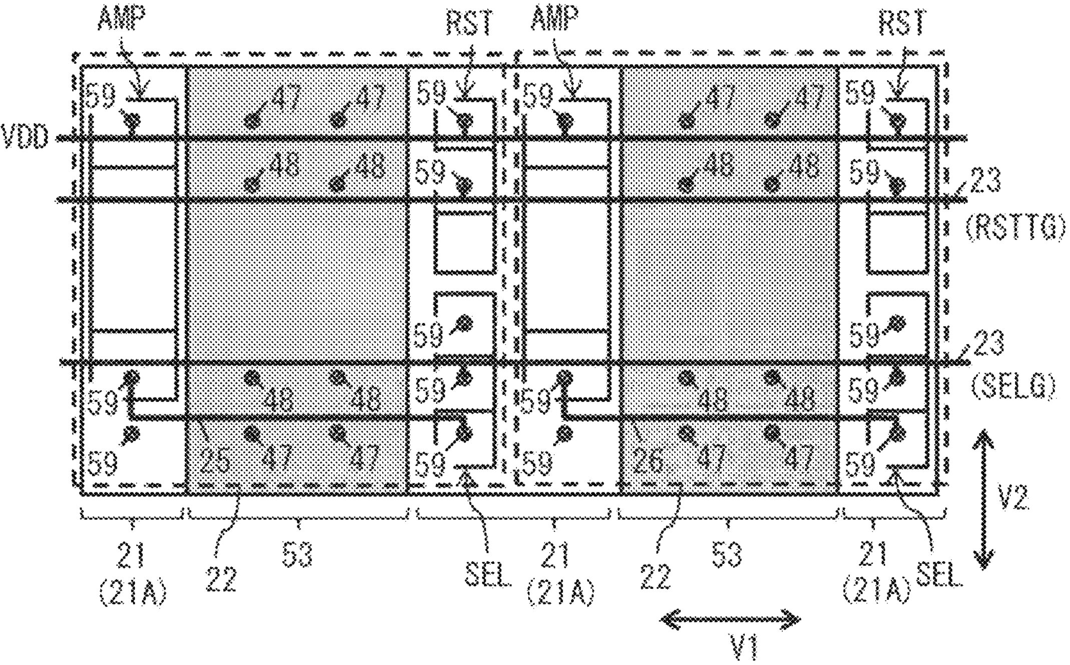

[FIG. 12]
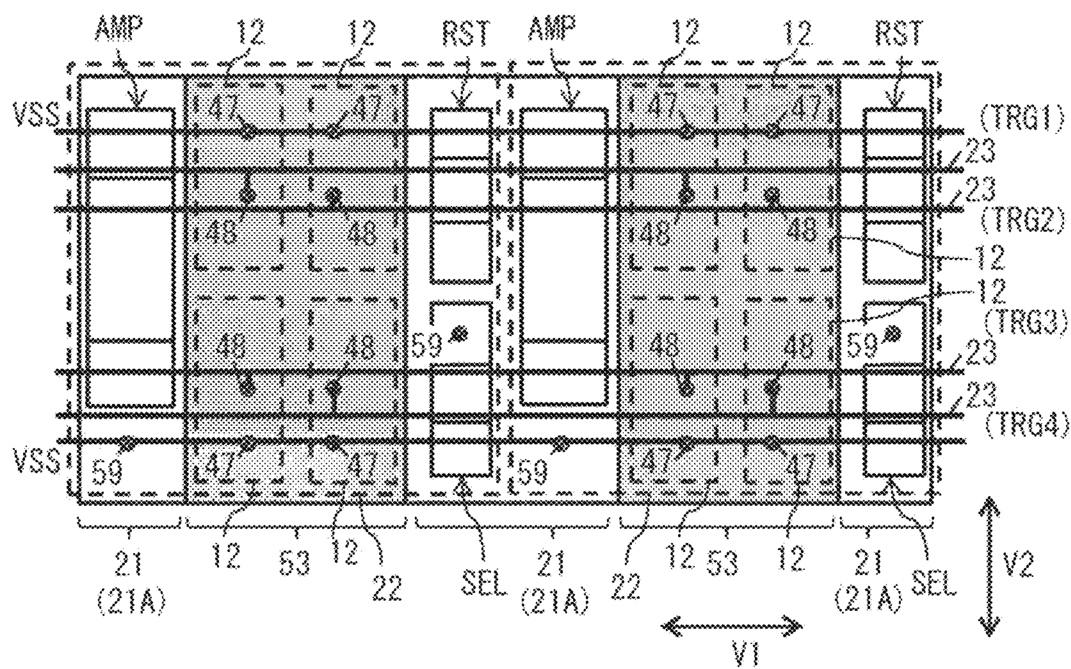
[FIG. 13]
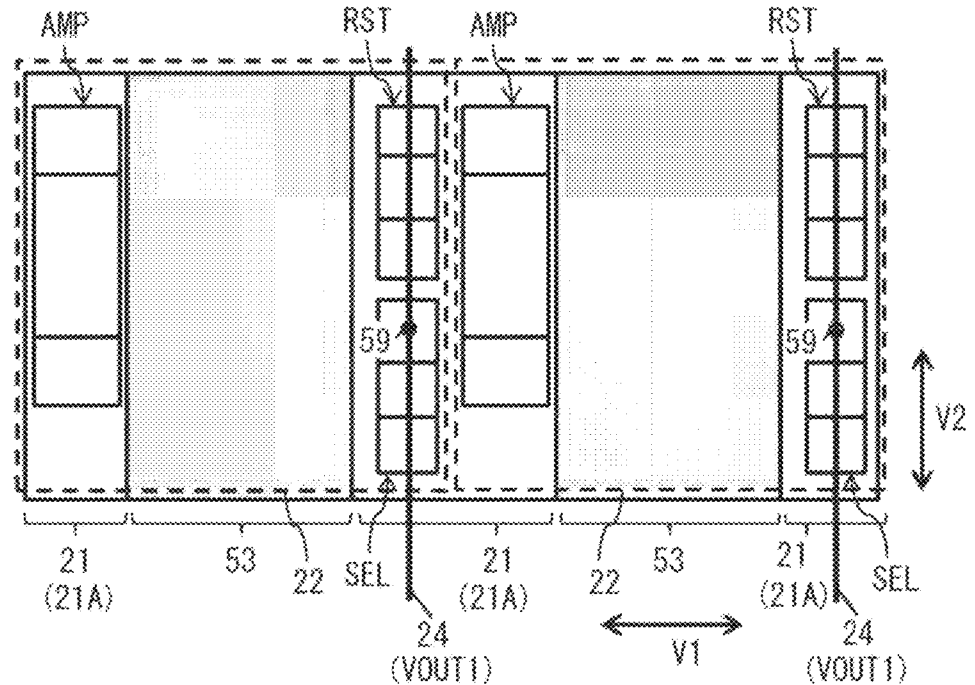

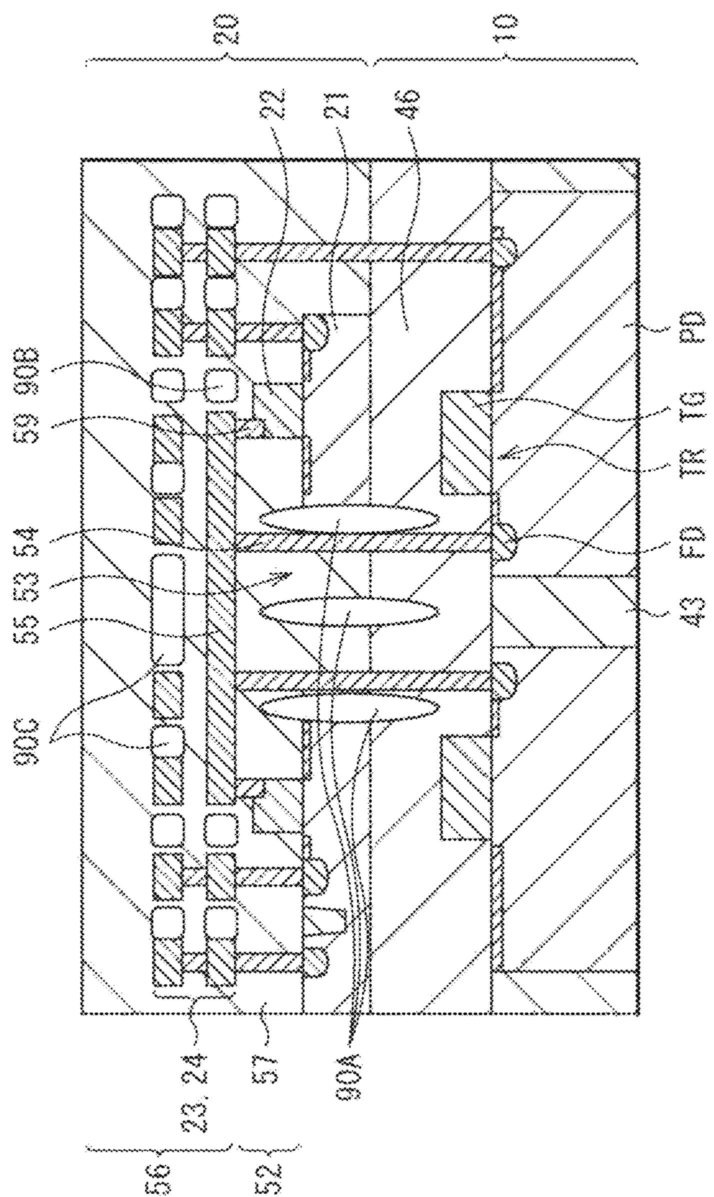
[FIG. 14]

[FIG. 15]
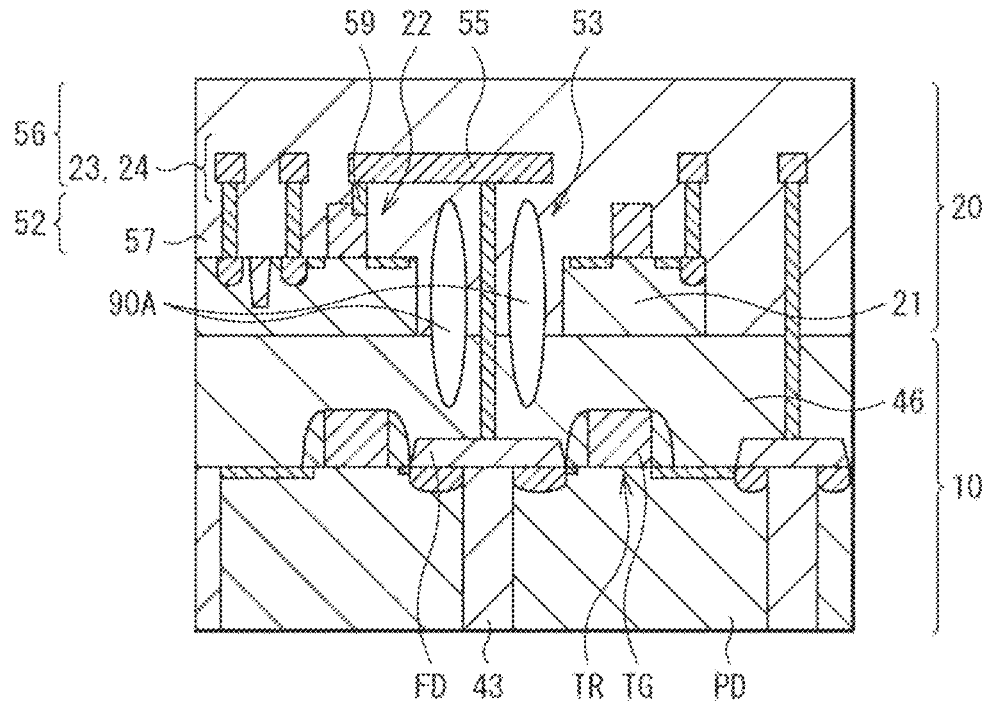

[FIG. 16]
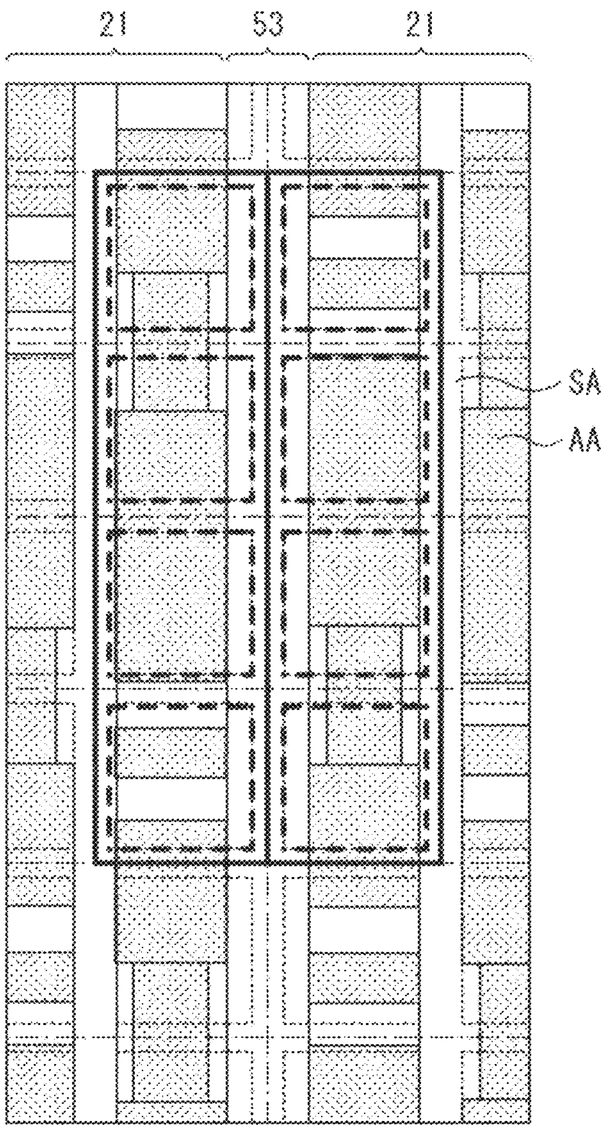

[FIG. 17]
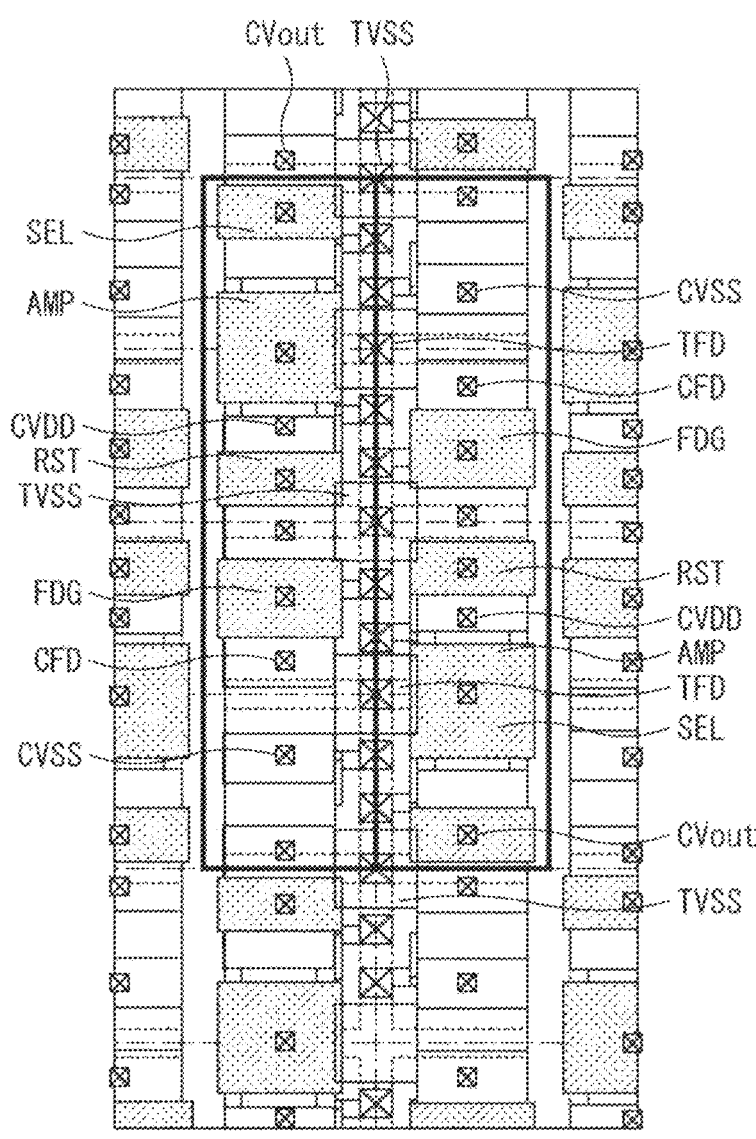

[FIG. 18]
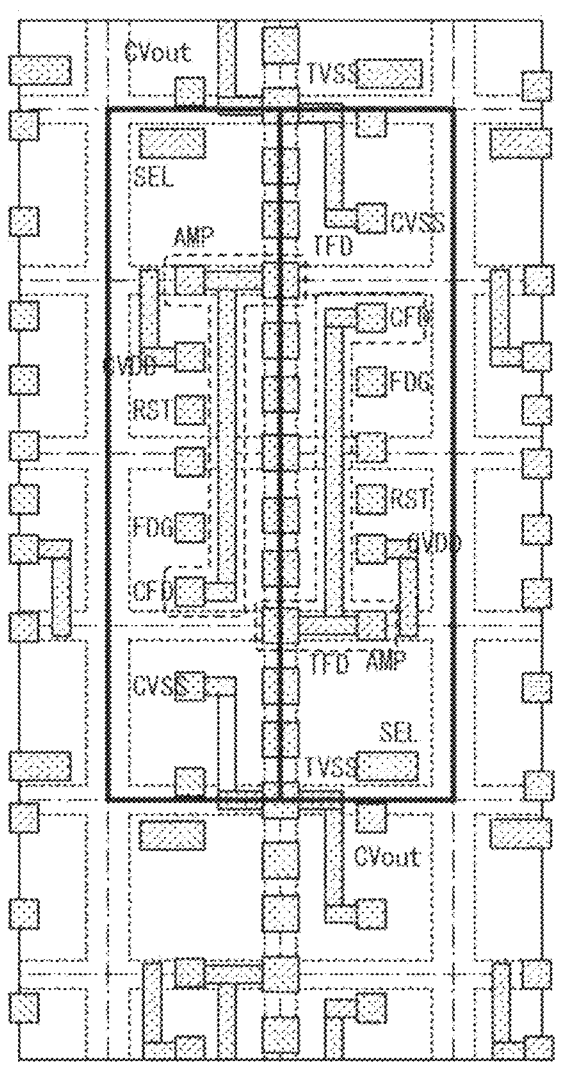

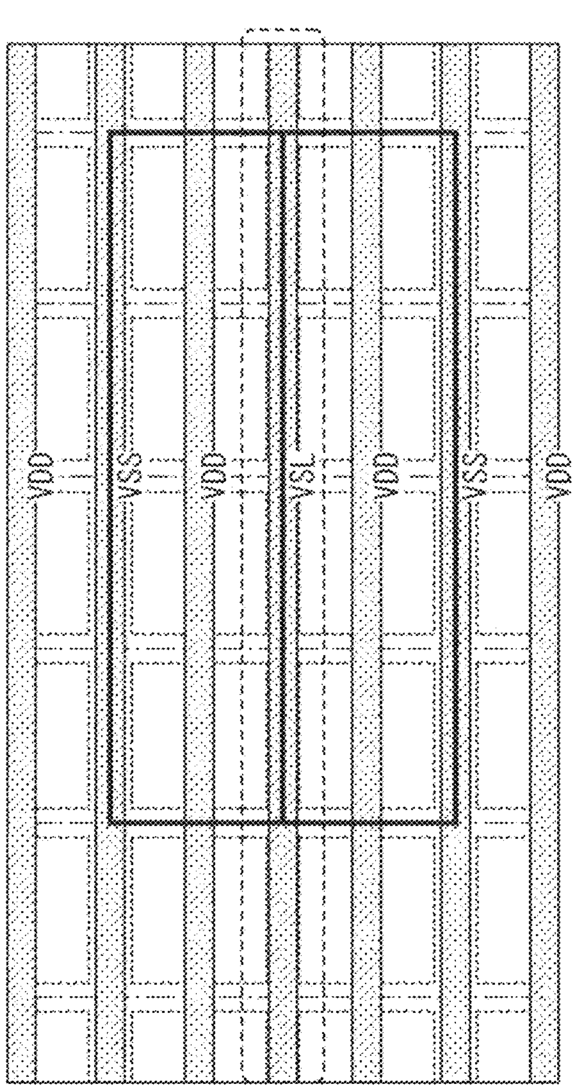
[FIG. 19]

[FIG. 20A]
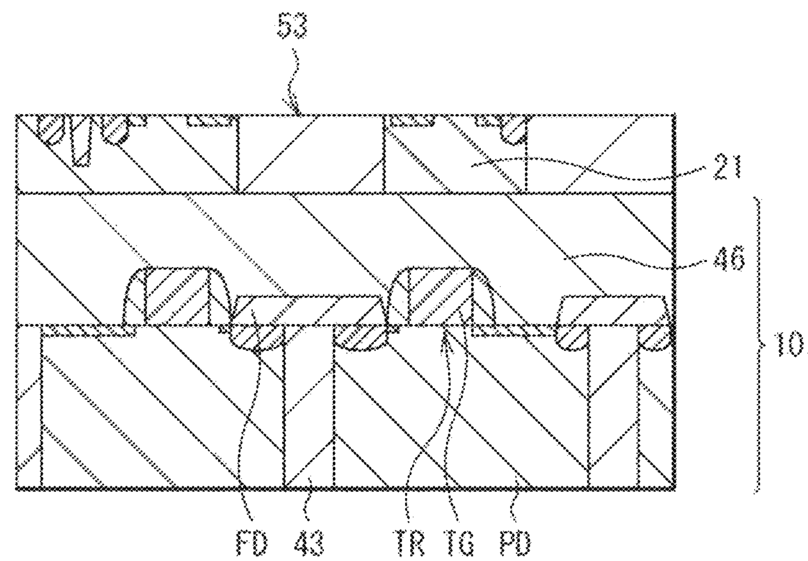
[FIG. 20B]
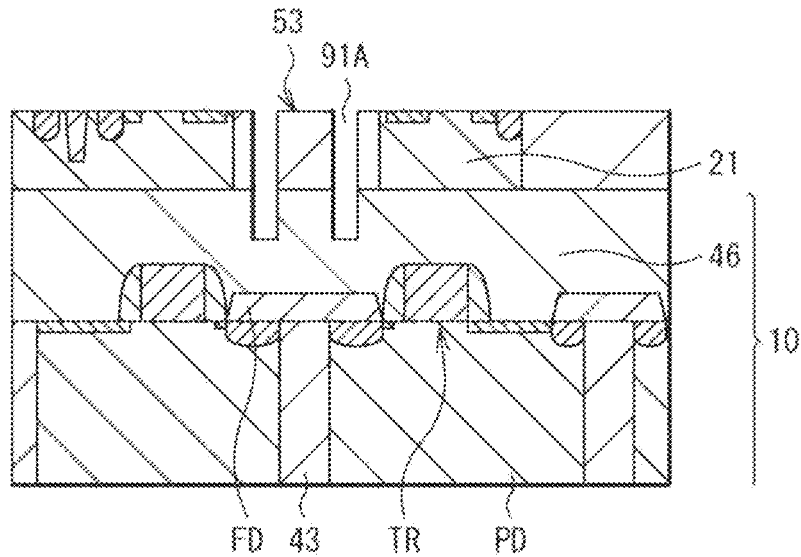

[FIG. 20C]
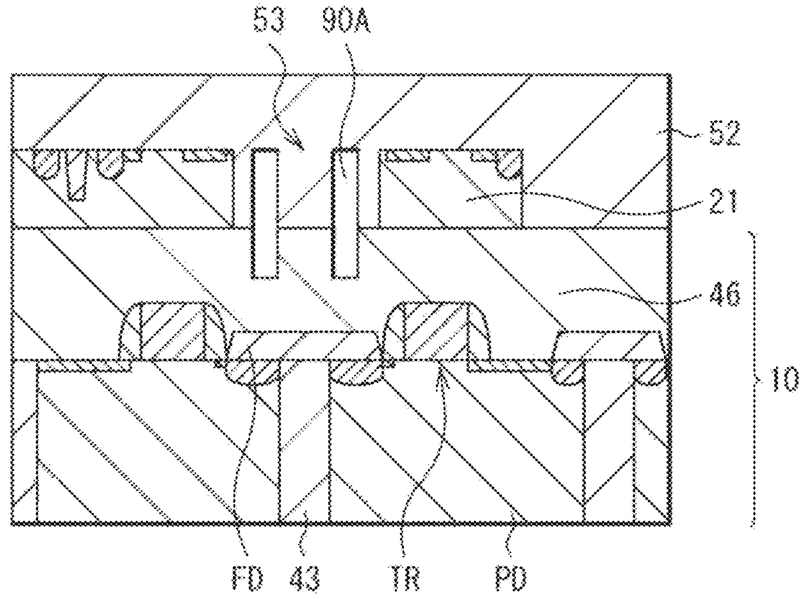
[FIG. 20D]
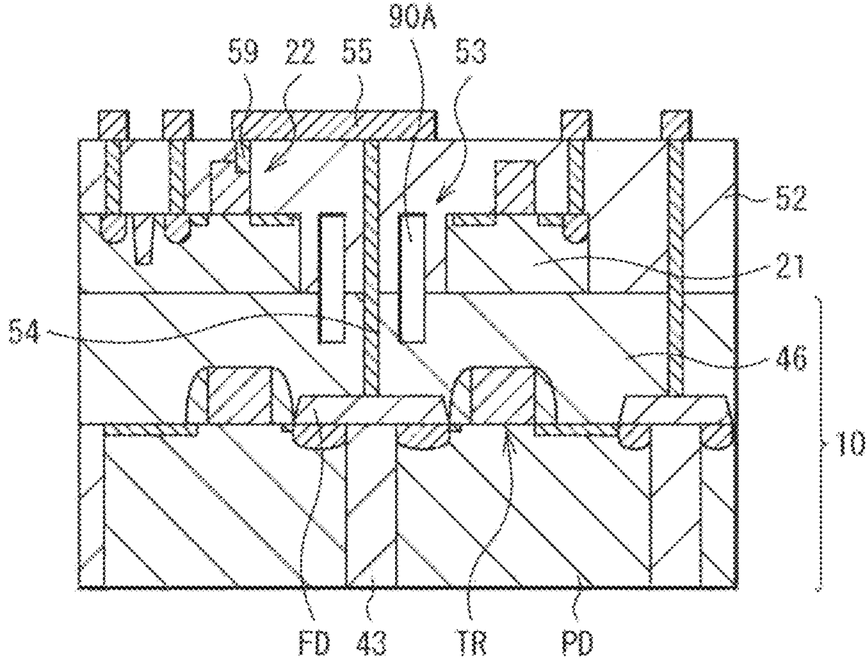

[FIG. 20E]
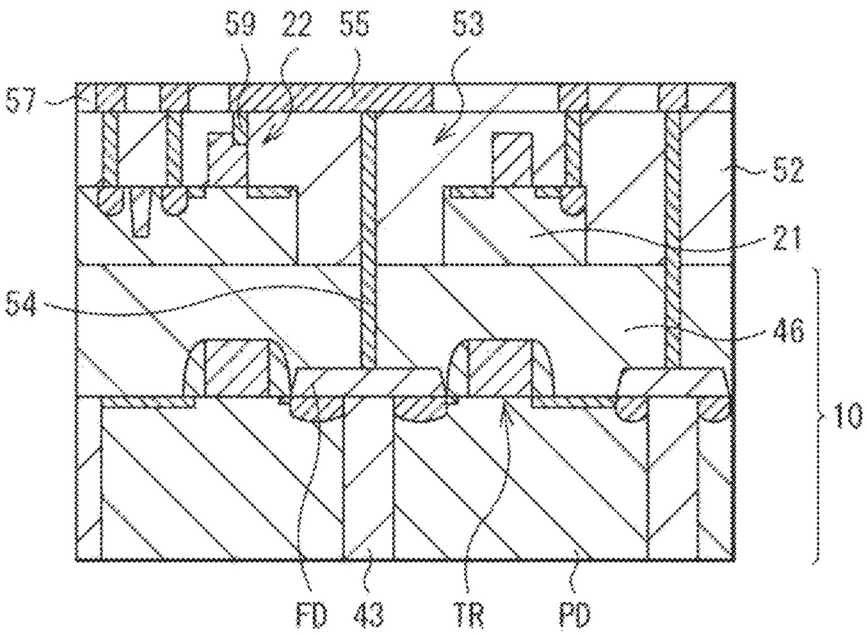
[FIG. 20F]
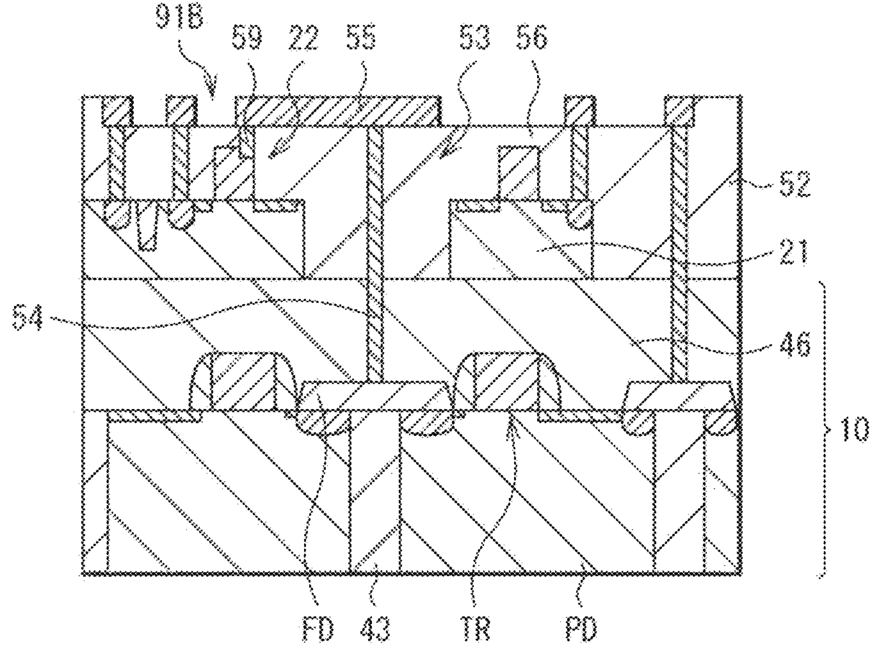

[FIG. 20G]
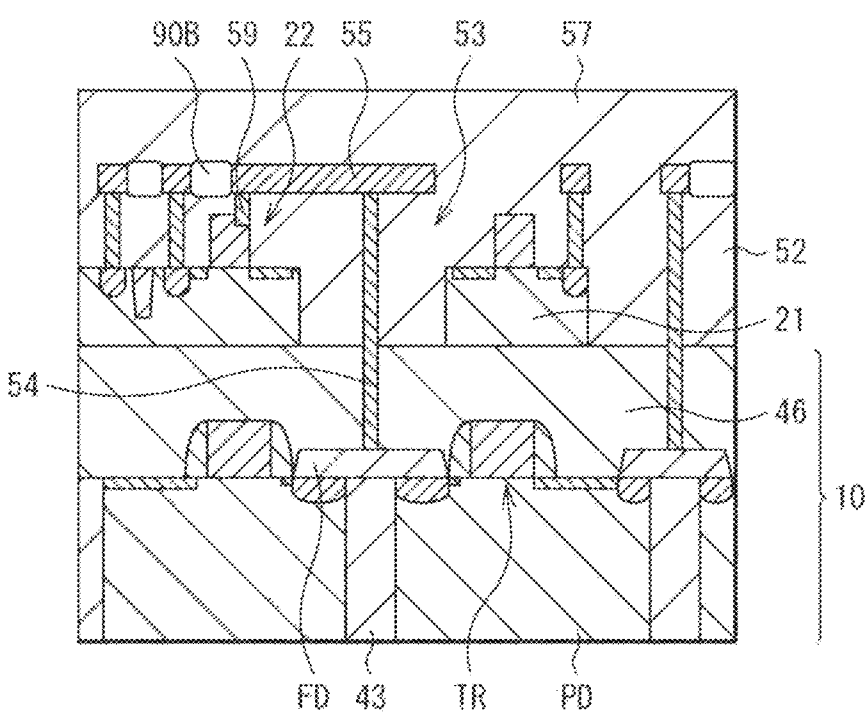

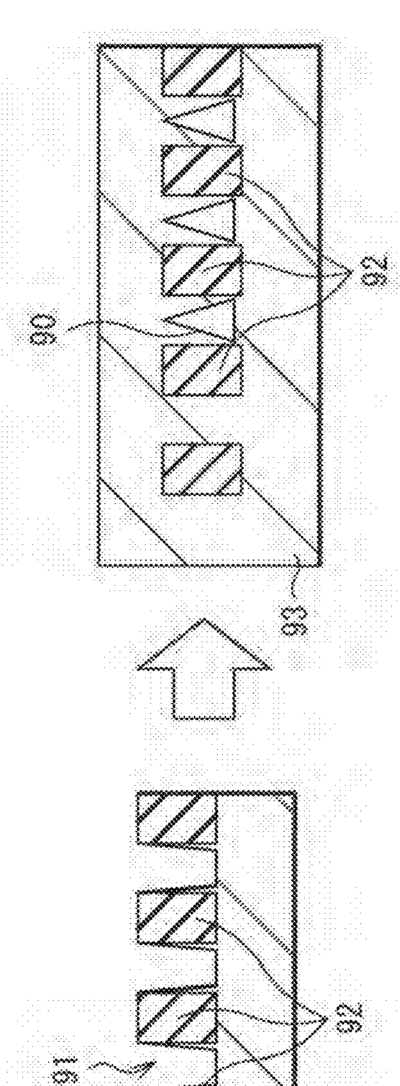
[FIG. 21]

[FIG. 22A]
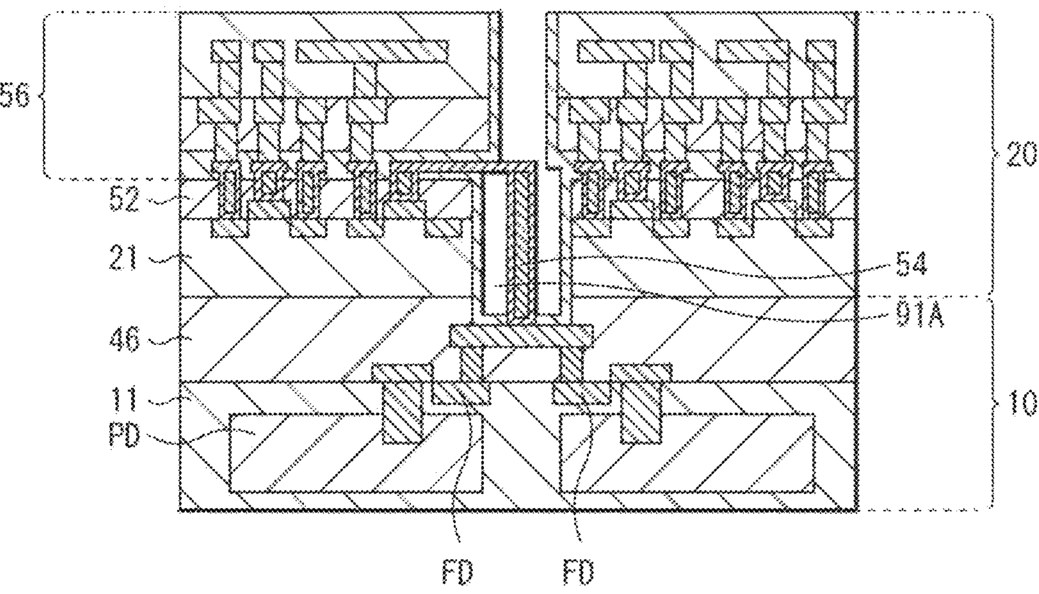

[FIG. 22B]
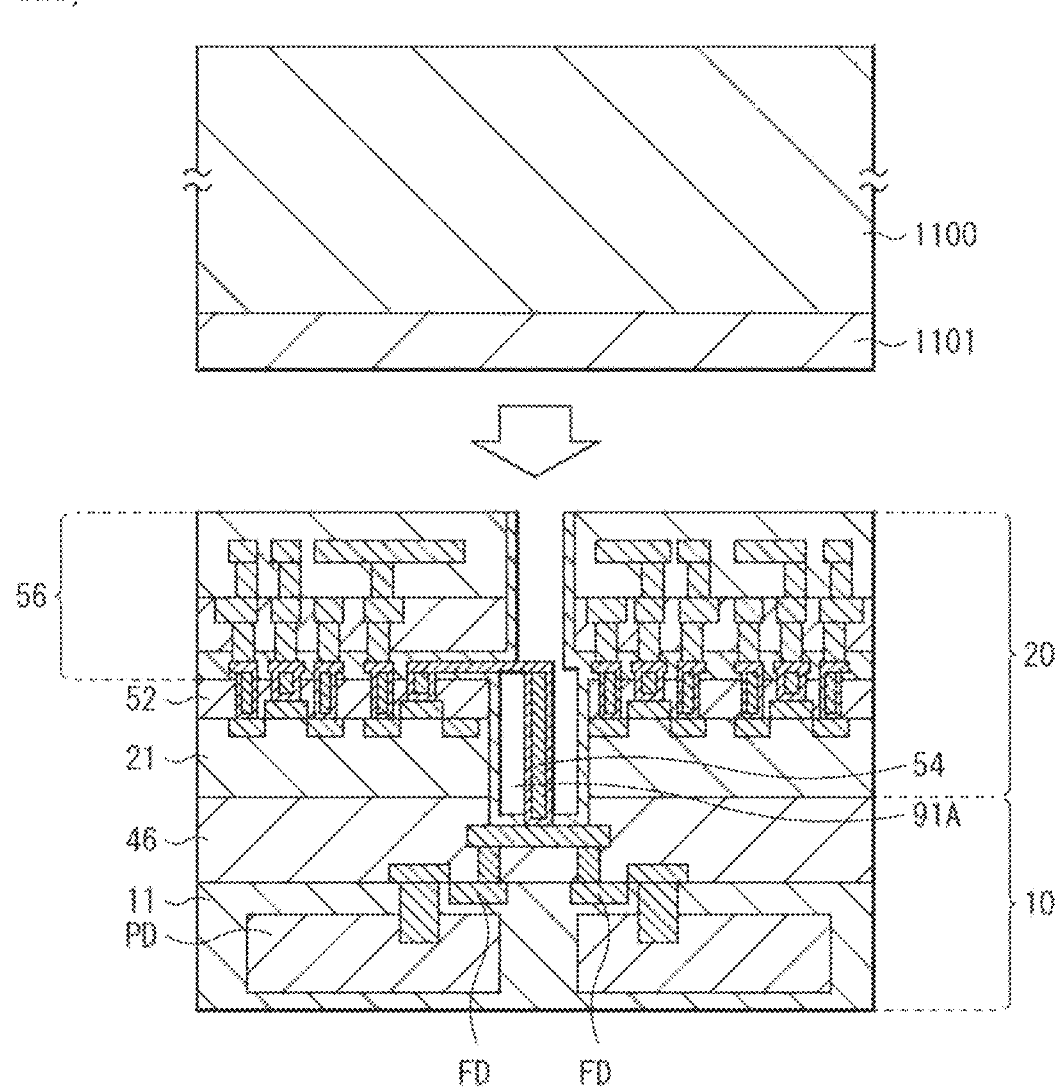

[FIG. 22C]
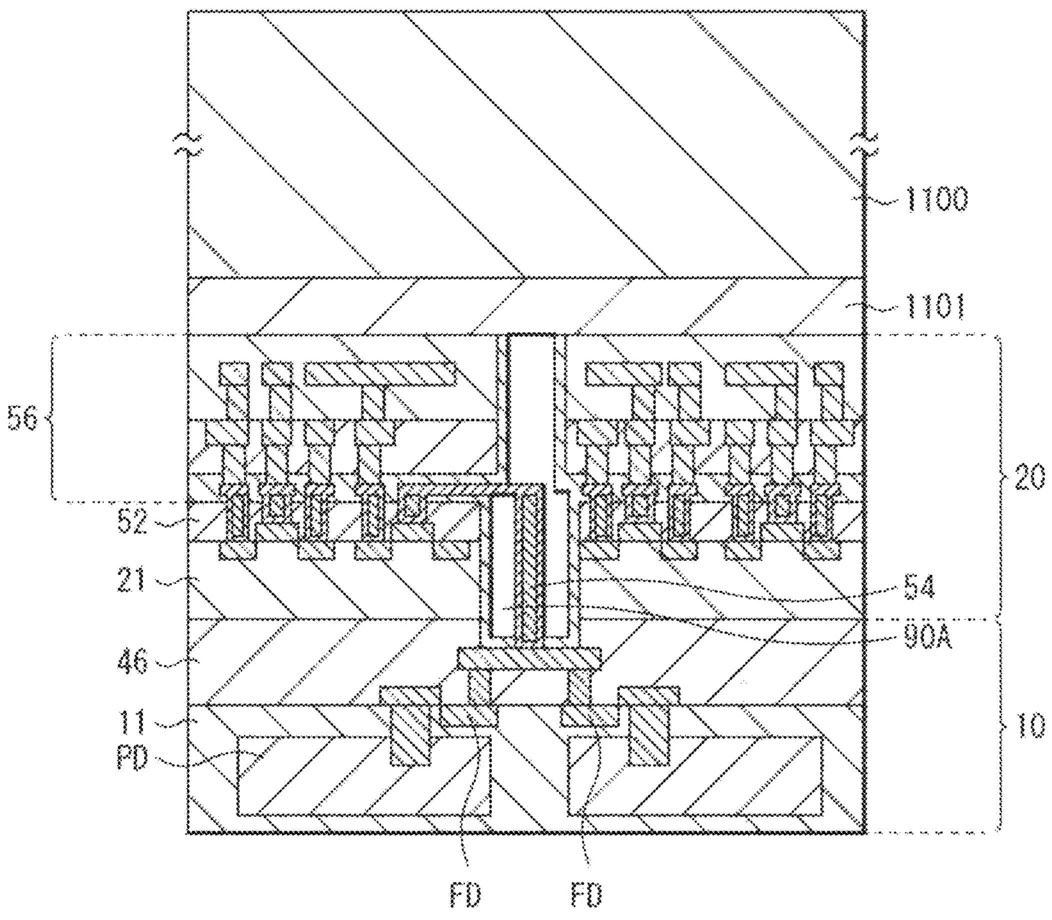
[FIG. 22D]
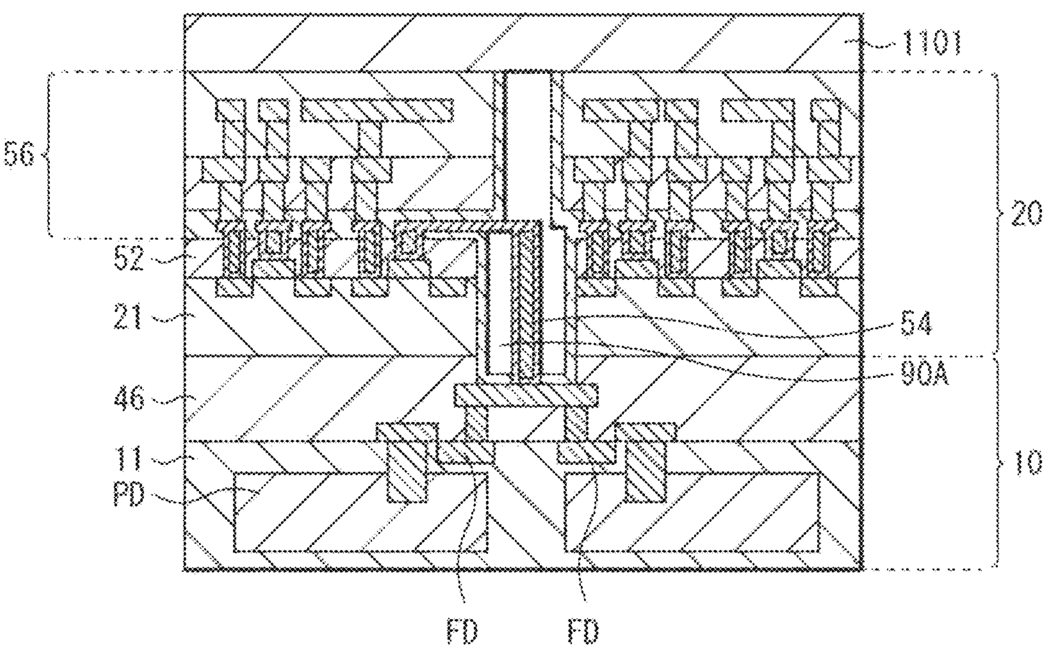

[FIG. 22E]
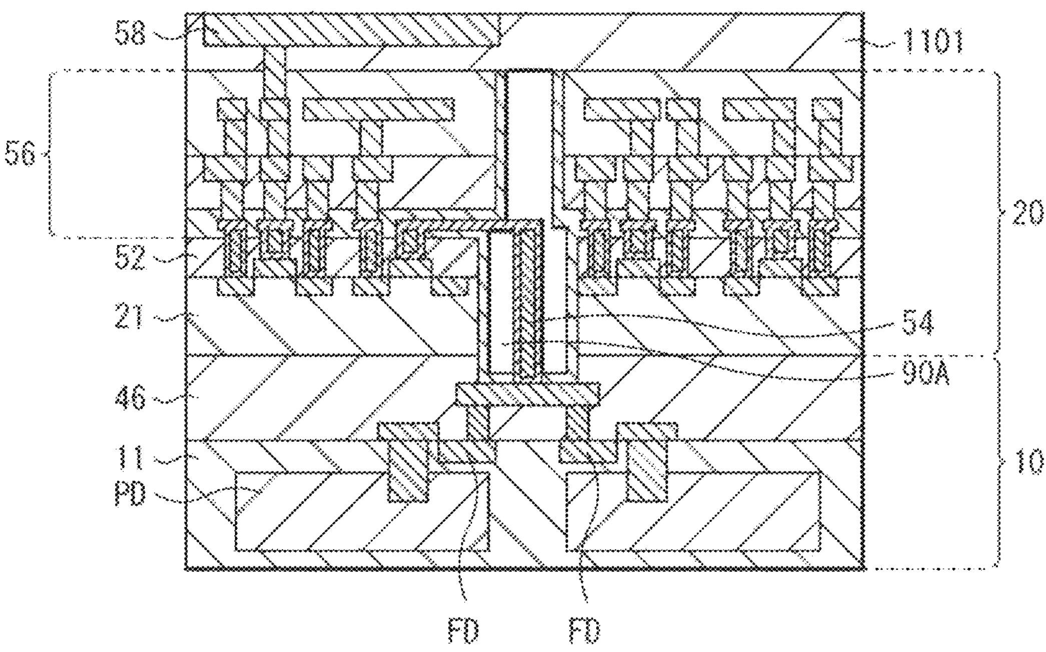

[FIG. 22F]
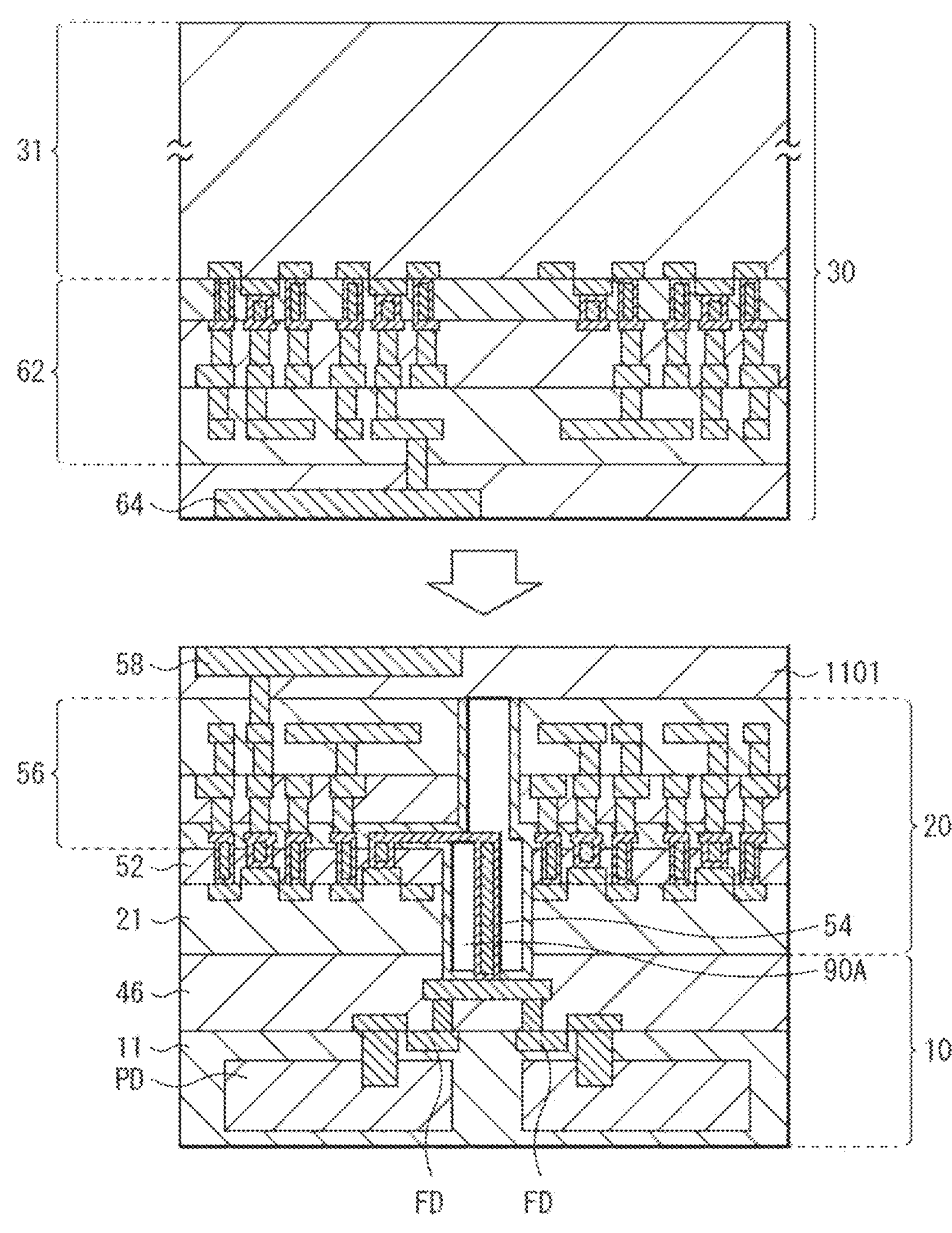

[FIG. 22G]
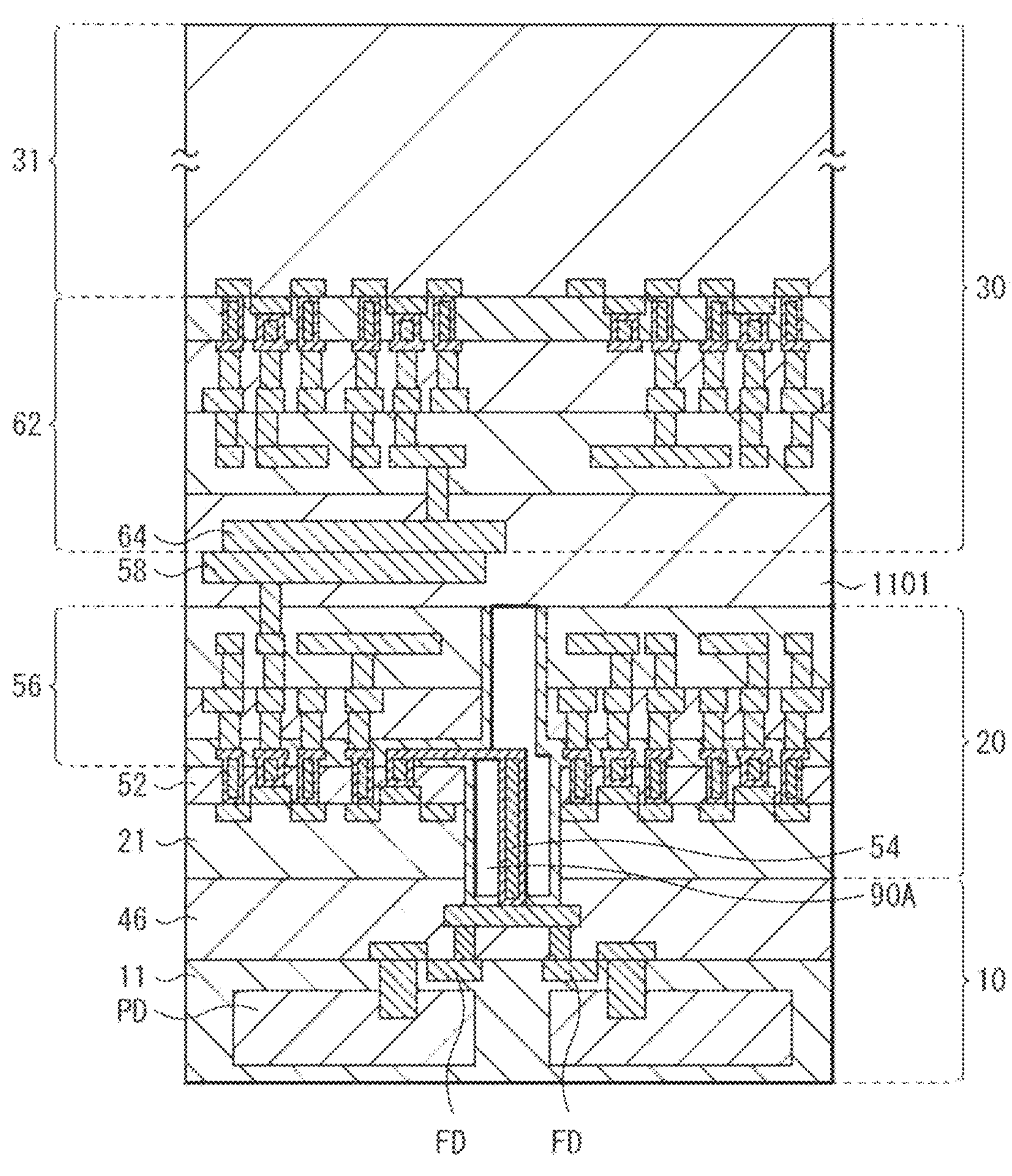

[FIG. 22H]
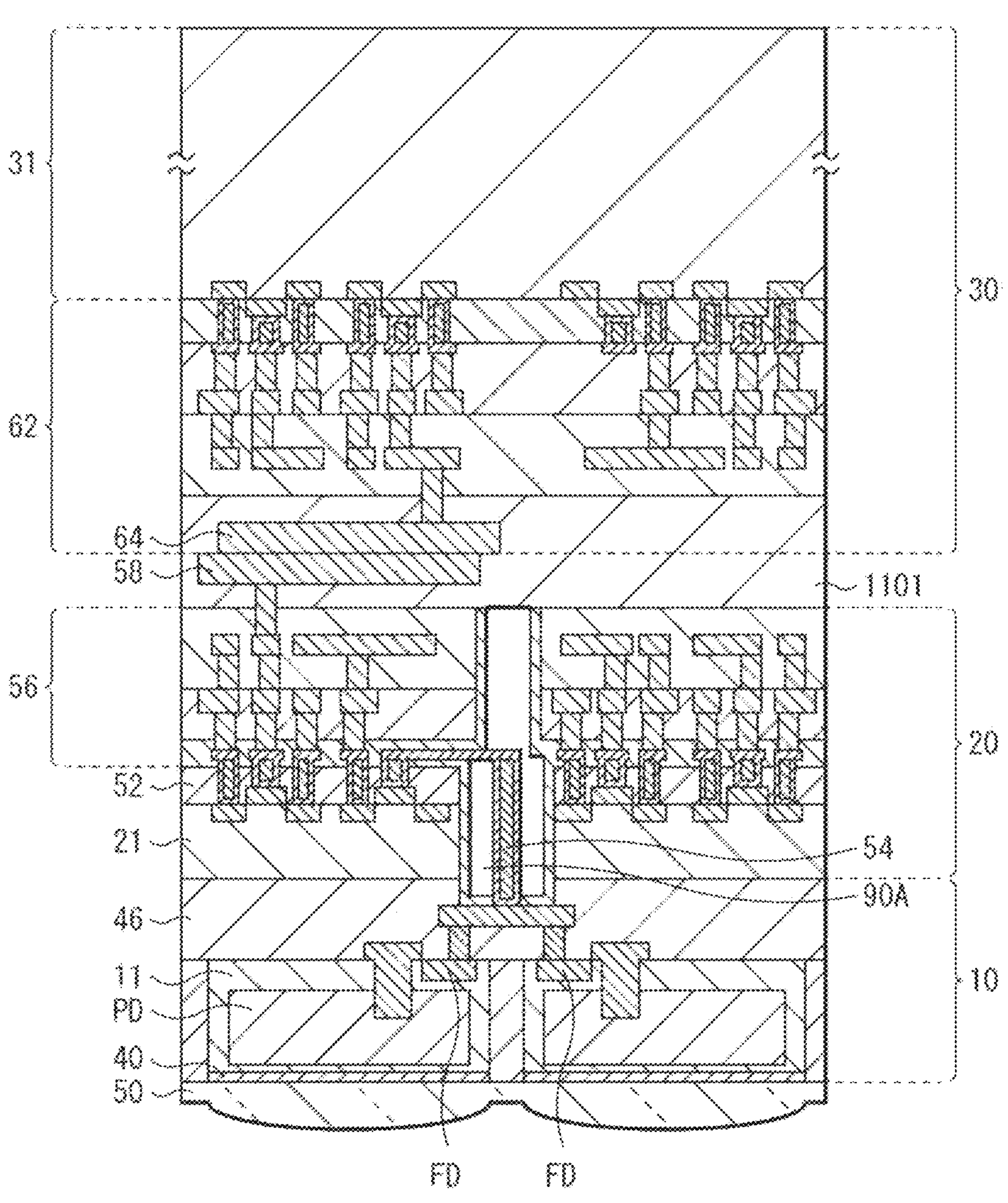

[FIG. 23]
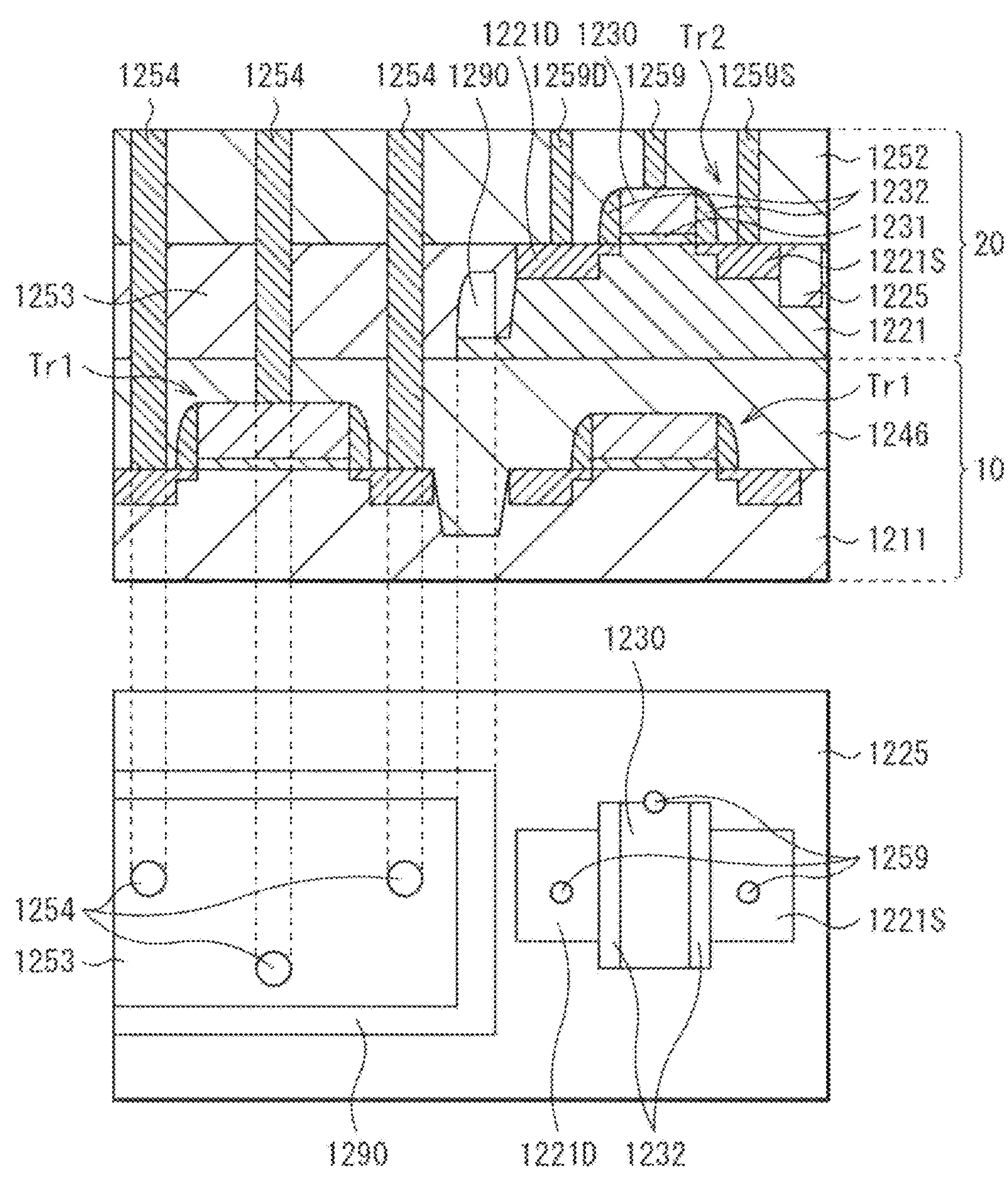

[FIG. 24A]
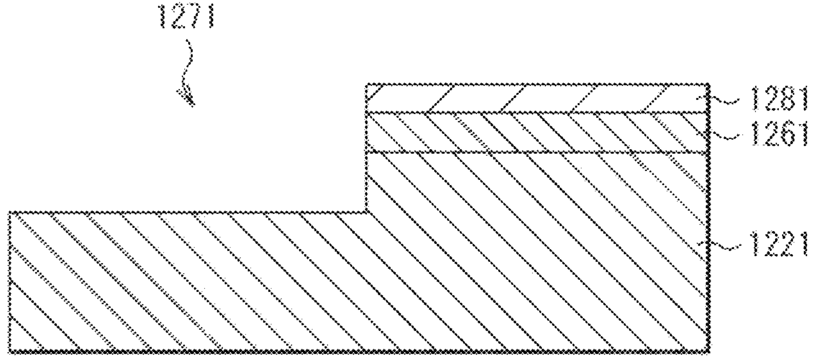
[FIG. 24B]
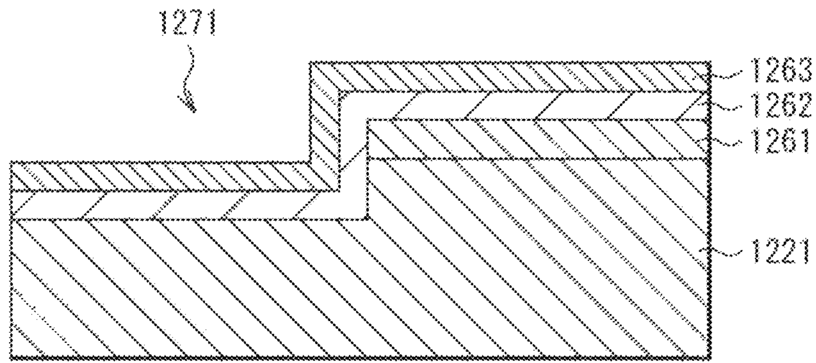

[FIG. 24C]
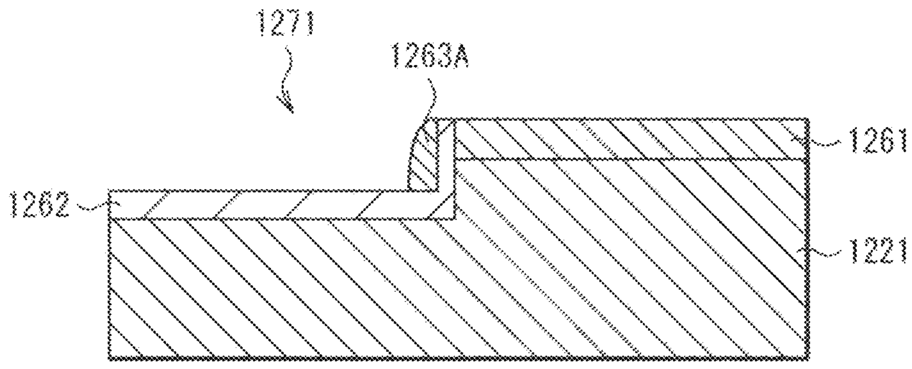
[FIG. 24D]
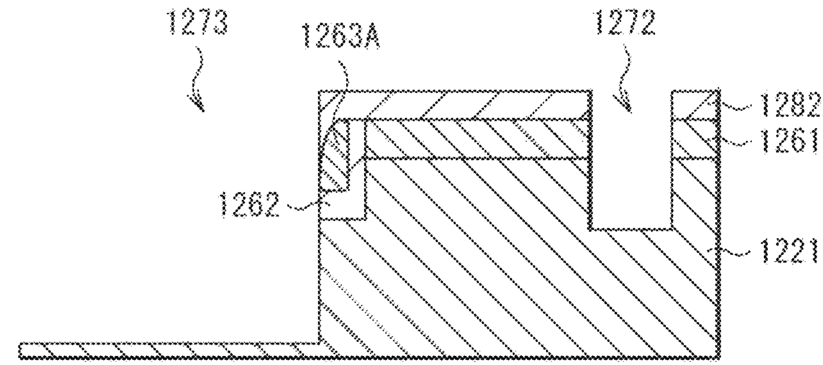

[FIG. 24E]
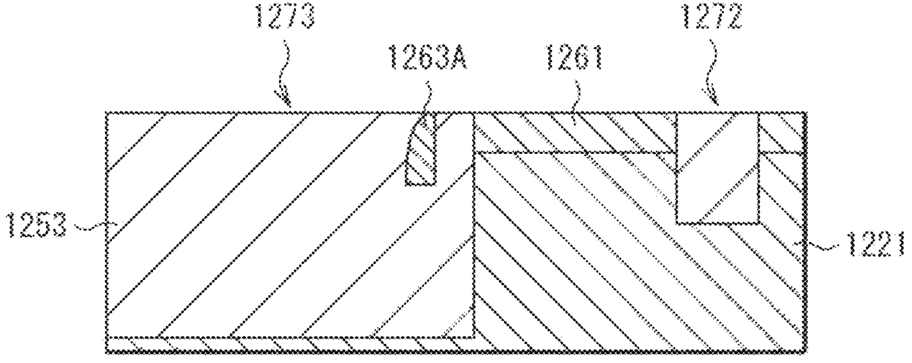
[FIG. 24F]
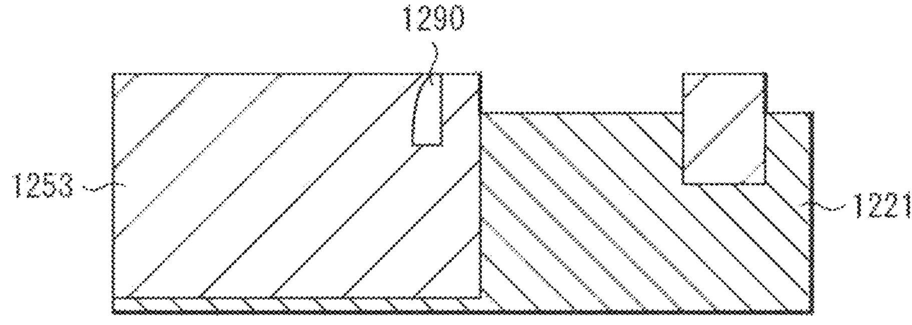
[FIG. 24G]
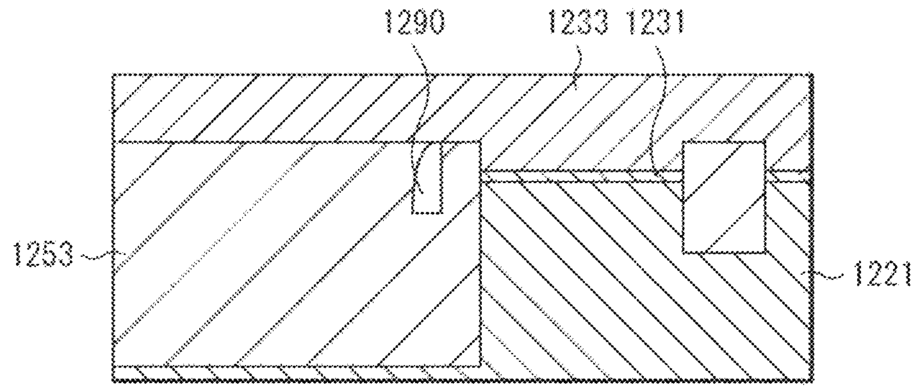

[FIG. 24H]
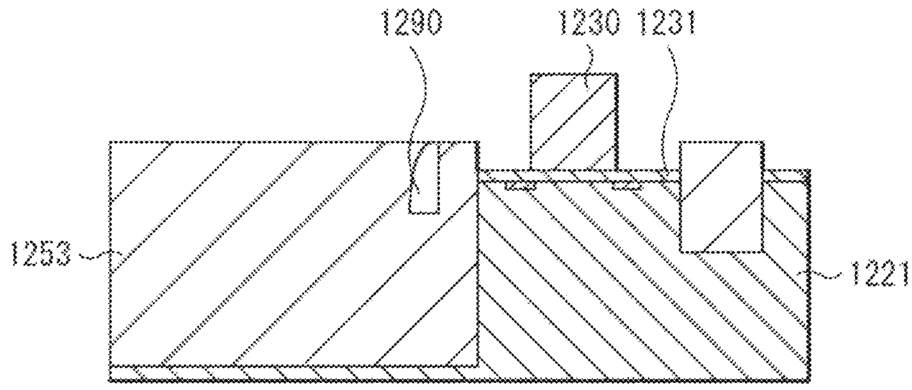
[FIG. 25I]
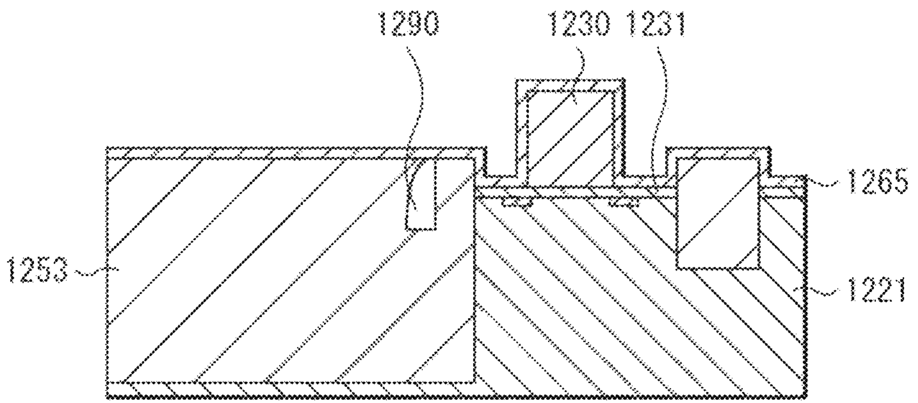
[FIG. 24J]
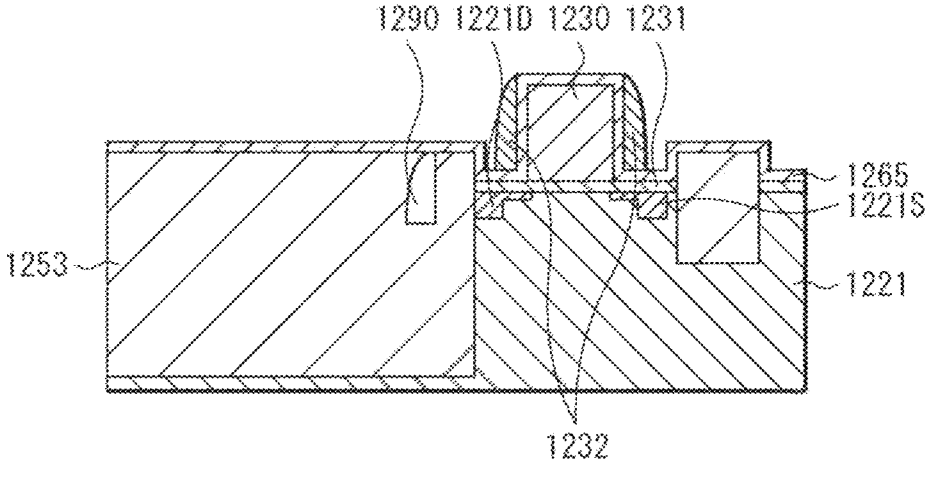

[FIG. 24K]
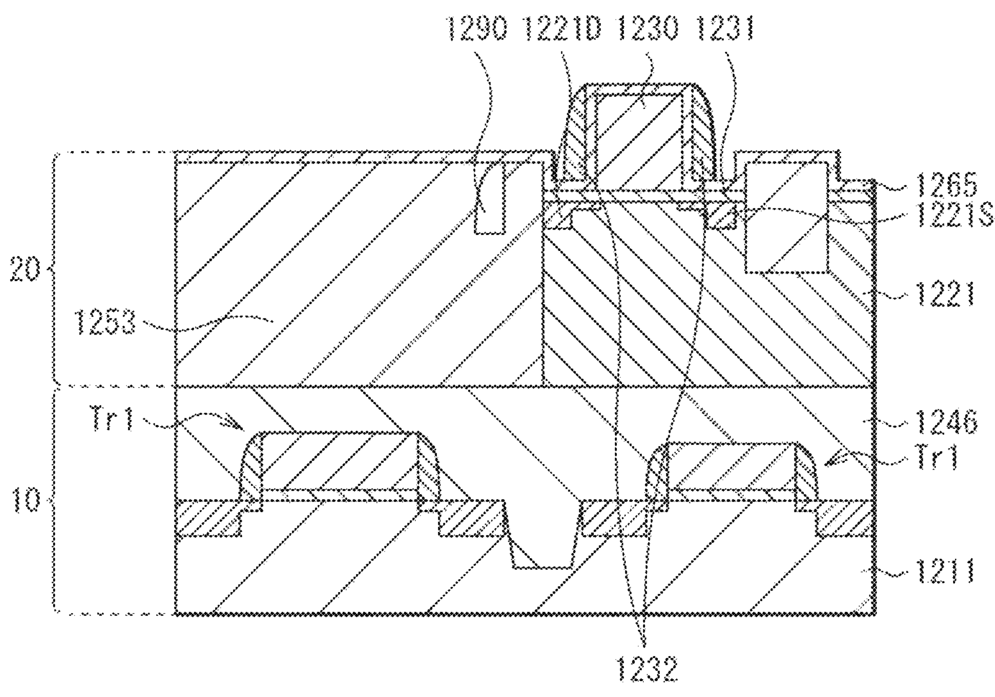
[FIG. 24L]
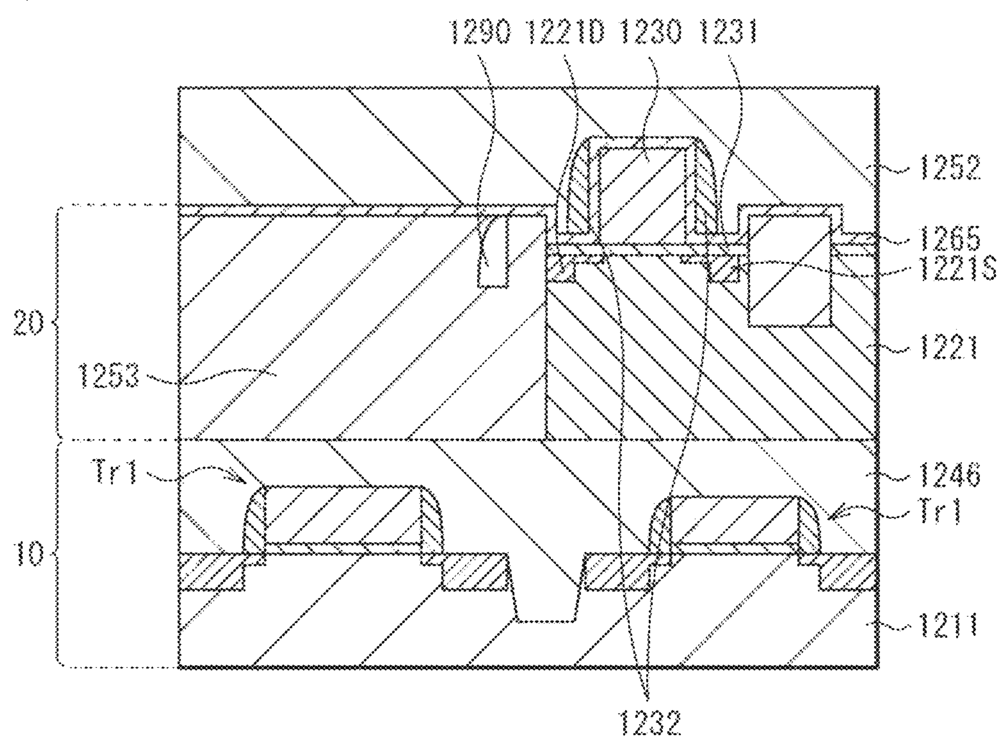

[FIG. 25A]
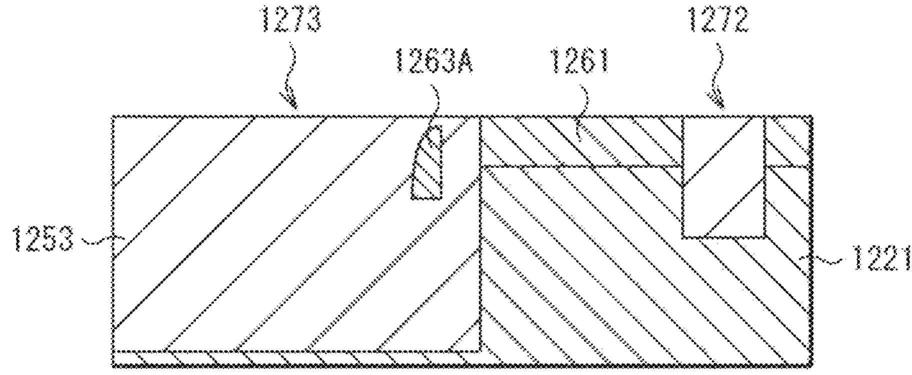
[FIG. 25B]
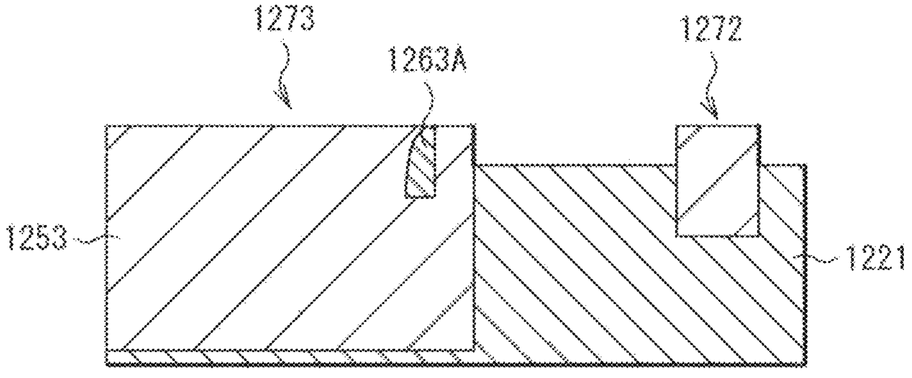
[FIG. 25C]
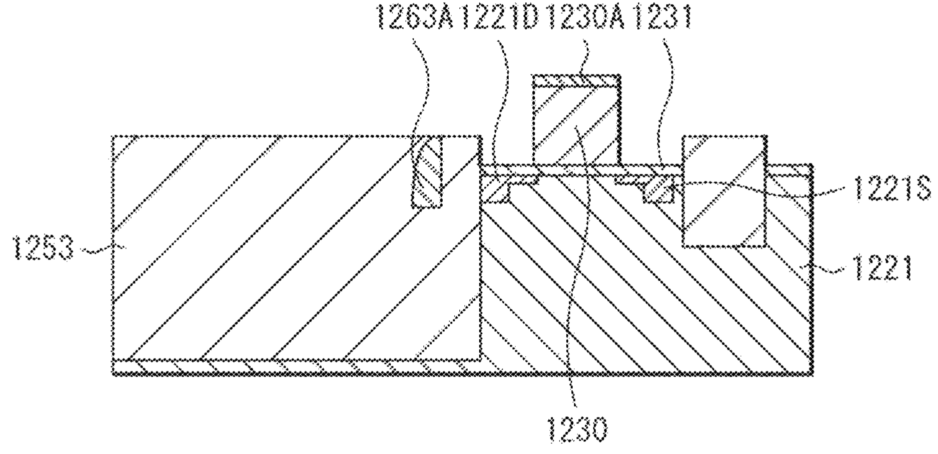

[FIG. 25D]
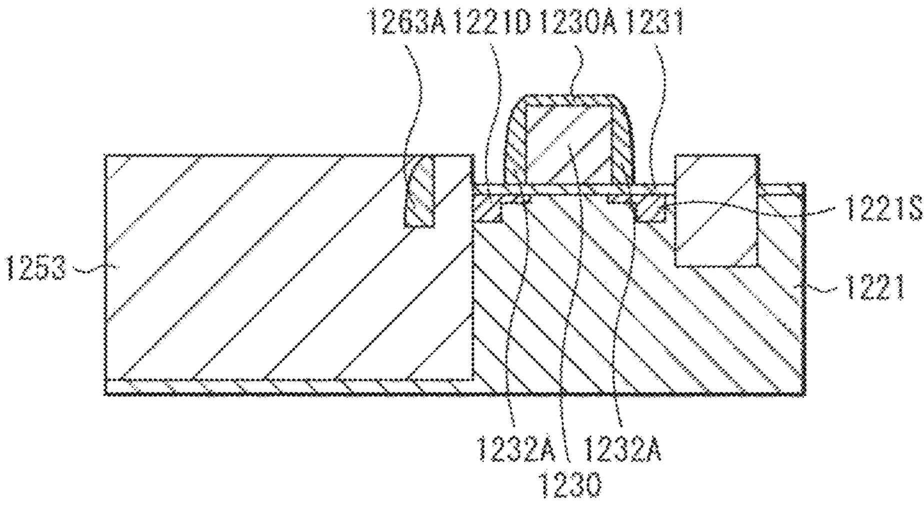
[FIG. 25E]
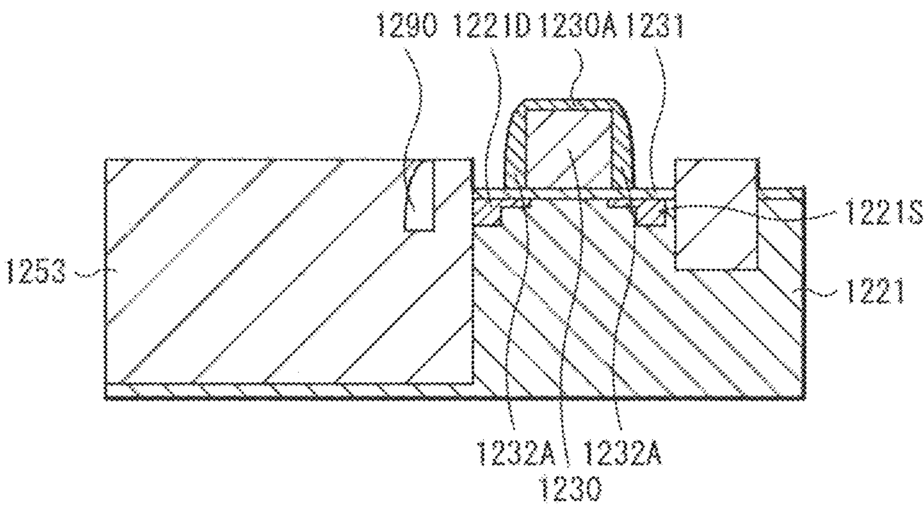
[FIG. 25F]
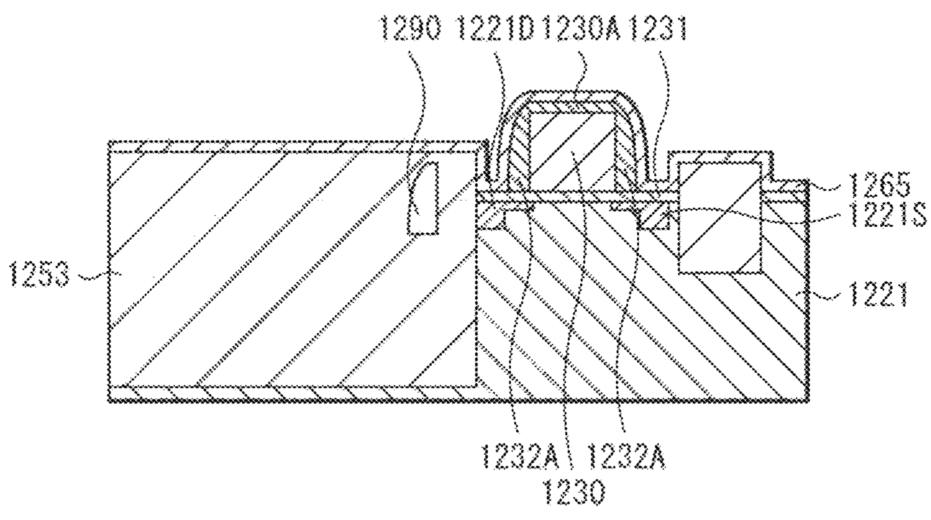

[FIG. 26]
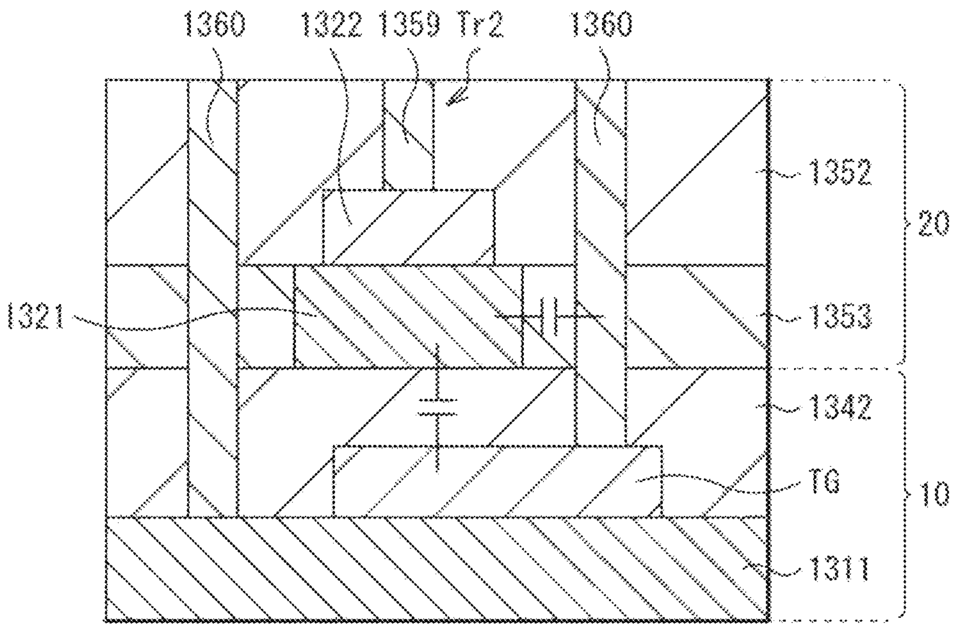
[FIG. 27]
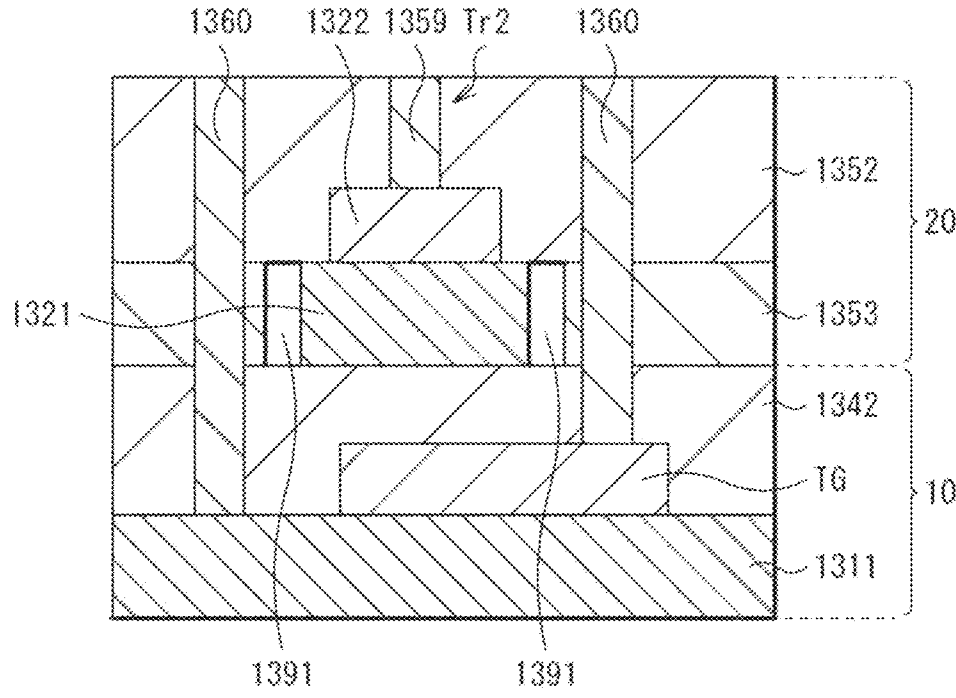

[FIG. 28]
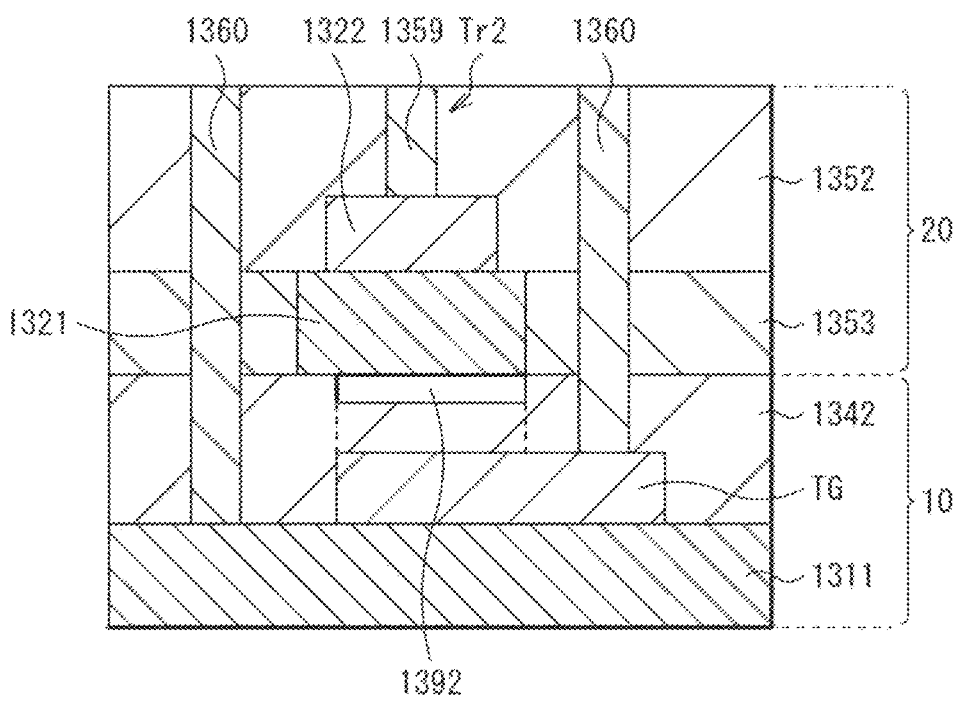

[FIG. 29A]
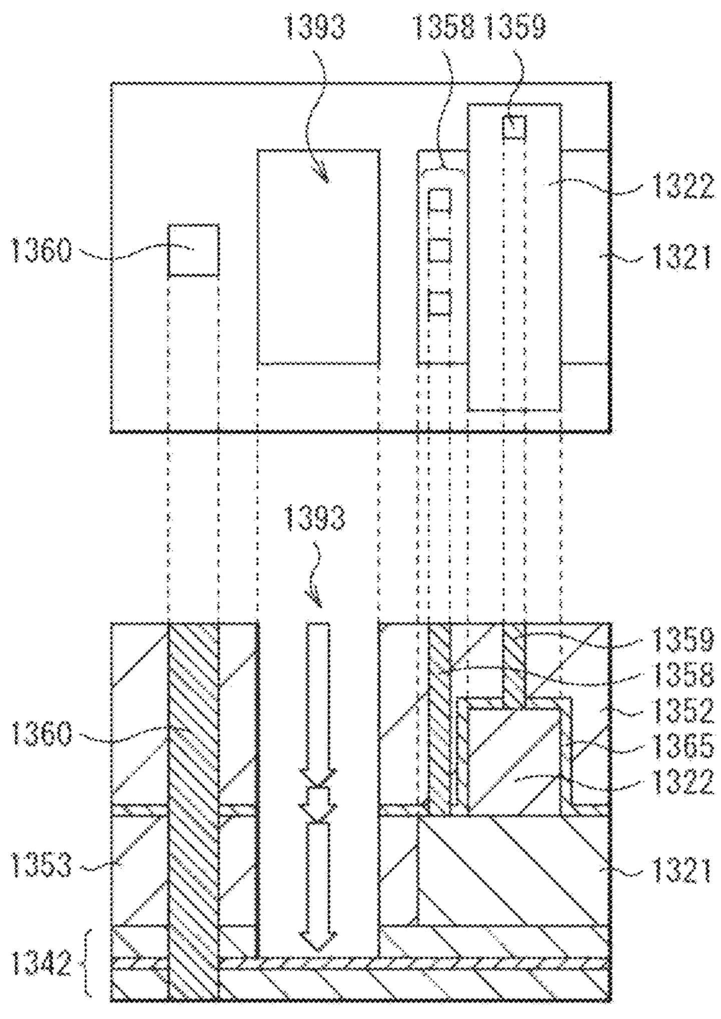

[FIG. 29B]
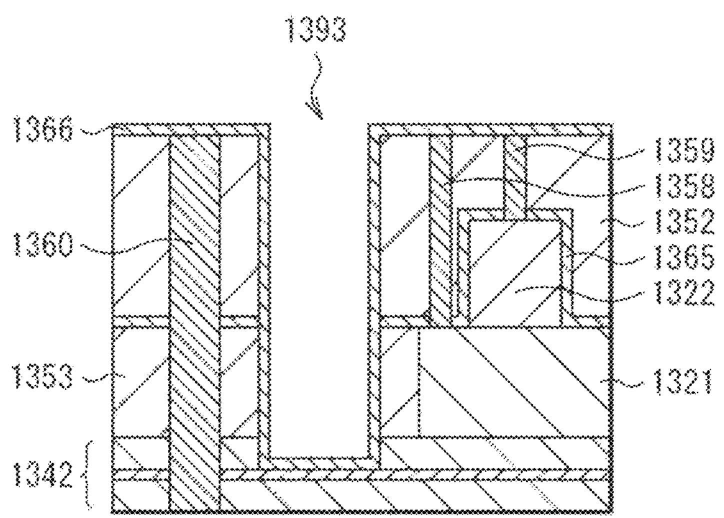

[FIG. 29C]
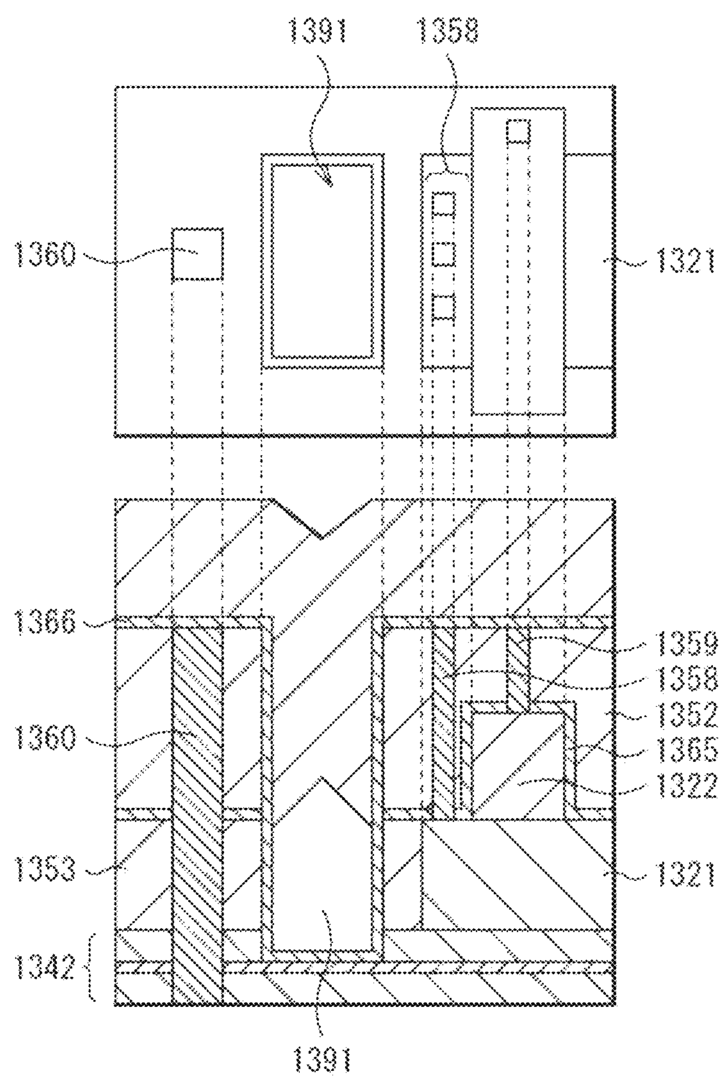

[FIG. 30]
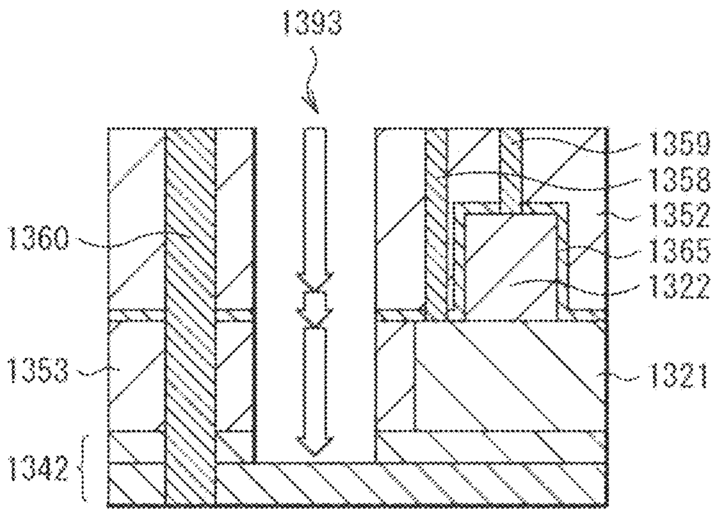

[FIG. 31A]
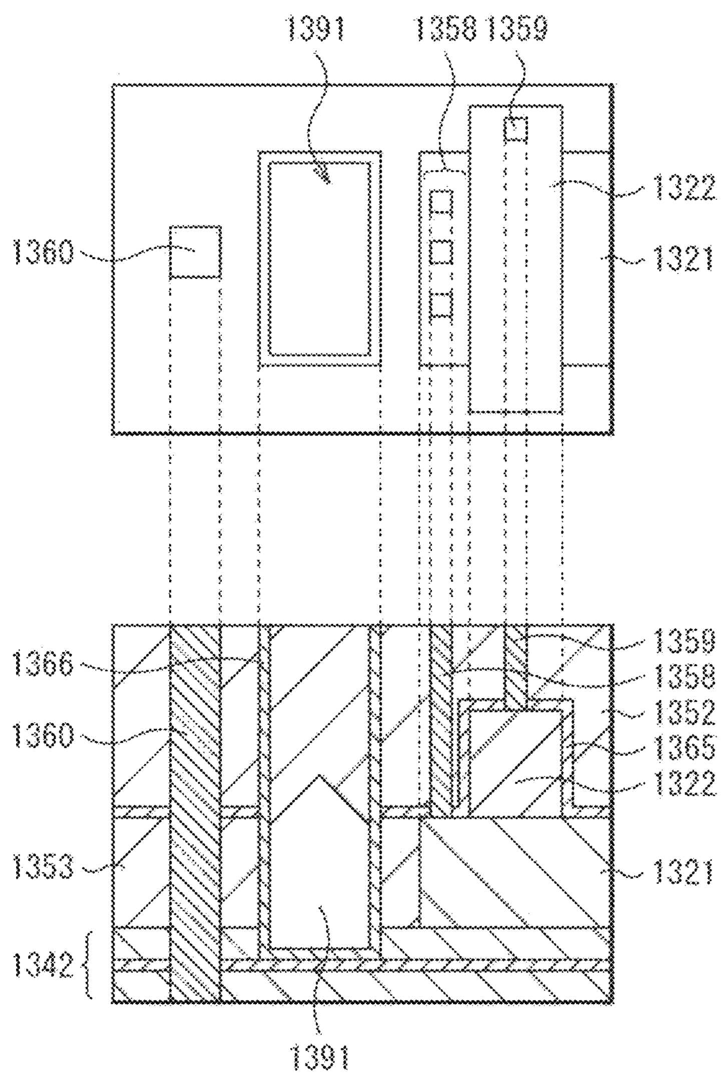

[FIG. 31B]
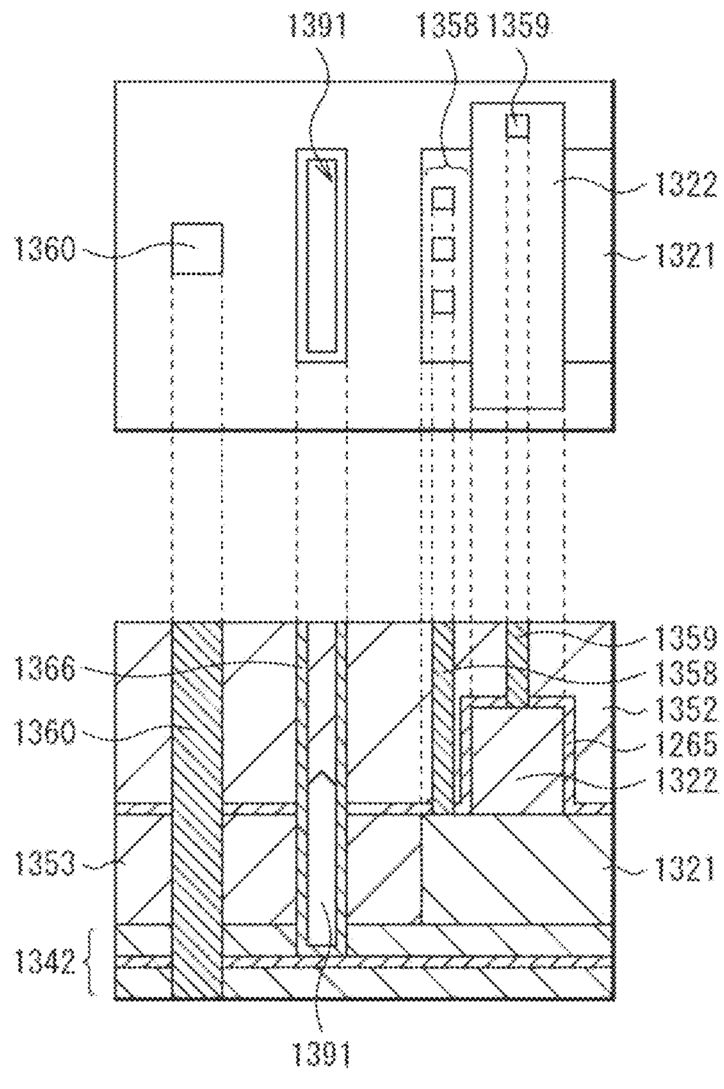

[FIG. 31C]
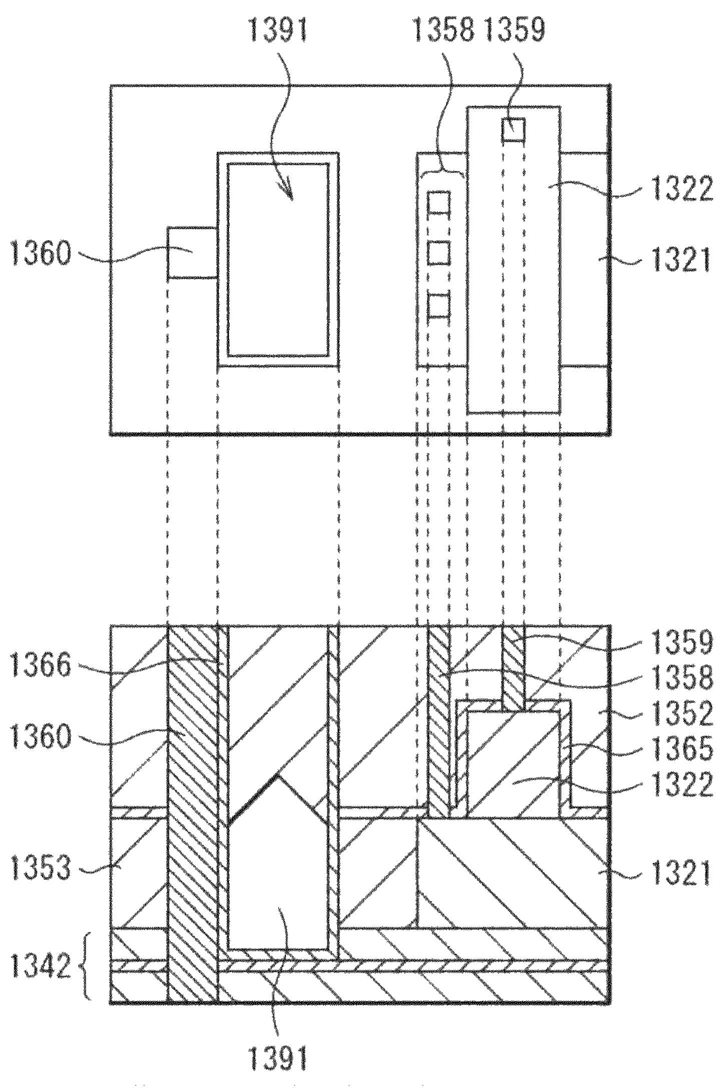

[FIG. 31D]
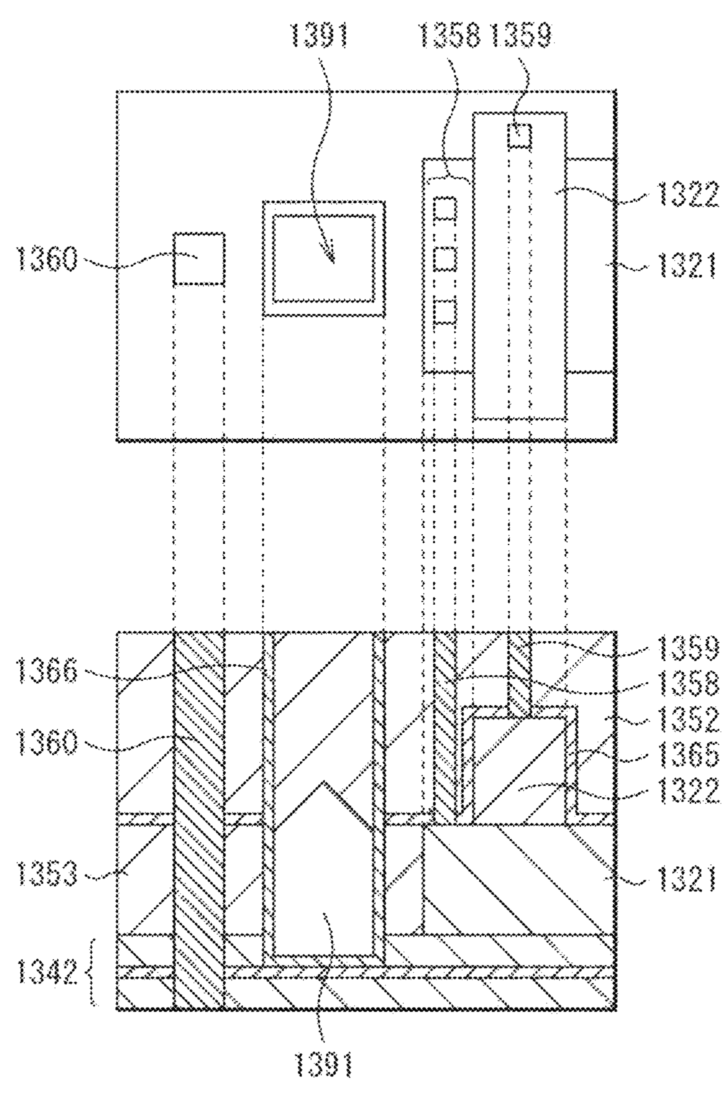

[FIG. 31E]
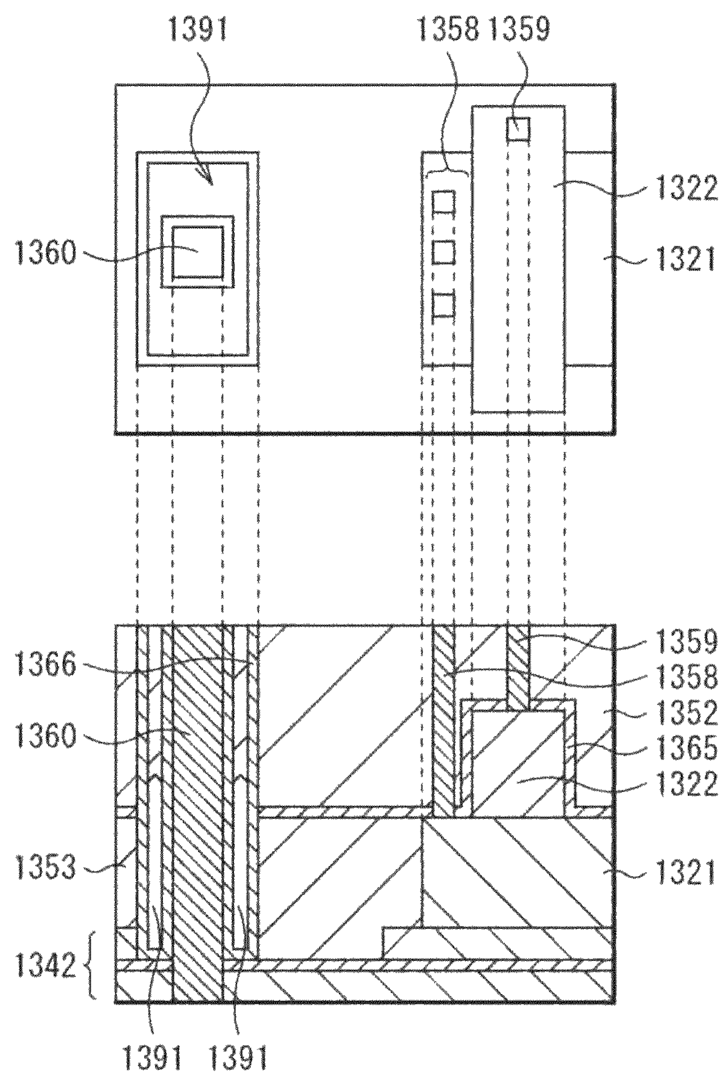

[FIG. 31F]
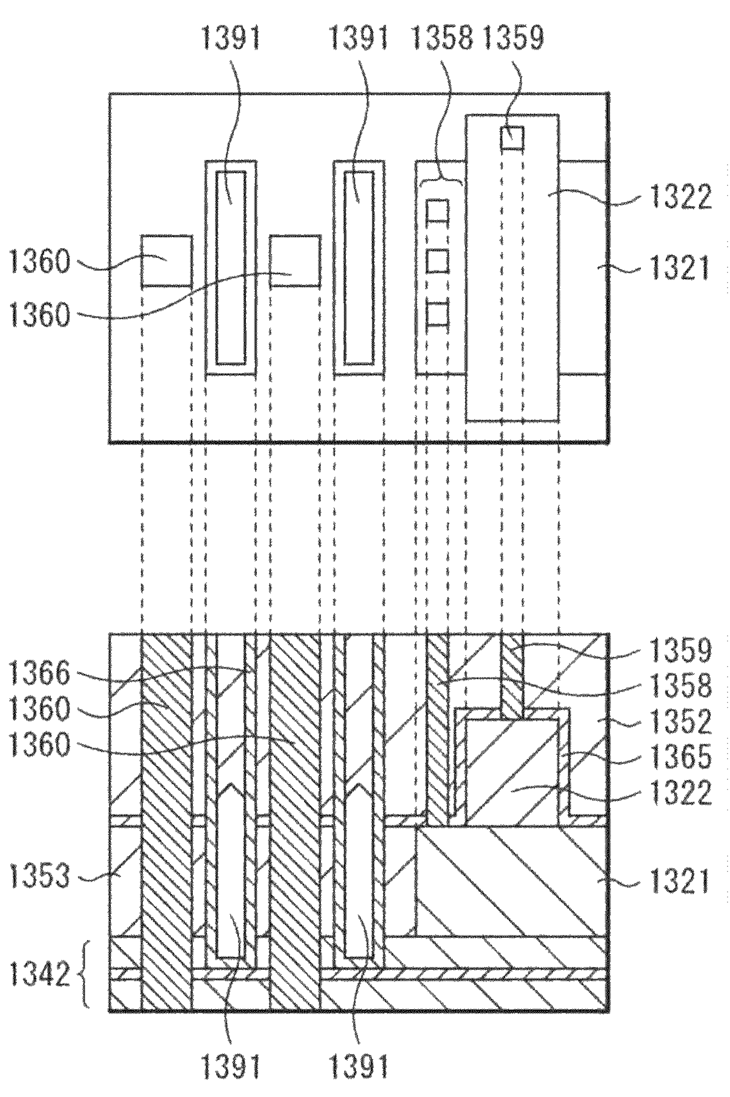

[FIG. 32A]
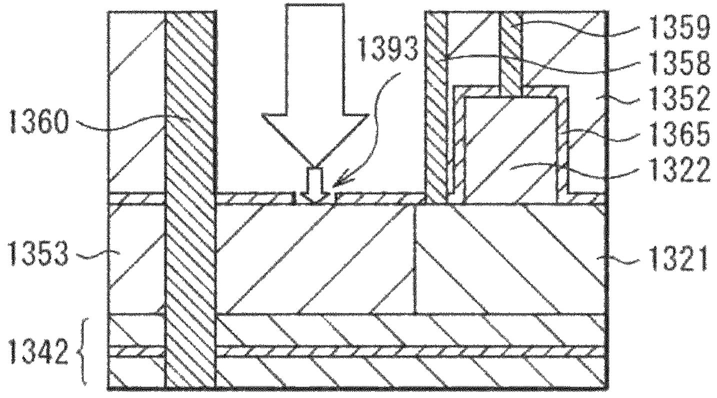
[FIG. 32B]
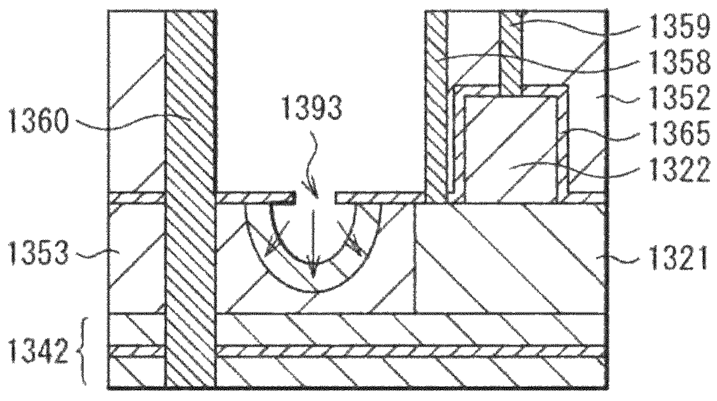

[FIG. 32C]
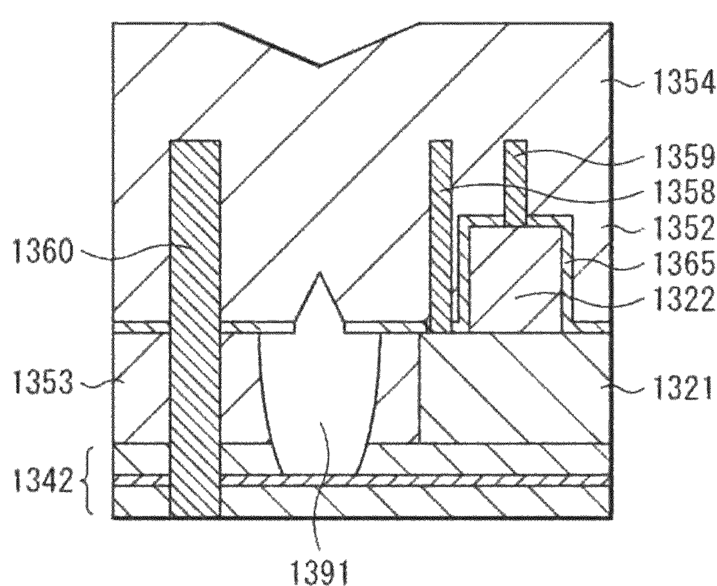

[FIG. 33A]
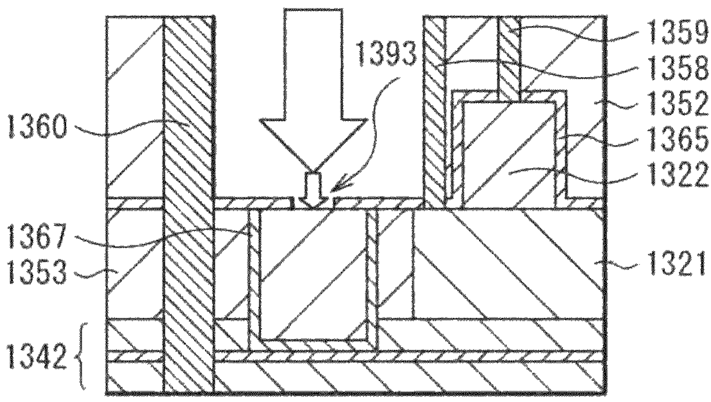
[FIG. 33B]
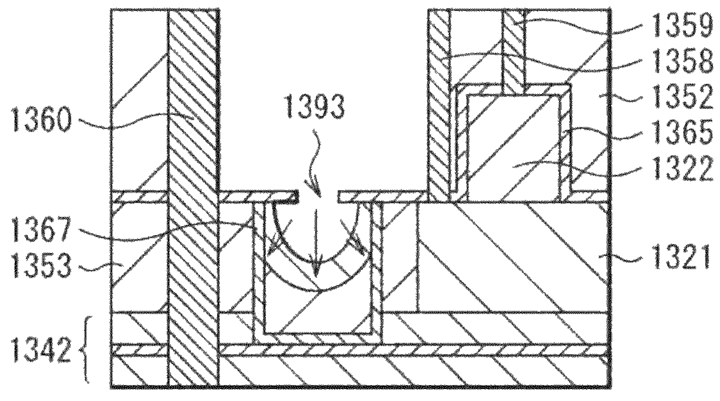

[FIG. 33C]
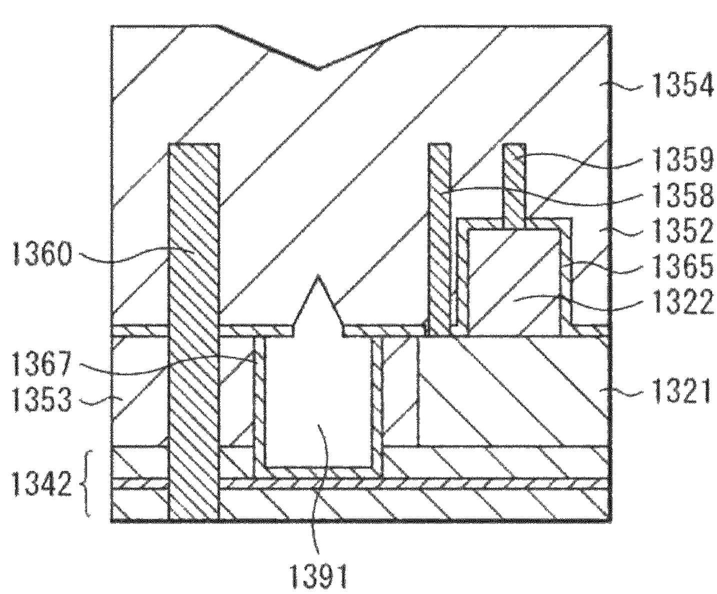

[FIG. 34A]
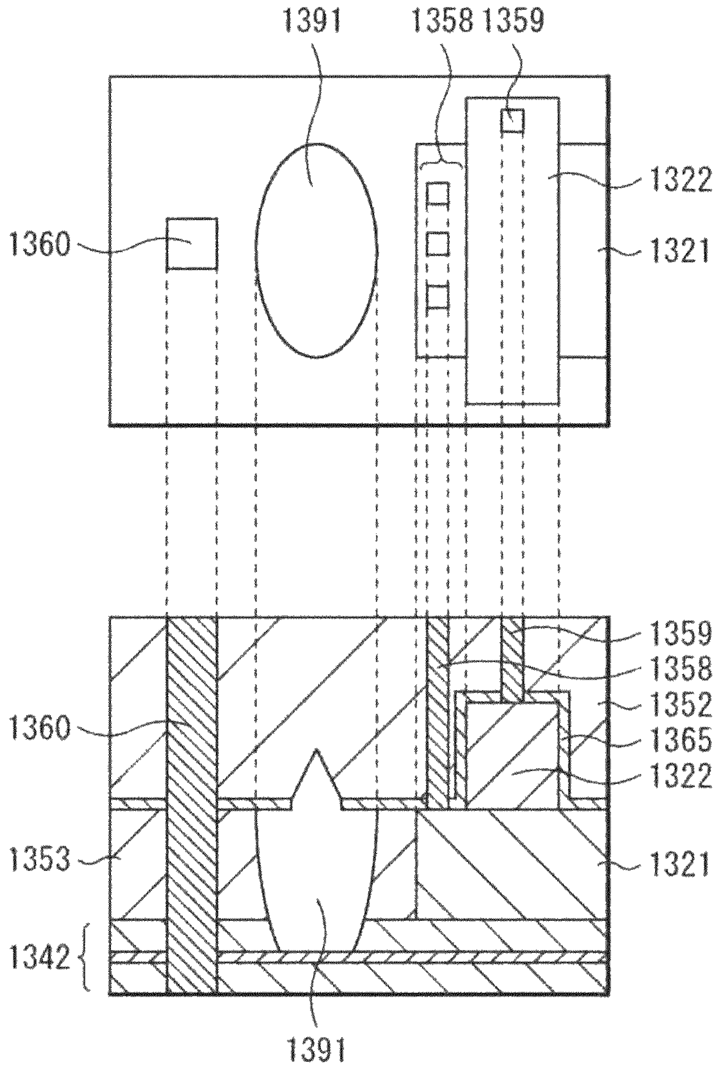

[FIG. 34B]
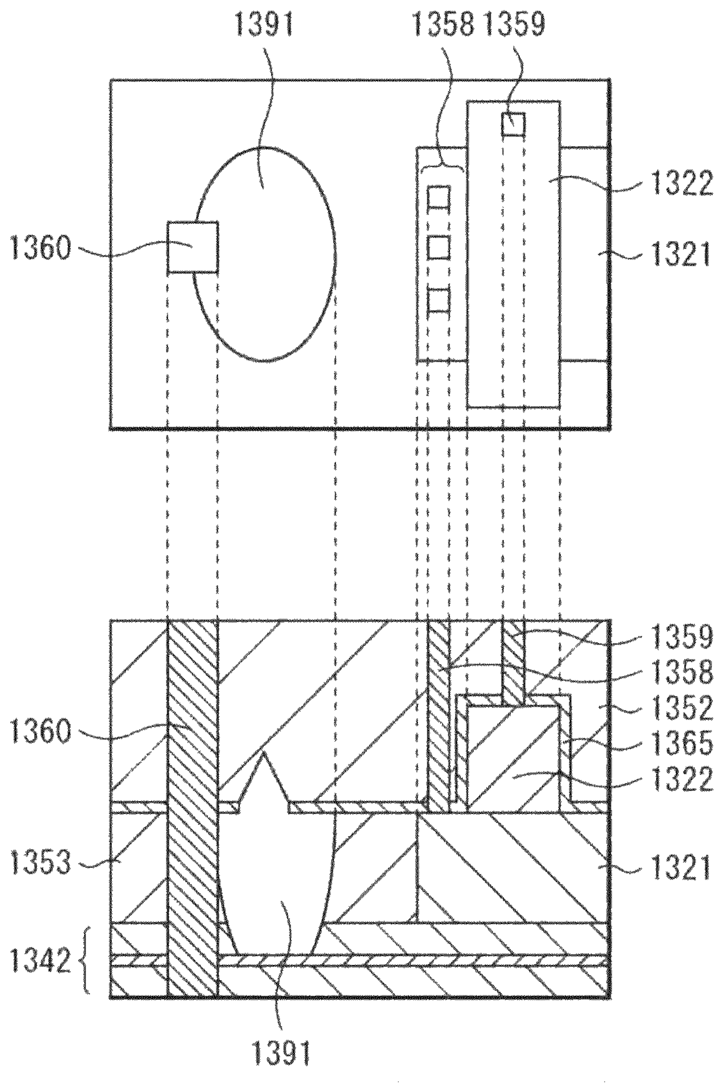

[FIG. 34C]
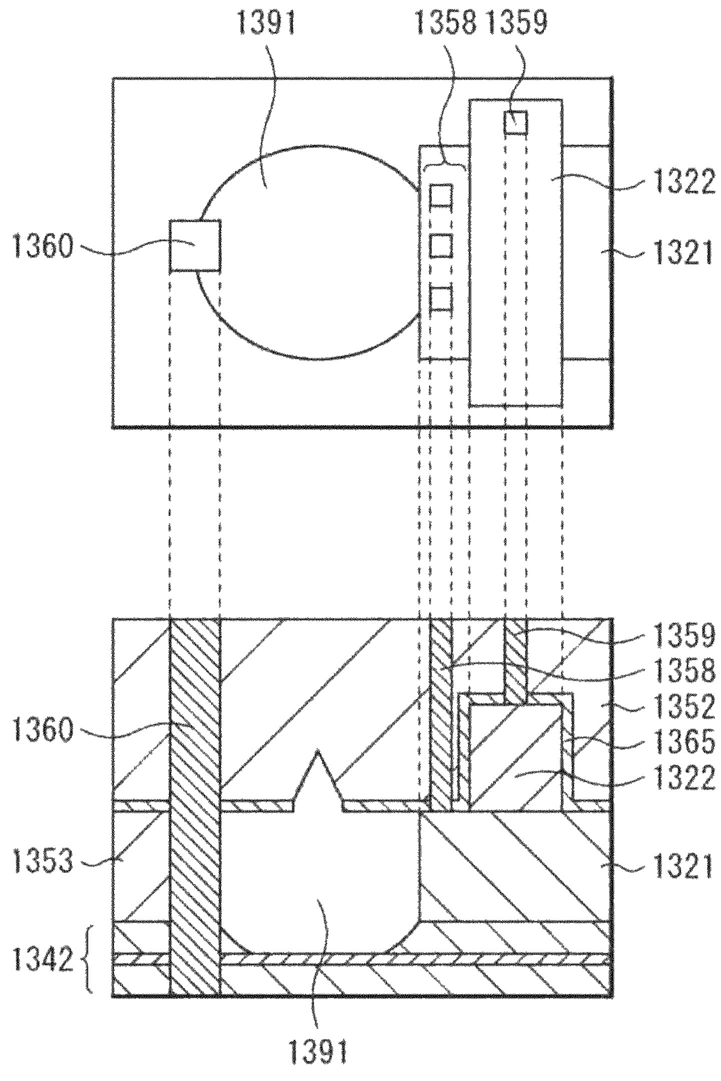

[FIG. 35A]
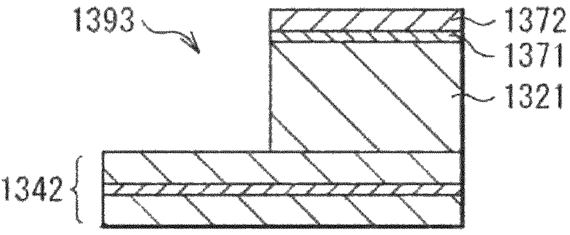
[FIG. 35B]
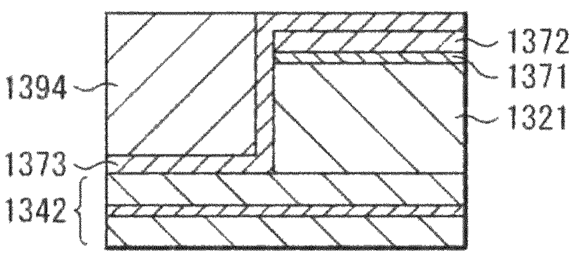

[FIG. 35C]
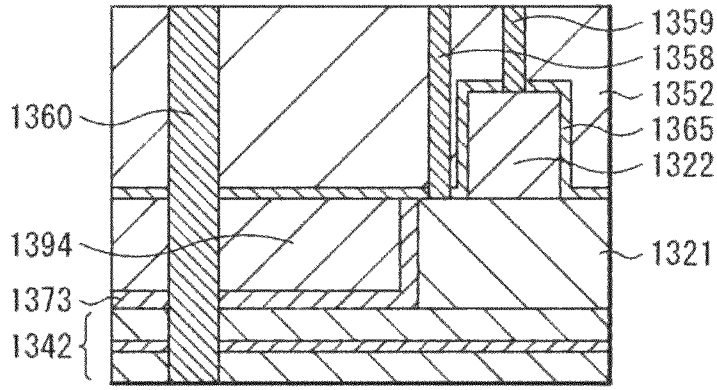
[FIG. 35D]
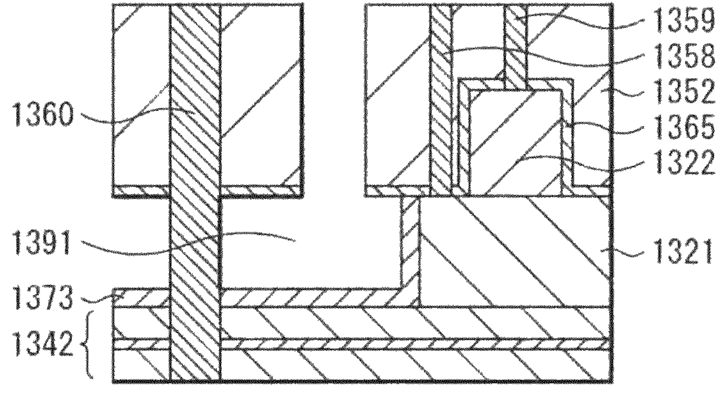

[FIG. 36A]
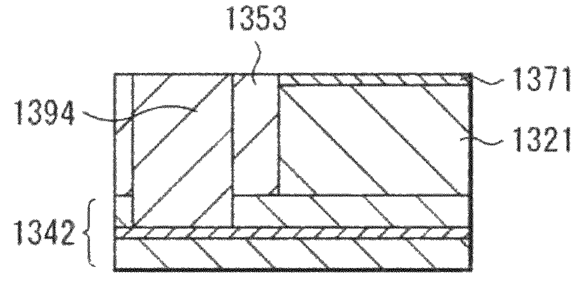
[FIG. 36B]
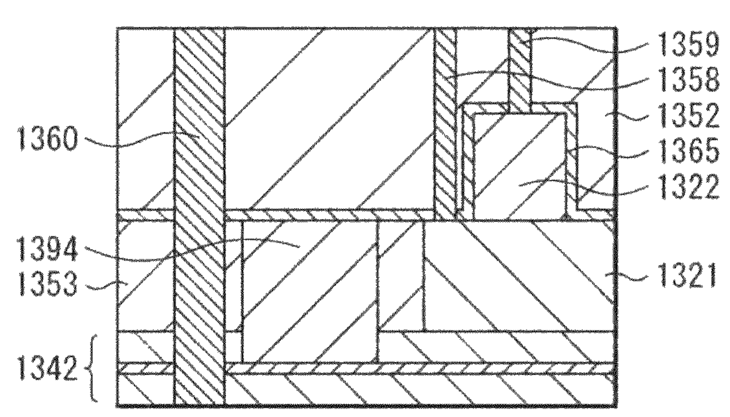
[FIG. 36C]
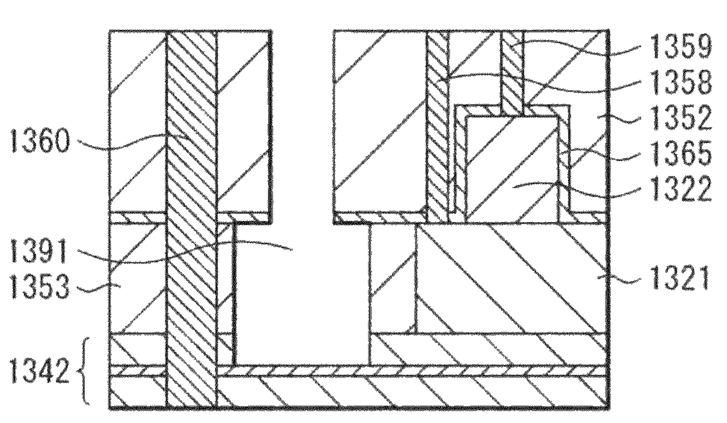

[FIG. 37A]
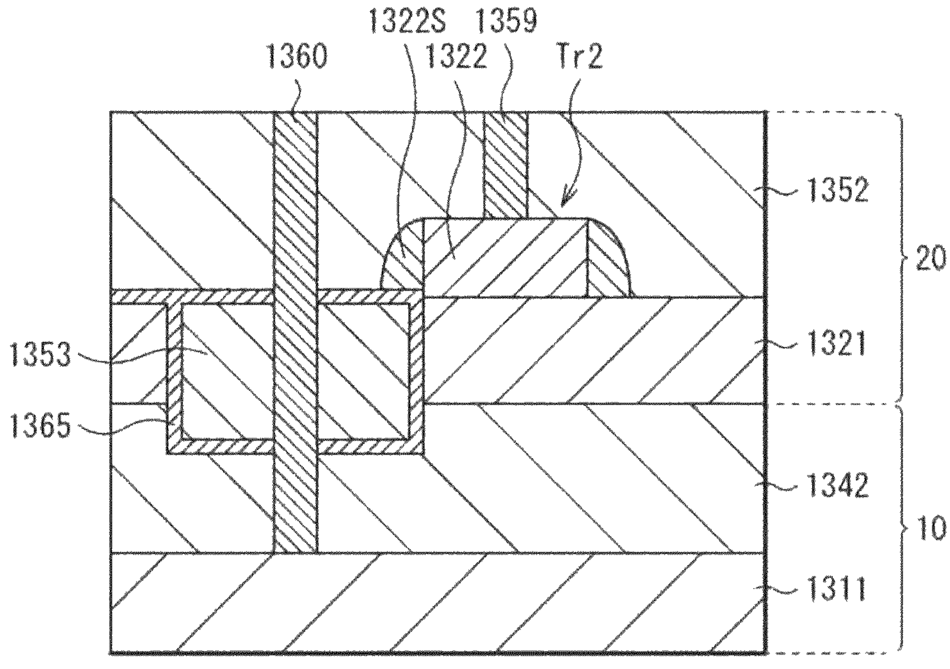
[FIG. 37B]
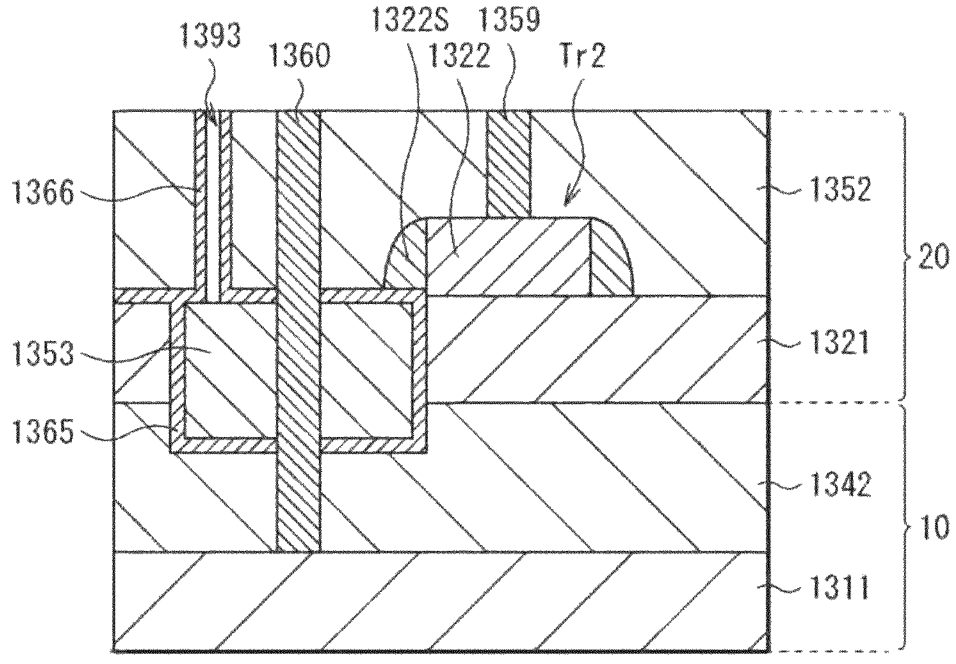

[FIG 37C]
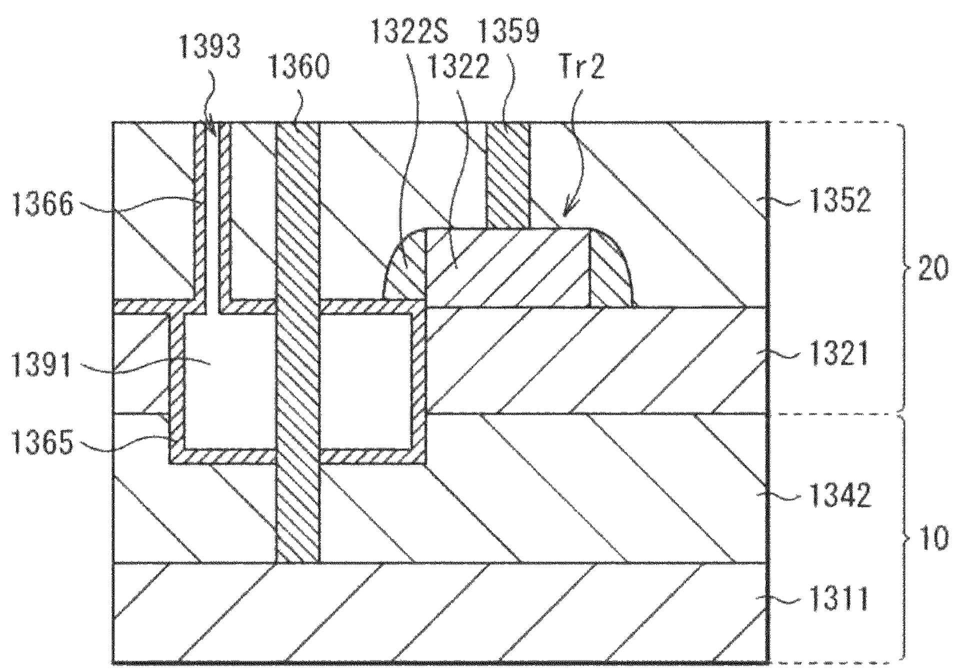

[FIG. 38A]
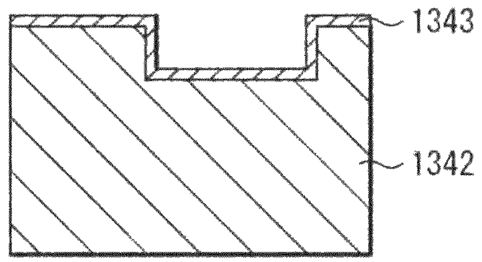
[FIG. 38B]
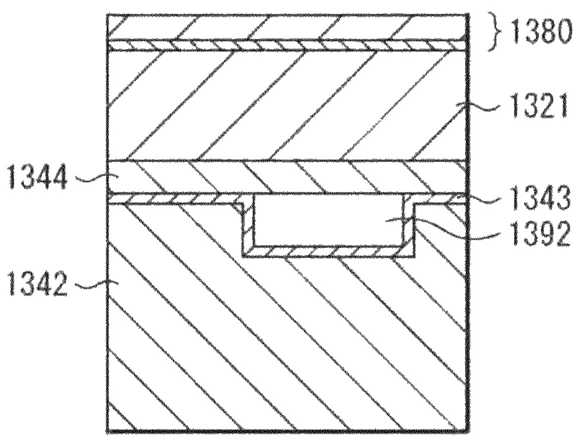
[FIG. 38C]
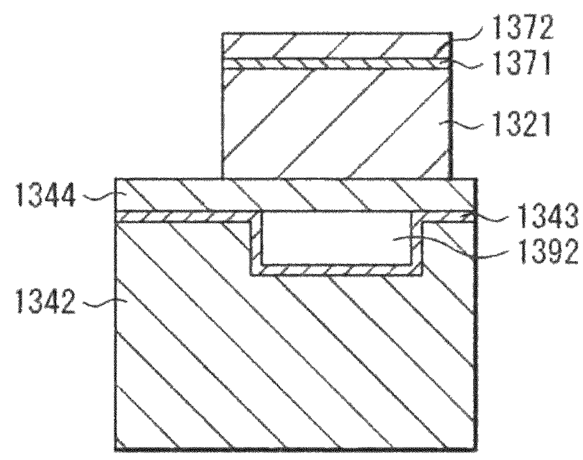

[FIG. 38D]
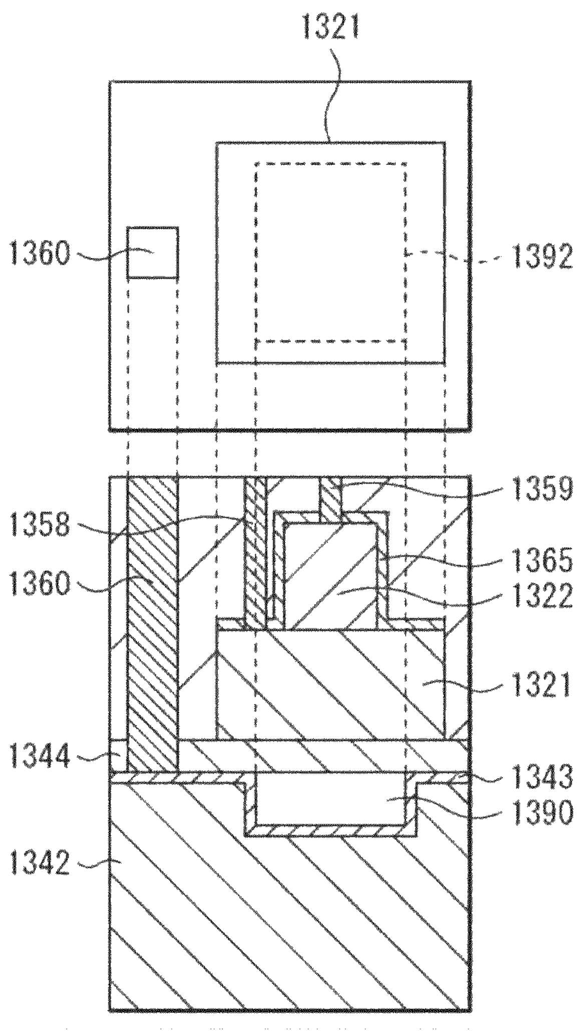

[FIG. 39A]
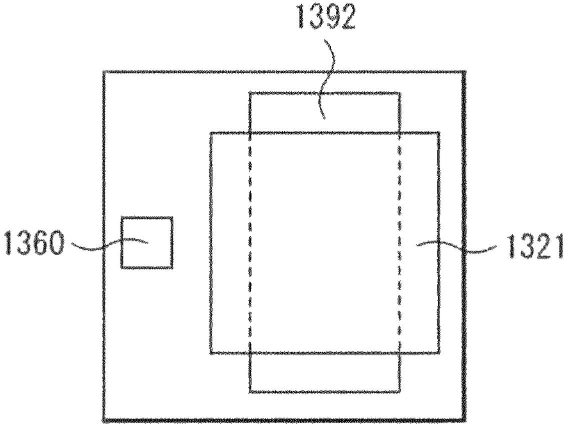
[FIG. 39B]
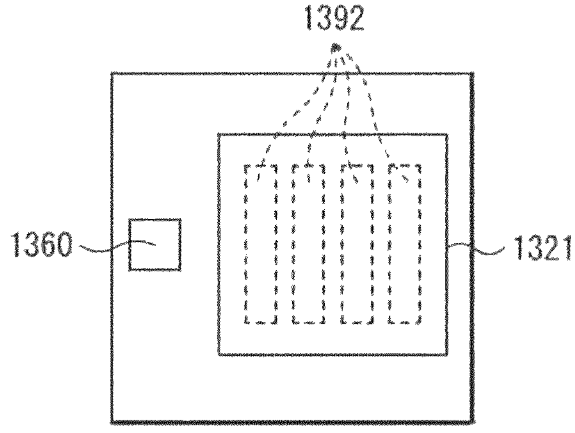

[FIG. 39C]
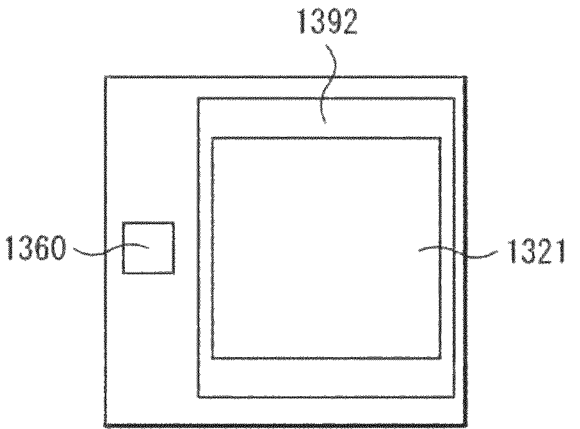
[FIG. 39D]
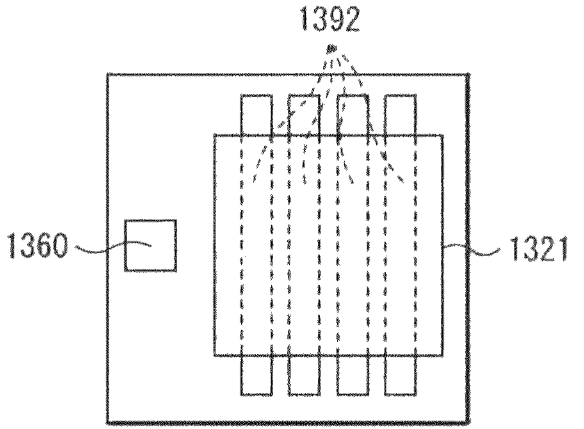

[FIG. 40A]
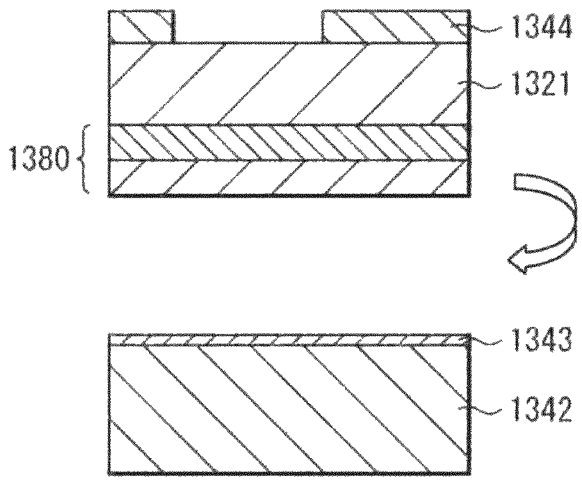
[FIG. 40B]
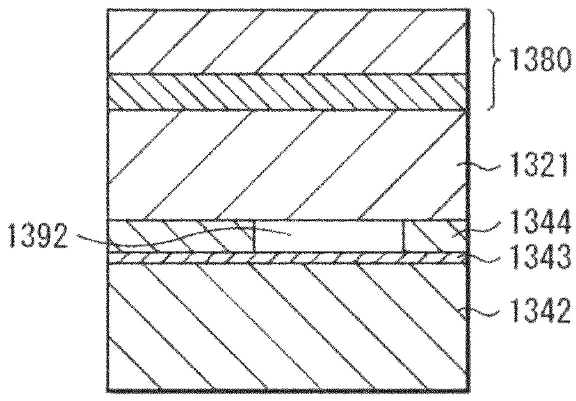
[FIG. 40C]
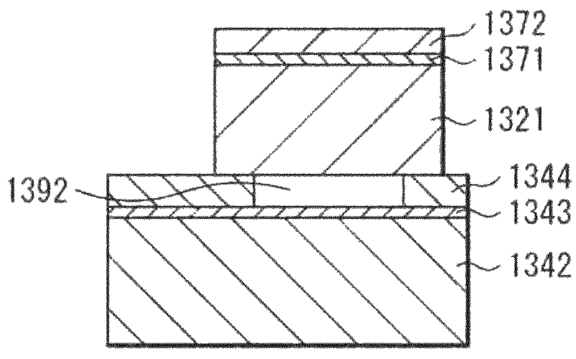

[FIG. 40D]
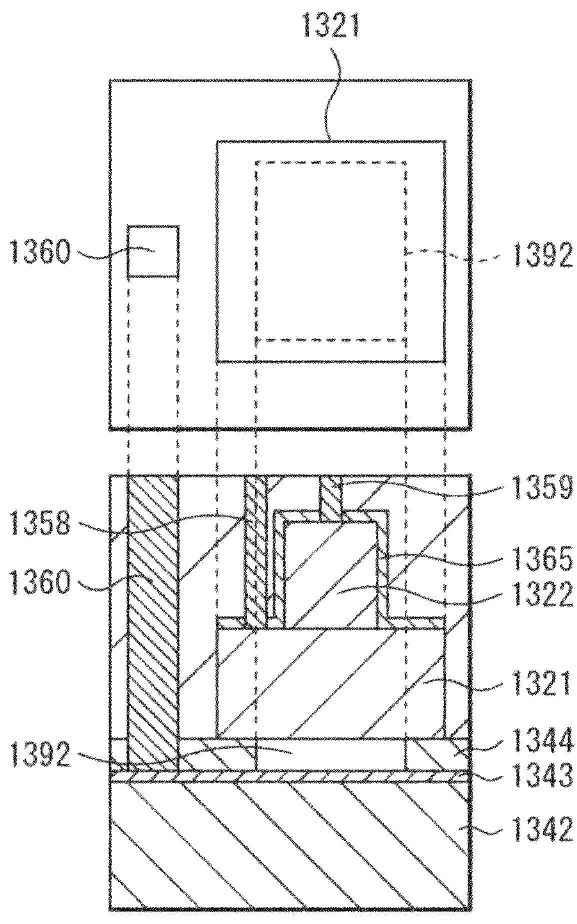

[FIG. 41A]
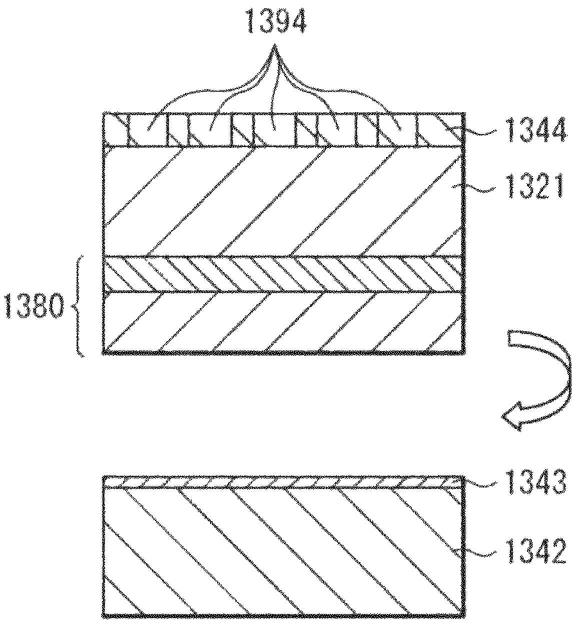
[FIG. 41B]
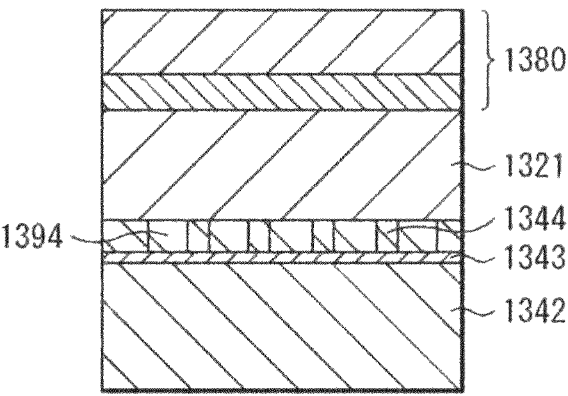

[FIG. 41C]
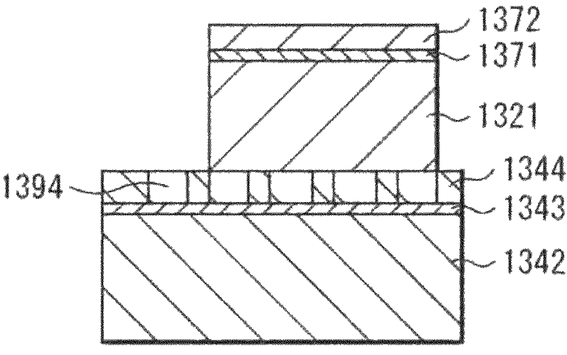
[FIG. 41D]
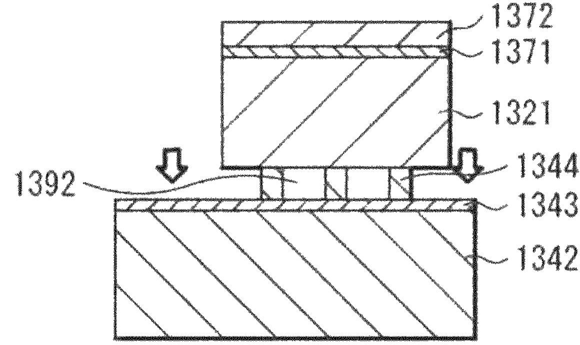

[FIG. 41E]
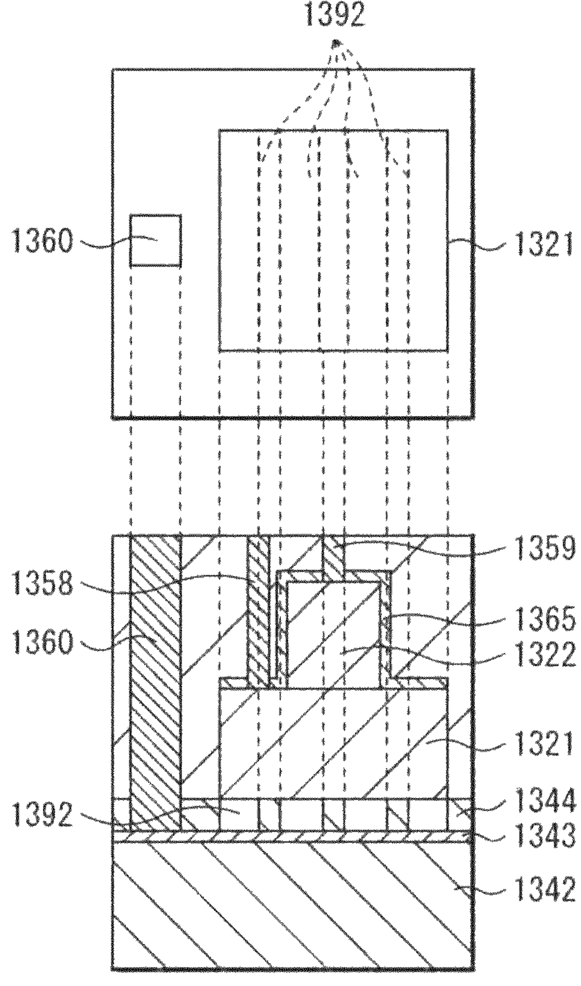

[FIG. 42A]
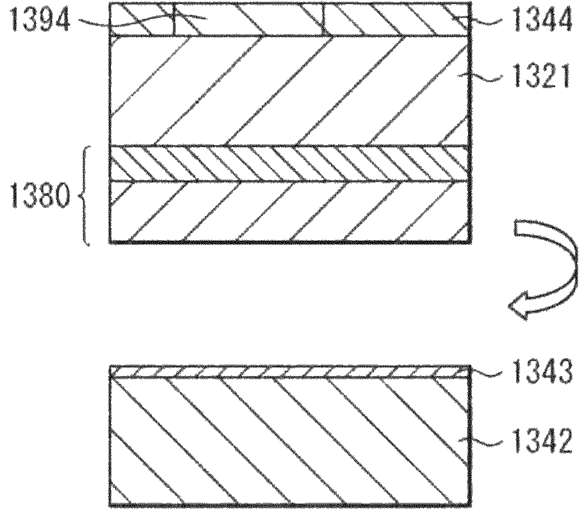
[FIG. 42B]
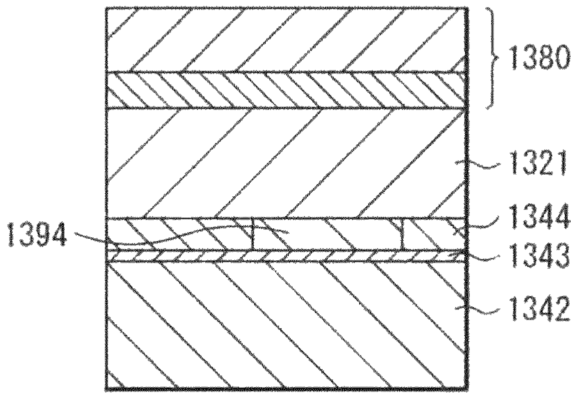

[FIG. 42C]
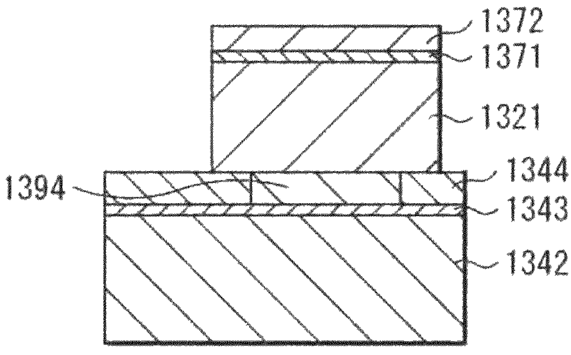
[FIG. 42D]
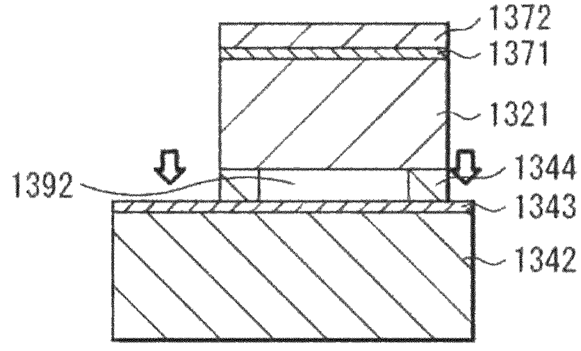

[FIG. 42E]
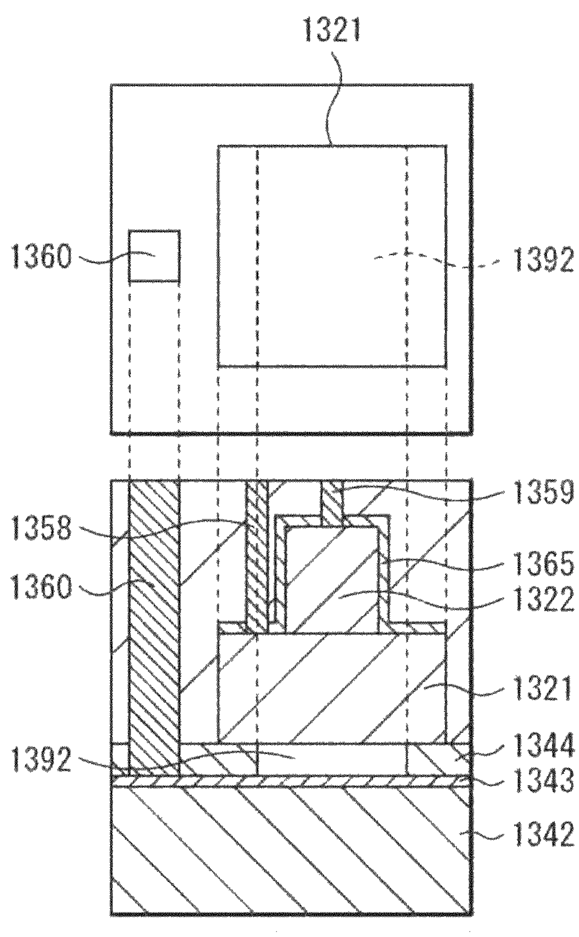

[FIG. 43]
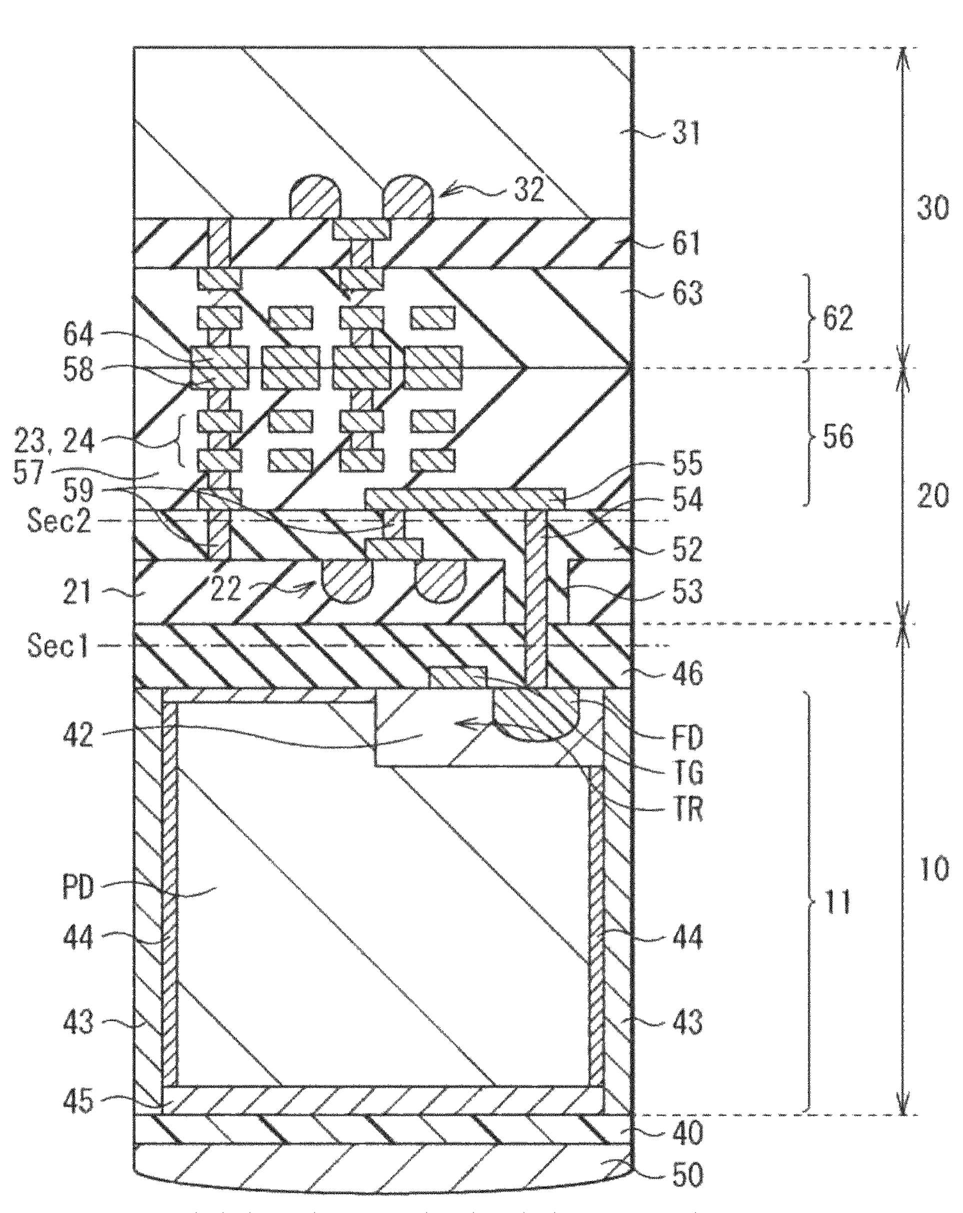

[FIG. 44]
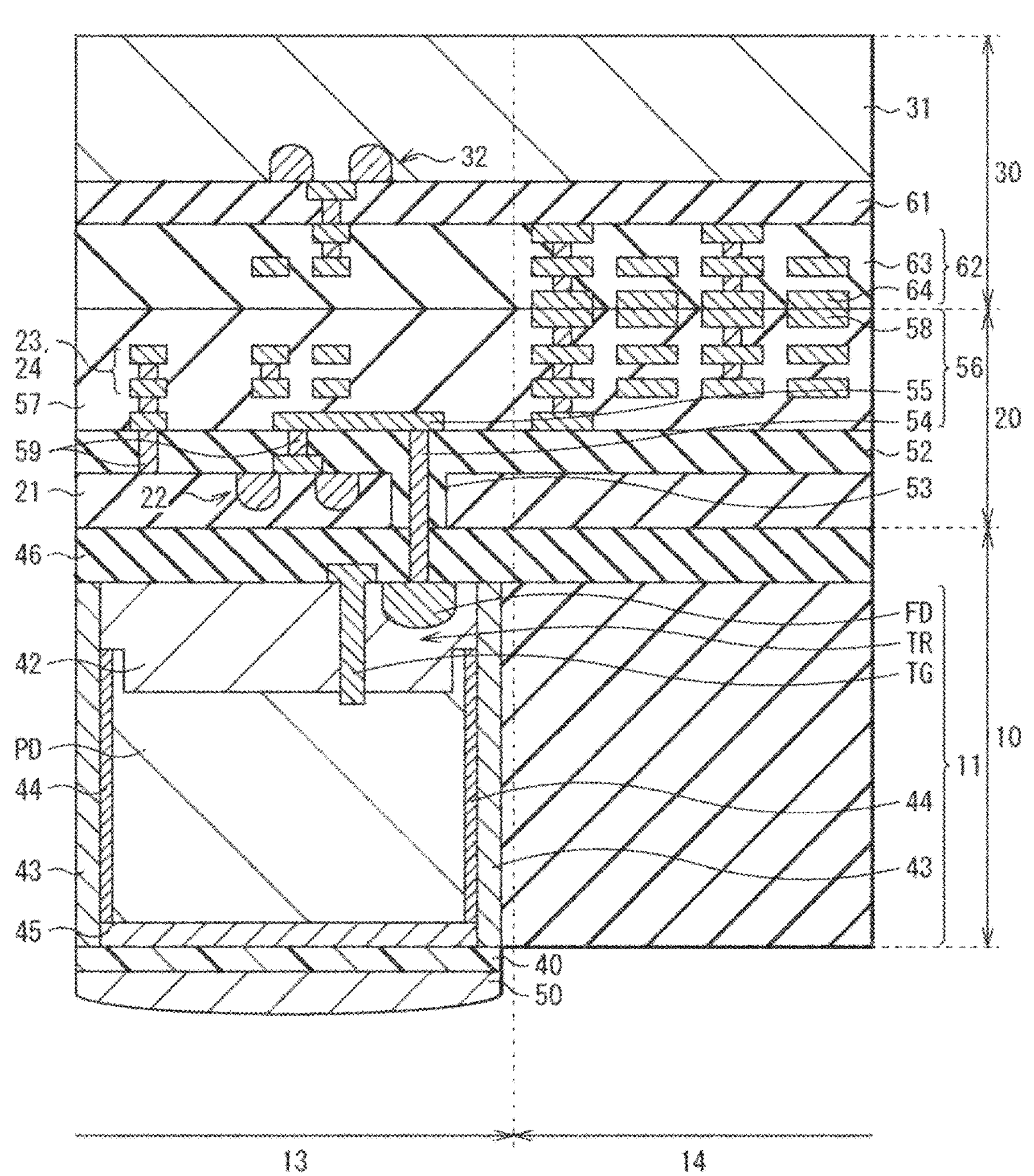

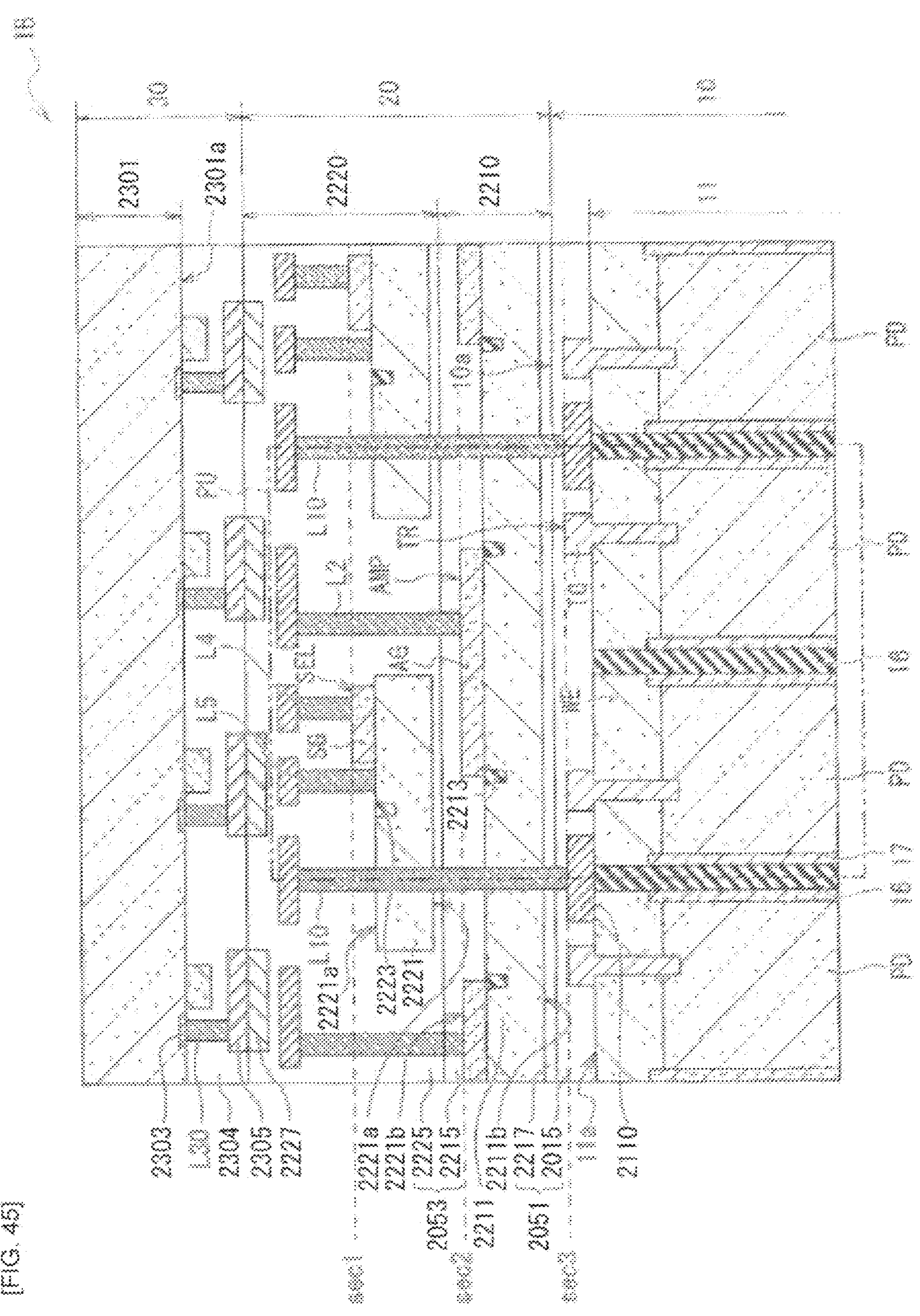
[FIG. 45]

[FIG. 46]
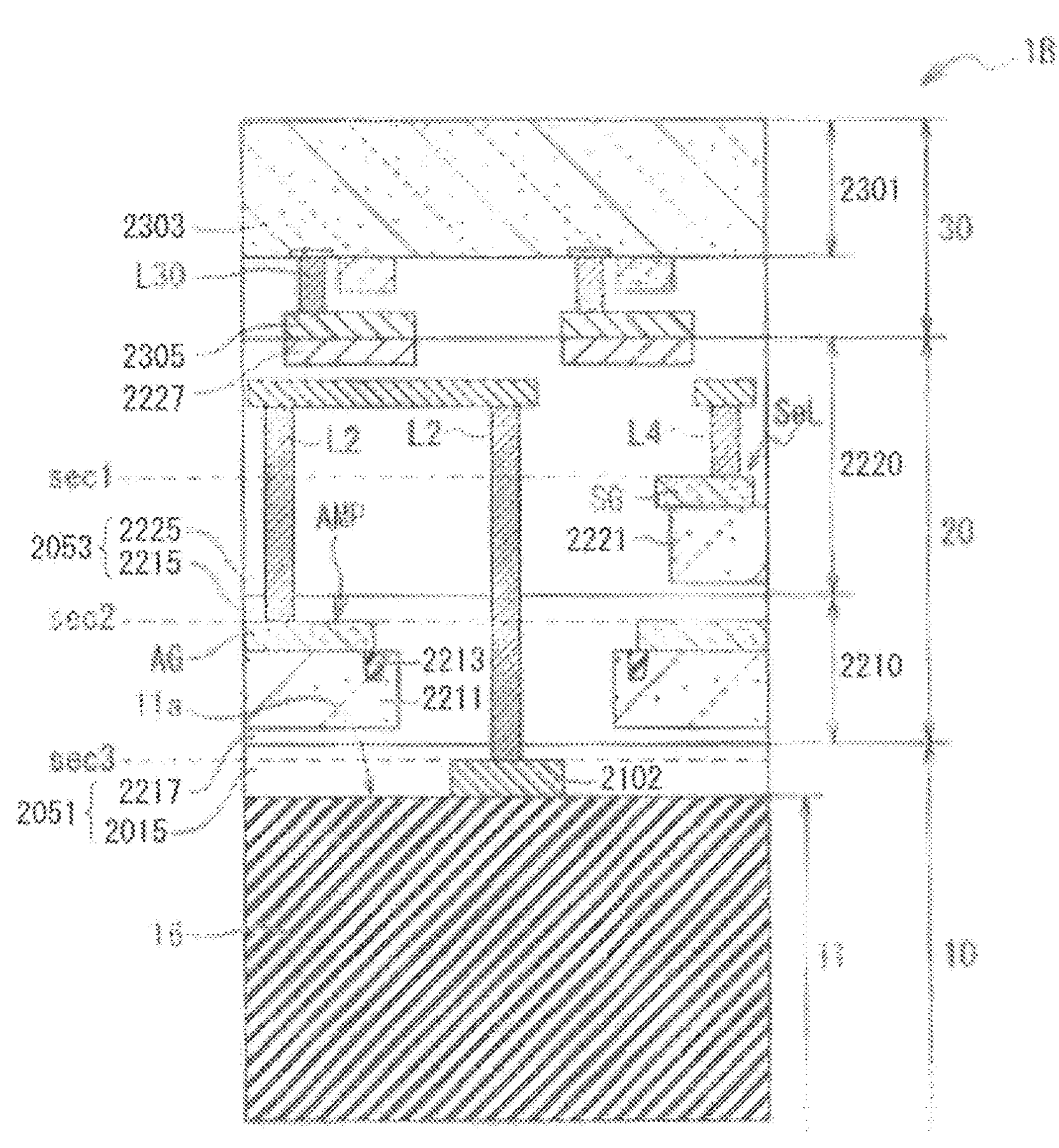

[FIG. 47]
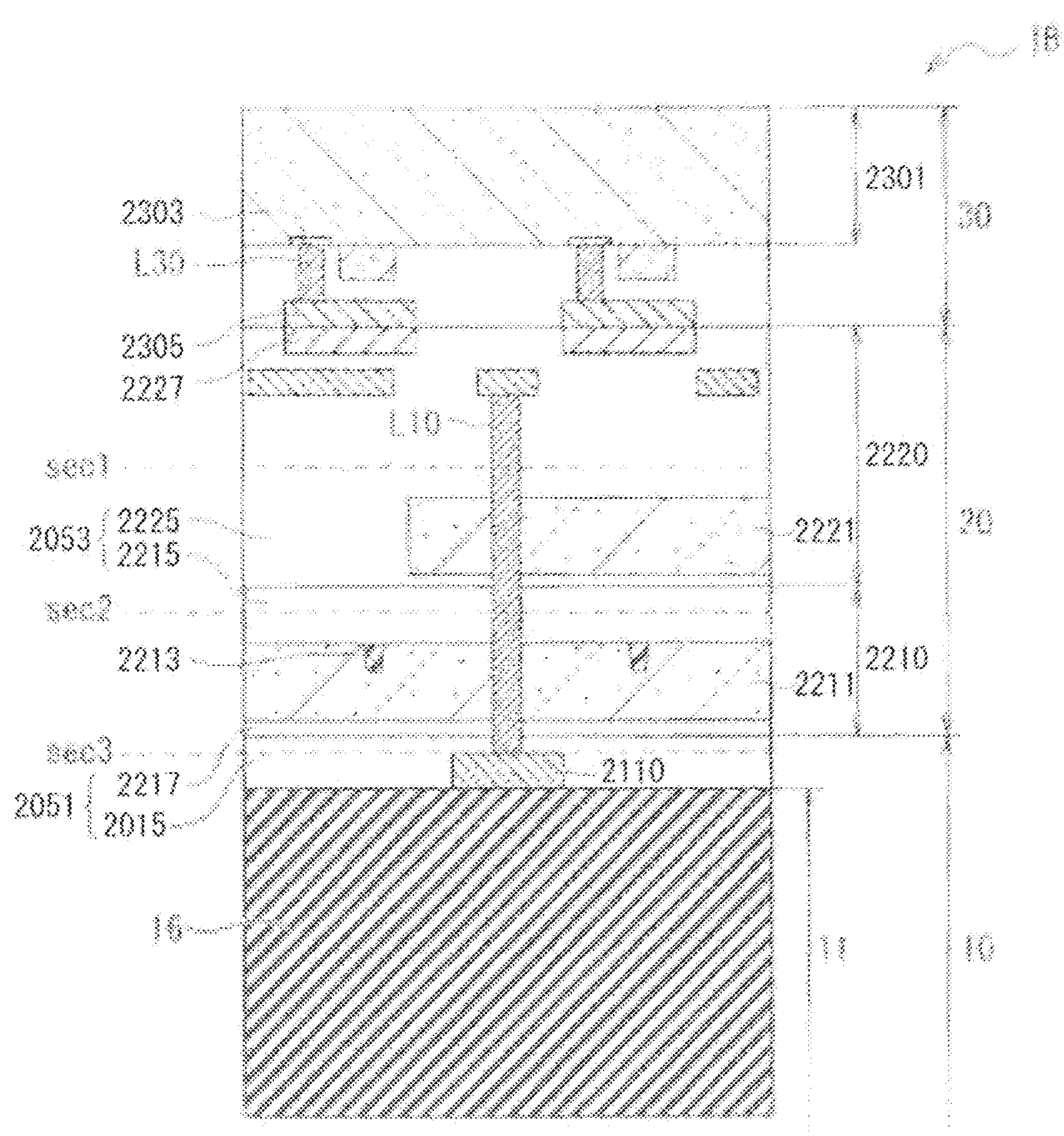

[FIG. 48]
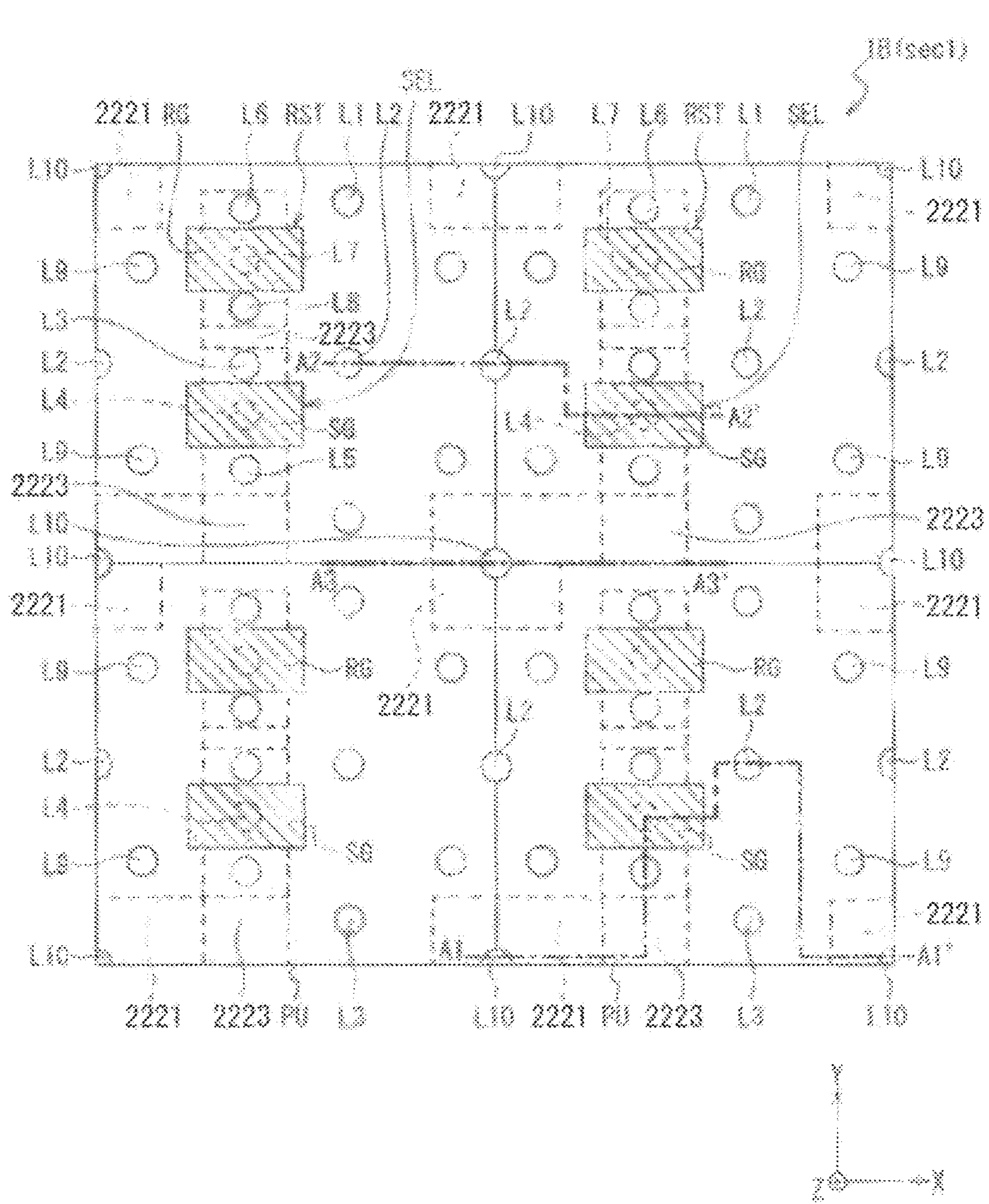

[FIG. 49]
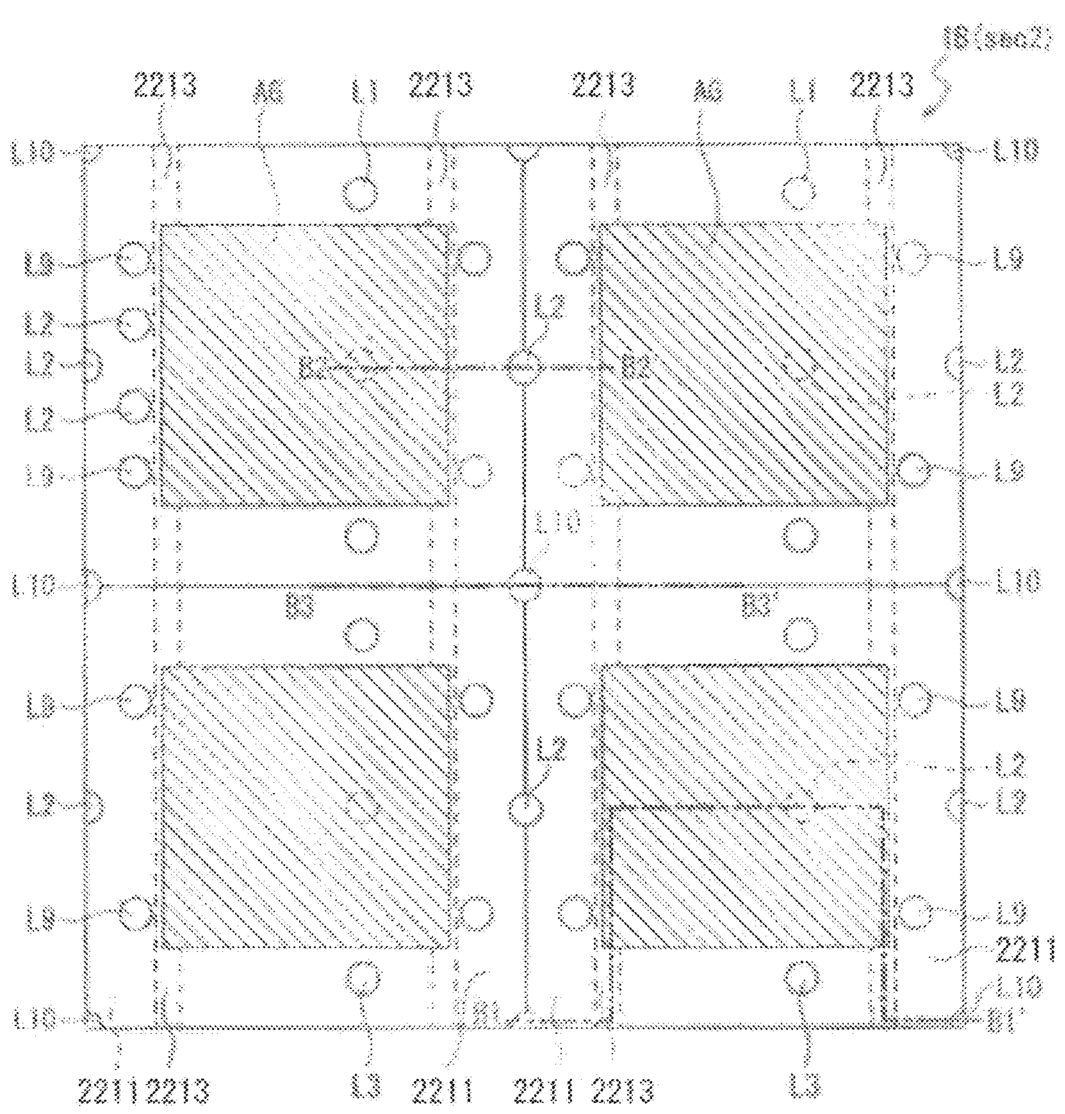

[FIG. 50]
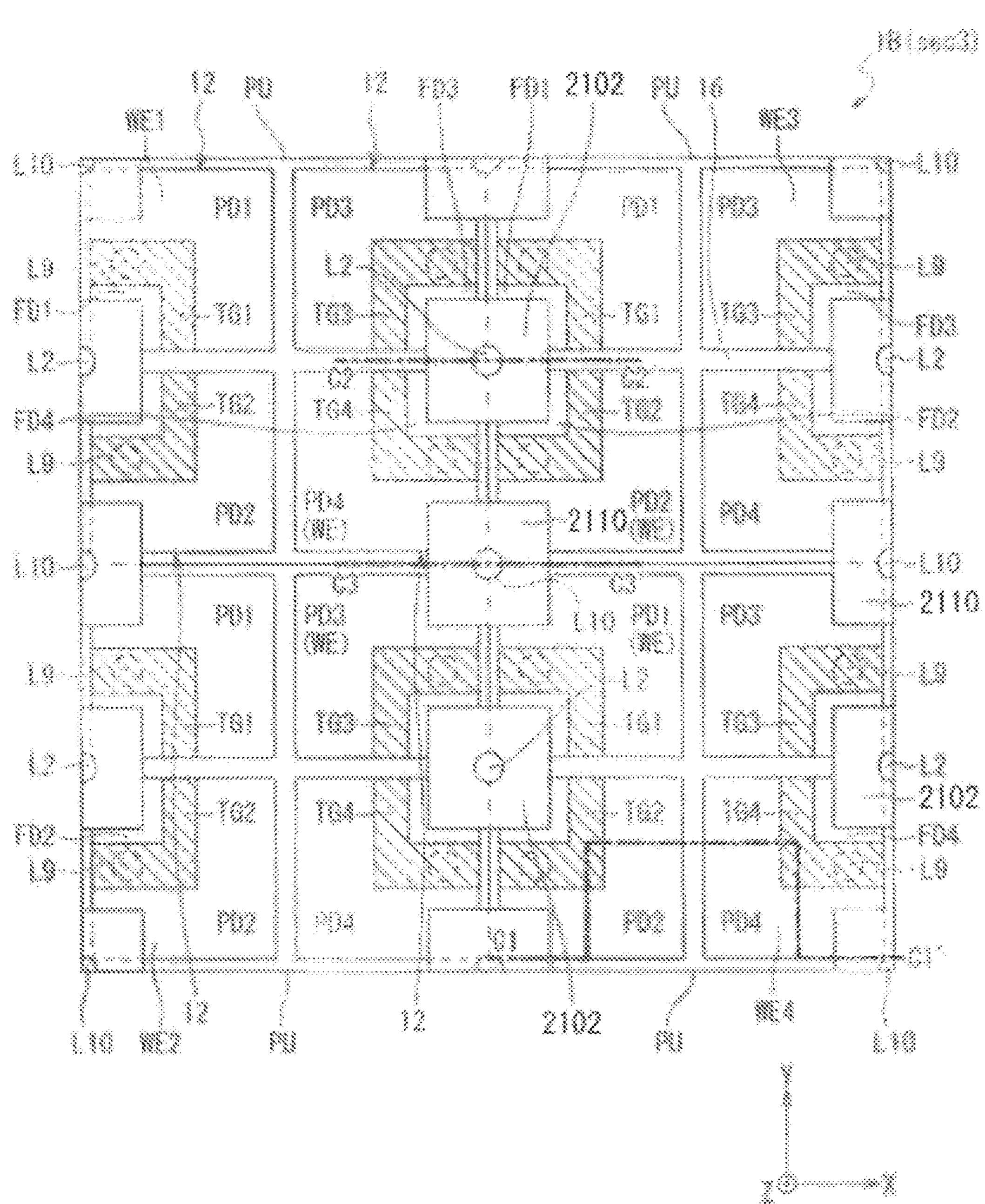

[FIG. 51]
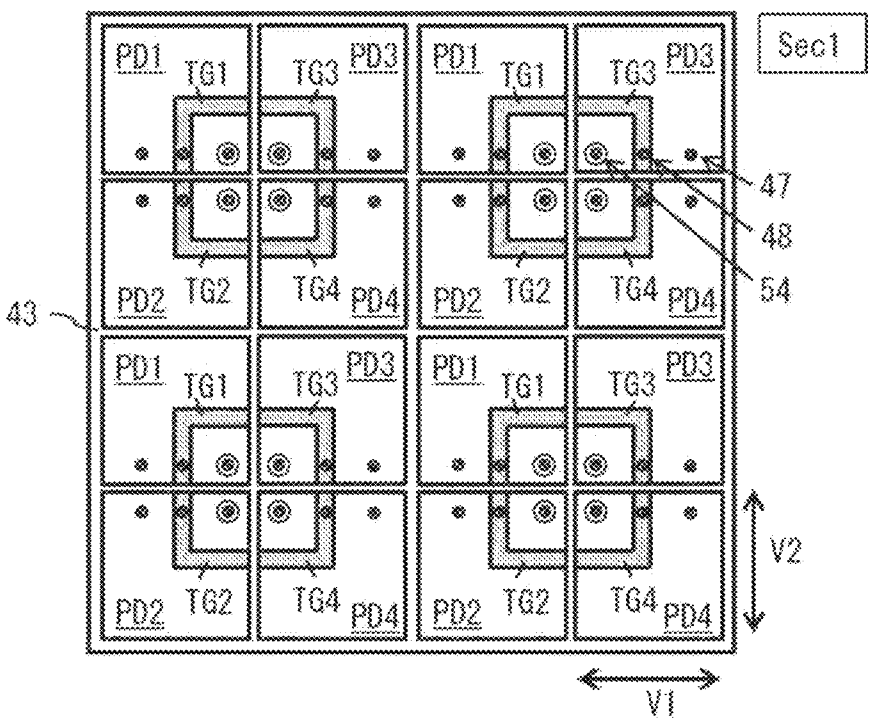
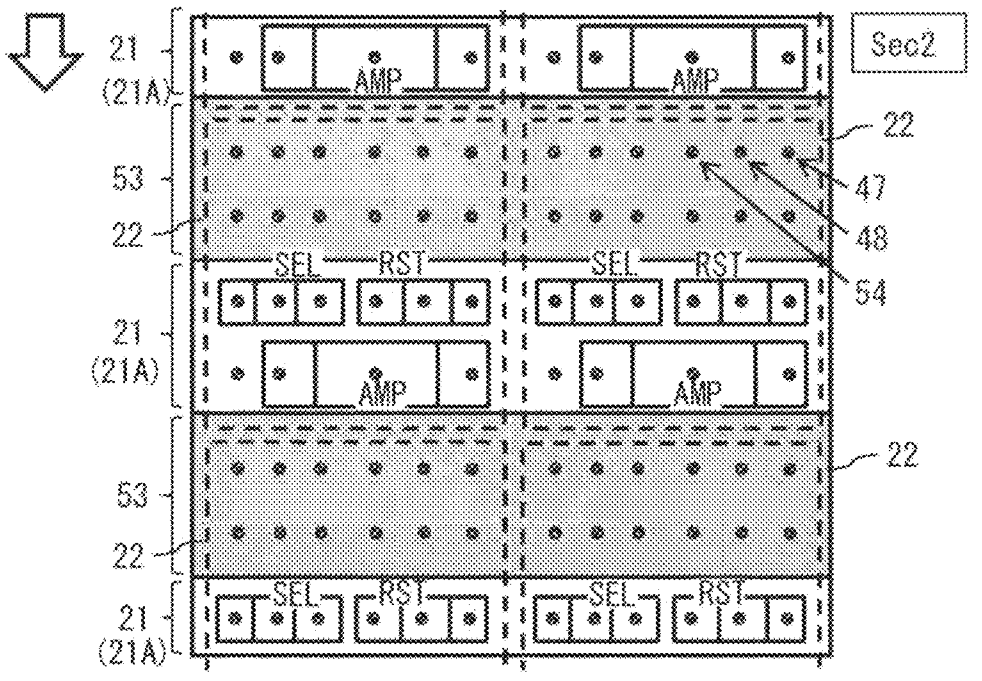

[FIG. 52]
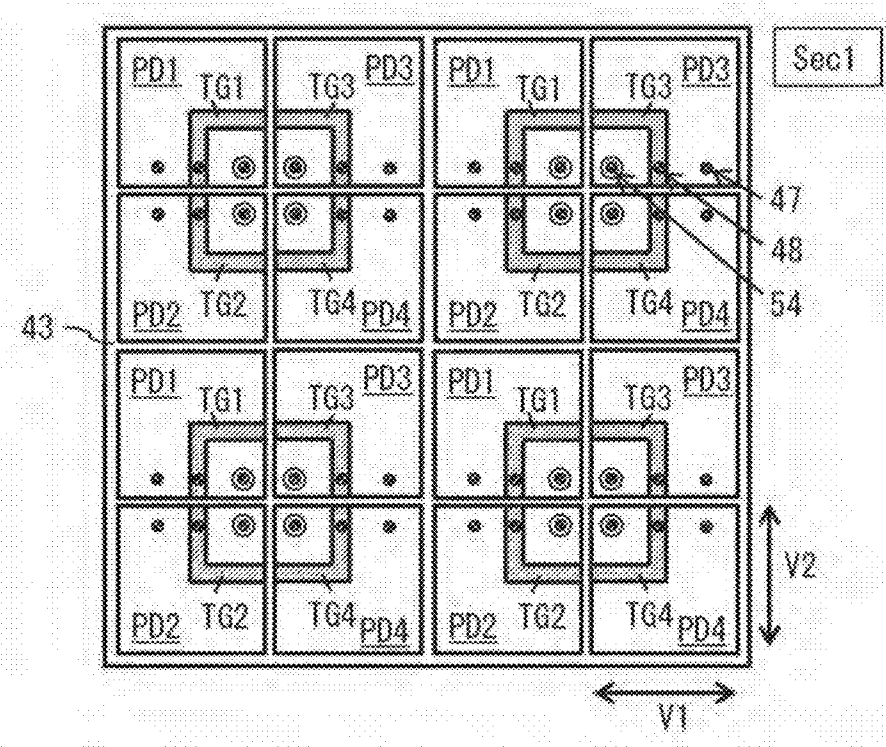
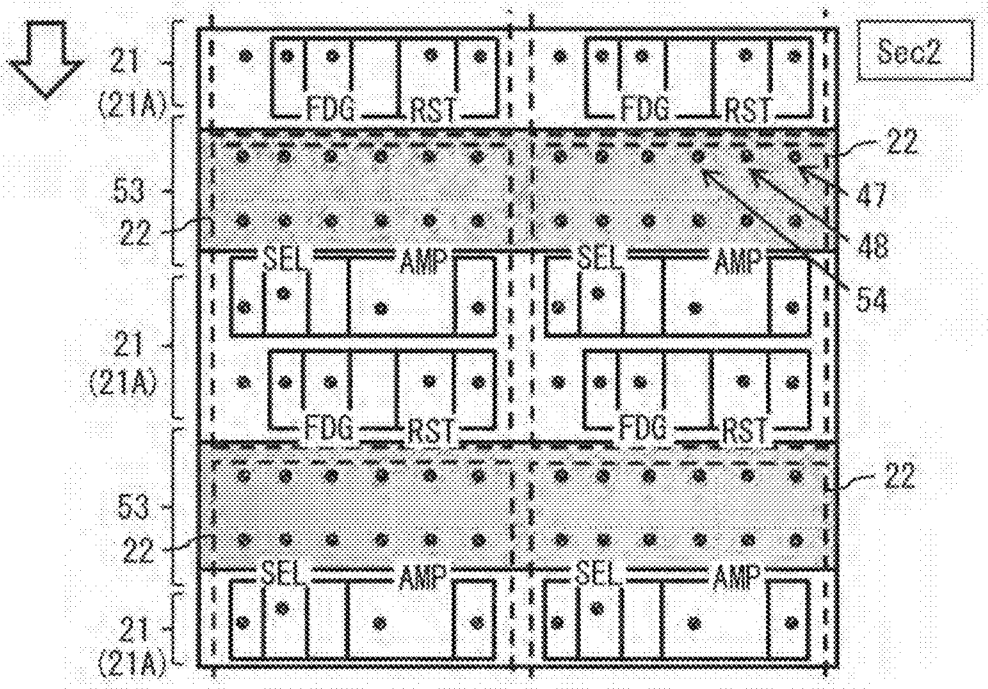

[FIG. 53]
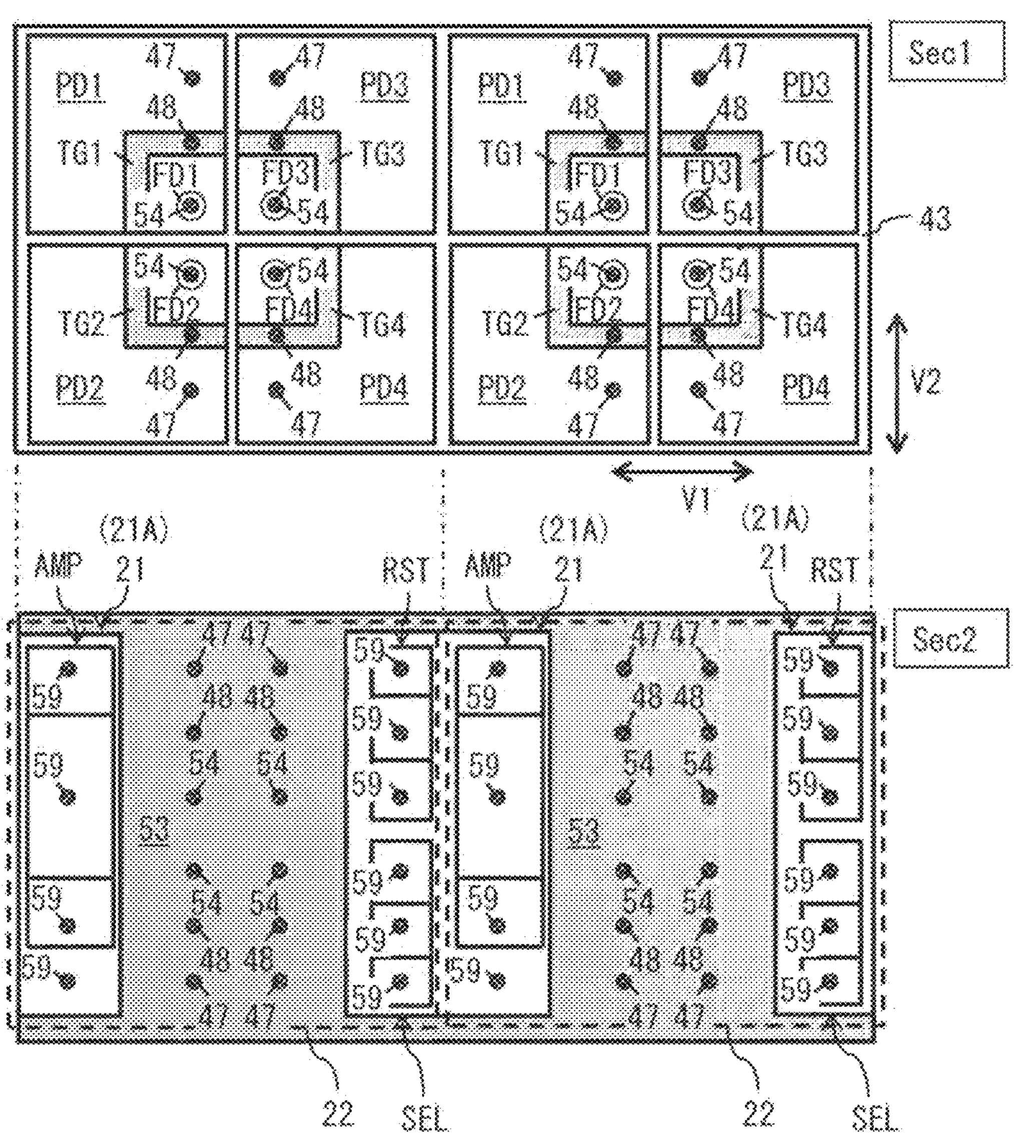

[FIG. 54]
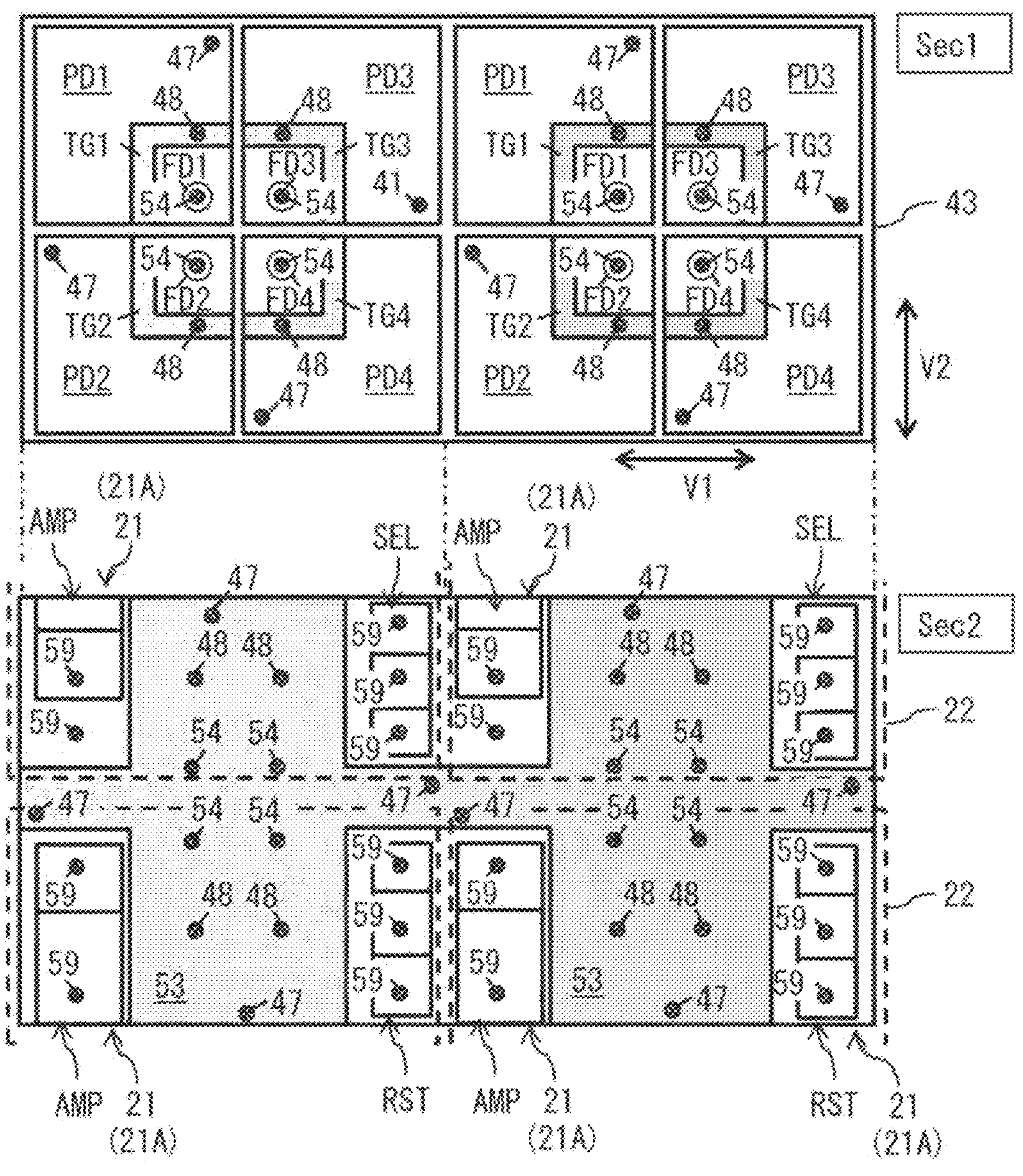

[FIG. 55]
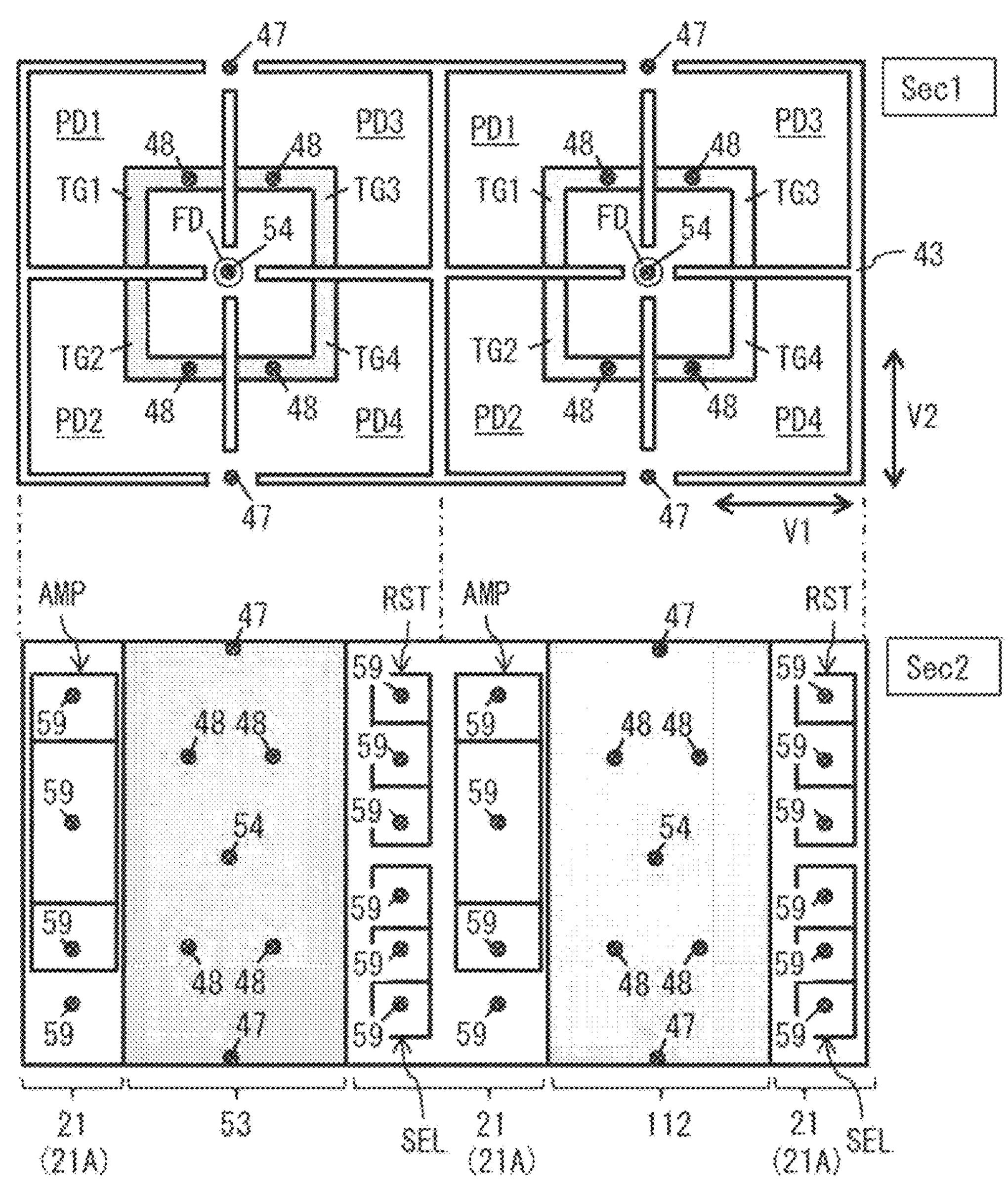

[FIG. 56]
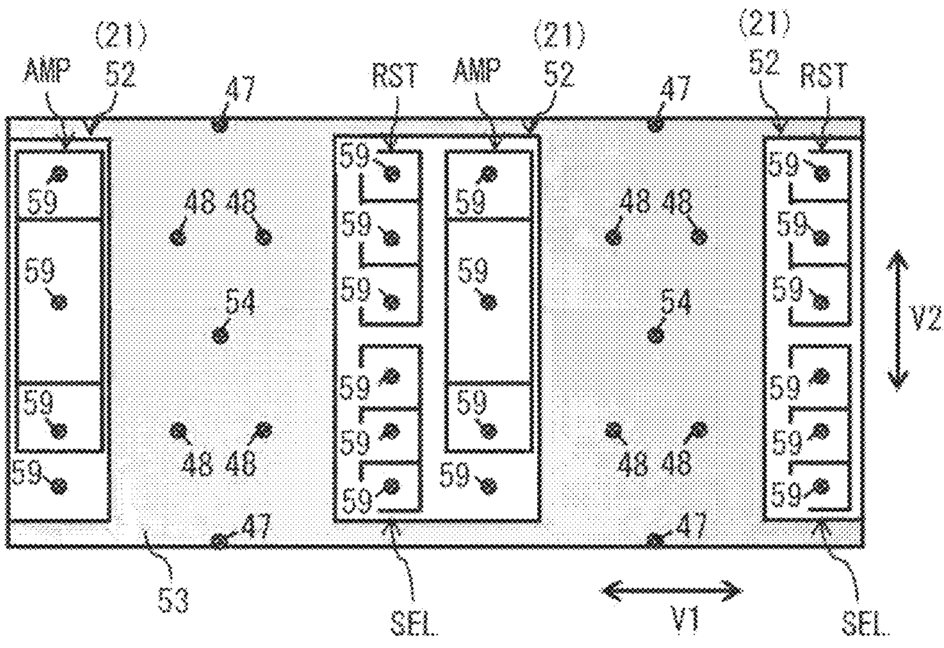
[FIG. 57]
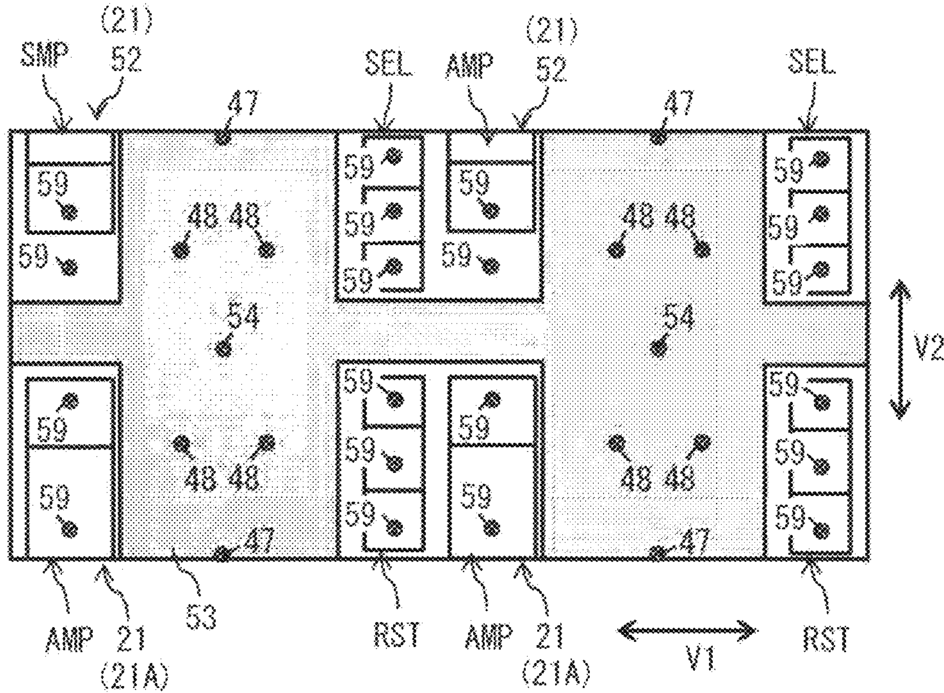

[FIG. 58]
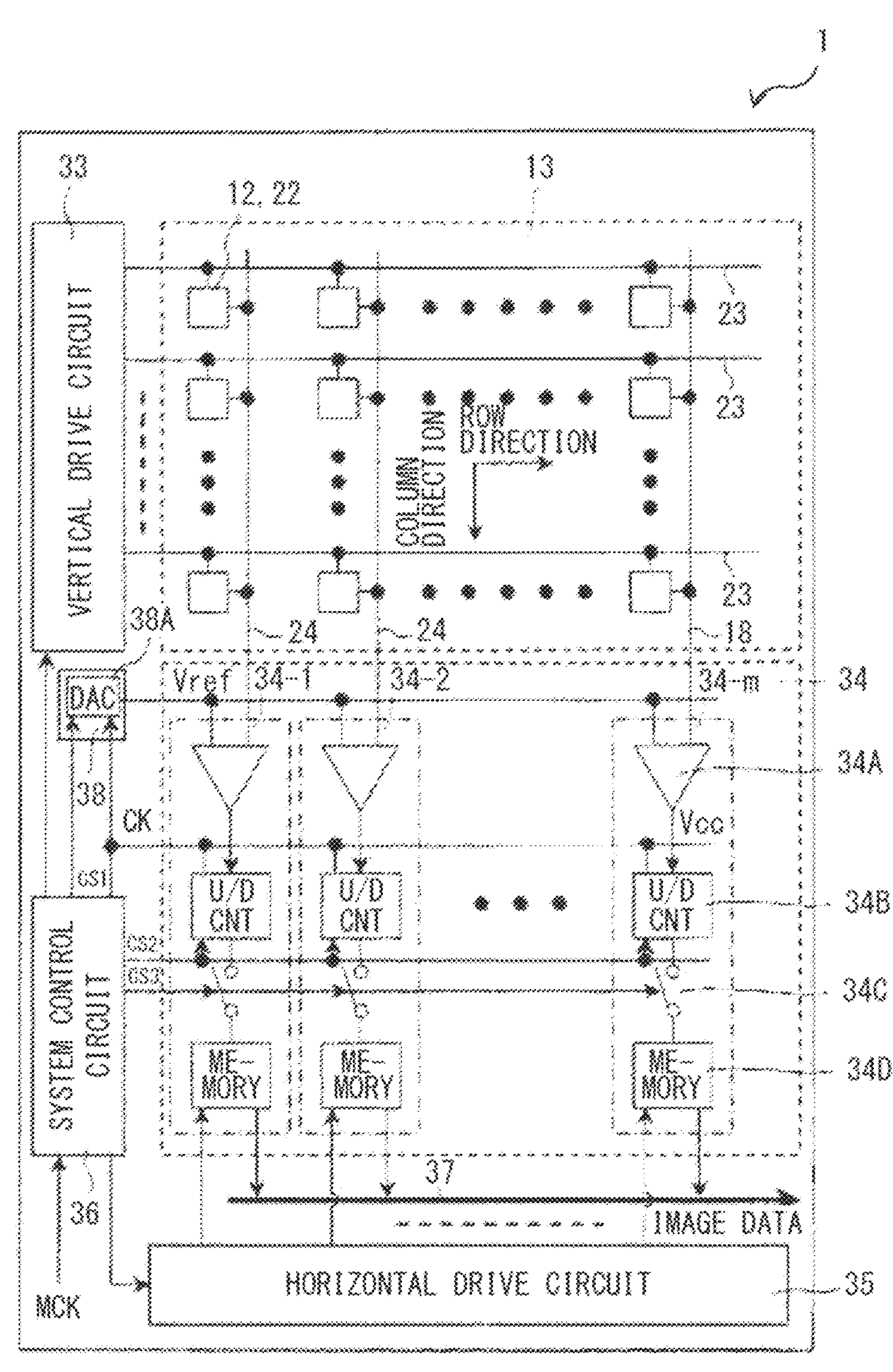

[FIG. 59]
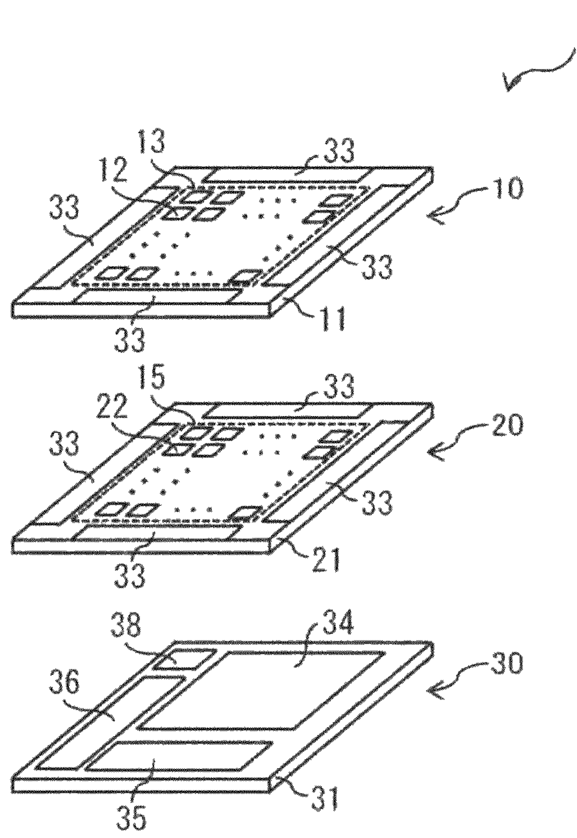
[FIG. 60]
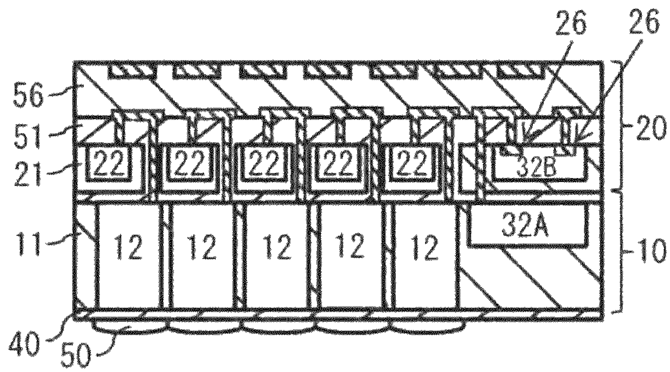

[FIG. 61]
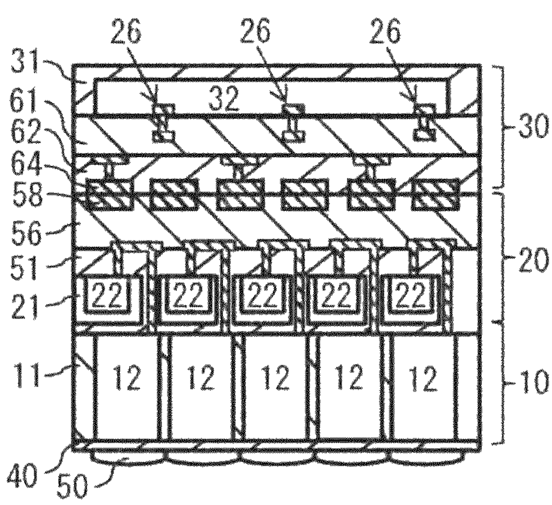

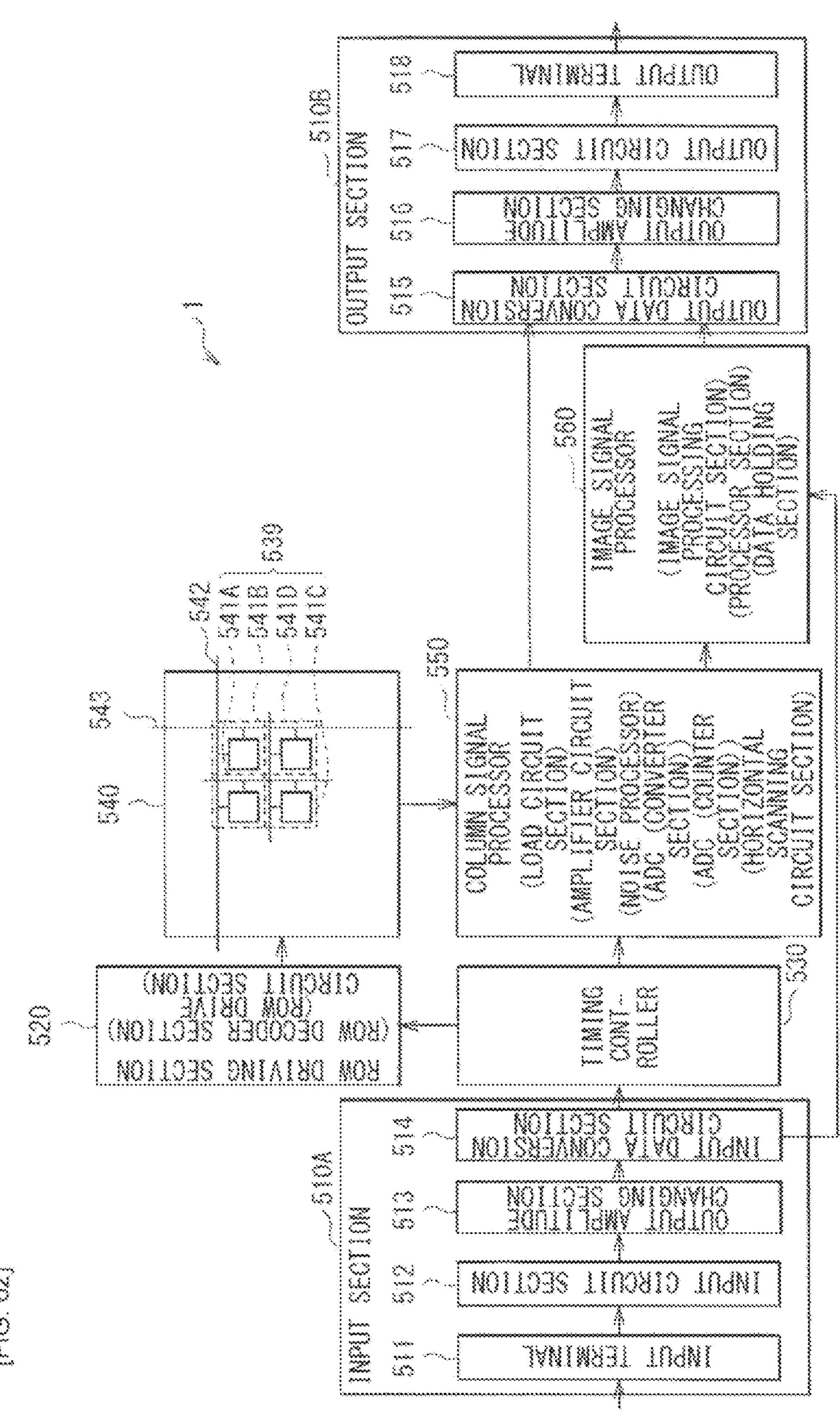
[FIG. 62]
1
INPUT SECTION
510A
511
INPUT TERMINAL
512
INPUT CIRCUIT SECTION
513
OUTPUT AMPLITUDE CHANGING SECTION
514
INPUT DATA CONVERSION CIRCUIT SECTION
520
ROW DRIVING SECTION
(ROW DECODER SECTION)
(ROW DRIVE CIRCUIT SECTION)
530
TIMING CONT-ROLLER
540
543
542
541A
541B
541D
541C
539
550
COLUMN SIGNAL PROCESSOR
(LOAD CIRCUIT SECTION)
(AMPLIFIER CIRCUIT SECTION)
(NOISE PROCESSOR)
(ADC (CONVERTER SECTION))
(ADC (COUNTER SECTION))
(HORIZONTAL SCANNING CIRCUIT SECTION)
560
IMAGE SIGNAL PROCESSOR
(IMAGE SIGNAL PROCESSING CIRCUIT SECTION)
(PROCESSOR SECTION)
(DATA HOLDING SECTION)
OUTPUT SECTION
510B
515
OUTPUT DATA CONVERSION CIRCUIT SECTION
516
OUTPUT AMPLITUDE CHANGING SECTION
517
OUTPUT CIRCUIT SECTION
518
OUTPUT TERMINAL

[FIG. 63]
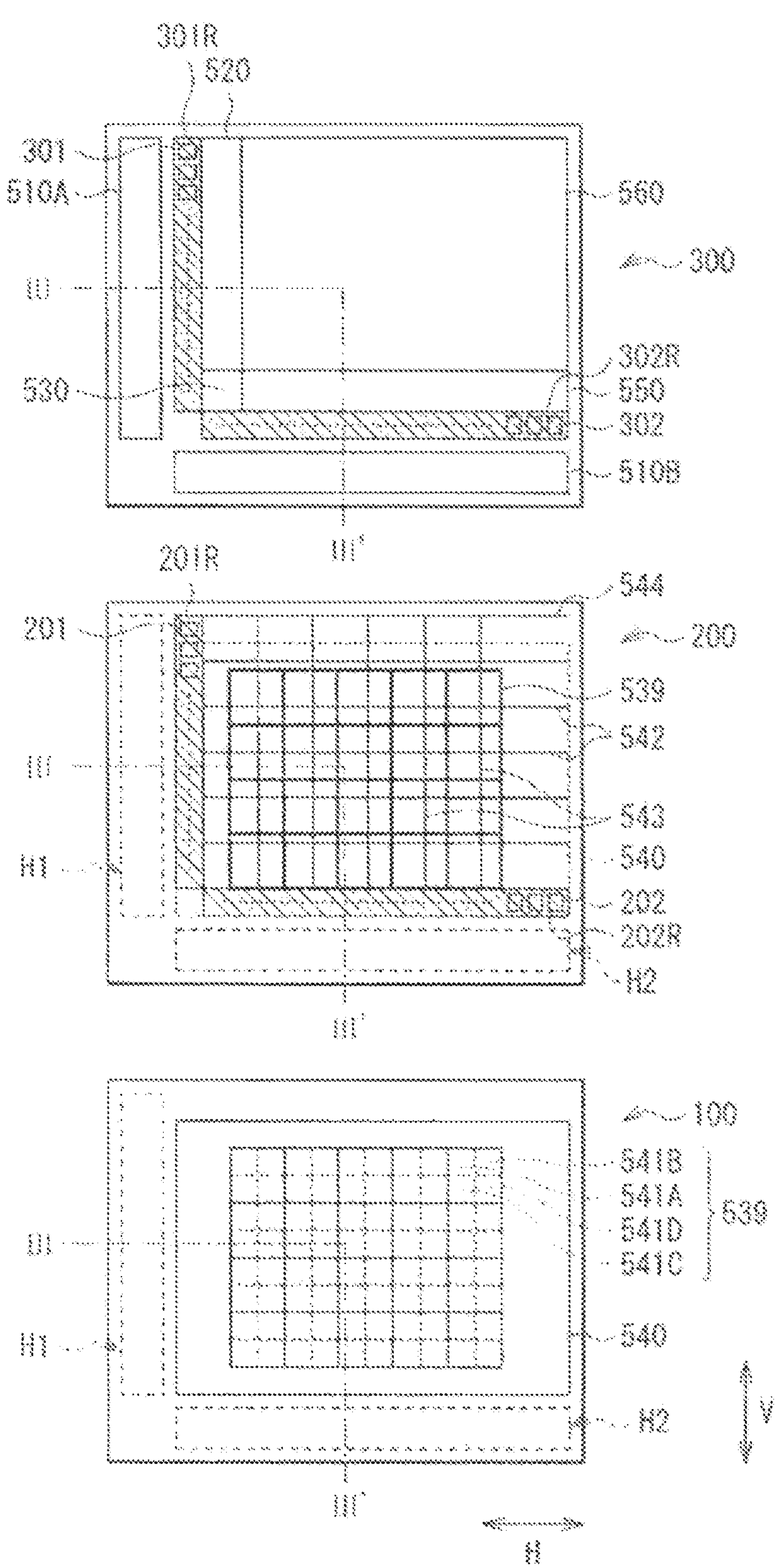

[FIG. 64]
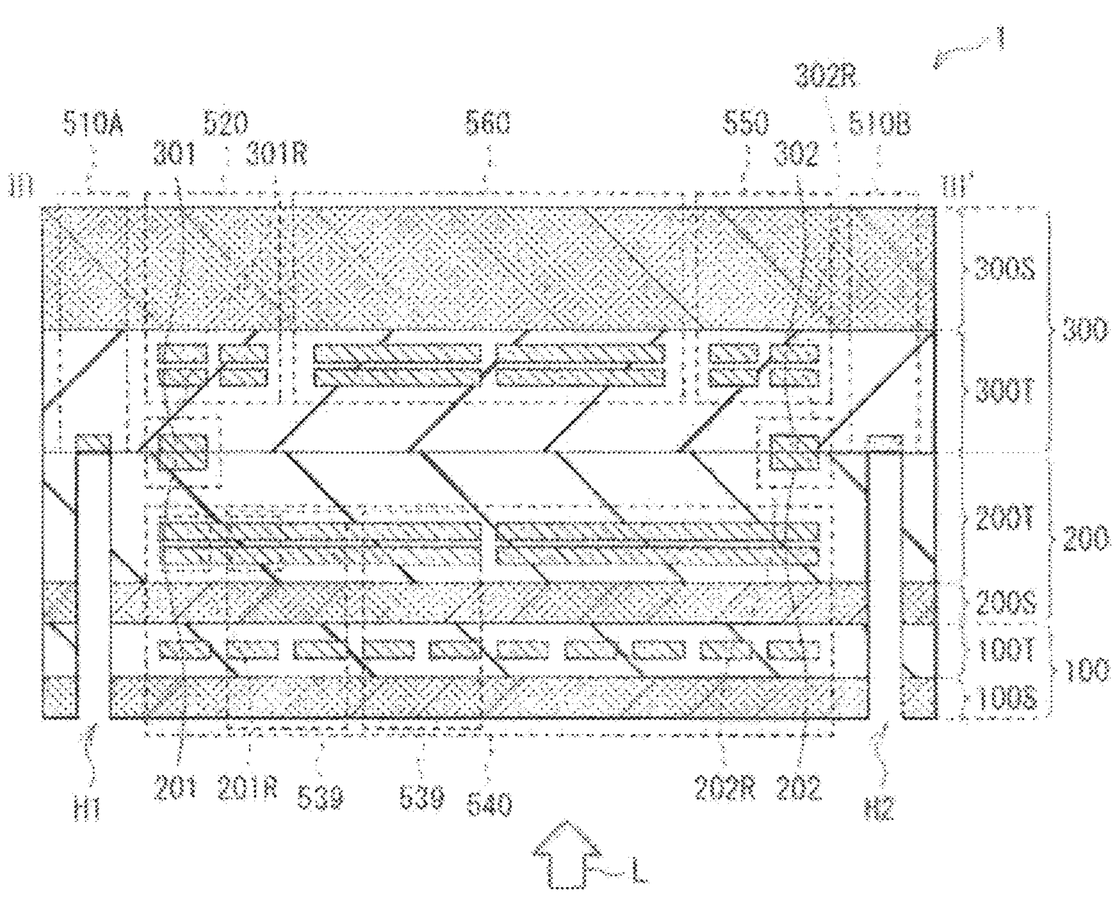

[FIG. 65]
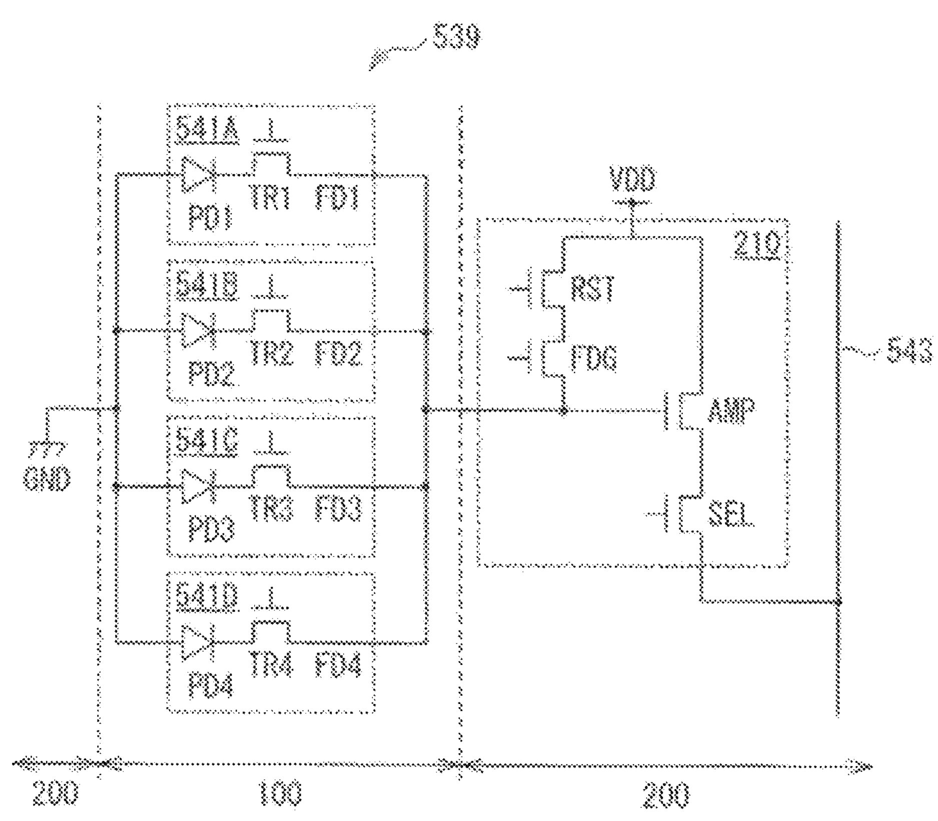

[FIG. 66]
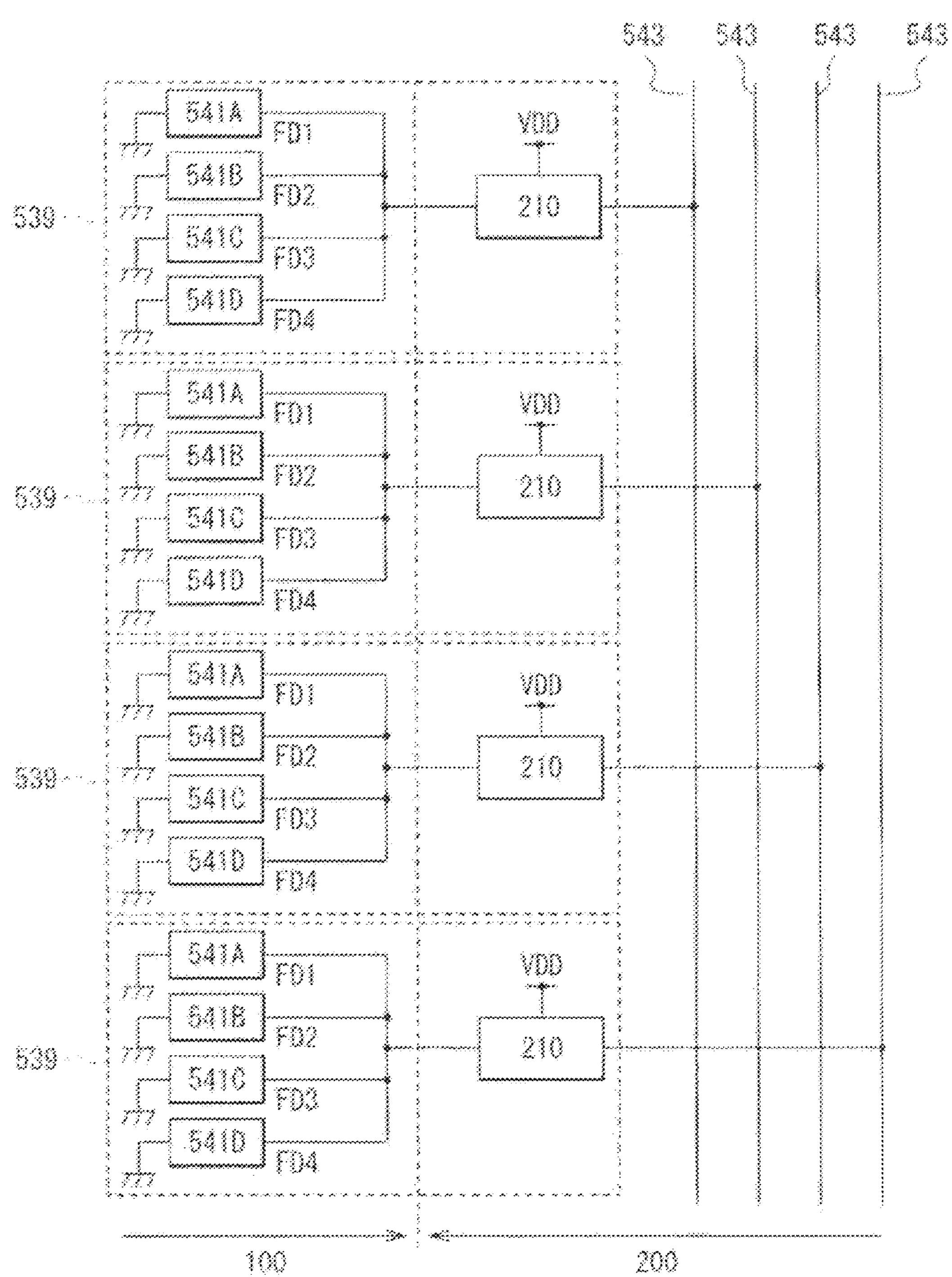

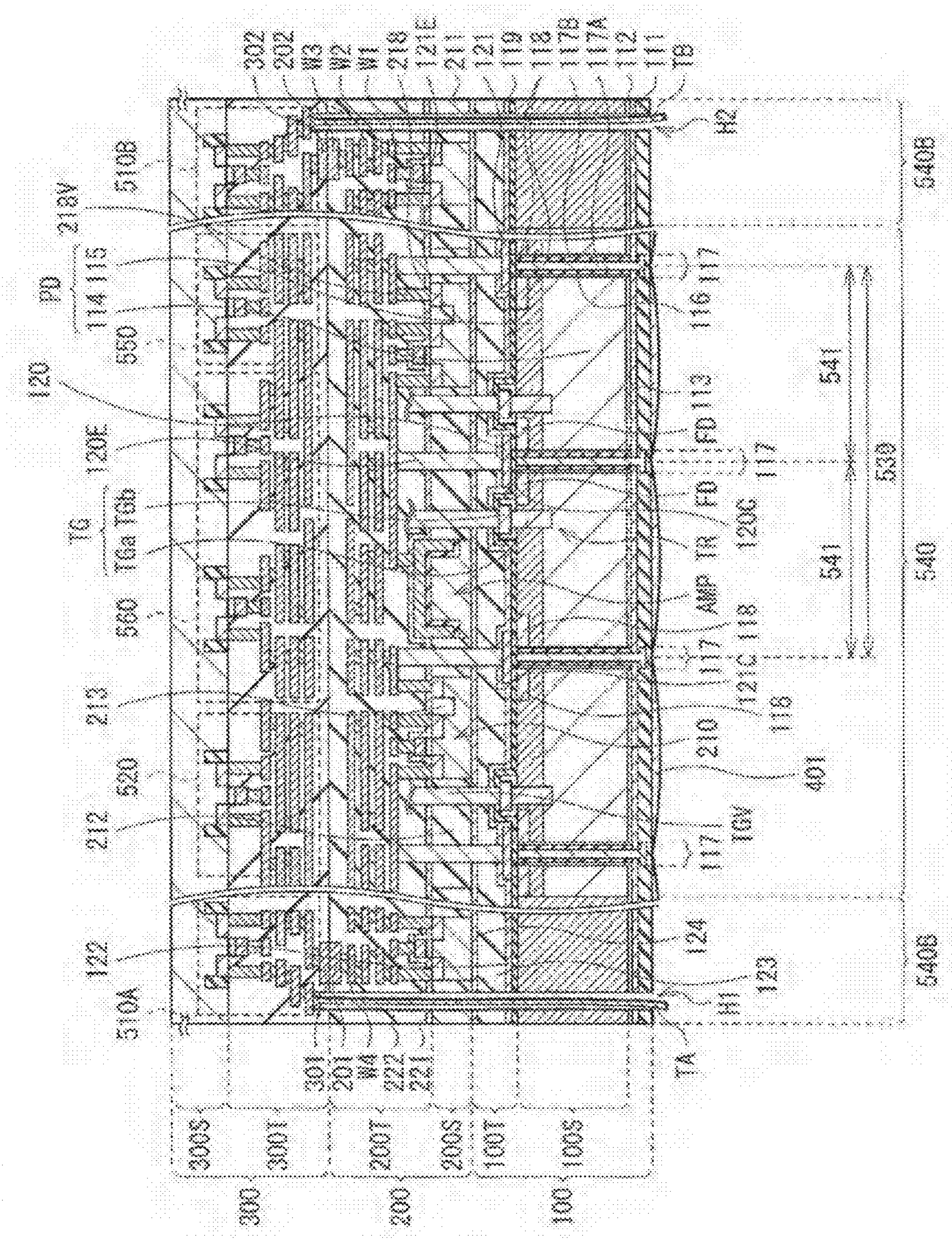
[FIG. 67]
300
300S
300T
200
200T
200S
100
100T
100S
301
201
W4
222
221
510A
122
212
520
213
560
TG
TGa
TGb
120E
120
550
PD
114
115
218V
510B
302
202
W3
W2
W1
218
121E
211
121
119
116
117B
117A
112
111
TB
H2
H1
TA
123
124
117
TGV
401
210
116
121C
118
AMP
TR
FD
120C
113
540B
541
530
540

[FIG. 68A]
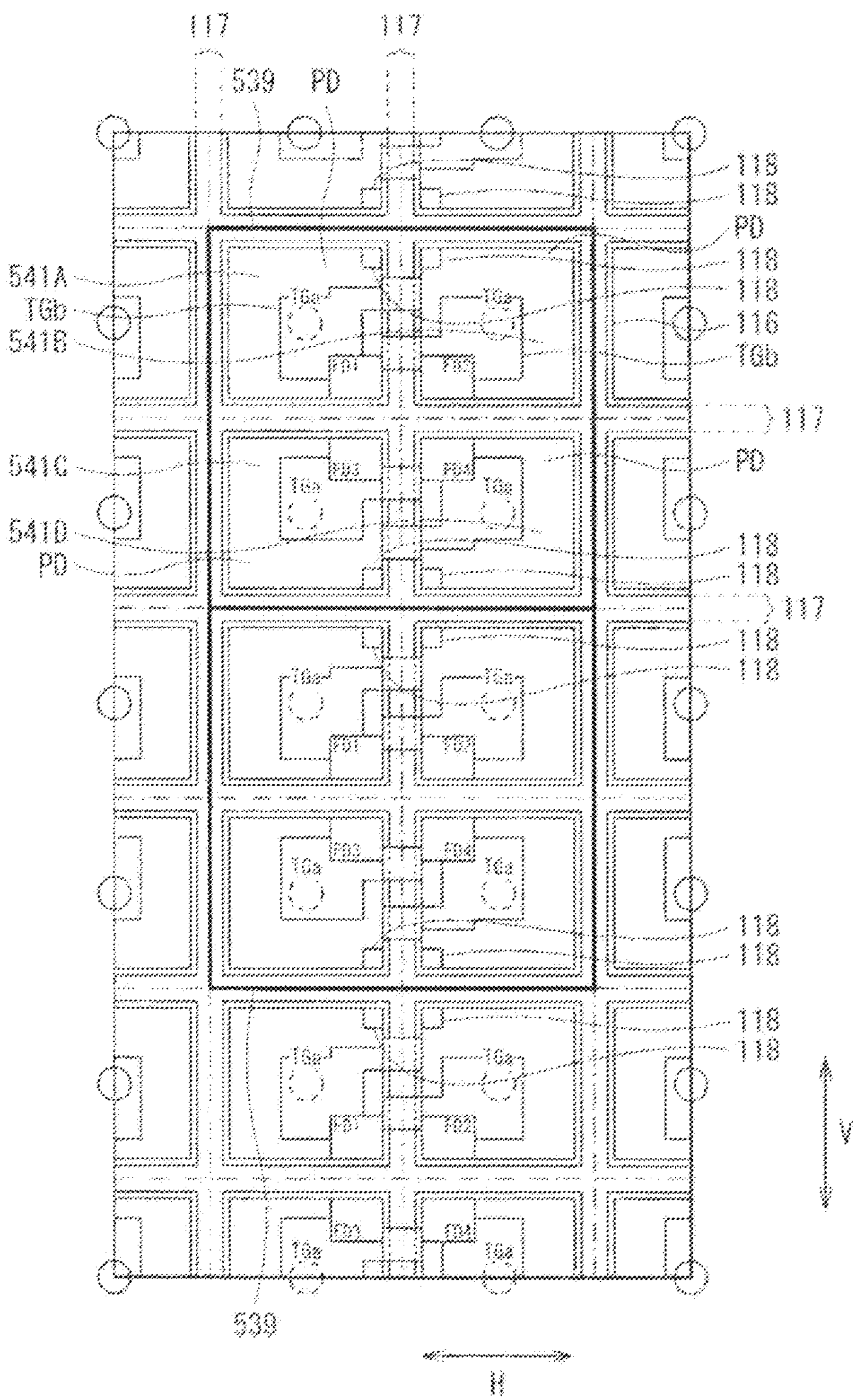

[FIG. 68B]
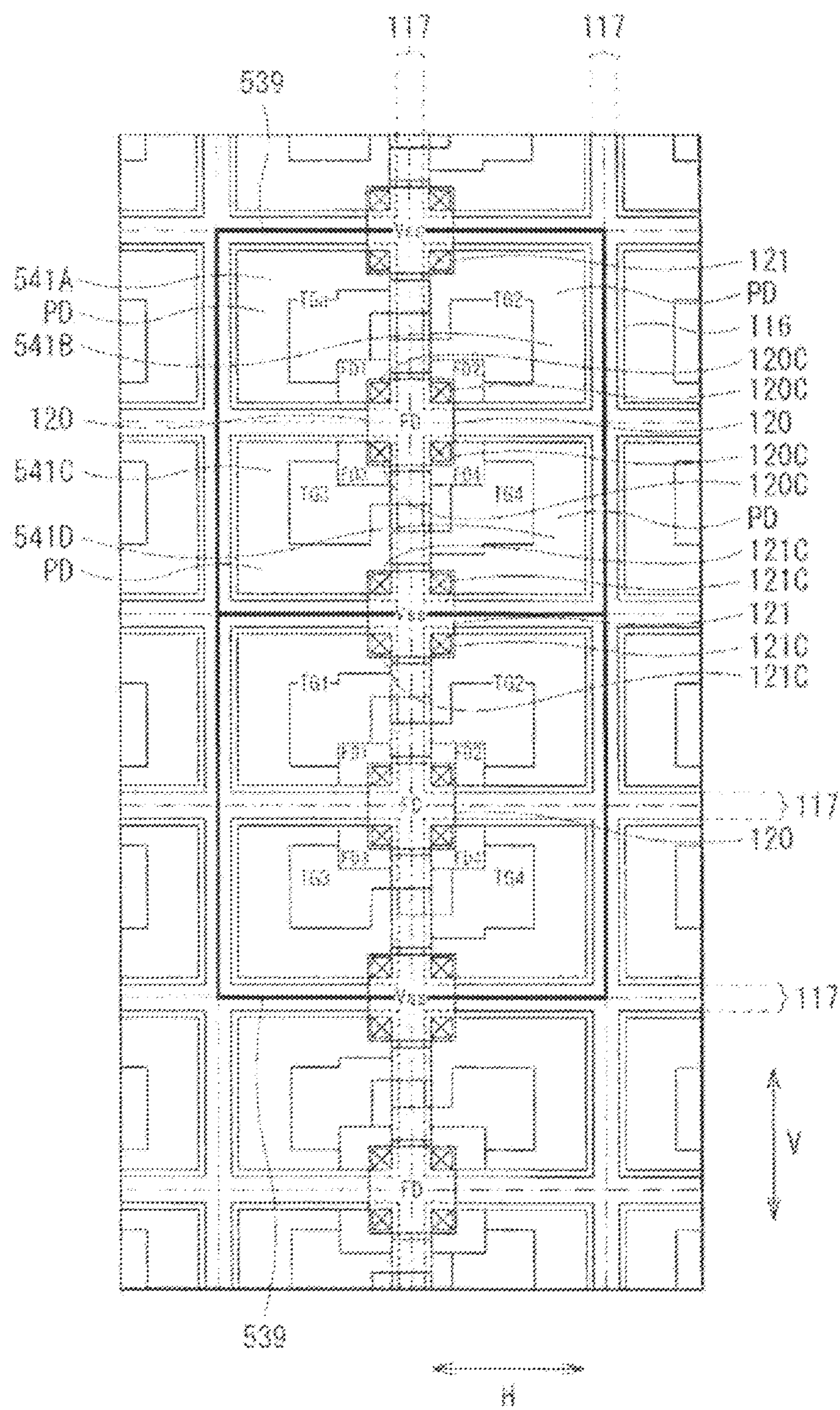

[FIG. 69]
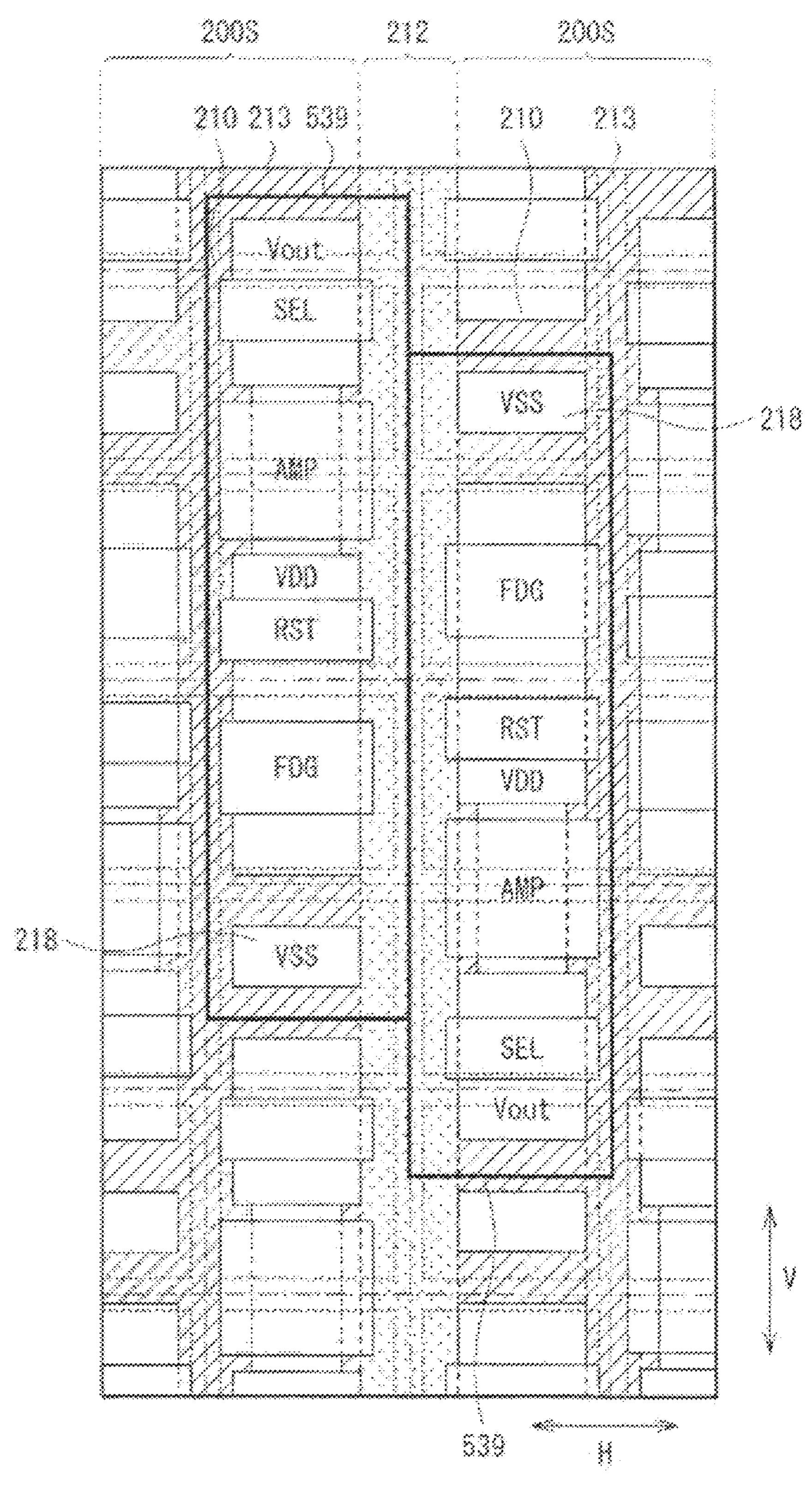

[FIG. 70]
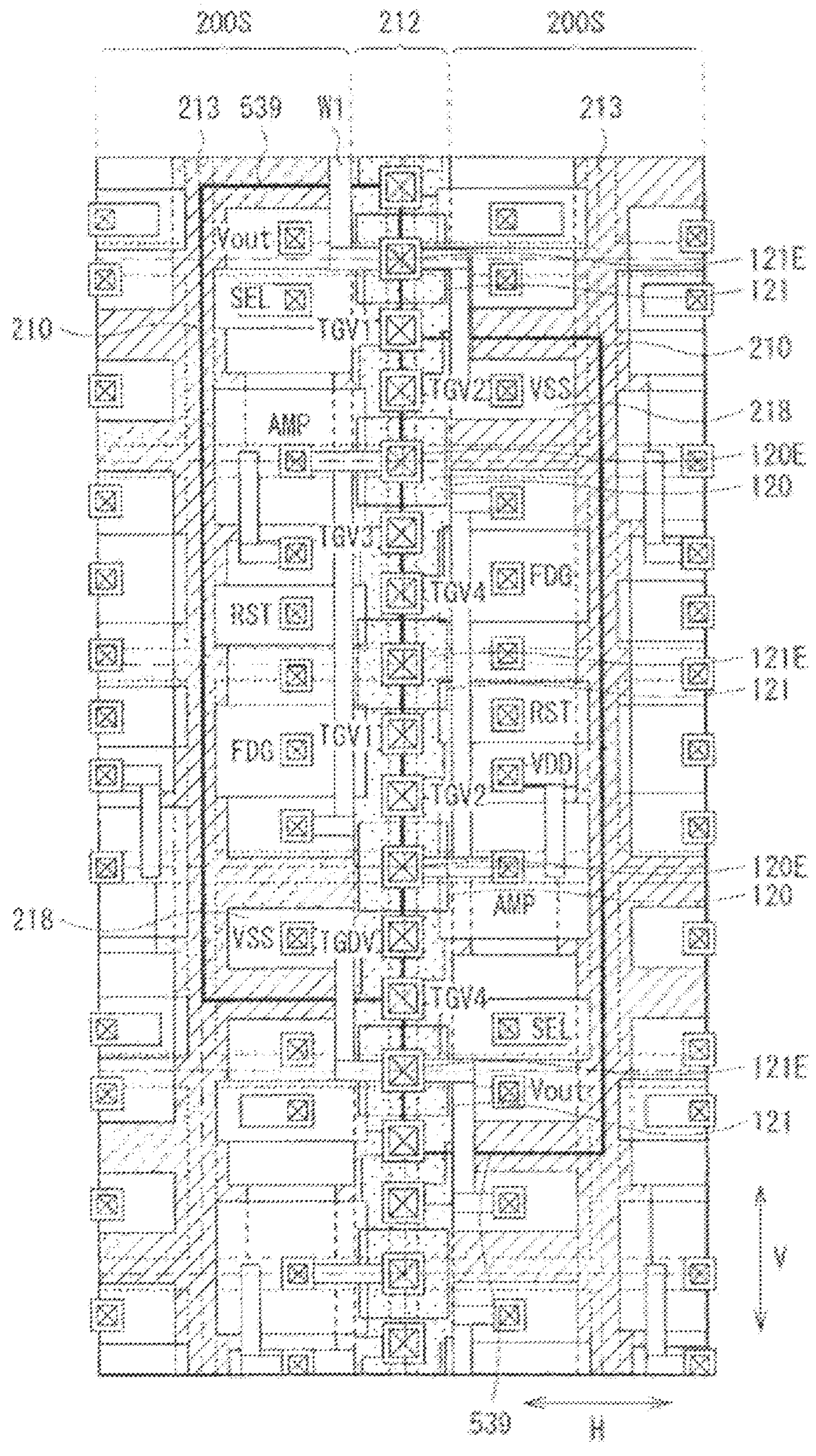

[FIG. 71]
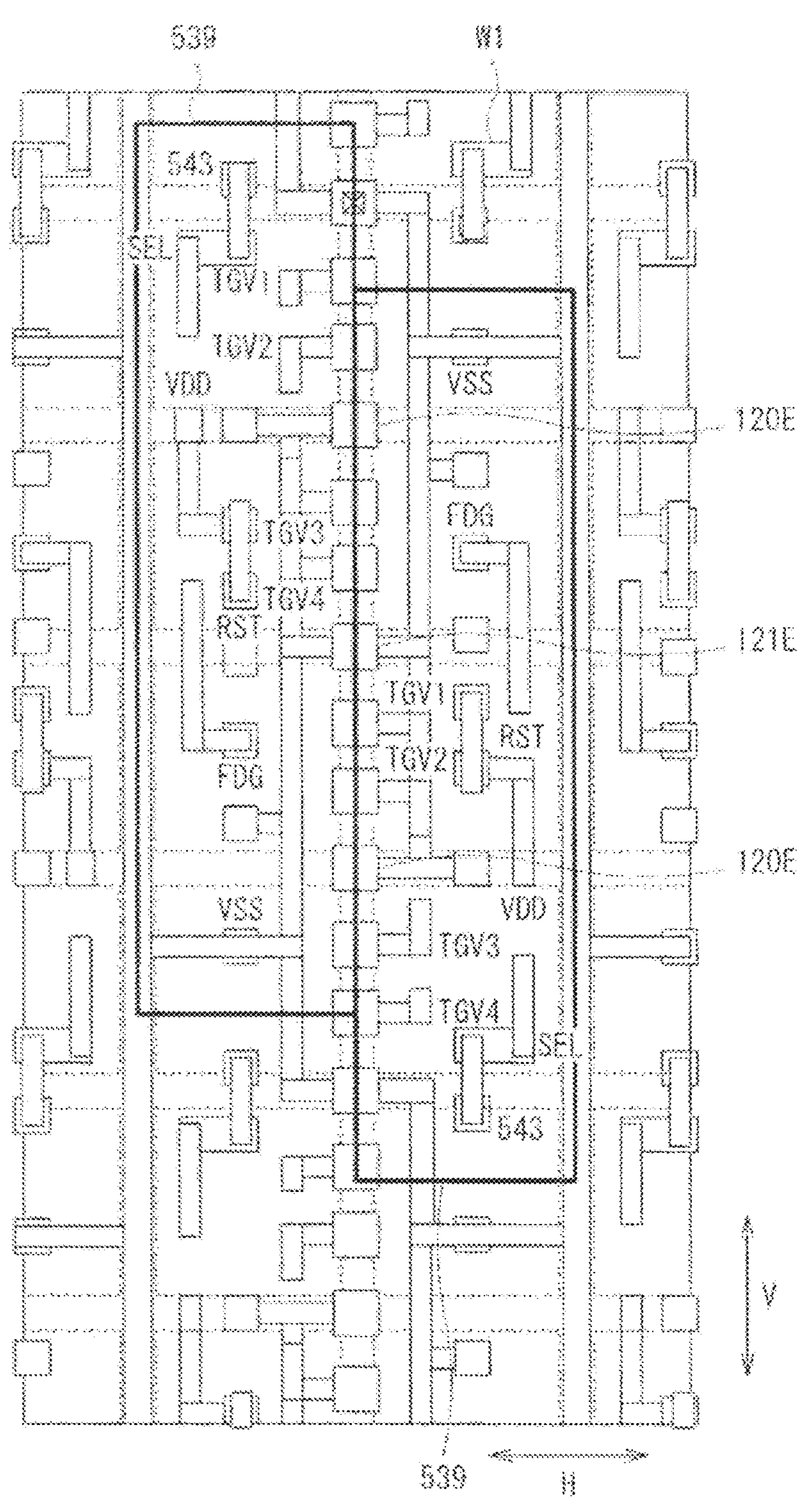

[FIG. 72]
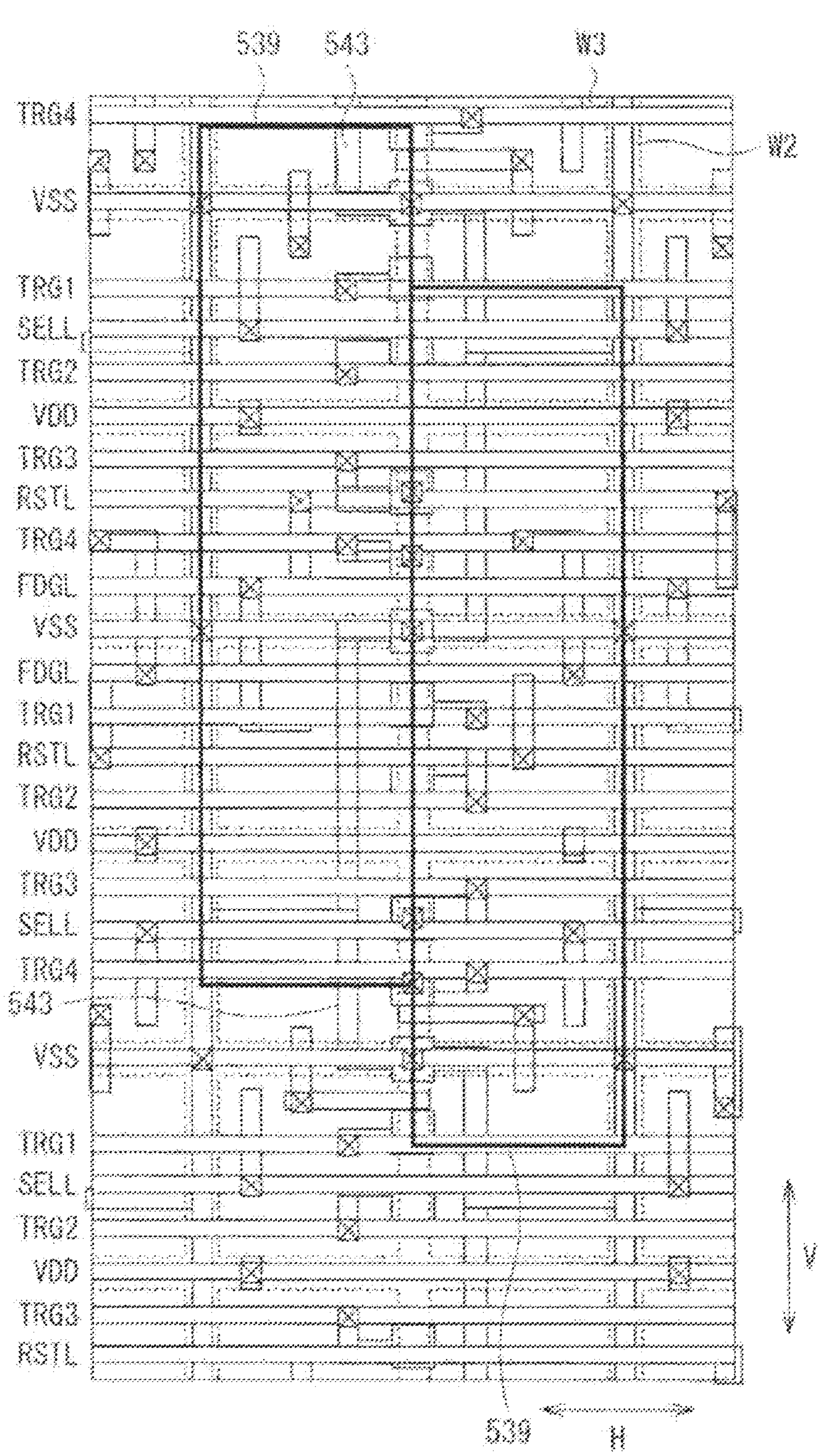

[FIG. 73]
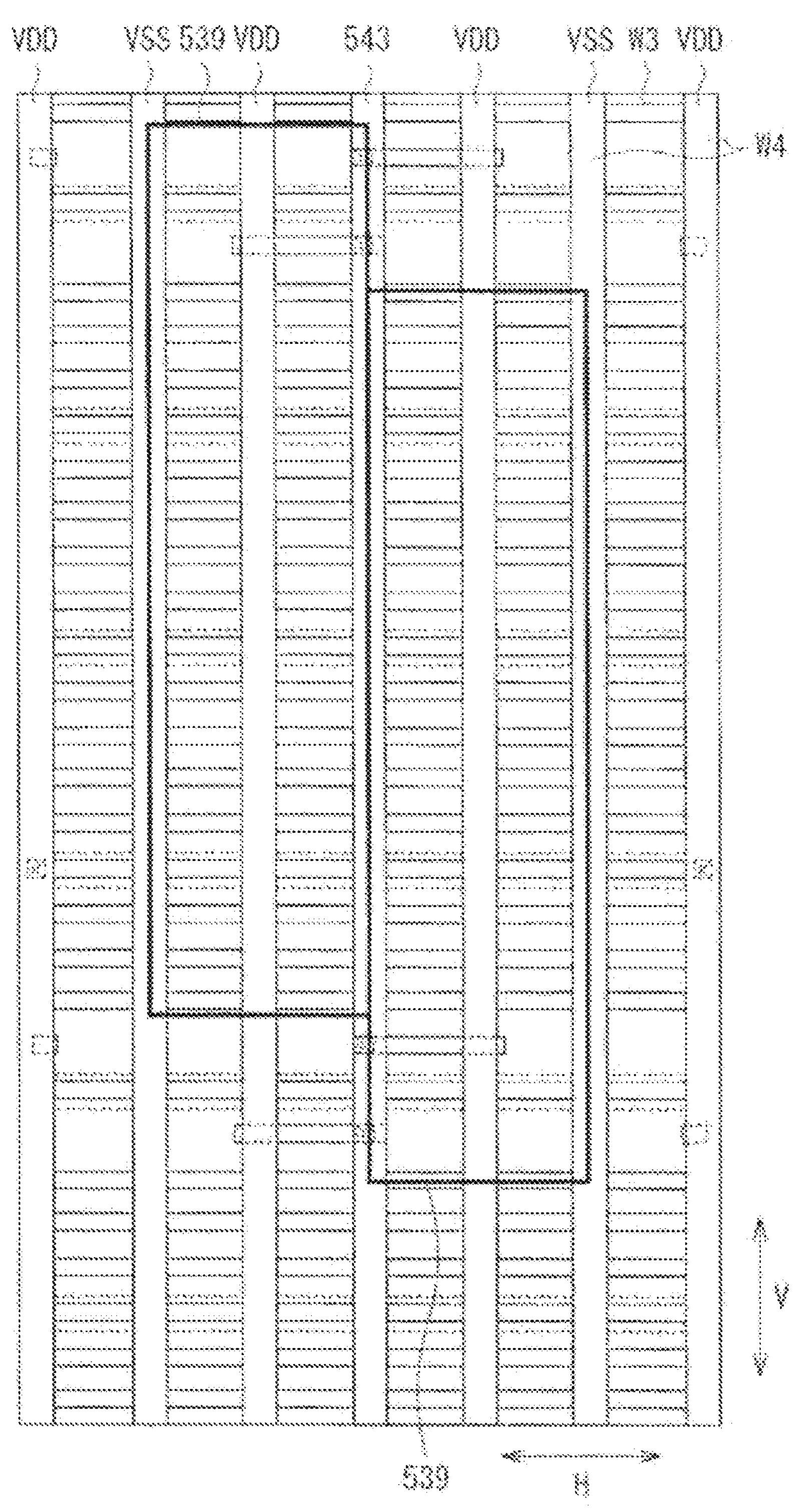

[FIG. 74]
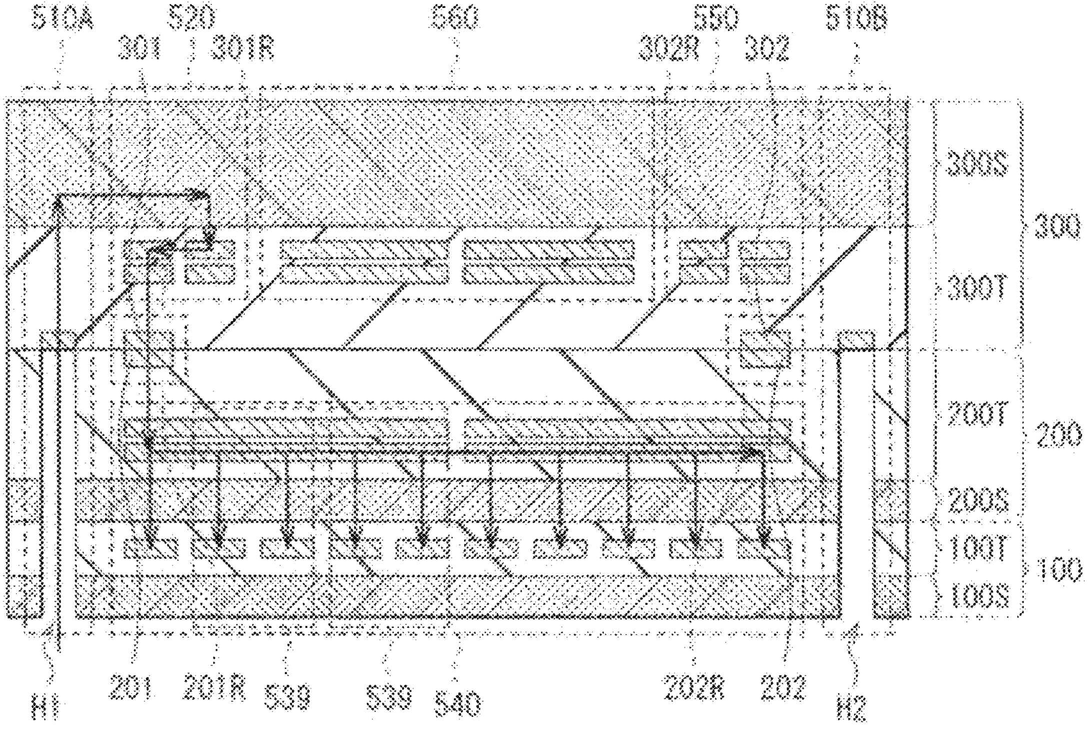
[FIG. 75]
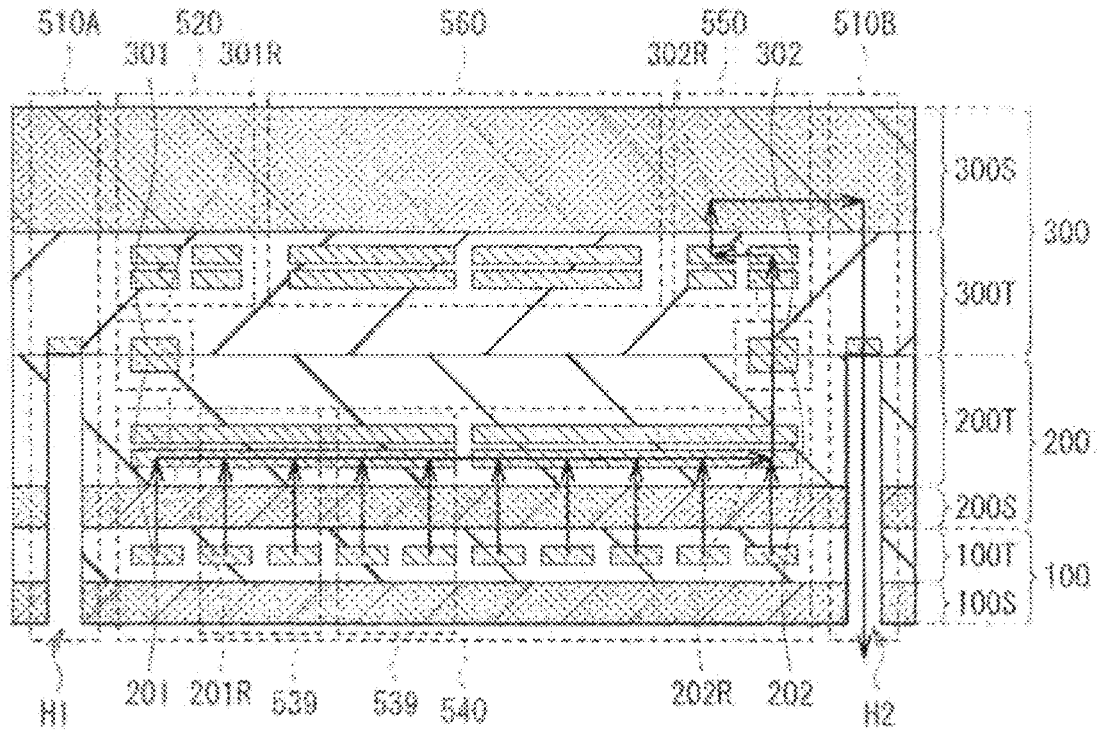

[FIG. 76]
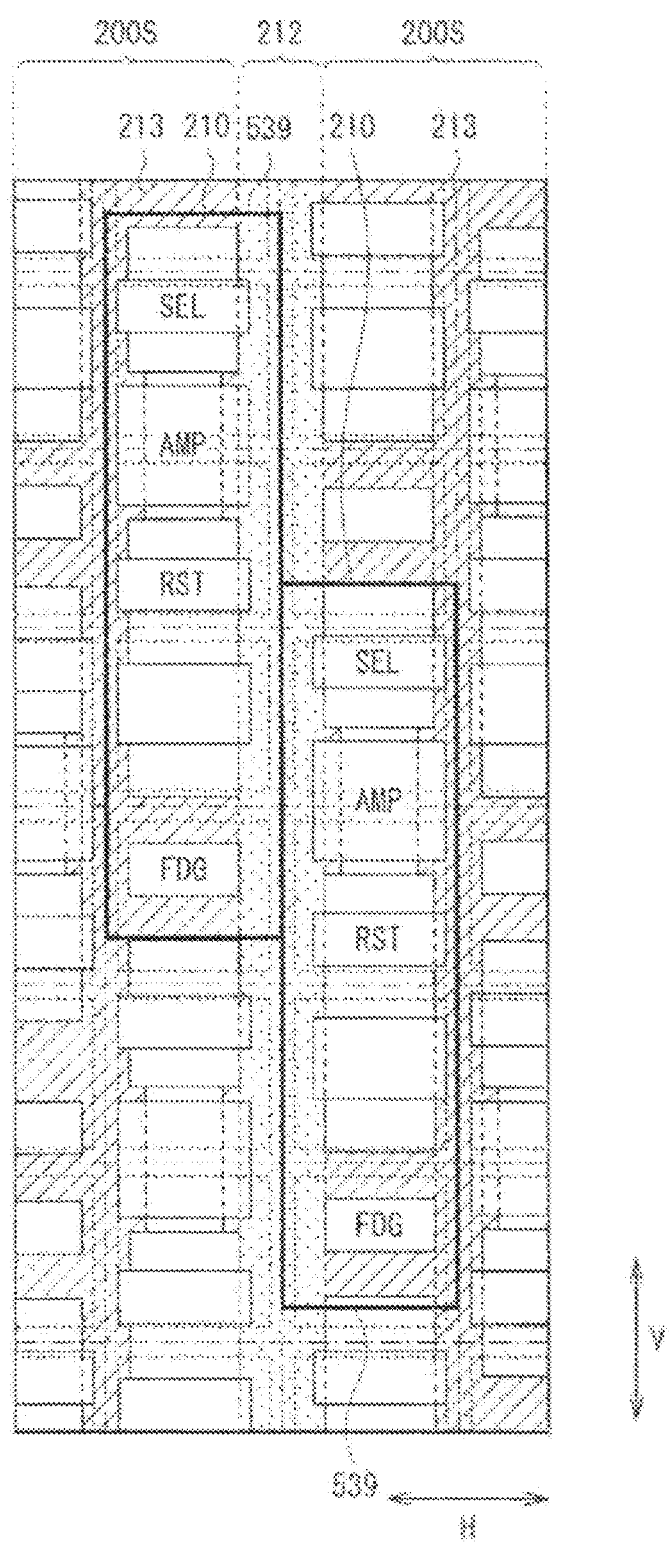

[FIG. 77]
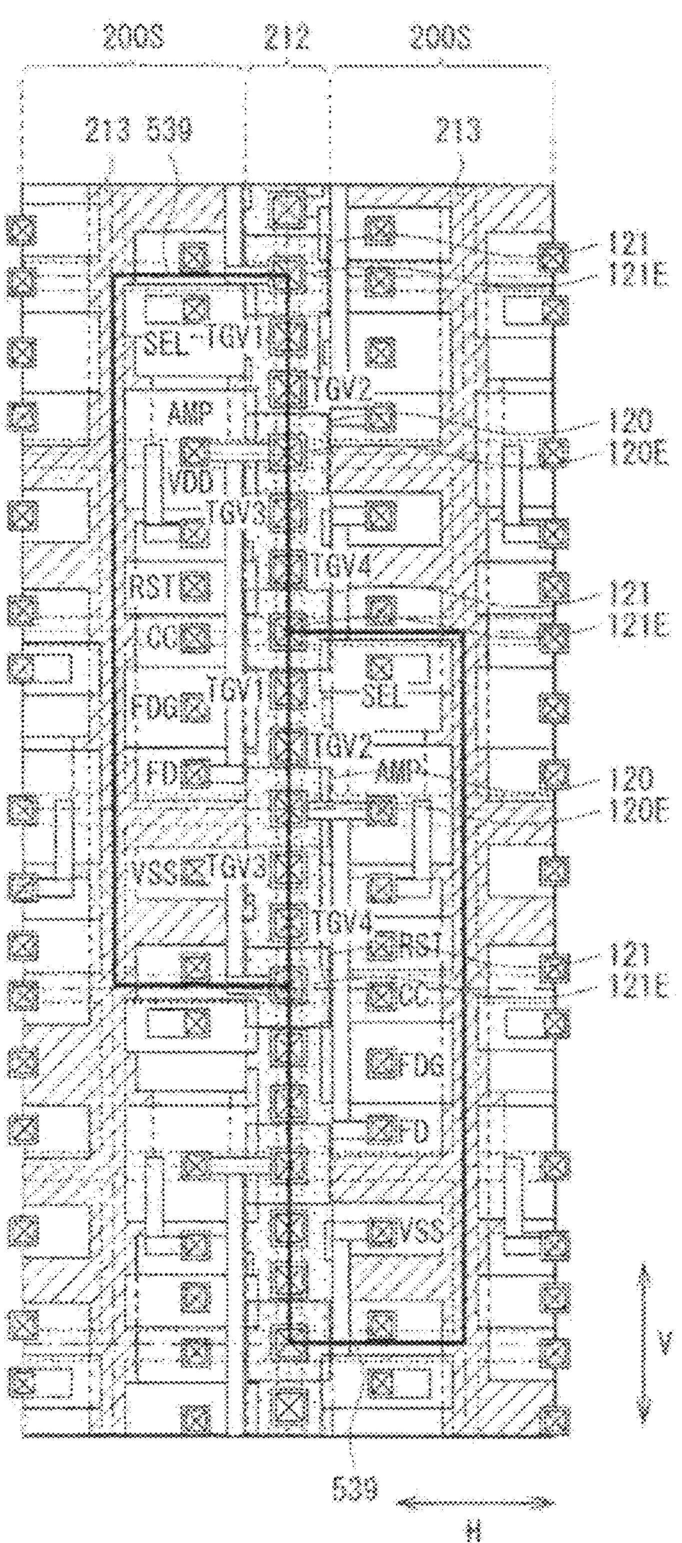

[FIG. 78]
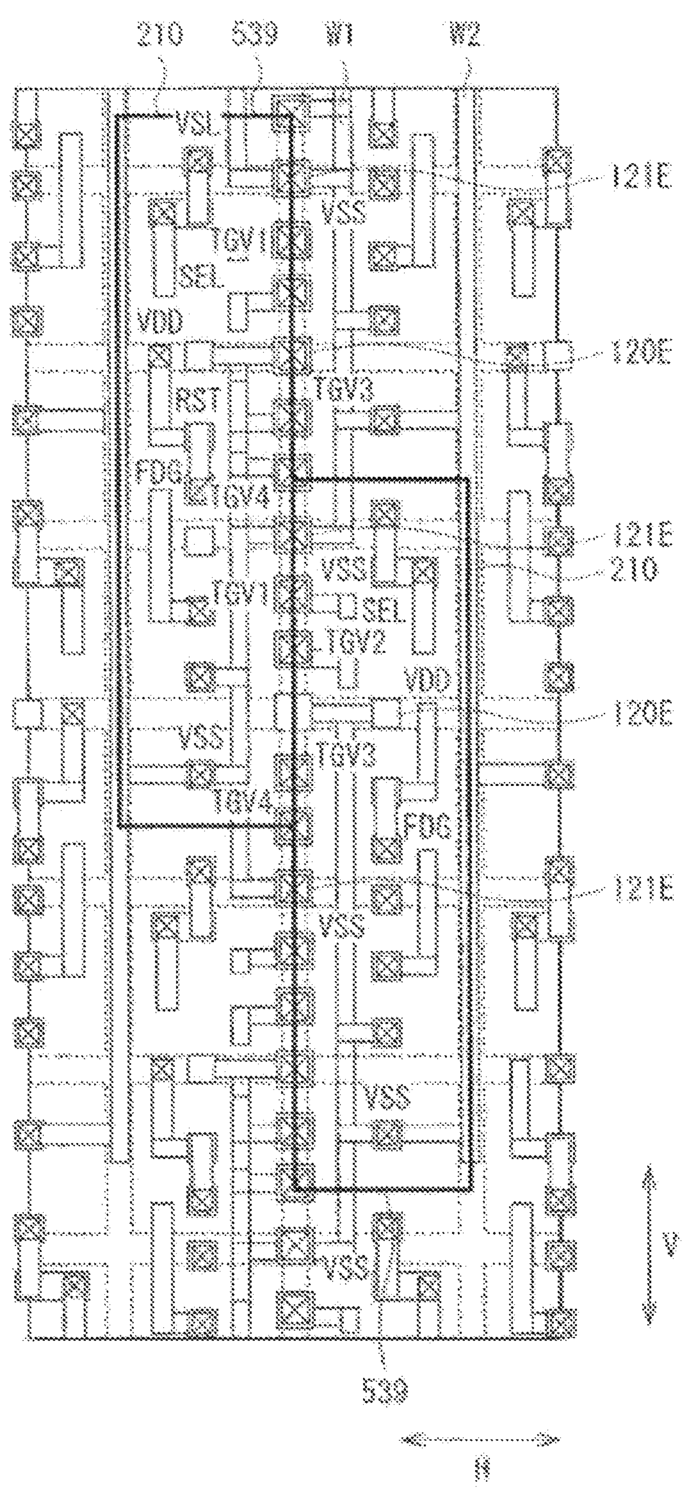

[FIG. 79]
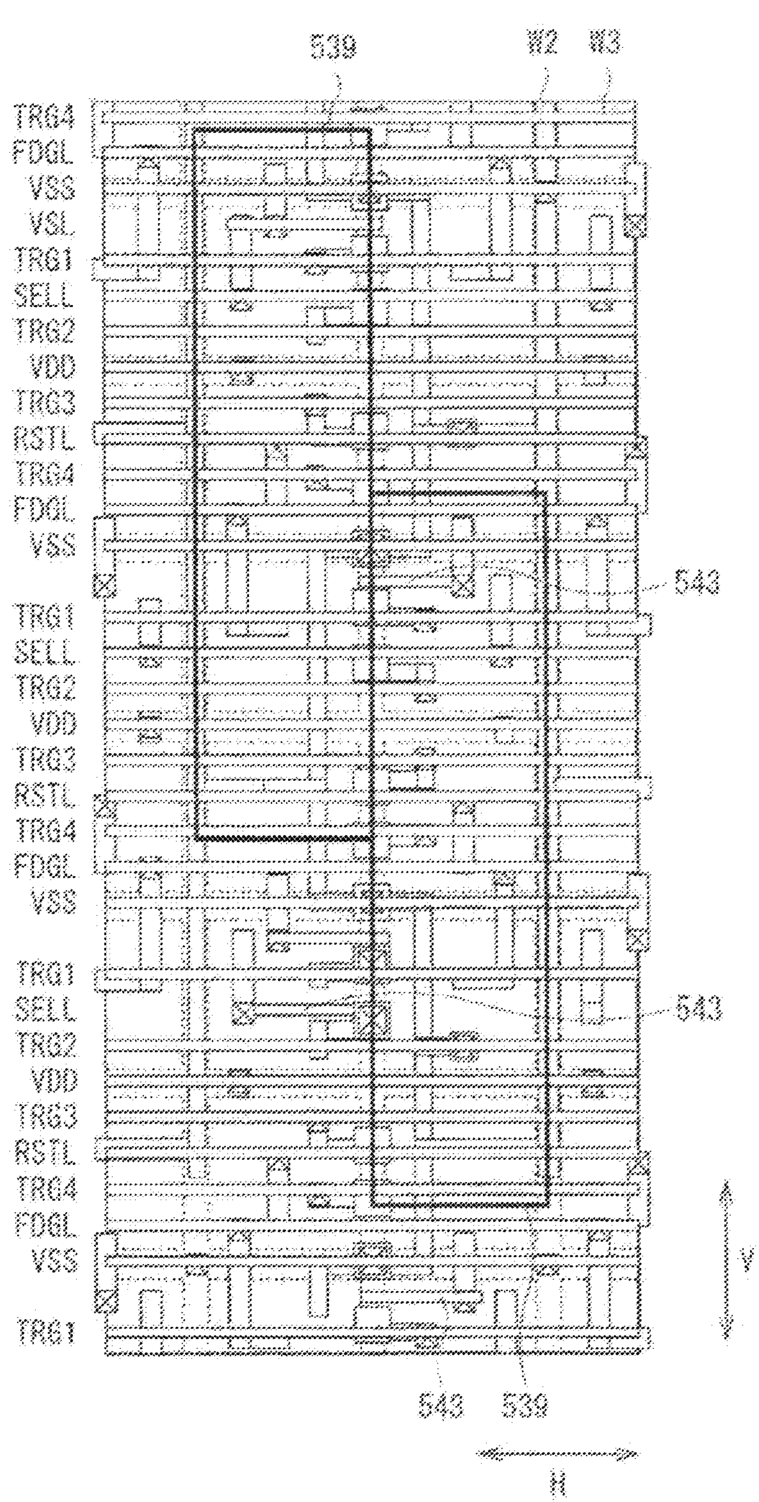

[FIG. 80]
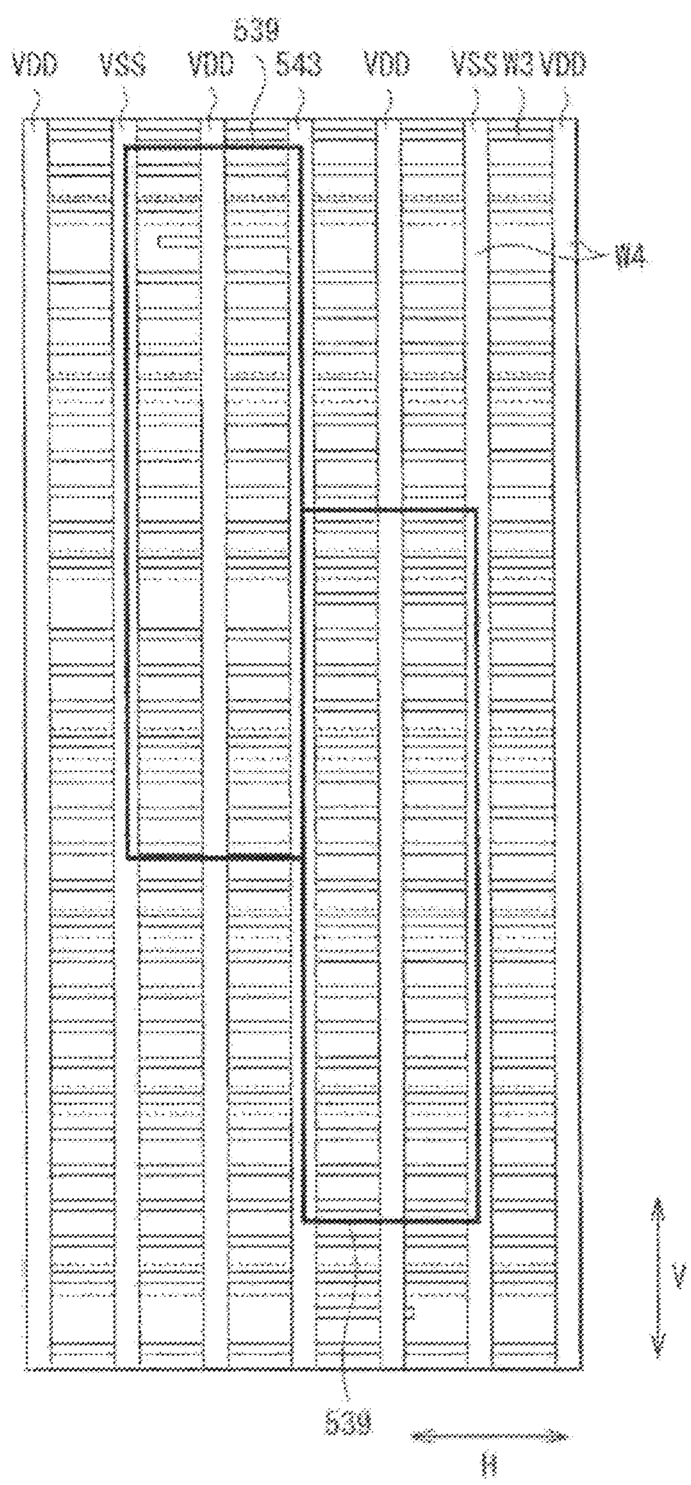

[FIG. 81]
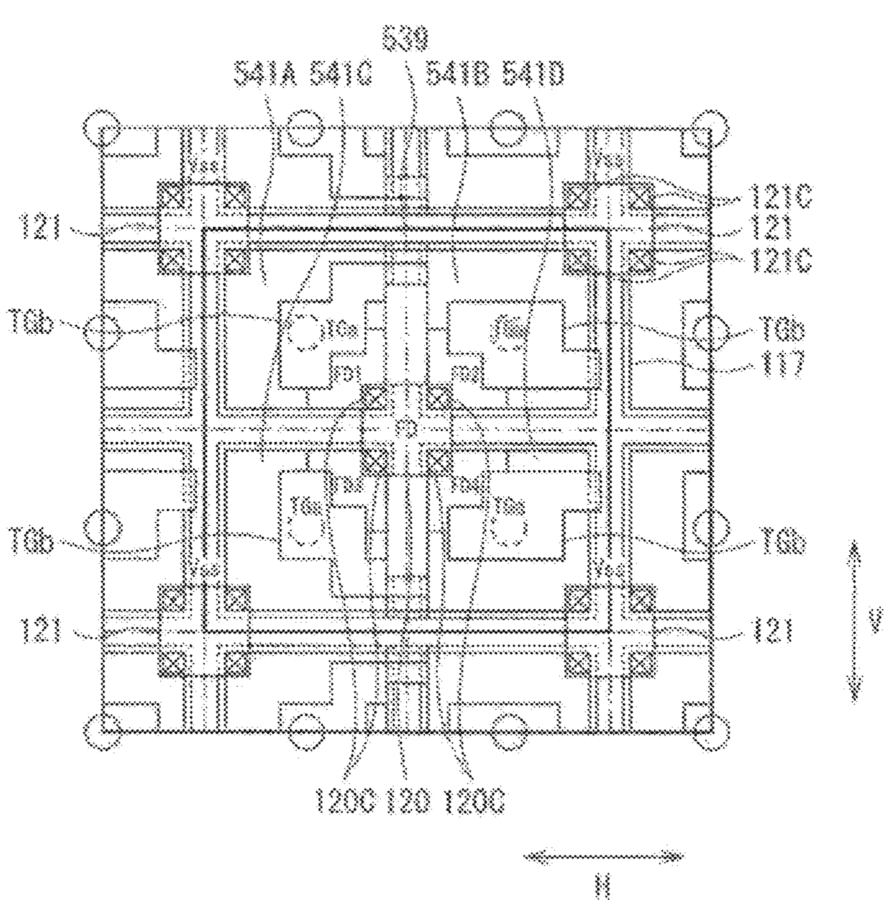

[FIG. 82]
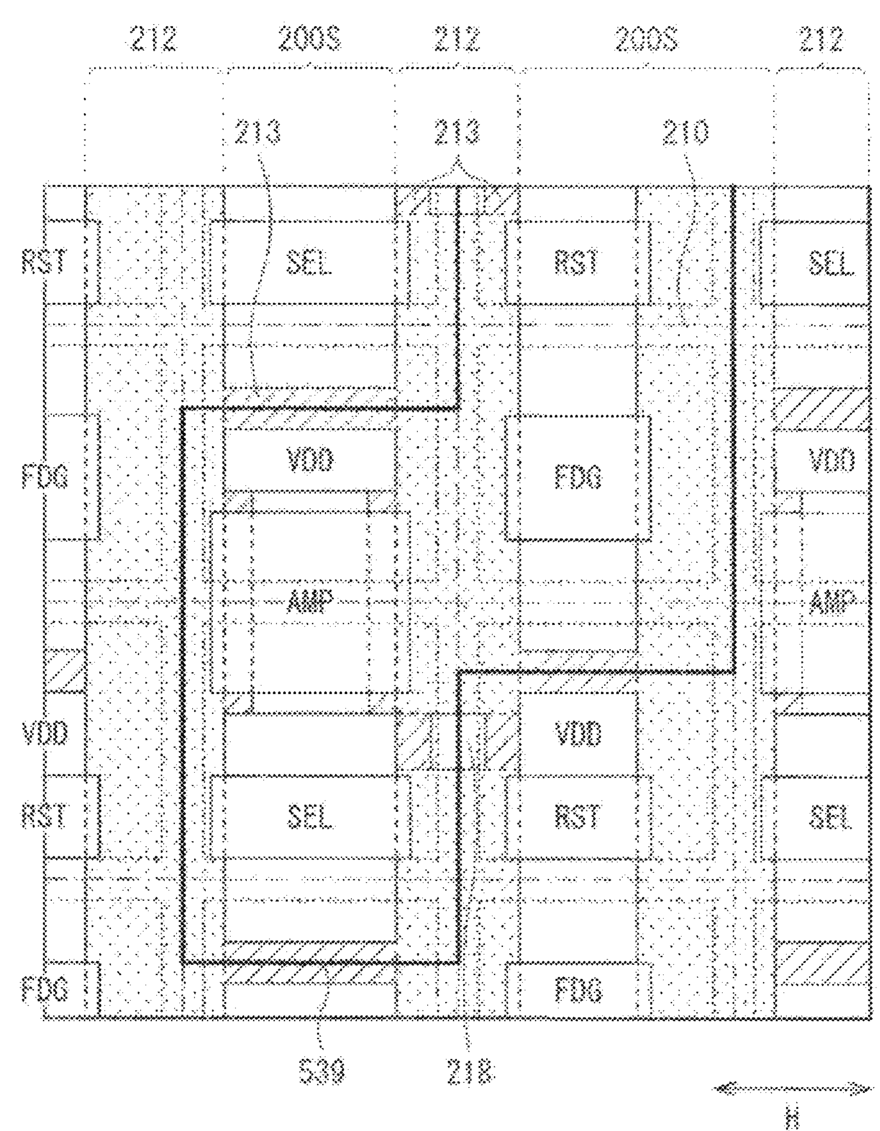
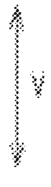

[FIG. 83]
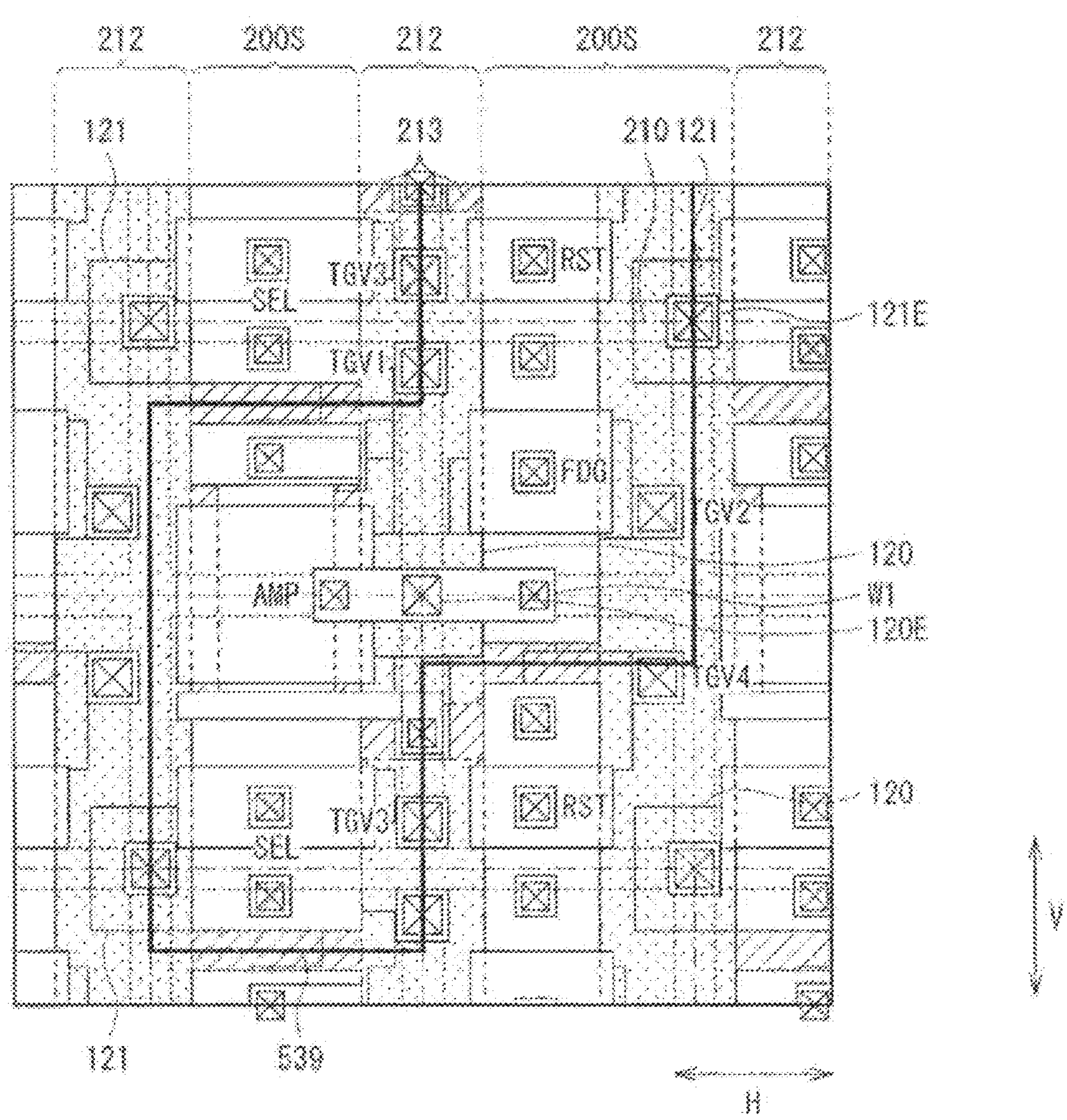

[FIG. 84]
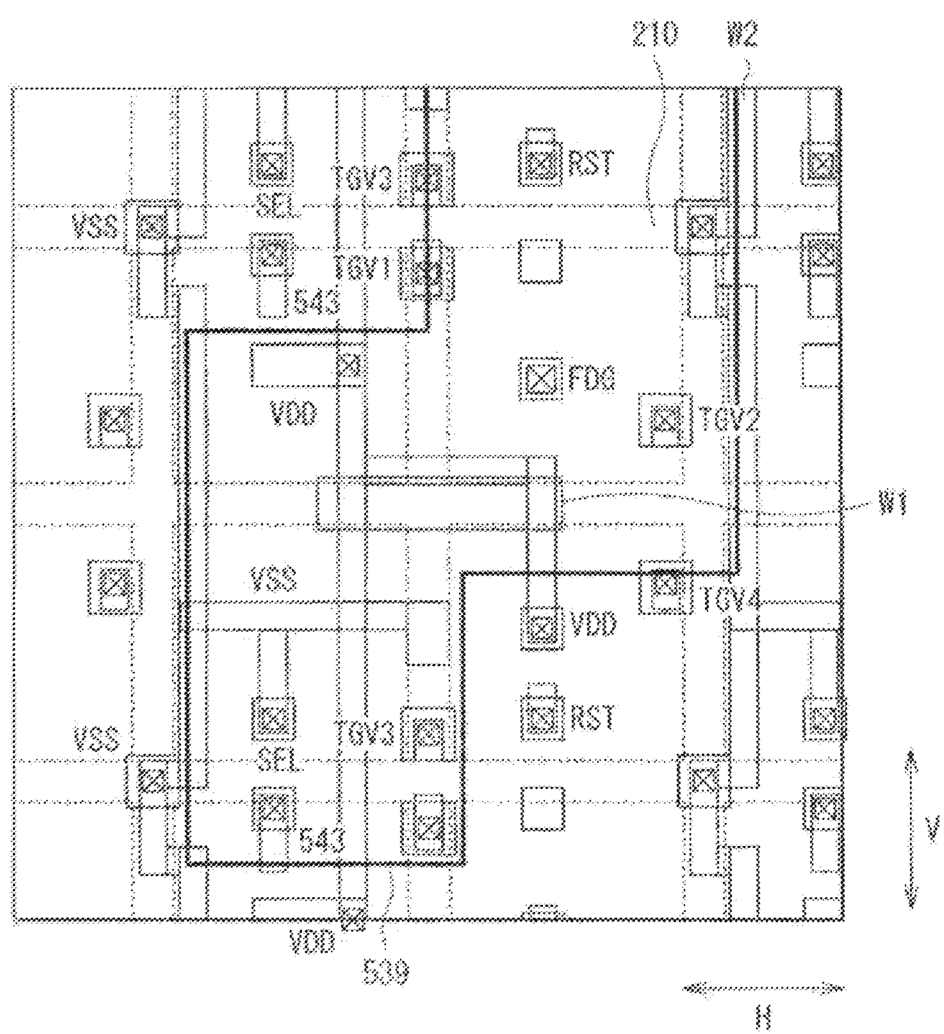

[FIG. 85]
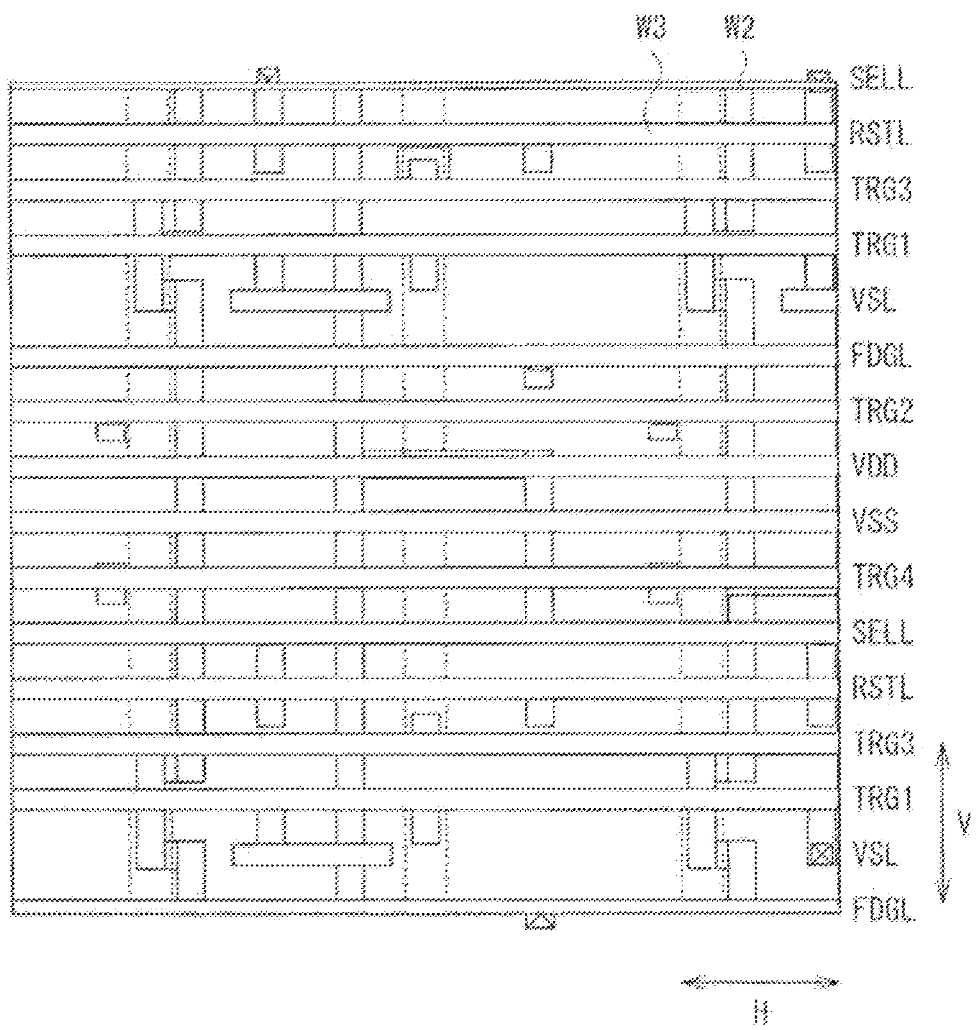

[FIG. 86]
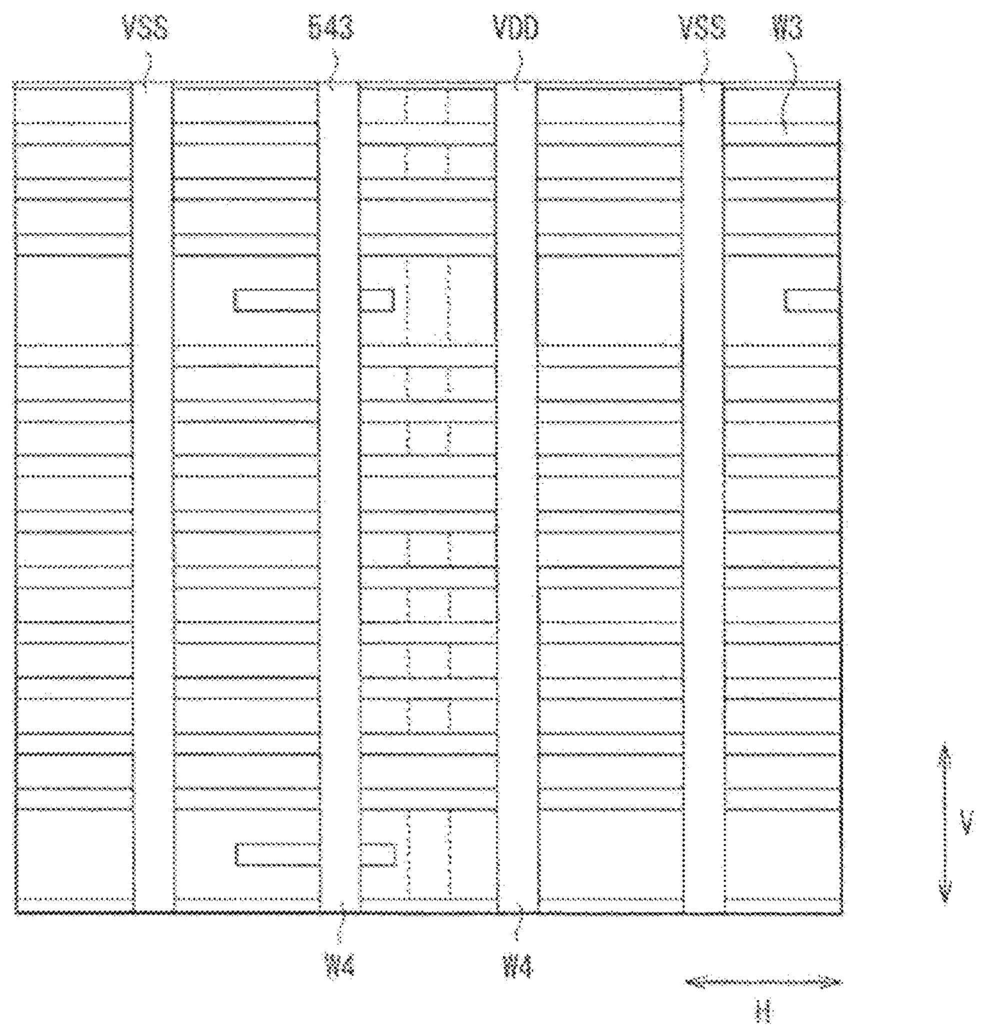

[FIG. 87]
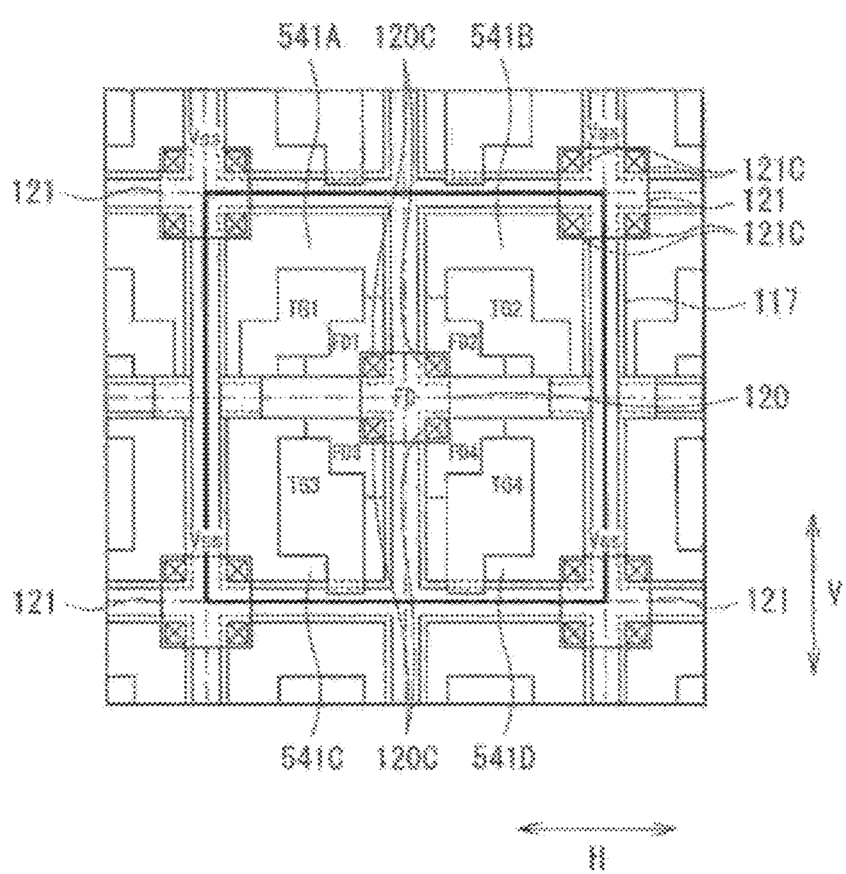

[FIG. 88]
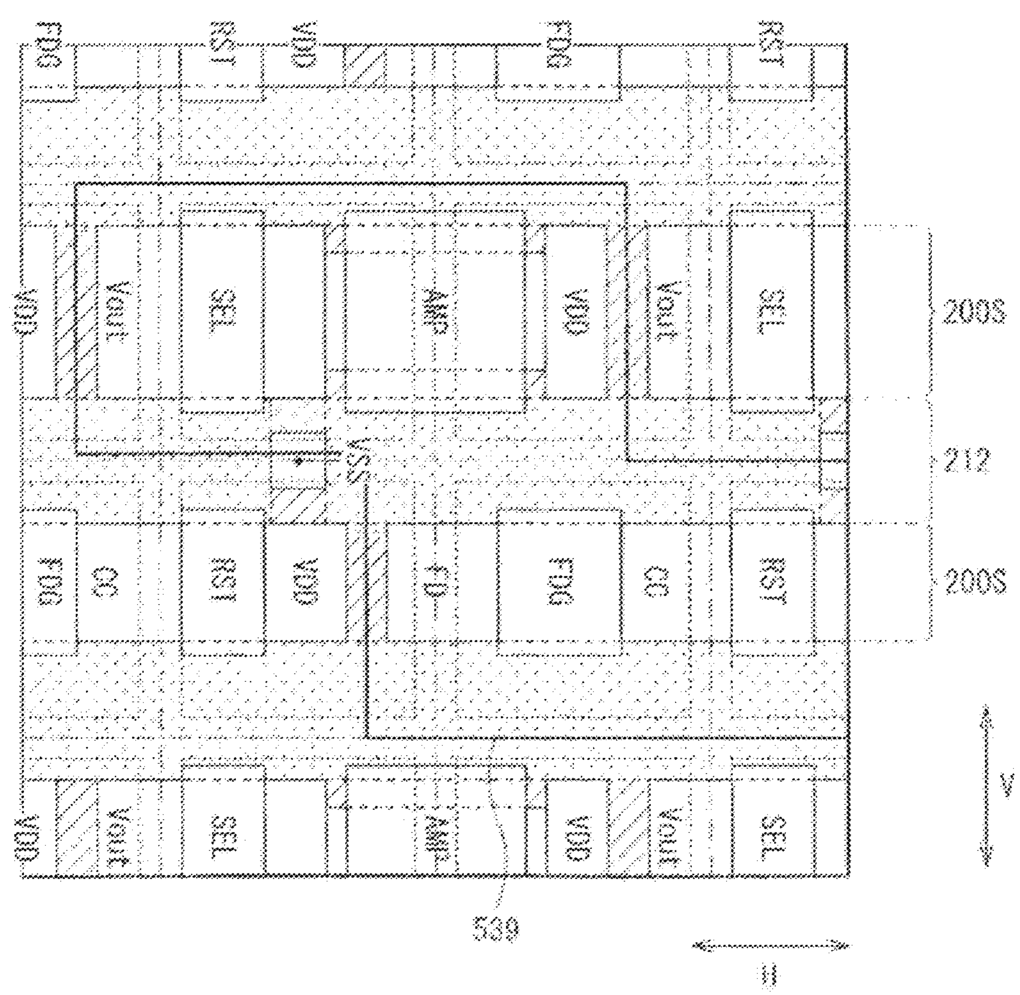

[FIG. 89]
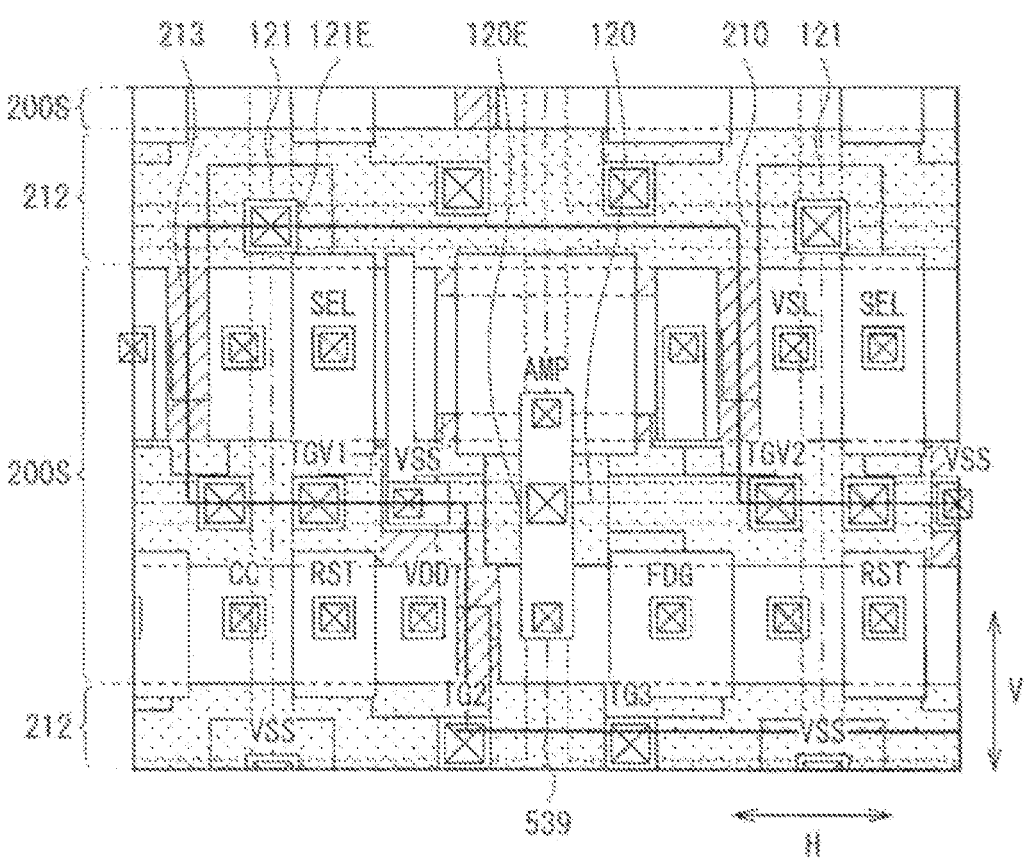

[FIG. 90]
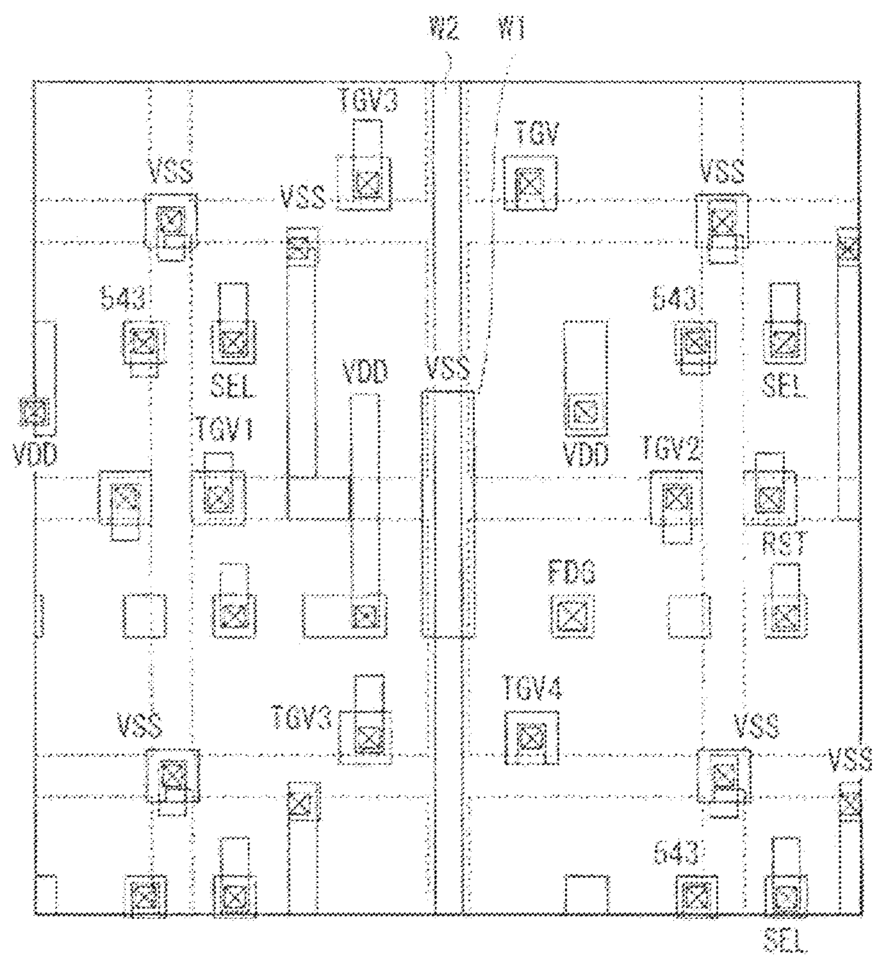

[FIG. 91]
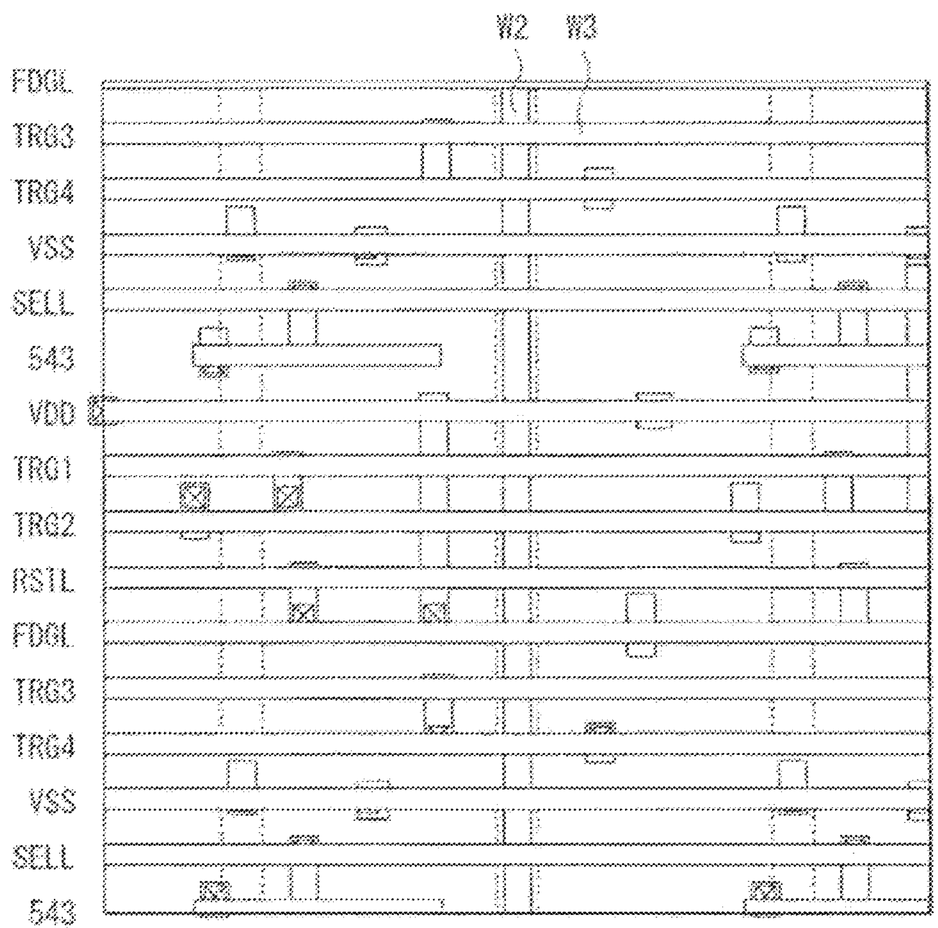

[FIG. 92]
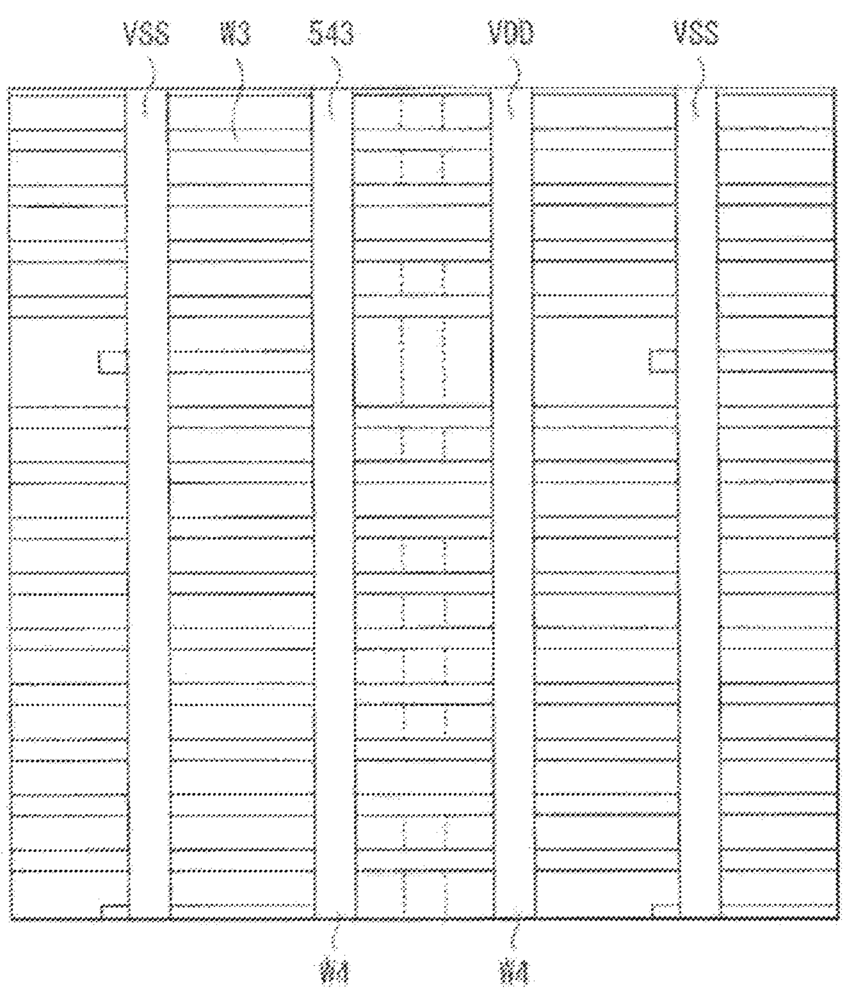

[FIG. 93]
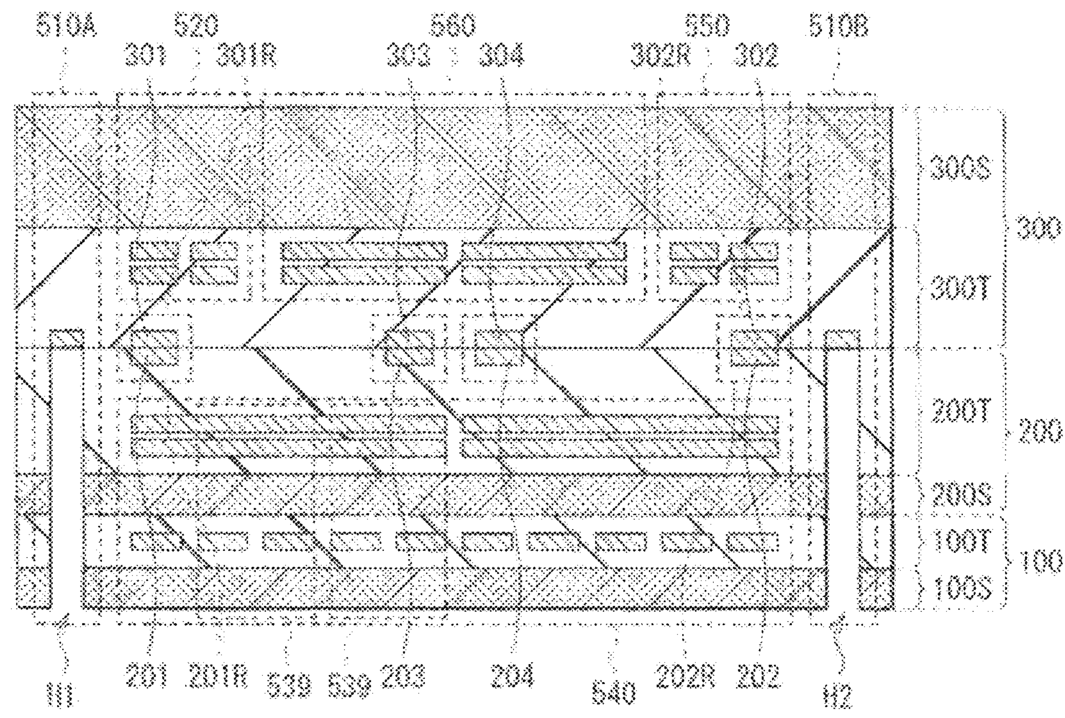

[FIG. 94]
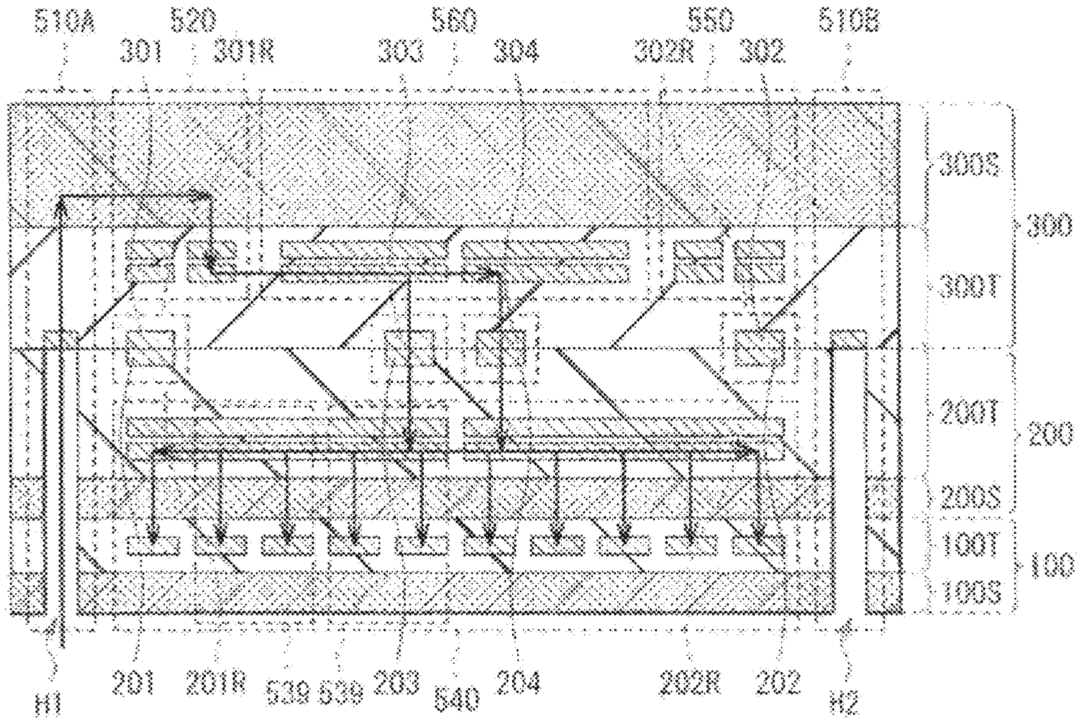
[FIG. 95]
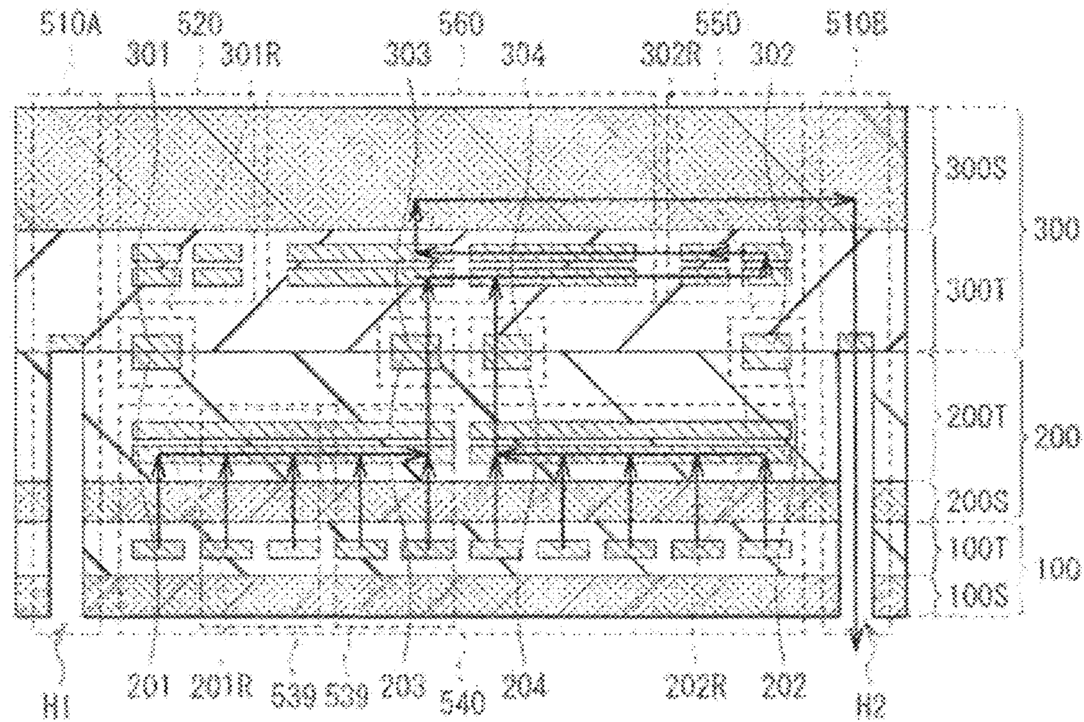

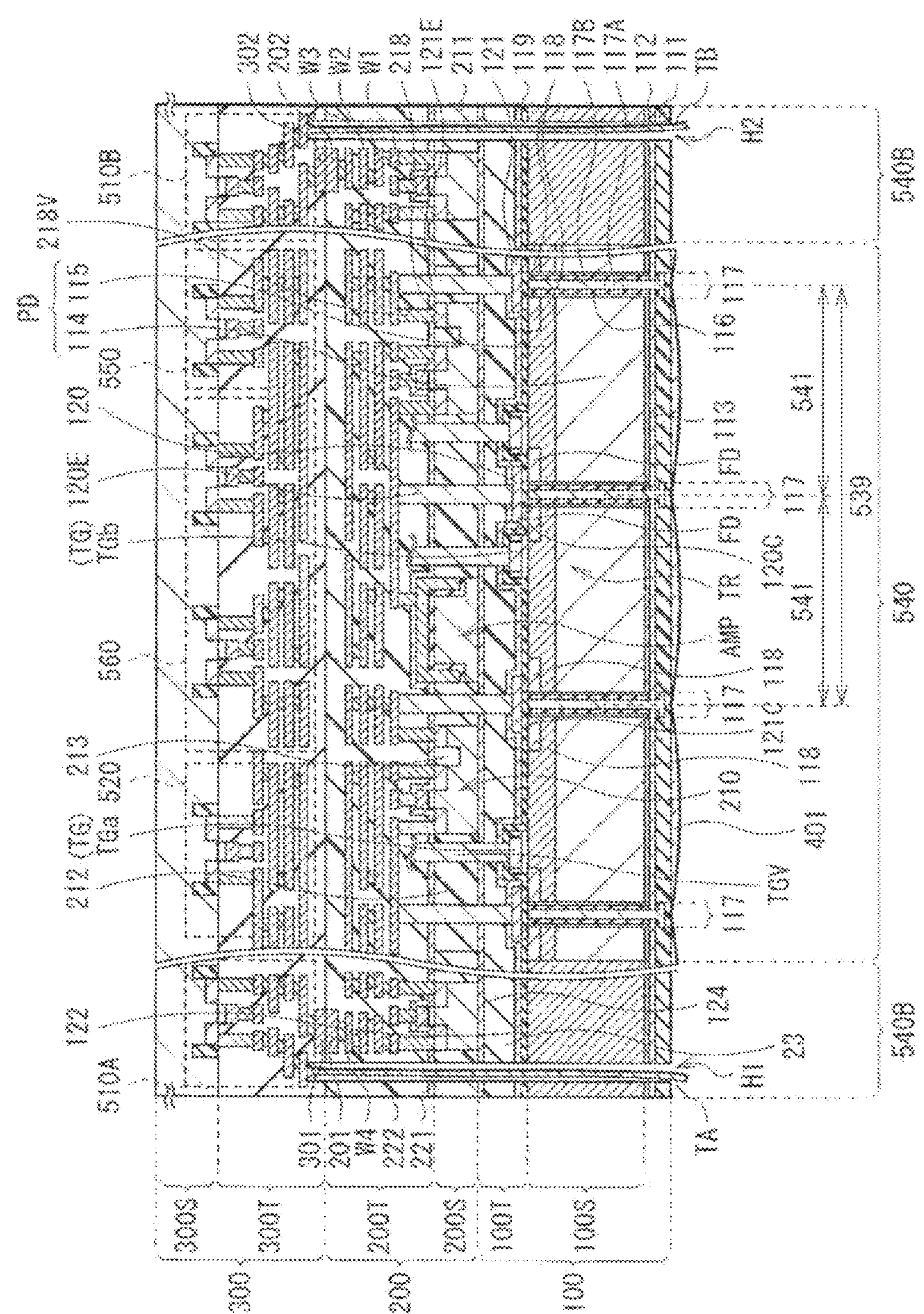
[FIG. 96]

[FIG. 97]
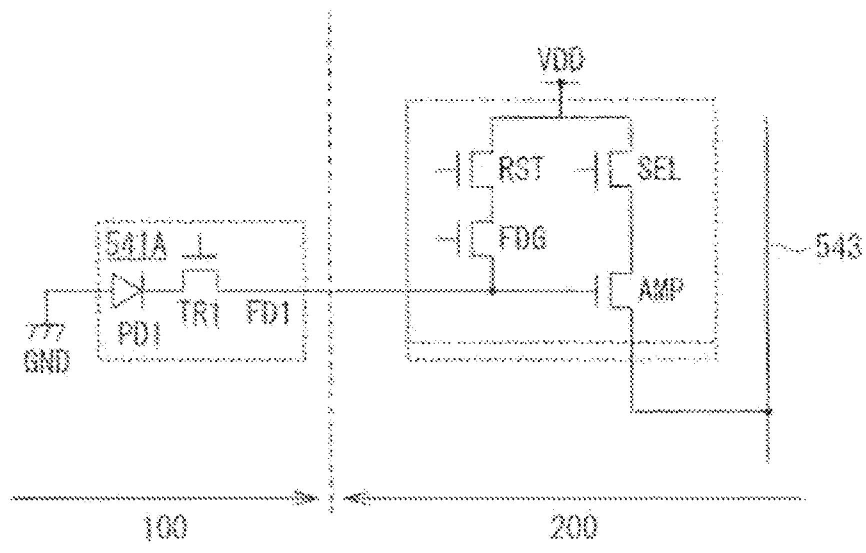
[FIG. 98]
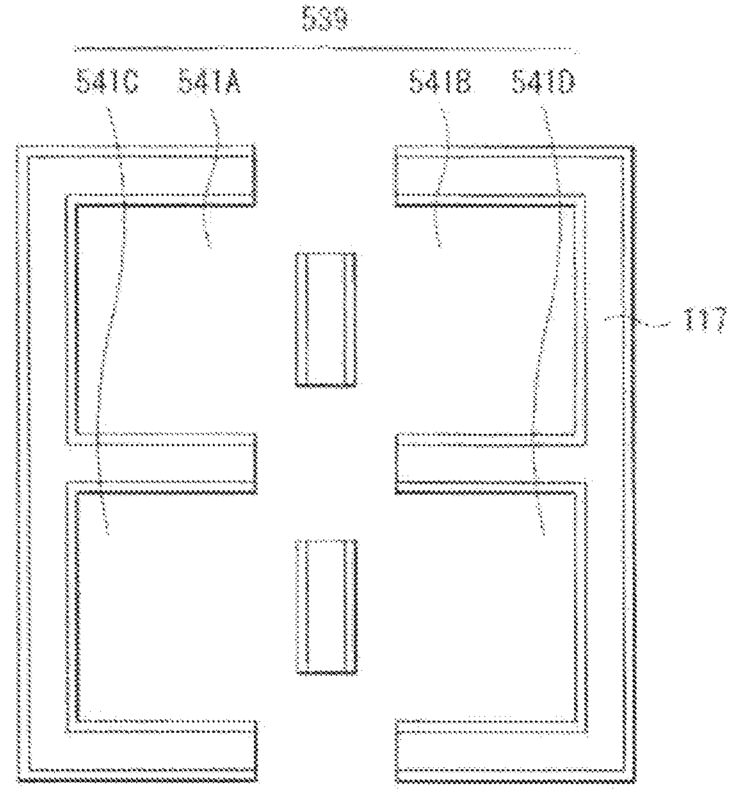

[FIG. 99]
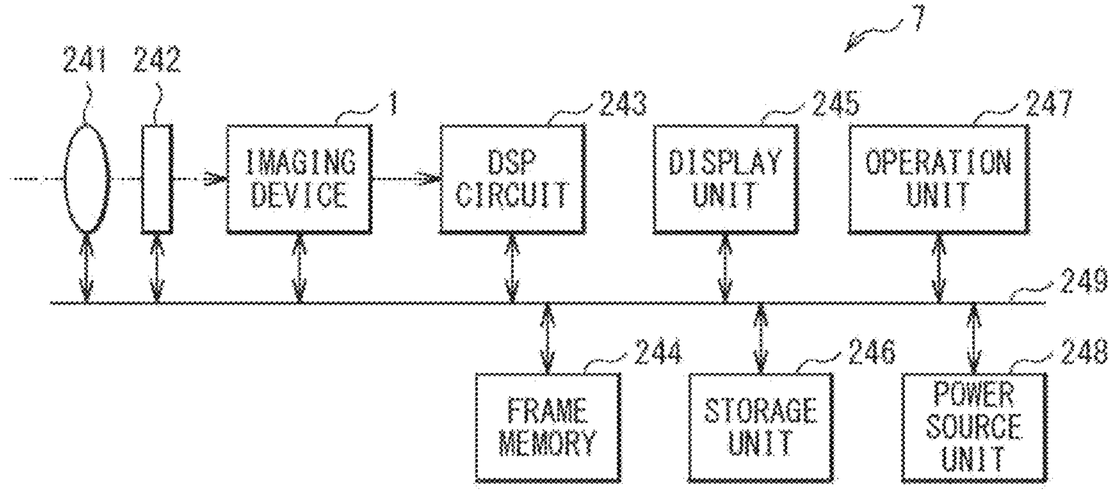
[FIG. 100]
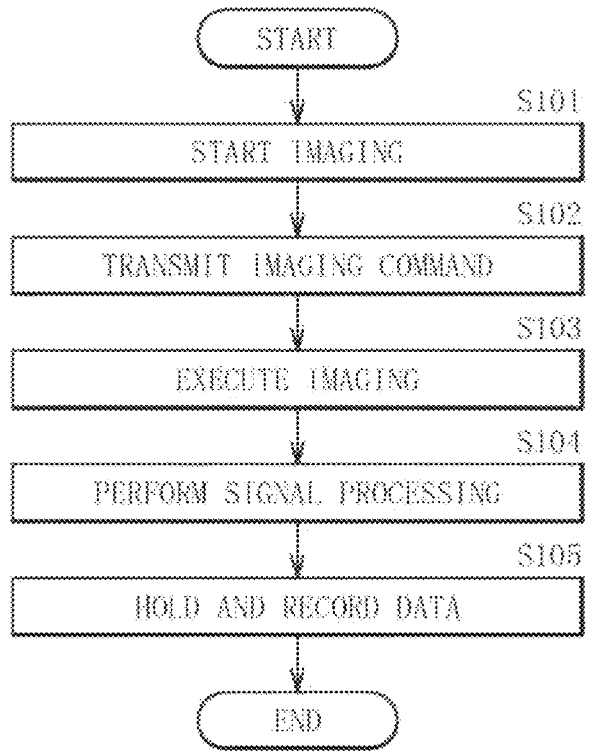

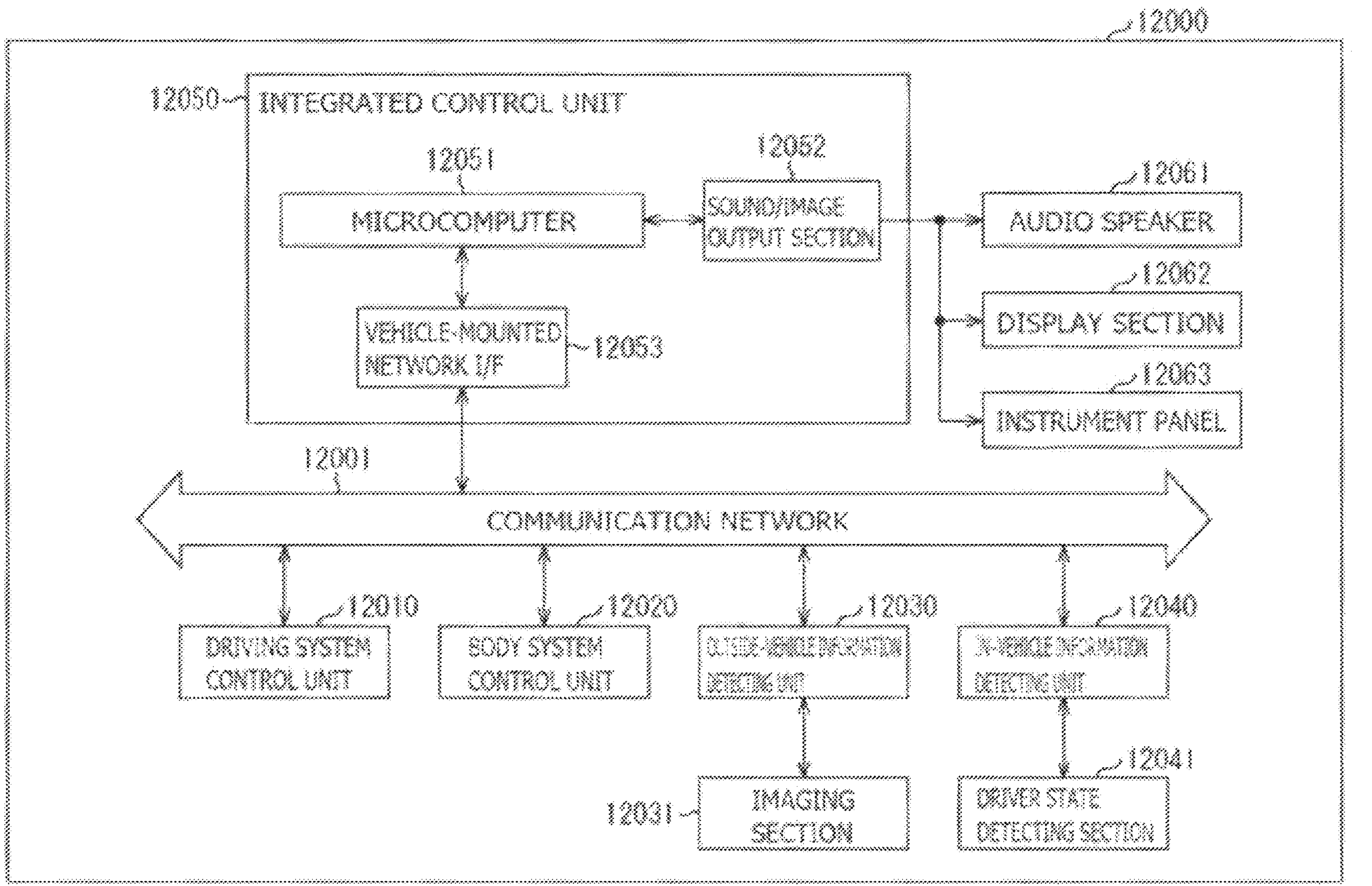
[FIG. 101]
12000
12050
INTEGRATED CONTROL UNIT
12051
MICROCOMPUTER
12052
SOUND/IMAGE OUTPUT SECTION
12053
VEHICLE-MOUNTED NETWORK I/F
12061
AUDIO SPEAKER
12062
DISPLAY SECTION
12063
INSTRUMENT PANEL
12001
COMMUNICATION NETWORK
12010
DRIVING SYSTEM CONTROL UNIT
12020
BODY SYSTEM CONTROL UNIT
12030
12040
12031
IMAGING SECTION
12041
DRIVER STATE DETECTING SECTION

[FIG. 102]
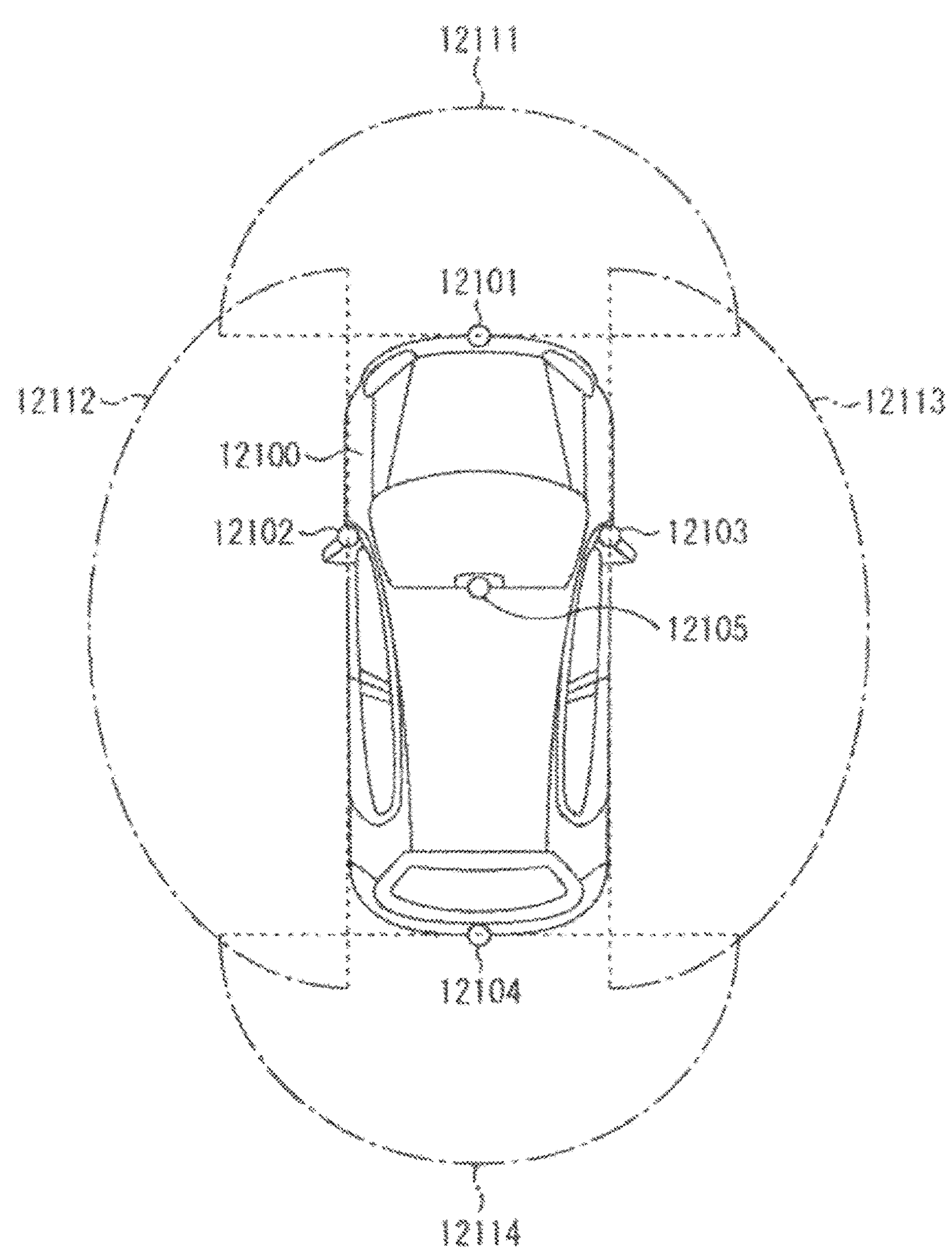

[FIG. 103]
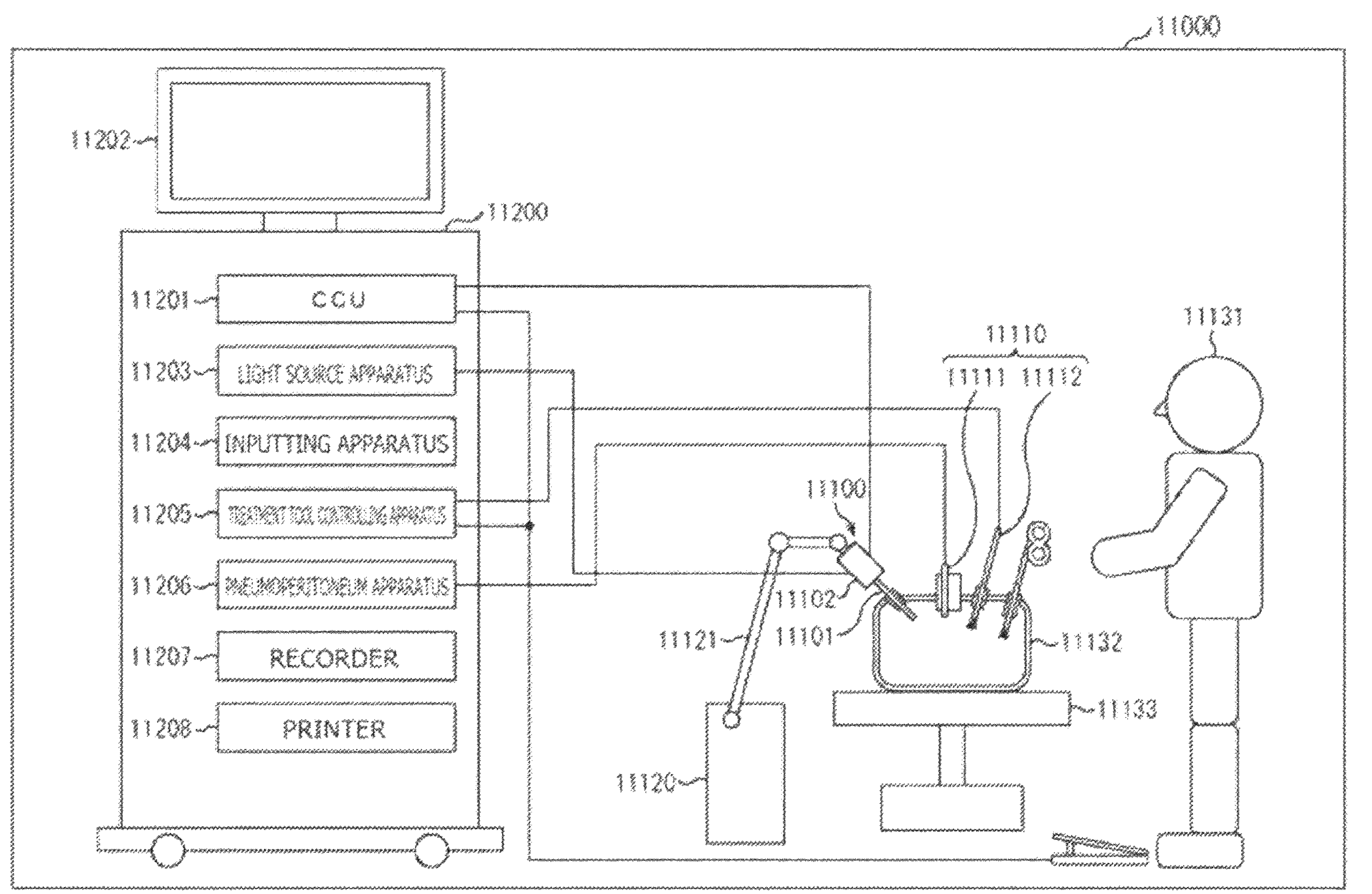

[FIG. 104]
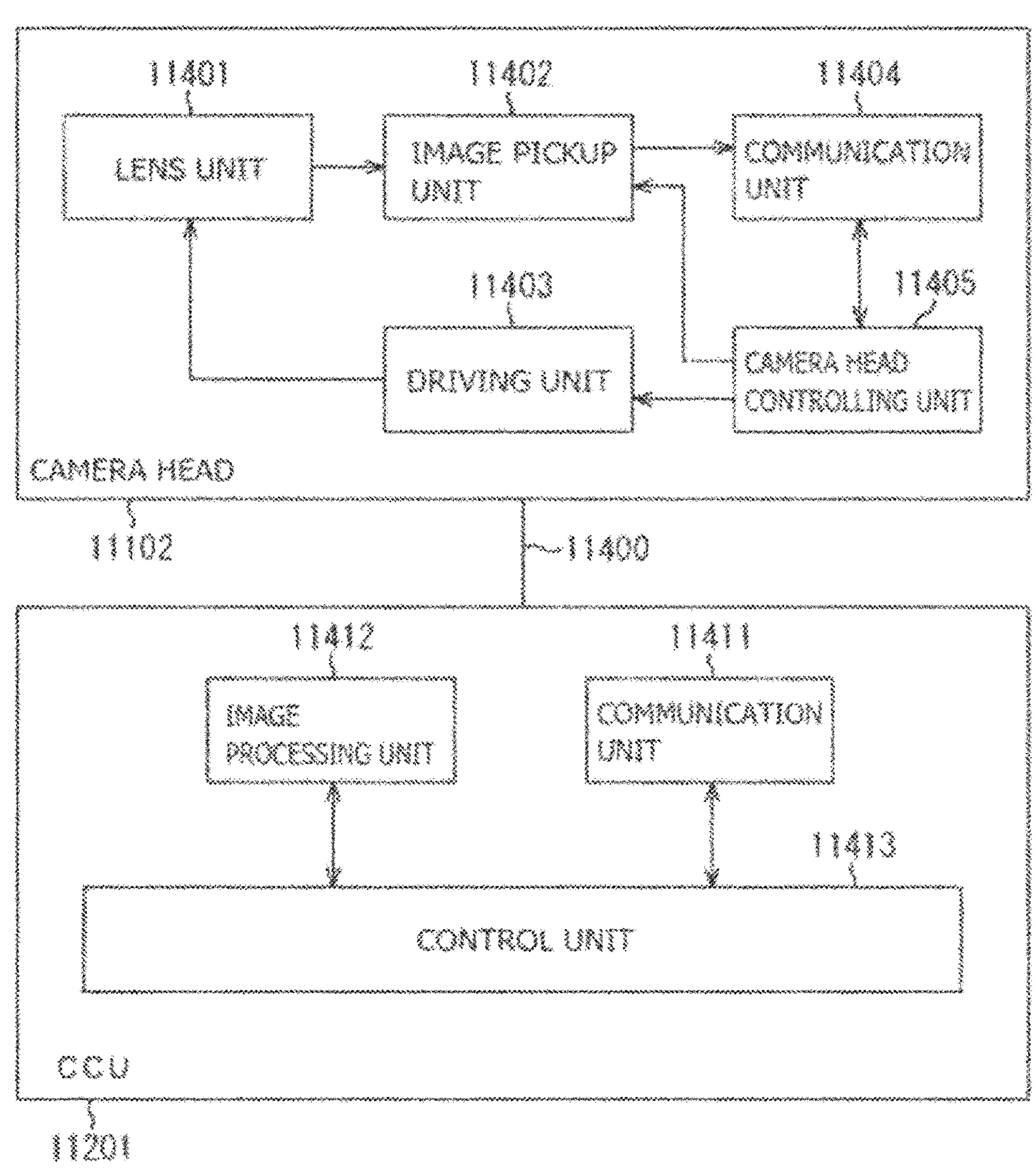

THREE-DIMENSIONALLY STRUCTURED IMAGING DEVICE

CROSS REFERENCE TO RELATED APPLICATIONS

This application is a continuation application of U.S. patent application Ser. No. 17/620,359 filed on Dec. 17, 2021, which is a U.S. National Phase of International Patent Application No. PCT/JP2020/024448 filed on Jun. 22, 2020, which claims priority benefit of Japanese Patent Application No. JP 2019-118647 filed in the Japan Patent Office on Jun. 26, 2019. Each of the above-referenced applications is hereby incorporated herein by reference in its entirety.

TECHNICAL FIELD

The present disclosure relates to an imaging device.

BACKGROUND ART

Miniaturization of an area per pixel of a two-dimensionally structured imaging device has been achieved by introduction of a miniaturizing process and improvement in packaging density. In recent years, in order to achieve further size reduction in an imaging device and higher pixel density, a three-dimensionally structured imaging device has been developed. The three-dimensionally structured imaging device is configured by stacking, for example, a semiconductor substrate including a plurality of sensor pixels and a semiconductor substrate including a signal processing circuit that processes a signal obtained at each sensor pixel, on each other (see PTL 1).

CITATION LIST

Patent Literature

PTL 1: Japanese Unexamined Patent Application Publication No. 2010-245506

SUMMARY OF THE INVENTION

The three-dimensionally structured imaging device tends to be subjected to influences of a resistive component, a capacity component, and an inductive component of a non-ideal electronic part or a wiring line more notably, because of complexity of the internal circuit structure, as compared with the two-dimensionally structured imaging device. Therefore, it is desired, in the three-dimensionally structured imaging device, to suppress the influence of the resistive component, the capacity component, and the inductive component generated in the electronic part or the wiring line.

It is therefore desirable to provide an imaging device that makes it possible to improve characteristics by reducing a capacity component caused by a three-dimensional structure.

An imaging device according to an embodiment of the present disclosure includes: a first substrate including a sensor pixel that performs photoelectric conversion; a second substrate including a pixel circuit that outputs a pixel signal on a basis of electric charges outputted from the sensor pixel; and a third substrate including a processing circuit that performs signal processing on the pixel signal. The first substrate, the second substrate, and the third substrate are stacked in this order, and a low-permittivity region is provided in at least any region around a circuit that reads electric charges from the sensor pixel and outputs the pixel signal.

In the imaging device according to an embodiment of the present disclosure, there are provided: a first substrate including a sensor pixel that performs photoelectric conversion; a second substrate including a pixel circuit that outputs a pixel signal on a basis of electric charges outputted from the sensor pixel; and a third substrate including a processing circuit that performs signal processing on the pixel signal, in which the first substrate, the second substrate, and the third substrate are stacked in this order, and a low-permittivity region is provided in at least any region around a circuit that reads electric charges from the sensor pixel and outputs the pixel signal. This makes it possible, for example, for the imaging device to reduce permittivity of a wiring line included in a second insulating layer or of a space around a second semiconductor substrate, in the second substrate including the second semiconductor substrate on which the second insulating layer is stacked.

BRIEF DESCRIPTION OF THE DRAWINGS

FIG. 1 is a schematic view of an example of an outline configuration of an imaging device 1 according to an embodiment of the present disclosure.

FIG. 2 is a circuit diagram illustrating an example of a sensor pixel 12 and a pixel circuit 22.

FIG. 3 is a circuit diagram illustrating another example of the sensor pixel 12 and the pixel circuit 22.

FIG. 4 is a circuit diagram illustrating another example of the sensor pixel 12 and the pixel circuit 22.

FIG. 5 is a circuit diagram illustrating another example of the sensor pixel 12 and the pixel circuit 22.

FIG. 6 is a circuit diagram illustrating an example of coupling between a plurality of pixel circuits 22 and a plurality of vertical signal lines 24.

FIG. 7 is a longitudinal cross-sectional view of an example of a cross-sectional configuration in a stacking direction of the imaging device 1.

FIG. 8 is a schematic view of an example of a cross-sectional configuration in a horizontal direction of the imaging device 1.

FIG. 9 is a schematic view of an example of the cross-sectional configuration in the horizontal direction of the imaging device 1.

FIG. 10 is a schematic view of an example of a wiring layout in a horizontal plane of the imaging device 1.

FIG. 11 is a schematic view of an example of the wiring layout in the horizontal plane of the imaging device 1.

FIG. 12 is a schematic view of an example of the wiring layout in the horizontal plane of the imaging device 1.

FIG. 13 is a schematic view of an example of the wiring layout in the horizontal plane of the imaging device 1.

FIG. 14 is a longitudinal cross-sectional view of an example of a cross-sectional configuration in the stacking direction of the imaging device 1 according to a first embodiment.

FIG. 15 is a longitudinal cross-sectional view of a cross-sectional configuration in the stacking direction of the imaging device 1 in which a floating diffusion FD is shared by a plurality of sensor pixels 12.

FIG. 16 is a plan view of a planar arrangement of a second semiconductor substrate 21 and a separation insulating layer 53 in a pixel region 13.

FIG. 17 is a plan view of a planar arrangement of a through-wiring line 54, a coupling section 59, and a gate electrode in the pixel region 13.

FIG. 18 is a plan view of a planar arrangement of a coupling wiring line 55 in the pixel region 13.

FIG. 19 is a plan view of a planar arrangement of wiring lines included in a wiring layer 56 in the pixel region 13.

FIG. 20A is a longitudinal cross-sectional view that describes an example of a method of forming a low-permittivity region 90A.

FIG. 20B is a longitudinal cross-sectional view that describes an example of the method of forming the low-permittivity region 90A.

FIG. 20C is a longitudinal cross-sectional view that describes an example of the method of forming the low-permittivity region 90A.

FIG. 20D is a longitudinal cross-sectional view that describes an example of the method of forming the low-permittivity region 90A.

FIG. 20E is a longitudinal cross-sectional view that describes an example of a method of forming low-permittivity regions 90B and 90C.

FIG. 20F is a longitudinal cross-sectional view that describes an example of the method of forming the low-permittivity regions 90B and 90C.

FIG. 20G is a longitudinal cross-sectional view that describes an example of the method of forming the low-permittivity regions 90B and 90C.

FIG. 21 is a schematic cross-sectional view that describes a variation in a cross-sectional shape of the low-permittivity regions 90A, 90B, and 90C.

FIG. 22A is a longitudinal cross-sectional view that describes each process of another example of the method of forming the low-permittivity region 90A.

FIG. 22B is a longitudinal cross-sectional view that describes each process of another example of the method of forming the low-permittivity region 90A.

FIG. 22C is a longitudinal cross-sectional view that describes each process of another example of the method of forming the low-permittivity region 90A.

FIG. 22D is a longitudinal cross-sectional view that describes each process of another example of the method of forming the low-permittivity region 90A.

FIG. 22E is a longitudinal cross-sectional view that describes each process of another example of the method of forming the low-permittivity region 90A.

FIG. 22F is a longitudinal cross-sectional view that describes each process of another example of the method of forming the low-permittivity region 90A.

FIG. 22G is a longitudinal cross-sectional view that describes each process of another example of the method of forming the low-permittivity region 90A.

FIG. 22H is a longitudinal cross-sectional view that describes each process of another example of the method of forming the low-permittivity region 90A.

FIG. 23 includes a cross-sectional view and a top view schematically illustrating a configuration of a stack of a first substrate 10 and a second substrate 20 according to a second embodiment.

FIG. 24A is a longitudinal cross-sectional view that describes each process of a first method of forming a low-permittivity region 1290.

FIG. 24B is a longitudinal cross-sectional view that describes each process of the first method of forming the low-permittivity region 1290.

FIG. 24C is a longitudinal cross-sectional view that describes each process of the first method of forming the low-permittivity region 1290.

FIG. 24D is a longitudinal cross-sectional view that describes each process of the first method of forming the low-permittivity region 1290.

FIG. 24E is a longitudinal cross-sectional view that describes each process of the first method of forming the low-permittivity region 1290.

FIG. 24F is a longitudinal cross-sectional view that describes each process of the first method of forming the low-permittivity region 1290.

FIG. 24G is a longitudinal cross-sectional view that describes each process of the first method of forming the low-permittivity region 1290.

FIG. 24H is a longitudinal cross-sectional view that describes each process of the first method of forming the low-permittivity region 1290.

FIG. 24I is a longitudinal cross-sectional view that describes each process of the first method of forming the low-permittivity region 1290.

FIG. 24J is a longitudinal cross-sectional view that describes each process of the first method of forming the low-permittivity region 1290.

FIG. 24K is a longitudinal cross-sectional view that describes each process of the first method of forming the low-permittivity region 1290.

FIG. 24L is a longitudinal cross-sectional view that describes each process of the first method of forming the low-permittivity region 1290.

FIG. 25A is a longitudinal cross-sectional view that describes each process of a second method of forming the low-permittivity region 1290.

FIG. 25B is a longitudinal cross-sectional view that describes each process of the second method of forming the low-permittivity region 1290.

FIG. 25C is a longitudinal cross-sectional view that describes each process of the second method of forming the low-permittivity region 1290.

FIG. 25D is a longitudinal cross-sectional view that describes each process of the second method of forming the low-permittivity region 1290.

FIG. 25E is a longitudinal cross-sectional view that describes each process of the second method of forming the low-permittivity region 1290.

FIG. 25F is a longitudinal cross-sectional view that describes each process of the second method of forming the low-permittivity region 1290.

FIG. 26 is a schematic cross-sectional view of an example of parasitic capacitance generated in the stack in which the first substrate 10 and the second substrate 20 are stacked.

FIG. 27 is a longitudinal cross-sectional view of a region where the low-permittivity region is provided in a first aspect of a third embodiment.

FIG. 28 is a longitudinal cross-sectional view of a region where the low-permittivity region is provided in a second aspect of the third embodiment FIG. 29A includes a plan view and a longitudinal cross-sectional view that describe a first method of forming a low-permittivity region 1391 in the first aspect.

FIG. 29B includes a plan view and a longitudinal cross-sectional view that describe the first method of forming the low-permittivity region 1391 in the first aspect.

FIG. 29C includes a plan view and a longitudinal cross-sectional view that describe the first method of forming the low-permittivity region 1391 in the first aspect.

FIG. 30 includes a plan view and a longitudinal cross-sectional view of a variation in formation of an opening 1393 illustrated in FIG. 29A.

FIG. 31A includes a plan view and a longitudinal cross-sectional view of a variation in a shape of the low-permittivity region 1391 in the first aspect.

FIG. 31B includes a plan view and a longitudinal cross-sectional view of a variation in the shape of the low-permittivity region 1391 in the first aspect.

FIG. 31C includes a plan view and a longitudinal cross-sectional view of a variation in the shape of the low-permittivity region 1391 in the first aspect.

FIG. 31D includes a plan view and a longitudinal cross-sectional view of a variation in the shape of the low-permittivity region 1391 in the first aspect.

FIG. 31E includes a plan view and a longitudinal cross-sectional view of a variation in the shape of the low-permittivity region 1391 in the first aspect.

FIG. 31F includes a plan view and a longitudinal cross-sectional view of a variation in the shape of the low-permittivity region 1391 in the first aspect.

FIG. 32A includes a plan view and a longitudinal cross-sectional view that describe a second method of forming the low-permittivity region 1391 in the first aspect.

FIG. 32B includes a plan view and a longitudinal cross-sectional view that describe the second method of forming the low-permittivity region 1391 in the first aspect.

FIG. 32C includes a plan view and a longitudinal cross-sectional view that describe the second method of forming the low-permittivity region 1391 in the first aspect.

FIG. 33A includes a plan view and a longitudinal cross-sectional view of a variation in formation of the opening 1393 illustrated in FIGS. 32A, 32B, and 32C.

FIG. 33B includes a plan view and a longitudinal cross-sectional view of a variation in the formation of the opening 1393 illustrated in FIGS. 32A, 32B, and 32C.

FIG. 33C includes a plan view and a longitudinal cross-sectional view of a variation in the formation of the opening 1393 illustrated in FIGS. 32A, 32B, and 32C.

FIG. 34A includes a plan view and a longitudinal cross-sectional view of a variation in the shape of the low-permittivity region 1391 in the first aspect.

FIG. 34B includes a plan view and a longitudinal cross-sectional view of a variation in the shape of the low-permittivity region 1391 in the first aspect.

FIG. 34C includes a plan view and a longitudinal cross-sectional view of a variation in the shape of the low-permittivity region 1391 in the first aspect.

FIG. 35A is a longitudinal cross-sectional view that describes a third method of forming the low-permittivity region 1391 in the first aspect.

FIG. 35B is a longitudinal cross-sectional view that describes the third method of forming the low-permittivity region 1391 in the first aspect.

FIG. 35C is a longitudinal cross-sectional view that describes the third method of forming the low-permittivity region 1391 in the first aspect.

FIG. 35D is a longitudinal cross-sectional view that describes the third method of forming the low-permittivity region 1391 in the first aspect.

FIG. 36A is a longitudinal cross-sectional view that describes a variation in the third method of forming the low-permittivity region 1391 in the first aspect.

FIG. 36B is a longitudinal cross-sectional view that describes a variation in the third method of forming the low-permittivity region 1391 in the first aspect.

FIG. 36C is a longitudinal cross-sectional view that describes a variation in the third method of forming the low-permittivity region 1391 in the first aspect.

FIG. 37A is a longitudinal cross-sectional view that describes a fourth method of forming the low-permittivity region 1391 in the first aspect.

FIG. 37B is a longitudinal cross-sectional view that describes the fourth method of forming the low-permittivity region 1391 in the first aspect.

FIG. 37C is a longitudinal cross-sectional view that describes the fourth method of forming the low-permittivity region 1391 in the first aspect.

FIG. 38A is a longitudinal cross-sectional view that describes a first method of forming a low-permittivity region 1392 in the second aspect.

FIG. 38B is a longitudinal cross-sectional view that describes the first method of forming the low-permittivity region 1392 in the second aspect.

FIG. 38C is a longitudinal cross-sectional view that describes the first method of forming the low-permittivity region 1392 in the second aspect.

FIG. 38D is a longitudinal cross-sectional view that describes the first method of forming the low-permittivity region 1392 in the second aspect.

FIG. 39A is a plan view of a variation in a shape of the low-permittivity region 1392 in the second aspect.

FIG. 39B is a plan view of a variation in the shape of the low-permittivity region 1392 in the second aspect.

FIG. 39C is a plan view of a variation in the shape of the low-permittivity region 1392 in the second aspect.

FIG. 39D is a plan view of a variation in the shape of the low-permittivity region 1392 in the second aspect.

FIG. 40A is a longitudinal cross-sectional view that describes a second method of forming the low-permittivity region 1392 in the second aspect.

FIG. 40B is a longitudinal cross-sectional view that describes the second method of forming the low-permittivity region 1392 in the second aspect.

FIG. 40C is a longitudinal cross-sectional view that describes the second method of forming the low-permittivity region 1392 in the second aspect.

FIG. 40D is a longitudinal cross-sectional view that describes the second method of forming the low-permittivity region 1392 in the second aspect.

FIG. 41A is a longitudinal cross-sectional view that describes a third method of forming the low-permittivity region 1932 in the second aspect.

FIG. 41B is a longitudinal cross-sectional view that describes the third method of forming the low-permittivity region 1932 in the second aspect.

FIG. 41C is a longitudinal cross-sectional view that describes the third method of forming the low-permittivity region 1932 in the second aspect.

FIG. 41D is a longitudinal cross-sectional view that describes the third method of forming the low-permittivity region 1932 in the second aspect.

FIG. 41E is a longitudinal cross-sectional view that describes the third method of forming the low-permittivity region 1932 in the second aspect.

FIG. 42A is a longitudinal cross-sectional view that describes a fourth method of forming the low-permittivity region 1932 in the second aspect.

FIG. 42B is a longitudinal cross-sectional view that describes the fourth method of forming the low-permittivity region 1932 in the second aspect.

FIG. 42C is a longitudinal cross-sectional view that describes the fourth method of forming the low-permittivity region 1932 in the second aspect.

FIG. 42D is a longitudinal cross-sectional view that describes the fourth method of forming the low-permittivity region 1932 in the second aspect.

FIG. 42E is a longitudinal cross-sectional view that describes the fourth method of forming the low-permittivity region 1932 in the second aspect.

FIG. 43 is a longitudinal cross-sectional view of a modification example of the cross-sectional configuration illustrated in FIG. 7.

FIG. 44 is a longitudinal cross-sectional view of a modification example of the cross-sectional configuration illustrated in FIG. 7.

FIG. 45 is a cross-sectional view in a thickness direction of a configuration example of an imaging device according to a fourth modification example.

FIG. 46 is a cross-sectional view in the thickness direction of the configuration example of the imaging device according to the fourth modification example.

FIG. 47 is a cross-sectional view in the thickness direction of the configuration example of the imaging device according to the fourth modification example.

FIG. 48 is a cross-sectional view in a horizontal direction of a layout example of a plurality of pixel units according to the fourth modification example.

FIG. 49 is a cross-sectional view in the horizontal direction of a layout example of the plurality of pixel units according to the fourth modification example.

FIG. 50 is a cross-sectional view in the horizontal direction of a layout example of the plurality of pixel units according to the fourth modification example.

FIG. 51 is a schematic view of a modification example of cross-sectional configurations along a cut plane Sec1 and a cut plane Sec2 in FIG. 7.

FIG. 52 is a schematic view of a modification example of the cross-sectional configurations along the cut plane Sec1 and the cut plane Sec2 in FIG. 7.

FIG. 53 is a schematic view of a modification example of the cross-sectional configurations along the cut plane Sec1 and the cut plane Sec2 in FIG. 7.

FIG. 54 is a schematic view of a modification example of the cross-sectional configurations along the cut plane Sec1 and the cut plane Sec2 in FIG. 7.

FIG. 55 is a schematic view of a modification example of the cross-sectional configurations along the cut plane Sec1 and the cut plane Sec2 in FIG. 7.

FIG. 56 is a schematic view of another example of the cross-sectional configuration along the cut plane Sec2 of the imaging device 1 according to a seventh modification example.

FIG. 57 is a schematic view of another example of the cross-sectional configuration along the cut plane Sec2 of the imaging device 1 according to the seventh modification example.

FIG. 58 is a schematic view of a circuit configuration of a CMOS image sensor mounted on a column parallel ADC.

FIG. 59 is a schematic view of an example of a configuration in which the imaging device 1 illustrated in FIG. 58 includes three substrates that are stacked.

FIG. 60 is a schematic view of an example of a cross-sectional configuration of the imaging device 1 according to a tenth modification example.

FIG. 61 is a schematic view of an example in which a low-resistance region 26 including a silicide such as $CoSi_2$ or NiSi is applied to the imaging device 1 including the substrates that are stacked.

FIG. 62 is a block diagram illustrating an example of a functional configuration of an imaging device according to an embodiment of the present disclosure.

FIG. 63 is a schematic plan view of an outline configuration of the imaging device illustrated in FIG. 62.

FIG. 64 is a schematic view of a cross-sectional configuration taken along a line III-III' illustrated in FIG. 63.

FIG. 65 is an equivalent circuit diagram of a pixel sharing unit illustrated in FIG. 62.

FIG. 66 illustrates an example of a coupling mode between a plurality of pixel sharing units and a plurality of vertical signal lines.

FIG. 67 is a schematic cross-sectional view of an example of a specific configuration of an imaging device illustrated in FIG. 64.

FIG. 68A is a schematic view of an example of a planar configuration of a main part of a first substrate illustrated in FIG. 67.

FIG. 68B is a schematic view of a planar configuration of a pad section together with the main part of first substrate illustrated in FIG. 68A.

FIG. 69 is a schematic view of an example of a planar configuration of a second substrate (semiconductor layer) illustrated in FIG. 67.

FIG. 70 is a schematic view of an example of a planar configuration of main parts of a pixel circuit and the first substrate together with a first wiring layer illustrated in FIG. 67.

FIG. 71 is a schematic view of an example of a planar configuration of the first wiring layer and a second wiring layer illustrated in FIG. 67.

FIG. 72 is a schematic view of an example of a planar configuration of the second wiring layer and a third wiring layer illustrated in FIG. 67.

FIG. 73 is a schematic view of an example of a planar configuration of the third wiring layer and a fourth wiring layer illustrated in FIG. 67.

FIG. 74 is a schematic view for describing a path of an input signal to the imaging device illustrated in FIG. 64.

FIG. 75 is a schematic view for describing a signal path of a pixel signal of the imaging device illustrated in FIG. 64.

FIG. 76 is a schematic view of a modification example of the planar configuration of the second substrate (semiconductor layer) illustrated in FIG. 69.

FIG. 77 is a schematic view of a planar configuration of main parts of the first wiring layer and the first substrate together with a pixel circuit illustrated in FIG. 76.

FIG. 78 is a schematic view of an example of a planar configuration of a second wiring layer together with the first wiring layer illustrated in FIG. 77.

FIG. 79 is a schematic view of an example of a planar configuration of a third wiring layer together with the second wiring layer illustrated in FIG. 78.

FIG. 80 is a schematic view of an example of a planar configuration of a fourth wiring layer together with the third wiring layer illustrated in FIG. 79.

FIG. 81 is a schematic view of a modification example of the planar configuration of the first substrate illustrated in FIG. 68A.

FIG. 82 is a schematic view of an example of a planar configuration of a second substrate (semiconductor layer) to be stacked on the first substrate illustrated in FIG. 81.

FIG. 83 is a schematic view of an example of a planar configuration of the first wiring layer together with a pixel circuit illustrated in FIG. 82.

FIG. 84 is a schematic view of an example of a planar configuration of a second wiring layer together with the first wiring layer illustrated in FIG. 83.

FIG. 85 is a schematic view of an example of a planar configuration of a third wiring layer together with the second wiring layer illustrated in FIG. 84.

FIG. 86 is a schematic view of an example of a planar configuration of a fourth wiring layer together with the third wiring layer illustrated in FIG. 85.

FIG. 87 is a schematic view of another example of the planar configuration of the first substrate illustrated in FIG. 81.

FIG. 88 is a schematic view of an example of a planar configuration of a second substrate (semiconductor layer) to be stacked on the first substrate illustrated in FIG. 87.

FIG. 89 is a schematic view of an example of a planar configuration of a first wiring layer together with a pixel circuit illustrated in FIG. 88.

FIG. 90 is a schematic view of an example of a planar configuration of a second wiring layer together with the first wiring layer illustrated in FIG. 89.

FIG. 91 is a schematic view of an example of a planar configuration of a third wiring layer together with the second wiring layer illustrated in FIG. 90.

FIG. 92 is a schematic view of an example of a planar configuration of a fourth wiring layer together with the third wiring layer illustrated in FIG. 91.

FIG. 93 is a schematic cross-sectional view of another example of the imaging device illustrated in FIG. 64.

FIG. 94 is a schematic view for describing a path of an input signal to the imaging device illustrated in FIG. 93.

FIG. 95 is a schematic view for describing a signal path of a pixel signal of the imaging device illustrated in FIG. 93.

FIG. 96 is a schematic cross-sectional view of another example of the imaging device illustrated in FIG. 67.

FIG. 97 illustrates another example of an equivalent circuit illustrated in FIG. 65.

FIG. 98 is a schematic plan view of another example of a pixel separation section illustrated in FIG. 68A and the like.

FIG. 99 illustrates an example of an outline configuration of an imaging system including the imaging device according to any of the embodiments described above and the modification examples thereof.

FIG. 100 illustrates an example of an imaging procedure in the imaging system illustrated in FIG. 99.

FIG. 101 is a block diagram depicting an example of schematic configuration of a vehicle control system.

FIG. 102 is a diagram of assistance in explaining an example of installation positions of an outside-vehicle information detecting section and an imaging section.

FIG. 103 is a view depicting an example of a schematic configuration of an endoscopic surgery system.

FIG. 104 is a block diagram depicting an example of a functional configuration of a camera head and a camera control unit (CCU).

MODES FOR CARRYING OUT THE INVENTION

Some embodiments of the present disclosure are described below in detail with reference to the drawings. The embodiments described below are merely specific examples of the present disclosure, and the technique according to the present disclosure is not limited to the modes described below. Further, properties of constituent elements of the present disclosure, such as arrangement, dimensions, and dimension ratios illustrated in drawings of the present disclosure are not limited to those illustrated in the drawings. It is to be noted that description is given in the following order.

1. Configuration of Imaging Device
2. First Embodiment
3. Second Embodiment
4. Third Embodiment
5. Modification Examples
6. Specific Examples 6.1. Embodiment (Imaging Device having Stacked Structure of Three Substrates)
6.2. Modification Example 1 (Planar Configuration Example 1)
6.3. Modification Example 2 (Planar Configuration Example 2)
6.4. Modification Example 3 (Planar Configuration Example 3)
6.5. Modification Example 4 (Example of Including Contact Section between Substrates in Middle Part of Pixel Array Section)
6.6. Modification Example 5 (Example of Including Planar Transfer Transistor)
6.7. Modification Example 6 (Example in which One Pixel is Coupled to One Pixel Circuit)
6.8. Modification Example 7 (Configuration Example of Pixel Separation Section)
6.9. Applicable Example (Imaging System)
6.10. Application Examples

1. Configuration of Imaging Device

First, description is given, with reference to FIGS. 1 to 13, of an imaging device to which a technique according to the present disclosure is applied.

FIG. 1 is a schematic view of an example of an outline configuration of an imaging device 1 according to an embodiment of the present disclosure. As illustrated in FIG. 1, the imaging device 1 is a three-dimensionally structured imaging device including a first substrate 10, a second substrate 20, and a third substrate 30, and has a configuration in which these three substrates are attached together. It is to be noted that the first substrate 10, the second substrate 20, and the third substrate 30 are stacked in this order.

The first substrate 10 includes a first semiconductor substrate 11 including a plurality of sensor pixels 12 that perform photoelectric conversion. The plurality of sensor pixels 12 are provided to be arranged in matrix inside a pixel region 13 of the first substrate 10.

The second substrate 20 includes a second semiconductor substrate 21 including a pixel circuit 22 that outputs a pixel signal on the basis of electric charges from the sensor pixel 12. For example, one pixel circuit 22 is provided for every four sensor pixels 12; the pixel circuit 22 is a readout circuit that sequentially reads electric charges having been photoelectrically converted from the four sensor pixels 12. In addition, the second substrate 20 includes a plurality of pixel drive lines 23 extending in a row direction and a plurality of vertical signal lines 24 extending in a column direction.

The third substrate 30 includes a third semiconductor substrate 31 including a processing circuit 32 that performs signal processing on a pixel signal. In addition, the processing circuit 32 includes, for example, a vertical drive circuit 33, a column signal processing circuit 34, a horizontal drive circuit 35, and a system control circuit 36. The processing circuit 32 is able to output an output voltage Vout for each sensor pixel 12 from the horizontal drive circuit 35 to the outside.

The vertical drive circuit 33 sequentially selects the plurality of sensor pixels 12 on a row-by-row basis, for example. The column signal processing circuit 34 performs, for example, correlation double sampling processing on a pixel signal outputted from each sensor pixel 12 of a row selected by the vertical drive circuit 33. For example, the column signal processing circuit 34 performs the correlation double sampling processing to thereby extract a signal level of the pixel signal, thus being able to hold pixel data corresponding to an amount of light received by each sensor pixel 12. The horizontal drive circuit 35 sequentially outputs the pixel data held in the column signal processing circuit 34, for example, to the outside. The system control circuit 36 controls driving of each configuration inside the processing circuit 32, for example. This enables the processing circuit 32 to output the pixel data based on the amount of light received by each of the sensor pixels 12 to the outside.

FIG. 2 is a circuit diagram illustrating an example of the sensor pixel 12 and the pixel circuit 22. In the circuit diagram illustrated in FIG. 2, four sensor pixels 12 share one pixel circuit 22. The term "share" as used here means that outputs from the four sensor pixels 12 are inputted to the common one pixel circuit 22.

Each of the sensor pixels 12 has a component common to each other. In the following, in a case where respective components of the sensor pixels 12 are distinguished from one another, identification numbers (1, 2, 3, and 4) are each assigned at the end of a symbol of the component. Meanwhile, in a case where the sensor pixels 12 are not distinguished from one another, the assigning of the identification number at the end of the symbol of the component is omitted.

The sensor pixel 12 includes, for example, a photodiode PD, a transfer transistor TR electrically coupled to the photodiode PD, and a floating diffusion FD that temporarily holds electric charges outputted from the photodiode PD via the transfer transistor TR. The photodiode PD is a photoelectric conversion element that performs photoelectric conversion to thereby generate electric charges corresponding to an amount of light reception. The transfer transistor TR is, for example, a MOS (Metal-Oxide-Semiconductor) transistor.

A cathode of the photodiode PD is electrically coupled to a source of the transfer transistor TR, and an anode of the photodiode PD is electrically coupled to a reference potential line. A drain of the transfer transistor TR is electrically coupled to the floating diffusion FD, and a gate of the transfer transistor TR is electrically coupled to a pixel drive line 23.

Respective floating diffusions FD of the sensor pixels 12 sharing the pixel circuit 22 are electrically coupled to one another, and are electrically coupled to an input end of the common pixel circuit 22. The pixel circuit 22 includes, for example, a reset transistor RST, a selection transistor SEL, and an amplification transistor AMP. In addition, the pixel circuit 22 optionally includes the selection transistor SEL. A source of the reset transistor RST (i.e., an input end of the pixel circuit 22) is electrically coupled to the floating diffusion FD; a drain of the reset transistor RST is electrically coupled to a power source line VDD and a drain of the amplification transistor AMP; and a gate of the reset transistor RST is electrically coupled to the pixel drive line 23. A source of the amplification transistor AMP is electrically coupled to a drain of the selection transistor SEL, and a gate of the amplification transistor AMP is electrically coupled to the source of the reset transistor RST. A source of the selection transistor SEL (i.e., an output end of the pixel circuit 22) is electrically coupled to the vertical signal line 24, and a gate of the selection transistor SEL is electrically coupled to the pixel drive line 23.

The transfer transistor TR brought into an ON state transfers electric charges having been photoelectrically converted by the photodiode PD to the floating diffusion FD. The reset transistor RST resets a potential of the floating diffusion FD to a predetermined potential. The reset transistor RST brought into an ON state resets the potential of the floating diffusion FD to a potential of the power source line VDD. The selection transistor SEL controls an output timing of a pixel signal from the pixel circuit 22.

The amplification transistor AMP generates, as a pixel signal, a signal of a voltage corresponding to the level of electric charges held in the floating diffusion FD. The amplification transistor AMP constitutes an amplifier of so-called source follower type, and outputs a pixel signal of a voltage corresponding to the level of electric charges generated in the photodiode PD. In a case where the selection transistor SEL is brought into an ON state, the amplification transistor AMP amplifies the potential of the floating diffusion FD, and outputs a voltage corresponding to the amplified potential to the column signal processing circuit 34 via the vertical signal line 24. The reset transistor RST, the amplification transistor AMP, and the selection transistor SEL are each, for example, a MOS transistor.

FIGS. 3 to 5 are each a circuit diagram illustrating another example of the sensor pixel 12 and the pixel circuit 22.

As illustrated in FIG. 3, the selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the pixel drive line 23. The source of the amplification transistor AMP (i.e., an output end of the pixel circuit 22) is electrically coupled to the vertical signal line 24, and the gate of the amplification transistor AMP is electrically coupled to the source of the reset transistor RST.

In addition, as illustrated in FIG. 4 or 5, an FD conversion gain switching transistor FDG may be further provided between the source of the reset transistor RST and the gate of the amplification transistor AMP.

Electric charge Q is represented by a product of a capacity C and a voltage V; thus, in a case where the capacity C of the floating diffusion FD is large, the voltage V after conversion at the amplification transistor AMP becomes lower. Meanwhile, in a case where the electric charge Q of the pixel signal is large, the floating diffusion FD is not able to keep holding the electric charge Q from the photodiode PD, unless the capacity C of the floating diffusion FD is sufficiently large. In addition, it is also crucial that the capacity C of the floating diffusion FD be moderately large not to allow the voltage V converted at the amplification transistor AMP to be too high. Therefore, the FD conversion gain switching transistor FDG is provided to switch electric charge-voltage conversion efficiency in the pixel circuit 22.

The FD conversion gain switching transistor FDG is brought into an ON state to thereby increase the capacity C of the floating diffusion FD by an amount of the gate capacity of the FD conversion gain switching transistor FDG, as compared with an OFF state. Accordingly, by switching the ON or OFF state of the FD conversion gain switching transistor FDG to allow the capacity C of the floating diffusion FD to be variable, it is possible to switch the electric charge-voltage conversion efficiency in the pixel circuit 22.

FIG. 6 is a circuit diagram illustrating an example of coupling between a plurality of pixel circuits 22 and the plurality of vertical signal lines 24. As illustrated in FIG. 6, in a case where the plurality of pixel circuits 22 are arranged side by side in an extending direction of the vertical signal line 24 (e.g., a column direction), the plurality of vertical signal lines 24 may be assigned one by one to the respective pixel circuits 22. It is to be noted that, in FIG. 6, identification numbers (1, 2, 3, and 4) are assigned at the ends of respective symbols of the vertical signal lines 24 in order to distinguish the vertical signal lines 24 from one another.

FIG. 7 is a longitudinal cross-sectional view of an example of a cross-sectional configuration in a stacking direction of the imaging device 1.

As illustrated in FIG. 7, the imaging device 1 has a configuration in which the first substrate 10, the second substrate 20, and the third substrate 30 are stacked in this order. A color filter 40 and a light-receiving lens 50 are provided, for example, for each sensor pixel 12 on side of a light incident surface (also referred to as back surface side) of the first substrate 10. That is, the imaging device 1 is an imaging device of so-called back-illuminated type.

The first substrate 10 has a configuration in which a first insulating layer 46 is stacked on the first semiconductor substrate 11. The first semiconductor substrate 11 is a silicon substrate, and includes, for example, a p-well layer 42 in a portion of a front surface or in the vicinity thereof as well as the photodiode PD in other regions (i.e., a region deeper than the p-well layer 42). The p-well layer 42 is configured by a p-type semiconductor region, and the photodiode PD is configured by a semiconductor region of an electrically-conductive type (specifically, n-type) different from that of the p-well layer 42. The first semiconductor substrate 11 includes, inside the p-well layer 42, the floating diffusion FD which is a semiconductor region of an electrically-conductive type (specifically, n-type) different from that of the p-well layer 42.

The first substrate 10 includes, for each sensor pixel 12, the photodiode PD, the transfer transistor TR, and the floating diffusion FD. The first substrate 10 includes the transfer transistor TR and the floating diffusion FD in a portion on side opposite to the side of the light incident surface (i.e., front surface side or side of the second substrate 20) of the first semiconductor substrate 11.

The first substrate 10 includes an element separation section 43 that separates the sensor pixels 12 from each other. The element separation section 43 is formed to extend in a normal direction of a main surface of the first semiconductor substrate 11 (a direction perpendicular to the front surface of the first semiconductor substrate 11), and electrically separates the adjacent sensor pixels 12 from each other. The element separation section 43 includes, for example, silicon oxide that penetrates the first semiconductor substrate 11.

The first substrate 10 includes, for example, a p-well layer 44 in contact with a side surface of the element separation section 43 on side of the photodiode PD. The p-well layer 44 is configured by a semiconductor region of an electrically-conductive type (specifically, p-type) different from that of the photodiode PD. The first substrate 10 includes, for example, a fixed charge film 45 in contact with the back surface of the first semiconductor substrate 11. The fixed charge film 45 includes an insulating film having negative fixed electric charges in order to suppress generation of a dark current due to an interface state on side of a light-receiving surface of the first semiconductor substrate 11. Examples of a material of the fixed charge film 45 may include hafnium oxide, zirconium oxide, aluminum oxide, titanium oxide, and tantalum oxide. The fixed charge film 45 induces an electric field to thereby form, at the interface on the side of the light-receiving surface of the first semiconductor substrate 11, a hole accumulation layer that suppresses generation of electrons from the interface.

The color filter 40 is provided on side of the back surface of the first semiconductor substrate 11. Specifically, the color filter 40 is provided in contact with the fixed charge film 45, for example, at a position opposed to the sensor pixel 12 with respect to the fixed charge film 45. The light-receiving lens 50 is provided in contact with the color filter 40, for example, at a position opposed to the sensor pixel 12 with respect to the color filter 40 and the fixed charge film 45.

The second substrate 20 includes a second insulating layer 52 that is stacked on the second semiconductor substrate 21. The second semiconductor substrate 21 is a silicon substrate, and includes one pixel circuit 22 for every four sensor pixels 12. The second substrate 20 includes the pixel circuit 22 in a portion of the second semiconductor substrate 21 on side of the third substrate 30 (i.e., front surface side). The second substrate 20 is attached to the first substrate 10 to allow a back surface of the second semiconductor substrate 21 to be opposed to side of the front surface of the first semiconductor substrate 11. That is, the second substrate 20 is attached face-to-back to the first substrate 10.

The second semiconductor substrate 21 includes a separation insulating layer 53, and a through-wiring line 54 is provided inside the separation insulating layer 53. The through-wiring line 54 is electrically insulated from the second semiconductor substrate 21 by allowing a side surface thereof to be covered with the separation insulating layer 53. The through-wiring line 54 extends in a normal direction of a main surface of the second semiconductor substrate 21, and electrically couples elements of the first substrate 10 and elements of the second substrate 20 to one another. Specifically, the through-wiring line 54 electrically couples the floating diffusion FD and a coupling wiring line 55 to each other. One through-wiring line 54 is provided for each sensor pixel 12, for example.

The second substrate 20 includes, in the second insulating layer 52, for example, a plurality of coupling sections 59 electrically coupled to the pixel circuit 22 or the second semiconductor substrate 21. A wiring layer 56 includes, for example, an interlayer insulating layer 57, and the plurality of pixel drive lines 23 and the plurality of vertical signal lines 24 provided inside the interlayer insulating layer 57. The wiring layer 56 includes, inside the interlayer insulating layer 57, for example, one coupling wiring line 55 for every four sensor pixels 12. The coupling wiring line 55 electrically couples the through-wiring lines 54 of the four sensor pixels 12 sharing the pixel circuit 22, together.

The wiring layer 56 further includes a plurality of pad electrodes 58 inside the interlayer insulating layer 57. Each of pad electrodes 58 includes a metal such as copper (Cu), for example. Each of the pad electrodes 58 is exposed to a front surface of the wiring layer 56, and is used for attaching the second substrate 20 and the third substrate 30 together and for electrically coupling the second substrate 20 and the third substrate 30 together. The plurality of pad electrodes 58 are provided one by one for each of the pixel drive lines 23 and for each of the vertical signal lines 24. Here, the second substrate 20 may be provided in a stacked structure of a plurality of semiconductor substrates and a plurality of insulating layers.

Specifically, the second substrate 20 may include two semiconductor substrates stacked in a thickness direction. For example, the second substrate 20 may be provided to allow a further semiconductor substrate to be stacked on the second insulating layer 52 that is stacked on the second semiconductor substrate 21. For example, a transistor is provided in the semiconductor substrate further provided on the second insulating layer 52, and is electrically coupled to a transistor provided in the second semiconductor substrate 21 via the coupling section 59.

That is, the pixel circuit 22 provided in the second substrate 20 may be provided separately in the second semiconductor substrate 21 and in the semiconductor substrate further stacked on the second insulating layer 52. Specifically, at least one or more transistors of the amplification transistor AMP, the reset transistor RST, and the selection transistor SEL included in the pixel circuit 22 may be provided in the second semiconductor substrate 21, and remaining transistors thereof may be provided in the semiconductor substrate further stacked on the second insulating layer 52. As one example, the amplification transistor AMP may be provided in the second semiconductor substrate 21, and the reset transistor RST and the selection transistor SEL may be provided in the semiconductor substrate further stacked on the second insulating layer 52.

Alternatively, the second substrate 20 may include three semiconductor substrates stacked in the thickness direction. For example, the second substrate 20 may be provided to allow an upper first semiconductor substrate to be further stacked on the second insulating layer 52 stacked on the second semiconductor substrate 21 and to allow an upper second semiconductor substrate to be further stacked over the upper first semiconductor substrate with an insulating layer interposed therebetween. For example, transistors are provided in the upper first semiconductor substrate and the upper second semiconductor substrate that are stacked, and are electrically coupled to the transistors provided in the second semiconductor substrate 21 via the coupling section 59 or the like.

That is, the pixel circuit 22 to be provided in the second substrate 20 may be provided separately in the second semiconductor substrate 21 and in the upper first semiconductor substrate and the upper second semiconductor substrate that are stacked. Specifically, at least one or more transistors of the amplification transistor AMP, the reset transistor RST, and the selection transistor SEL included in the pixel circuit 22 may be provided in each of the second semiconductor substrate 21, the upper first semiconductor substrate, and the upper second semiconductor substrate. As one example, the amplification transistor AMP may be provided in the second semiconductor substrate 21; the reset transistor RST may be provided in the upper first semiconductor substrate further provided on the second semiconductor substrate 21; and the selection transistor SEL may be provided in the upper second semiconductor substrate further provided on the upper first semiconductor substrate.

In the second substrate 20 including a plurality of semiconductor substrates stacked in the thickness direction, stacking the semiconductor substrates separately makes it possible to further decrease an area of the semiconductor substrates occupied by one pixel circuit 22. The use of such a second substrate 20 enables the imaging device 1 to have a smaller chip area of the imaging device 1.

In addition, the use of such a second substrate 20 enables the imaging device 1 to selectively enlarge an area of any transistor of the amplification transistor AMP, the reset transistor RST, and the selection transistor SEL included in the pixel circuit 22. This enables the imaging device 1 to further reduce noise by the enlargement of the area of the amplification transistor AMP.

The third substrate 30 includes, for example, a third insulating layer 61 that is stacked on the third semiconductor substrate 31. The third semiconductor substrate 31 is a silicon substrate, and includes the processing circuit 32. It is to be noted that the third substrate 30 is attached to the second substrate 20, with surfaces on the front surface sides being attached together. For this reason, in the description of each configuration of the third substrate 30, a vertical relationship to be described is opposite to the vertical direction in the drawing. The third substrate 30 is attached to the second substrate 20, with a front surface of the third semiconductor substrate 31 being opposed to the side of the front surface of the second semiconductor substrate 21. That is, the third substrate 30 is attached face-to-face to the second substrate 20.

The third substrate 30 includes, for example, a wiring layer 62 on the third insulating layer 61. The wiring layer 62 includes, for example, an interlayer insulating layer 63 and a plurality of pad electrodes 64 provided inside the interlayer insulating layer 63 and being electrically coupled to the processing circuit 32. Each of the pad electrodes 64 includes, for example, a metal such as copper (Cu). The pad electrode 64 is exposed to a front surface of the wiring layer 62, and is used for attaching the second substrate 20 and the third substrate 30 together and for electrically coupling the second substrate 20 and the third substrate 30 together. The second substrate 20 and the third substrate 30 are electrically coupled to each other by bonding between the pad electrodes 58 and 64. That is, the gate (a transfer gate TG) of the transfer transistor TR is electrically coupled to the processing circuit 32 via the through-wiring line 54 and the pad electrodes 58 and 64.

FIGS. 8 and 9 are each a schematic view of an example of a cross-sectional configuration in a horizontal direction of the imaging device 1. The diagrams on upper side of FIGS. 8 and 9 are each a schematic view of an example of a cross-sectional configuration along a cut plane Sec1 in FIG. 7, and diagrams on lower side of FIGS. 8 and 9 are each a schematic view of an example of a cross-sectional configuration along a cut plane Sec2 in FIG. 7.

FIG. 8 exemplifies a configuration in which two sets of four sensor pixels 12 of 2×2 are arranged in a first direction V1, and FIG. 9 exemplifies a configuration in which four sets of four sensor pixels 12 of 2×2 are arranged in the first direction V1 and a second direction V2.

The first direction V1 is parallel to one arrangement direction (e.g., row direction) of two arrangement directions (e.g., row direction and column direction) of the plurality of sensor pixels 12 arranged in matrix. In addition, the second direction V2 is parallel to an arrangement direction (e.g., column direction) orthogonal to the first direction.

The through-wiring line 54 is provided for each sensor pixel 12, for example, and electrically couples together the floating diffusion FD and the coupling wiring line 55 described later. Through-wiring lines 47 and 48 are provided for each sensor pixel 12, for example. The through-wiring line 47 electrically couples together the p-well layer 42 of the first semiconductor substrate 11 and the wiring lines in the second substrate 20. The through-wiring line 48 electrically couples the transfer gate TG and the pixel drive line 23 together.

As illustrated in FIG. 8, a plurality of through-wiring lines 54, a plurality of through-wiring lines 48, and a plurality of through-wiring lines 47 are arranged side by side in a strip shape in the second direction V2 (vertical direction in FIG. 8) in a plane of the first substrate 10. FIG. 8 exemplifies a case where the plurality of through-wiring lines 54, the plurality of through-wiring lines 48, and the plurality of through-wiring lines 47 are arranged side by side in two rows in the second direction V2.

As illustrated in FIG. 9, the plurality of through-wiring lines 54, the plurality of through-wiring lines 48, and the plurality of through-wiring lines 47 are arranged side by side in a strip shape in the first direction V1 (horizontal direction in FIG. 9) in the plane of the first substrate 10. FIG. 9 exemplifies a case where the plurality of through-wiring lines 54, the plurality of through-wiring lines 48, and the plurality of through-wiring lines 47 are arranged side by side in two rows in the first direction V1.

In the four sensor pixels 12 sharing the pixel circuit 22, four floating diffusions FD are arranged close to one another with the element separation section 43 interposed therebetween, for example. In the four sensor pixels 12 sharing the pixel circuit 22, four transfer gates TG are arranged to surround the four floating diffusions FD, and forms an annular shape, for example, by the four transfer gates TG.

As illustrated in FIG. 8, the separation insulating layer 53 includes a plurality of blocks extending in the second direction V2. The second semiconductor substrate 21 includes a plurality of island-shaped blocks 21A extending in the second direction V2 and arranged side by side in the second direction V2. Each of the blocks 21A includes, for example, a plurality of sets of reset transistors RST, amplification transistors AMP, and selection transistors SEL. The one pixel circuit 22 shared by the four sensor pixels 12 includes, for example, the reset transistor RST, the amplification transistor AMP, and the selection transistor SEL present in a region corresponding to the four sensor pixels 12. For example, the pixel circuit 22 includes the amplification transistor AMP in a left adjacent block 21A of the separation insulating layer 53 and the reset transistor RST and the selection transistor SEL in a right adjacent block 21A of the separation insulating layer 53.

In addition, as illustrated in FIG. 9, the separation insulating layer 53 includes a plurality of blocks extending in the first direction V1. The second semiconductor substrate 21 includes a plurality of island-shaped blocks 21A extending in the first direction V1 and arranged side by side in the first direction V1. Each of the blocks 21A includes, for example, a plurality of sets of reset transistors RST, amplification transistors AMP, and selection transistors SEL. The one pixel circuit 22 shared by the four sensor pixels 12 includes, for example, the reset transistor RST, the amplification transistor AMP, and the selection transistor SEL present in a region corresponding to the four sensor pixels 12. For example, the pixel circuit 22 includes the amplification transistor AMP in a left adjacent block 21A of the separation insulating layer 53 and the reset transistor RST and the selection transistor SEL in a right adjacent block 21A of the separation insulating layer 53.

FIGS. 10 to 13 are each a schematic view of an example of a wiring layout in a horizontal plane of the imaging device 1. Similarly to FIG. 8, FIGS. 10 to 13 each illustrate an example of a wiring layout in a case where the one pixel circuit 22 shared by the four sensor pixels 12 is provided in a region corresponding to the four sensor pixels 12. FIGS. 10 to 13 each illustrate, for example, a wiring layout provided in layers different from each other in the wiring layer 56.

As illustrated in FIG. 10, for example, four through-wiring lines 54 adjacent to one another are electrically coupled to the coupling wiring line 55. The through-wiring line 54 is electrically coupled, via the coupling wiring line 55 and the coupling section 59, to the gate of the amplification transistor AMP included in the left adjacent block 21A of the separation insulating layer 53 and to the gate of the reset transistor RST included in the right adjacent block 21A of the separation insulating layer 53.

As illustrated in FIG. 11, for example, the power source line VDD is arranged at a position corresponding to each of the pixel circuits 22 arranged side by side in the first direction V1. The power source line VDD is electrically coupled, via the coupling section 59, to the drains of the respective amplification transistors AMP and the drains of the respective reset transistors RST of the pixel circuits 22 arranged side by side in the first direction V1. For example, two pixel drive lines 23 are arranged at positions corresponding to the respective pixel circuits 22 arranged side by side in the first direction V1. One of the pixel drive lines 23 functions, for example, as a wiring line RSTG electrically coupled to the gates of the respective reset transistors RST of the pixel circuits 22 arranged side by side in the first direction V1. The other of the pixel drive lines 23 functions, for example, as a wiring line SELG electrically coupled to the gates of respective selection transistors SEL of the pixel circuits 22 arranged side by side in the first direction V1. For example, the source of the amplification transistor AMP and the drain of the selection transistor SEL are electrically coupled to each other via a wiring line 25.

As illustrated in FIG. 12, for example, two reference potentials line VSS are arranged at positions corresponding to the respective pixel circuits 22 arranged side by side in the first direction V1. Each of the reference potential lines VSS is electrically coupled to the plurality of through-wiring lines 47 at positions corresponding to the sensor pixels 12 arranged side by side in the second direction V2. For example, four pixel drive lines 23 are arranged at positions corresponding to the respective pixel circuits 22 arranged side by side in the first direction V1. Each of the four pixel drive lines 23 functions as a wiring line TRG electrically coupled to the through-wiring line 48 of one sensor pixel 12 corresponding to each of the pixel circuits 22 arranged side by side in the first direction V1. The four pixel drive lines 23 are each electrically coupled to the gate of the transfer transistor TR of each of the sensor pixels 12 arranged side by side in the first direction V1. In FIG. 12, in order to distinguish the wiring lines TRG from one another, identification numbers (1, 2, 3, and 4) are assigned at each end of the wiring line TRG.

As illustrated in FIG. 13, for example, the vertical signal line 24 is disposed at a position corresponding to each of the pixel circuits 22 arranged side by side in the second direction V2. The vertical signal line 24 is electrically coupled to the source of the amplification transistor AMP of each of the pixel circuits 22 arranged side by side in the second direction V2.

The technique according to the present disclosure is applied to the stacked imaging device 1 described above. Hereinafter, specific description is given of the technique according to the present disclosure.

2. First Embodiment

First, description is given of a technique according to a first embodiment of the present disclosure, with reference to FIGS. 14, 15, 16, 17, 18, 19, 20A, 20B, 20C, 20D, 20E, 20F, 20G, 21, 22A, 22B, 22C, 22D, 22E, 22F, 22G, and 22H. The technique according to the present embodiment is directed to more efficiently improving electric characteristics of pixel circuits provided in the second substrate 20 by providing a low-permittivity region around a specific wiring line of the imaging device 1.

In the imaging device 1 configured by stacking three substrates, for example, electric charges having been photoelectrically converted by the photodiode PD provided in the first substrate 10 are outputted to the amplification transistor AMP provided in second substrate via the through-wiring line 54. The through-wiring line 54 is provided inside the separation insulating layer 53 penetrating the second semiconductor substrate 21, and electrically couples together a wiring line provided in the first substrate 10 and a wiring line provided in the second substrate 20.

Accordingly, in the imaging device 1, formation of a capacitor structure among the through-wiring line 54, the separation insulating layer 53, and the second semiconductor substrate 21 results in formation of parasitic capacitance. The formed parasitic capacitance exerts influence on electric charges prior to being amplified by the amplification transistor AMP, thus resulting in lowered conversion efficiency in converting the electric charges into a voltage in the pixel circuit 22.

The technique according to the present embodiment has been conceived in view of such circumstances. The technique according to the present embodiment is directed to providing a low-permittivity region in at least a portion of a region around a circuit that converts electric charges read from the floating diffusion FD of the sensor pixel 12 into a pixel signal. This makes it possible for the technique according to the present embodiment to reduce the influence of the parasitic capacitance on the pixel signal.

Subsequently, more specific description is given of the technique according to the present embodiment with reference to FIG. 14. FIG. 14 is a longitudinal cross-sectional view of an example of a cross-sectional configuration in a stacking direction of the imaging device 1 according to the present embodiment.

As illustrated in FIG. 14, the first substrate 10 includes the photodiode PD in a region defined by the element separation section 43. Electric charges photoelectrically converted by the photodiode PD are outputted to the floating diffusion FD via the transfer transistor TR including the transfer gate TG. The outputted electric charges are temporarily held in the floating diffusion FD, and thereafter outputted to the pixel circuit 22 provided in the second semiconductor substrate 21 via the through-wiring line 54.

The through-wiring line 54 is provided inside the separation insulating layer 53 penetrating the second semiconductor substrate 21 in a manner extending in the stacking direction of the first semiconductor substrate 11 and the second semiconductor substrate 21. The through-wiring line 54 outputs the electric charges temporarily held in the floating diffusion FD to the amplification transistor AMP or the like of the pixel circuit 22, via the coupling wiring line 55 and the coupling section 59.

In addition, the second substrate 20 further includes the wiring layer 56 on the second insulating layer 52. The wiring layer 56 includes, for example, the interlayer insulating layer 57, and the plurality of pixel drive lines 23 and the plurality of vertical signal lines 24 provided inside the interlayer insulating layer 57. The plurality of pixel drive lines 23 and the plurality of vertical signal lines 24 are each electrically coupled to the gate and source of the selection transistor SEL of the pixel circuit 22. The plurality of pixel drive lines 23 and the plurality of vertical signal lines 24 each control the selection transistor SEL to thereby control an output timing of the pixel signal generated on the basis of the electric charges outputted from the floating diffusion FD.

For example, a metal wiring line such as the through-wiring line 54, the coupling wiring line 55, the coupling section 59, the pixel drive line 23, and the vertical signal line 24 may include, for example, a metal material such as copper (Cu), aluminum (Al), and tungsten (W). In addition, a surface of the metal wiring line may be provided with a barrier layer of silicon carbide (SiC) or silicon carbonitride (SiCN), etc., in order to suppress diffusion of the metal used to form the wiring line.

The imaging device 1 according to the present embodiment includes, as a first aspect, a low-permittivity region 90A in at least a portion of a region inside the separation insulating layer 53. Specifically, the low-permittivity region 90A is provided in at least a portion of a region between the through-wiring line 54 penetrating the inside of the separation insulating layer 53 and the second semiconductor substrate 21, or between the through-wiring lines 54 penetrating the inside of the separation insulating layer 53. This enables the low-permittivity region 90A to reduce magnitude of parasitic capacitance generated between the through-wiring line 54 and the second semiconductor substrate 21 or another through-wiring line 54. Therefore, the low-permittivity region 90A is able to improve conversion efficiency in converting electric charges into a voltage in the amplification transistor AMP of the pixel circuit 22.

It is to be noted that the low-permittivity region 90A may be provided over the entire periphery to surround the circumference of the through-wiring line 54 provided inside the separation insulating layer 53. The formation of the low-permittivity region 90A over the entire periphery of the through-wiring line 54 makes it possible to reduce parasitic capacitance generated between the through-wiring line 54 and all conductors present around the through-wiring line 54.

In addition, the low-permittivity region 90A may be provided to be longer than a thickness of the second semiconductor substrate 21 in the stacking direction. This allows the low-permittivity region 90A to be provided in all regions in the stacking direction between the through-wiring line 54 and the second semiconductor substrate 21, thus making it possible to further reduce parasitic capacitance generated between the through-wiring line 54 and the second semiconductor substrate 21.

The low-permittivity region 90A is a region having lower permittivity than that of a material included in the first insulating layer 46, the separation insulating layer 53, and the second insulating layer 52 located peripherally. For example, the low-permittivity region 90A may be configured as an air gap of which the inside is a vacuum, or as an air gap in which air is enclosed. In addition, in a case where the first insulating layer 46, the separation insulating layer 53, and the second insulating layer 52 include silicon oxide ($SiO_2$: relative permittivity of 3.9), the low-permittivity region 90A may include a material having a lower relative permittivity than relative permittivity of silicon oxide. Further, the low-permittivity region 90A may include the air gap as described above and a low-permittivity material filling a portion of the inside of the air gap. It is to be noted that, as the low-permittivity material, for example, a dielectric material known as a Low-k material such as carbon-doped silicon (SiOC) or porous silica may be used.

In addition, the imaging device 1 according to the present embodiment includes, as a second aspect, a low-permittivity region 90B in at least a portion of a region around a wiring line allowing for electrical coupling from the through-wiring line 54 to the amplification transistor AMP. Specifically, the low-permittivity region 90B is provided in at least a portion of a region around the coupling section 59 or the coupling wiring line 55 electrically coupled to the floating diffusion FD via the through-wiring line 54. This enables the low-permittivity region 90B to reduce parasitic capacitance generated in the wiring line allowing for electrical coupling from the through-wiring line 54 to the amplification transistor AMP, similarly to the through-wiring line 54. Therefore, similarly to the low-permittivity region 90A, the low-permittivity region 90B makes it possible to improve the conversion efficiency in converting electric charges into a voltage in the amplification transistor AMP of the pixel circuit 22.

The low-permittivity region 90B is a region having lower permittivity than that of a material included in the second insulating layer 52 and the interlayer insulating layer 57 located peripherally. Similarly to the low-permittivity region 90A, the low-permittivity region 90B may be configured as an air gap of which the inside is a vacuum, or as an air gap in which air is enclosed. In addition, the low-permittivity region 90B may be configured as a region formed by a low-permittivity material, and may be configured by an air gap and a low-permittivity material filling a portion of the inside of the air gap. It is to be noted that, as the low-permittivity material, for example, a dielectric material known as a Low-k material such as carbon-doped silicon (SiOC) or porous silica may be used.

Further, the imaging device 1 according to the present embodiment includes, as a third aspect, a low-permittivity region 90C in at least a portion of a region around a wiring line included in the wiring layer 56 stacked on the second insulating layer 52. Specifically, the low-permittivity region 90C is provided in at least a portion of a region around the plurality of vertical signal lines 24 electrically coupled to the source of the selection transistor SEL that controls an output timing of the pixel signal generated on the basis of electric charges outputted from the floating diffusion FD. This enables the low-permittivity region 90C to reduce parasitic capacitance generated between the vertical signal line 24 and another wiring line. Therefore, it is possible for the low-permittivity region 90C to achieve faster signal processing and lower power consumption in the pixel circuit 22 or the processing circuit 32.

The low-permittivity region 90C is a region having lower permittivity than that of a material included in the interlayer insulating layer 57 located peripherally. Similarly to the low-permittivity regions 90A and 90B, the low-permittivity region 90C may be configured as an air gap of which the inside is a vacuum, or as an air gap in which air is enclosed. In addition, the low-permittivity region 90C may be configured as a region formed by a low-permittivity material, and may be configured by an air gap and a low-permittivity material filling a portion of the inside of the air gap. It is to be noted that, as the low-permittivity material, for example, a dielectric material known as a Low-k material such as carbon-doped silicon (SiOC) or porous silica may be used.

The low-permittivity regions 90A, 90B, and 90C are provided independently of one another. Accordingly, the imaging device 1 according to the present embodiment may include at least one or more of the low-permittivity region 90A, 90B, or 90C, or may include all of the low-permittivity regions 90A, 90B, and 90C.

It is to be noted that even in a case where the second substrate 20 includes a plurality of semiconductor substrates stacked in the thickness direction, the imaging device 1 according to the present embodiment may include a low-permittivity region in at least a portion of a region around the circuit that converts electric charges read from the floating diffusion FD into a pixel signal.

Specifically, in a case where the second substrate 20 includes a plurality of semiconductor substrates stacked in the thickness direction, the circuit that converts electric charges read from the floating diffusion FD into a pixel signal is provided throughout the plurality of stacked semiconductor substrates (i.e., the second semiconductor substrate 21 and at least one or more semiconductor substrates provided on the second semiconductor substrate 21). Accordingly, the low-permittivity regions 90A, 90B, and 90C may be provided in at least a portion of a region around the wiring line provided in the vicinity of the plurality of stacked semiconductor substrates. The low-permittivity regions 90A, 90B, and 90C may be each provided in a region around a wiring line provided in the vicinity of each of the plurality of stacked semiconductor substrates, or may be provided continuously in the region around the wiring line provided in the vicinity of each of the plurality of stacked semiconductor substrates.

This enables the imaging device 1 according to the present embodiment to more efficiently improve electric characteristics of the circuit provided in the second substrate 20, thus making it possible to further improve the conversion efficiency in converting electric charges read from the floating diffusion FD into a voltage.

Next, description is given, with reference to FIG. 15, of a variation in a configuration of the floating diffusion FD in the imaging device 1 according to the present embodiment. FIG. 15 is a longitudinal cross-sectional view of a cross-sectional configuration in the stacking direction of the imaging device 1 in which the floating diffusion FD is shared by the plurality of sensor pixels 12.

As illustrated in FIG. 15, for example, the floating diffusion FD may be provided on the element separation section 43 that isolates a plurality of adjacent photodiodes PD from each other. A plurality of transfer transistors TR that each read electric charges photoelectrically converted by each of the plurality of adjacent photodiodes PD are electrically coupled to the floating diffusion FD.

That is, in the imaging device 1 illustrated in FIG. 15, the floating diffusion FD and the pixel circuit 22 of a subsequent stage of the floating diffusion FD are shared by adjacent sensor pixels 12. It is to be noted that the number of the sensor pixels 12 sharing the floating diffusion FD and the pixel circuit 22 may be, but not particularly limited to, 2, 4, 8, or 16, for example.

In such an imaging device 1, providing the low-permittivity regions 90A, 90B, and 90C makes it possible to simultaneously improve the conversion efficiency in converting electric charges into a potential in the plurality of sensor pixels 12. Accordingly, in the imaging device 1 illustrated in FIG. 15, a smaller number of the low-permittivity regions 90A, 90B, and 90C makes it possible to improve the conversion efficiency in the plurality of sensor pixels 12. Thus, the formation of the low-permittivity regions 90A, 90B, and 90C makes it possible to suppress a decrease in strength of the entire imaging device 1.

(Planar Arrangement of Low-Permittivity Region)

Subsequently, description is given, with reference to FIGS. 16 to 19, of an example of a planar arrangement of the low-permittivity regions 90A, 90B, and 90C in the imaging device 1 according to the present embodiment. FIGS. 16 to 19 are each an example of a planar arrangement of a case where the floating diffusion FD and the pixel circuit 22 are shared by four sensor pixels 12 arranged in one direction.

FIG. 16 is a plan view of a planar arrangement of the second semiconductor substrate 21 and the separation insulating layer 53 in the pixel region 13. In FIG. 16, the respective photodiodes PD of the sensor pixels 12 are provided in regions surrounded by square broken lines.

As illustrated in FIG. 16, the second semiconductor substrate 21 is divided by the separation insulating layer 53, and the separation insulating layer 53 is provided in a manner corresponding to a boundary extending in one direction of each of the photodiodes PD of the sensor pixels 12.

The second semiconductor substrate 21 is provided with an activated region AA and an element separation region SA. The activated region AA is a region that serves as a source, drain, or channel region of a field-effect transistor. The activated region AA includes silicon or silicon in which electrically-conductive impurities are introduced. The element separation region SA is a region that electrically separates field-effect transistors provided in the activated region AA from one another. The element separation region SA is configured by forming an insulating layer at a depth in such a degree as not to penetrate the second semiconductor substrate 21 by using an STI (Shallow Trench Isolation) method or the like.

FIG. 17 is a plan view of a planar arrangement of the through-wiring line 54, the coupling section 59, and a gate electrode in the pixel region 13. In FIG. 17, four sensor pixels 12 arranged in one direction share one floating diffusion FD and the pixel circuit 22.

As illustrated in FIG. 17, the activated region AA extending in one direction includes, from one end portion to the other end portion, each gate electrode of the selection transistor SEL, the amplification transistor AMP, the reset transistor RST, and the FD conversion gain switching transistor FDG shared by the four sensor pixels 12. There are provided, as the coupling section 59, between these gate electrodes, a contact CVout that outputs an output voltage to the outside via the horizontal drive circuit 35, a contact CVDD to be electrically coupled to the power source line VDD that supplies a power source potential, a contact CVSS to be electrically coupled to the reference potential line VSS that supplies a reference potential, and a contact CFD to be electrically coupled to the floating diffusion FD.

The separation insulating layer 53 includes, as the through-wiring line 54, a through-contact TFD to be electrically coupled to the floating diffusion FD, and a through-contact TVSS to be electrically coupled to the reference potential line VSS. In addition, the separation insulating layer 53 includes each through-contact to be electrically coupled to the transfer gate of the transfer transistor TR of each of the sensor pixels 12.

At this time, the low-permittivity region 90A is preferably provided in at least a portion of a region around the through-contact TFD and the contact CFD electrically coupled to the floating diffusion FD. In addition, the low-permittivity region 90A is more preferably provided over the entire periphery in the region around the through-contact TFD and the contact CFD.

FIG. 18 is a plan view of a planar arrangement of the coupling wiring line 55 in the pixel region 13.

As illustrated in FIG. 18, a wiring line that electrically couples together each of the coupling sections 59 and each of the through-wiring lines 54 illustrated in FIG. 17 is provided, as the coupling wiring line 55. At this time, the low-permittivity region 90B is preferably provided in at least a portion of a region around the coupling wiring line 55 to be electrically coupled to the floating diffusion FD. Specifically, the low-permittivity region 90B is preferably provided in at least a portion of a region around the coupling wiring line 55 that transmits electric charges outputted from the floating diffusion FD to the gate of the amplification transistor AMP via the contact CFD and the through-contact TFD. For example, the low-permittivity region 90B is preferably provided in at least a portion of the region around the coupling wiring line 55 surrounded by a broken line in FIG. 18.

FIG. 19 is a plan view of a planar arrangement of wiring lines included in the wiring layer 56 in the pixel region 13.

As illustrated in FIG. 19, the wiring layer 56 includes the power source line VDD, the reference potential line VSS, and the vertical signal line 24 (VSL) provided to extend in a direction parallel to the extending direction of the separation insulating layer 53. The vertical signal line 24 is provided in a region corresponding to each boundary between the photodiodes PD of the sensor pixels 12, and the power source line VDD and the reference potential line VSS are each provided on both lateral sides of the vertical signal line 24. At this time, the low-permittivity region 90C is preferably provided in at least a portion of a region around the vertical signal line 24. For example, the low-permittivity region 90C is preferably provided in at least a portion of a region around the vertical signal line 24 surrounded by a broken line in FIG. 19.

(Method of Forming Low-Permittivity Region)

Next, description is given, with reference to FIGS. 20A, 20B, 20C, 20D, 21, 22A, 22B, 22C, 22D, 22E, 22F, 22G, and 22H, of a method of forming the low-permittivity regions 90A, 90B, and 90C in the imaging device 1 according to the present embodiment.

First, description is given, with reference to FIGS. 20A, 20B, 20C, and 20D, of an example of the method of forming the low-permittivity region 90A. FIGS. 20A, 20B, 20C, and 20D are each a longitudinal cross-sectional view that describes an example of the method of forming the low-permittivity region 90A.

As illustrated in FIG. 20A, the second semiconductor substrate 21 provided with the separation insulating layer 53 is attached to the first substrate 10 in which the photodiode PD, the floating diffusion FD, and the transfer transistor TR are formed.

Next, as illustrated in FIG. 20B, a slit-shaped opening 91A is formed in a region of the separation insulating layer 53 using dry etching or the like. Specifically, the dry etching or the like is used to form the opening 91A in a slit-shape of a substantially uniform width in a region where the through-wiring line 54 is to be formed in a subsequent stage and in a region of the separation insulating layer 53 between the second semiconductor substrates 21. Forming the opening 91A to have a slit-shape of a substantially uniform width enables each opening 91A to be uniformly occluded in depositing the second insulating layer 52 in a subsequent stage process.

Subsequently, as illustrated in FIG. 20C, CVD (Chemical Vapor Deposition) or the like is performed under a condition of low coverage to thereby deposit the second insulating layer 52 on the second semiconductor substrate 21. At this time, due to the low coverage of the deposition of the second insulating layer 52, the upper portion of the opening 91A ends up being occluded before the inside is filled. In this manner, an air gap formed by occluding the upper portion of the opening 91A serves as the low-permittivity region 90A.

Next, as illustrated in FIG. 20D, photolithography, etching, and deposition are performed in order to thereby form the coupling section 59 and the through-wiring line 54 in the second insulating layer 52. Here, the through-wiring line 54 is electrically coupled to the floating diffusion FD, for example, and is provided to allow the low-permittivity region 90A to be positioned between the through-wiring line 54 and the second semiconductor substrate 21. Thereafter, providing the coupling wiring line 55 on the second insulating layer 52 allows for formation of electrical coupling from the coupling section 59 and the through-wiring line 54 to another wiring line. Through such processes, it is possible to form the low-permittivity region 90A in the imaging device 1 according to the present embodiment.

Subsequently, description is given, with reference to FIGS. 20E, 20F, and 20G, of an example of a method of forming the low-permittivity regions 90B and 90C. FIG. 20E to 20G are each a longitudinal cross-sectional view that describes an example of the method of forming the low-permittivity regions 90B and 90C.

As illustrated in FIG. 20E, performing the processes illustrated in FIGS. 20A and 20D continuously allows the second semiconductor substrate 21 to be attached to the first substrate 10 in which the photodiode PD, the floating diffusion FD, and the transfer transistor TR are formed, and the coupling section 59 and the through-wiring line 54 to be formed from a front surface of the second insulating layer 52. Further, the coupling wiring line 55 and the interlayer insulating layer 57 are formed on the coupling section 59 and the through-wiring line 54.

Next, as illustrated in FIG. 20F, the dry etching or the like is used to form a slit-shaped opening 91B on a portion of a region between the coupling wiring lines 55. Specifically, the dry etching or the like is used to form the opening 91B in a slit-shape of a substantially uniform width in a region between the coupling wiring lines 55. Forming the opening 91B to have a slit shape of a substantially uniform width makes it possible to uniformly occlude each of the openings 91B in further disposing the interlayer insulating layer 57 in a subsequent stage process.

Subsequently, as illustrated in FIG. 20G, CVD or the like is performed under a condition of low coverage to thereby further deposit the interlayer insulating layer 57 on the second insulating layer 52. At this time, due to the low coverage of the deposition of the interlayer insulating layer 57, the upper portion of the opening 91B ends up being occluded before the inside is filled. In this manner, an air gap formed by occluding the upper portion of the opening 91B serves as the low-permittivity region 90B. Through such processes, it is possible to form the low-permittivity region 90B in the imaging device 1 according to the present embodiment. In addition, similarly, it is possible to form the low-permittivity region 90C in the imaging device 1 according to the present embodiment.

FIG. 21 is a schematic cross-sectional view that describes variations of cross-sectional shapes of the low-permittivity regions 90A, 90B, and 90C.

In the above embodiment, the cross-sectional shapes of the low-permittivity regions 90A, 90B, and 90C formed by an air gap are each exemplified by a rectangular shape. However, the cross-sectional shapes of the low-permittivity regions 90A, 90B, and 90C formed by an air gap may be each a shape other than the rectangular shape.

For example, as illustrated in FIG. 21, a cross-sectional shape of an opening 1191 formed upon etching an insulating layer 1193 in a narrow pattern between wiring lines 1192 may have an inversely tapered shape, due to an etchant for etching not penetrating sufficiently into a bottom portion of the opening 1191. In addition, in a case where the opening 1191 formed between the wiring lines 1192 is occluded by CVD or the like, the cross-sectional shapes of the low-permittivity regions 90A, 90B, and 90C with upper portions being occluded may have a forwardly tapered shape or a triangular shape due to a CVD deposit partially penetrating also into an upper portion of the opening 1191.

The cross-sectional shapes of the low-permittivity regions 90A, 90B, and 90C formed by an air gap may vary depending on a method of forming an air gap. For this reason, the cross-sectional shapes of the low-permittivity regions 90A, 90B, and 90C are not limited to the shapes described above.

Further, description is given, with reference to FIGS. 22A, 22B, 22C, 22D, 22E, 22F, 22G, and 22H, of another example of the method of forming the low-permittivity region 90A. FIGS. 22A, 22B, 22C, 22D, 22E, 22F, 22G, and 22H are each a longitudinal cross-sectional view that describes each process of another example of the method of forming the low-permittivity region 90A.

First, as illustrated in FIG. 22A, the first substrate 10 in which the first insulating layer 46 is stacked on the first semiconductor substrate 11 including the photodiode PD and the floating diffusion FD formed therein, and the second substrate 20 in which the second insulating layer 52 and the wiring layer 56 are stacked on the second semiconductor substrate 21 are attached together. Thereafter, etching or the like is used to remove an insulating layer around the through-wiring line 54 that electrically couples together the floating diffusion FD of the first substrate 10 and various wiring lines of the second substrate 20, thereby allowing for formation of the opening 91A. It is to be noted that an SiN film may be formed as a protective film on a side surface and a bottom surface inside the opening 91A.

Subsequently, as illustrated in FIG. 22B, an attached substrate 1100 is prepared, which has a front surface on which an $SiO_2$ film 1101 is formed.

Then, as illustrated in FIG. 22C, the attached substrate 1100 and a stack of the first substrate 10 and the second substrate 20 are attached to each other to allow the $SiO_2$ film 1101 to face the wiring layer 56.

Next, as illustrated in FIG. 22D, the attached substrate 1100 is detached from the $SiO_2$ film 1101. In this manner, an upper opening plane of the opening 91A is sealed by the $SiO_2$ film 1101 uniformly formed on the front surface of the attached substrate 1100 to thereby cause the opening 91A to be an air gap, thus forming the low-permittivity region 90A.

Subsequently, as illustrated in FIG. 22E, the pad electrode 58 electrically coupled to various wiring lines of the wiring layer 56 is formed on a front surface of the $SiO_2$ film 1101.

Thereafter, as illustrated in FIG. 22F, the third substrate 30 in which the wiring layer 62 is stacked on the third semiconductor substrate 31 is prepared. It is to be noted that the pad electrode 64 is similarly formed over the front surface of the wiring layer 62 at a position facing the pad electrode 58 provided on the front surface of the $SiO_2$ film 1101.

Then, as illustrated in FIG. 22G, the stack of the first substrate 10 and the second substrate 20 and the third substrate 30 are attached together to allow the $SiO_2$ film 1101 to be opposed to the wiring layer 62. At this time, the pad electrode 58 and the pad electrode 64 are bonded together to thereby form electrical coupling between the various wiring lines of the second substrate 20 and various wiring lines of the third substrate 30.

Thereafter, as illustrated in FIG. 22H, the color filter 40 and the light-receiving lens 50 are provided on side of a back surface of the first substrate 10 on side opposite to a surface on which the first insulating layer 46 is formed (i.e., a surface of the first semiconductor substrate 11 on the side opposite to the surface on which the first insulating layer 46 is formed). This enables formation of the imaging device 1.

The detailed description has been given above of the technique according to the first embodiment of the present disclosure. According to the technique of the present embodiment, it is possible to reduce parasitic capacitance generated in the wiring lines of the pixel circuit 22 from the floating diffusion FD to outputting of the pixel signal. Therefore, according to the technique of the present embodiment, it is possible to improve the electric charge-voltage conversion efficiency in the pixel circuit 22.

3. Second Embodiment

Next, description is given of a technique according to a second embodiment of the present disclosure with reference to FIGS. 23, 24A, 24B, 24C, 24D, 24E, 24F, 24G, 24H, 24I, 24J, 24K, 24L, 25A, 25B, 25C, 25D, 25E, and 25F. The technique according to the present embodiment is directed to more efficiently forming a low-permittivity region between the through-wiring line 54 and the second semiconductor substrate 21.

As described in the first embodiment, in the imaging device 1, providing the low-permittivity region in at least a portion of a region around the circuit that converts electric charges read from the floating diffusion FD into a pixel signal makes it possible to reduce the influence of parasitic capacitance on the pixel signal. In particular, in the imaging device 1 configured by stacking three substrates, providing the low-permittivity region 90A in a region between the through-wiring line 54 and the second semiconductor substrate 21 makes it possible to suppress a decrease in the electric charge-voltage conversion efficiency caused by the parasitic capacitance.

In the first embodiment, photolithography and etching are performed on the separation insulating layer 53 to provide the low-permittivity region 90A in a predetermined region between the through-wiring line 54 and the second semiconductor substrate 21. However, such a formation method results in addition of many processes for the formation of the low-permittivity region 90A.

The technique according to the present embodiment has been conceived in view of such circumstances. The technique according to the present embodiment is directed to forming the low-permittivity region 90A in a self-aligned manner between the through-wiring line 54 and the second semiconductor substrate 21. This makes it possible for the technique according to the present embodiment to reduce the number of processes in forming the low-permittivity region 90A, thus enabling formation of the low-permittivity region 90A between the through-wiring line 54 and the second semiconductor substrate 21 at less additional cost.

First, more specific description is given of the technique according to the present embodiment with reference to FIG. 23. FIG. 23 includes a cross-sectional view and a top view schematically illustrating a configuration of a stack of the first substrate 10 and the second substrate 20 according to the present embodiment.

As illustrated in the cross-sectional view on upper side of FIG. 23, in the stack according to the present embodiment, the first substrate 10 in which a first insulating layer 1246 (corresponding to the first insulating layer 46) is stacked on a first semiconductor substrate 1211 (corresponding to the first semiconductor substrate 11) and the second substrate 20 in which a second insulating layer 1252 (corresponding to the second insulating layer 52) is stacked on a second semiconductor substrate 1221 (corresponding to the second semiconductor substrate 21) are attached together. It is to be noted that the second semiconductor substrate 1221 (corresponding to the second semiconductor substrate 21) is divided by a separation insulating layer 1253 (corresponding to the separation insulating layer 53) provided to penetrate the second semiconductor substrate 1221.

The second semiconductor substrate 1221 of a second substrate 1220 includes, for example, a field-effect transistor Tr2. The field-effect transistor Tr2 includes: for example, a gate electrode 1230 provided over the second semiconductor substrate 1221 with a gate insulating film 1231 interposed therebetween; a sidewall insulating film 1232 provided on a side surface of the gate electrode 1230; and a source region 1221S and a drain region 1221D provided in the second semiconductor substrate 1221 on both sides sandwiching the gate electrode 1230. In addition, a gate contact 1259, a source contact 1259S, and a drain contact 1259D are provided on top of the gate electrode 1230, the source region 1221S, and the drain region 1221D, respectively. In addition, the first semiconductor substrate 1211 of the first substrate 1210 includes, for example, a field-effect transistor Tr having a structure similar to that of the field-effect transistor Tr2.

Here, each terminal of the field-effect transistor Tr provided in the first substrate 1210 is electrically coupled to each terminal of the field-effect transistor Tr2 provided in the second substrate 1220 by a through-wiring line 1254 provided to penetrate the separation insulating layer 1253 in an unillustrated region.

In the technique according to the present embodiment, as illustrated in the top view of the lower part of FIG. 23, a low-permittivity region 1290 is provided alongside the second semiconductor substrate 1221 to surround the through-wiring line 1254 over the entire periphery along an outer circumference of the separation insulating layer 1253. This enables the low-permittivity region 1290 to reduce parasitic capacitance generated between the through-wiring line 1254 and the second semiconductor substrate 1221.

The low-permittivity region 1290 is a region having lower permittivity than that of a material included in the separation insulating layer 1253. The low-permittivity region 1290 may be configured as an air gap of which the inside is a vacuum, or as an air gap in which air is enclosed. Alternatively, the low-permittivity region 1290 may be configured as a region formed by a low-permittivity material, and may be configured by an air gap and a region where a portion of the air gap is filled with a low-permittivity material. It is to be noted that, as the low-permittivity material, for example, a dielectric material known as a Low-k material such as carbon-doped silicon (SiOC) or porous silica may be used.

As described later, in the technique according to the present embodiment, the low-permittivity region 1290 is formed using a side wall on an inner side surface of a through-hole provided in the second semiconductor substrate 1221 in forming the separation insulating layer 1253. For this reason, according to the technique of the present embodiment, it is possible to form the low-permittivity region 1290 in a self-aligned manner along the outer circumference of the separation insulating layer 1253.

It is to be noted that, as mentioned in the first embodiment, the technique according to the present embodiment is applicable even to a case where the second substrate 20 includes a plurality of stacked semiconductor substrates in the thickness direction. Specifically, in a case where the second substrate 20 includes the plurality of stacked semiconductor substrates in the thickness direction, the low-permittivity region 1290 may be formed in a self-aligned manner along the outer circumference of the separation insulating layer 1253 that penetrates the plurality of stacked semiconductor substrates (i.e., the second semiconductor substrate 21, and at least one or more semiconductor substrates provided on the second semiconductor substrate 21).

(First Method of Forming Low-Permittivity Region)

Next, description is given, with reference to FIGS. 24A, 24B, 24C, 24D, 24E, 24F, 24G, 24H, 24I, 24J, 24K, and 24L, of a first method of forming the low-permittivity region 1290 according to the present embodiment. FIGS. 24A, 24B, 24C, 24D, 24E, 24F, 24G, 24H, 24I, 24J, 24K, and 24L are each a longitudinal cross-sectional view that describes each process of the first method of forming the low-permittivity region 1290.

First, as illustrated in FIG. 24A, an SiN film 1261 and a resist layer 1281 are formed on the second semiconductor substrate 1221, and thereafter etching is performed to form an opening 1271 in a region where the separation insulating layer 1253 is to be formed in a subsequent stage. The opening 1271 is preferably provided at a depth in such a degree as to enable etching in a subsequent stage to substantially penetrate the second semiconductor substrate 1221.

Subsequently, as illustrated in FIG. 24B, after the resist layer 1281 is detached, an $SiO_2$ film 1262 and an SiN film 1263 are deposited along a surface shape of the second semiconductor substrate 1221 over the second semiconductor substrate 1221 in which the opening 1271 is formed.

Next, as illustrated in FIG. 24C, dry etching is used to etch back the $SiO_2$ film 1262 and the SiN film 1263 across the entire surface to thereby form a sidewall 1263A on a side surface of the opening 1271.

Subsequently, as illustrated in FIG. 24D, a region to be an element separation region in the second semiconductor substrate 1221 and a region where the separation insulating layer 1253 is to be formed in a subsequent stage are etched to thereby form an opening 1272 and an opening 1273, respectively. At this time, the opening 1273 may be provided to allow a portion of the second semiconductor substrate 1221 to remain (i.e., not to penetrate the second semiconductor substrate 1221), or may be provided to penetrate the second semiconductor substrate 1221.

Next, as illustrated in FIG. 24E, the opening 1272 and the opening 1273 are each embedded by the separation insulating layer 1253 including $SiO_2$, and CPM (Chemical Mechanical Polish) is performed to planarize the front surface. At this time, the CMP on the separation insulating layer 1253 is performed until a tip of the sidewall 1263A is exposed. This makes it possible to remove the sidewall 1263A from the exposed surface in a subsequent stage process.

Subsequently, as illustrated in FIG. 24F, SiN is detached to remove the sidewall 1263A and the SiN film 1261. This allows for formation of an air gap that functions as the low-permittivity region 1290 in a region where the sidewall 1263A has been provided. A portion of the sidewall 1263A is exposed to the front surface of the separation insulating layer 1253 in the process illustrated in FIG. 24E, and thus is able to be removed by a method such as etching in the process illustrated in FIG. 24F.

Next, as illustrated in FIG. 24G, the gate insulating film 1231 is deposited, and thereafter a gate electrode layer 1233 including polysilicon or the like is deposited. As for the gate electrode layer 1233, the deposition of the gate electrode layer 1233 under a condition of low embedding property enables suppression of the gate electrode layer 1233 entering the low-permittivity region 1290 which is an air gap.

Thereafter, as illustrated in FIG. 24H, etching the gate electrode layer 1233 allows for formation of the gate electrode 1230. Further, introducing electrically-conductive impurities into the second semiconductor substrate 1221 on the both sides of the gate electrode 1230 allows for formation of an LDD (Lightly Doped Drain) region.

Subsequently, as illustrated in FIG. 24I, an $SiO_2$ film 1265 is deposited on the second semiconductor substrate 1221, the separation insulating layer 1253, and the gate electrode 1230 under a condition of low embedding property to thereby occlude the upper portion of an air gap.

Further, as illustrated in FIG. 24J, the SiN film is deposited along a surface shape of the gate electrode 1230, and then etch-back is performed to thereby form the sidewall insulating film 1232. Thereafter, electrically-conductive impurities are introduced into the second semiconductor substrate 1221 on the outer side of the sidewall insulating film 1232, thereby forming the source region 1221S and the drain region 1221D.

Next, as illustrated in FIG. 24K, the first substrate 10 in which the field-effect transistor Tr is provided is attached to the second substrate 20 formed in the processes up to 24J. Specifically, removing the second semiconductor substrate 1221 on side of a back surface of the second substrate 20 allows the separation insulating layer 1253 to completely divide the second semiconductor substrate 1221, and thereafter the first substrate 10 is attached to the side of the back surface of the second substrate 20.

Subsequently, as illustrated in FIG. 24L, the second insulating layer 1252 is deposited over the second semiconductor substrate 1221. Thereafter, a contact reaching various terminals of the field-effect transistor Tr of the first substrate 10 from the second insulating layer 1252 is formed in a region where the separation insulating layer 1253 is formed, thereby making it possible to form the stack of the first substrate 10 and the second substrate 20 illustrated in FIG. 23.

(Second Method of Forming Low-Permittivity Region)

Next, description is given of a second method of forming the low-permittivity region 1290 according to the present embodiment with reference to FIGS. 25A, 25B, 25C, 25D, 25E, and 25F. FIGS. 25A, 25B, 25C, 25D, 25E, and 25F are each a longitudinal cross-sectional view that describes each process of the second method of forming the low-permittivity region 1290.

First, going through processes similar to the processes illustrated in FIGS. 24A, 24B, 24C, and 24D allows for formation of the opening 1272 and the opening 1273 in the second semiconductor substrate 1221.

Next, as illustrated in FIG. 25A, the opening 1272 and the opening 1273 are each embedded by the separation insulating layer 1253 including $SiO_2$, and CMP (Chemical Mechanical Polish) is performed to planarize the front surface. At this time, the CMP on the separation insulating layer 1253 is performed in such a degree as not to allow the tip of the sidewall 1263A to be exposed, and removal of the sidewall 1263A is performed after formation of the gate electrode 1230 or the like. This makes it possible to prevent an air gap formed by the removal of the sidewall 1263A from being embedded again in forming the gate electrode 1230.

Subsequently, as illustrated in FIG. 25B, the SiN is detached to thereby remove the SiN film 1261. Meanwhile, the sidewall 1263A remains. Thereafter, the separation insulating layer 1253 is etched again to thereby expose the tip of the sidewall 1263A to the front surface of the separation insulating layer 1253.

Next, as illustrated in FIG. 25C, after the gate insulating film 1231 is deposited, a gate electrode layer including polysilicon or the like is deposited, and patterning is performed to thereby form the gate electrode 1230. Further, an $SiO_2$ film 1230A is formed on a top surface of the gate electrode 1230.

Thereafter, as illustrated in FIG. 25D, introducing electrically-conductive impurities into the second semiconductor substrate 1221 on both sides of the gate electrode 1230 allows for formation of an LDD (Lightly Doped Drain) region. Next, an $SiO_2$ film is deposited along the surface shape of the gate electrode 1230, and thereafter etch-back is performed to thereby form a sidewall insulating film 1232A. Subsequently, electrically-conductive impurities are introduced into the second semiconductor substrate 1221 on the outer side of the sidewall insulating film 1232A to thereby form the source region 1221S and the drain region 122D.

Then, as illustrated in FIG. 25E, the SiN is detached to thereby remove the sidewall 1263A. This allows for formation of an air gap that functions as the low-permittivity region 1290 in a region where the sidewall 1263A has been provided.

Subsequently, as illustrated in FIG. 25F, the $SiO_2$ film 1265 is deposited on the separation insulating layer 1253 under a condition of low embedding property to thereby occlude the upper portion of the air gap. Next, the SiN film is deposited along the surface shape of the gate electrode 1230. Thereafter, going through processes similar to the processes illustrated in FIGS. 24K and 24L enables formation of a stack similar to the stack of the first substrate 10 and the second substrate 20 illustrated in FIG. 23.

The detailed description has been given above of the technique according to the second embodiment of the present disclosure. According to the technique of the present embodiment, it is possible to form the low-permittivity region 1290 including an air gap in a self-aligned manner between the through-wiring line 1254 and the second semiconductor substrate 1221 without using lithography or the like. Therefore, according to the technique of the present embodiment, it is possible to form the low-permittivity region 1290 between the through-wiring line 1254 and the second semiconductor substrate 1221 at lower cost.

It is to be noted that the side wall 1263A that could not be removed may remain inside the low-permittivity region 1290 including an air gap. Even in such a case, the low-permittivity region 1290 is able to reduce the magnitude of parasitic capacitance generated between the through-wiring line 1254 and the second semiconductor substrate 1221.

4. Third Embodiment

Subsequently, description is given of a technique according to a third embodiment of the present disclosure with reference to FIGS. 26, 27, 28, 29A, 29B, 29C, 30, 31A, 31B, 31C, 31D, 31E, 31F, 32A, 32B, 32C, 33A, 33B, 33C, 34A, 34B, 34C, 35A, 35B, 35C, 35D, 36A, 36B, 36C, 37A, 37B, 37C, 38A, 38B, 38C, 38D, 39A, 39B, 39C, 39D, 40A, 40B, 40C, 40D, 41A, 41B, 41C, 41D, 41E, 42A, 42B, 42C, 42D, and 42E. The technique according to the present embodiment is directed to reducing parasitic capacitance generated by a three-dimensional structure in which the first substrate 10 and the second substrate 20 are attached together by providing a low-permittivity region in the vicinity of the second semiconductor substrate 21.

In the imaging device 1 configured by stacking three substrates, the first semiconductor substrate 11 and the second semiconductor substrate 21 are stacked with the first insulating layer 46 interposed therebetween. The parasitic capacitance is generated due to sandwiching of an insulator between two conductors, and thus the stacked second semiconductor substrate 21 may possibly generate parasitic capacitance between the second semiconductor substrate 21 and conductors present in various three-dimensional directions.

For example, FIG. 26 illustrates an example of the parasitic capacitance generated by the second semiconductor substrate 21. FIG. 26 is a schematic cross-sectional view of an example of the parasitic capacitance generated in a stack in which the first substrate 10 and the second substrate 20 are stacked.

As illustrated in FIG. 26, for example, in the stack according to the present embodiment, the first substrate 10 in which a first insulating layer 1342 (corresponding to the first insulating layer 46) is stacked on a first semiconductor substrate 1311 (corresponding to the first semiconductor substrate 11) and the second substrate 20 in which a second insulating layer 1352 (corresponding to the second insulating layer 52) is stacked on a second semiconductor substrate 1321 (corresponding to the second semiconductor substrate 21) are attached together. In addition, the second semiconductor substrate 1321 (corresponding to the second semiconductor substrate 21) is divided by a separation insulating layer 1353 (corresponding to the separation insulating layer 53) provided to penetrate the second semiconductor substrate 1321. The first substrate 10 includes the transfer gate TG that is a gate of the transfer transistor, and the second substrate 20 includes the field-effect transistor Tr2 including a gate electrode 1322. Further, each terminal of the transfer transistor or the like provided in the first substrate 10 is electrically coupled to a gate contact 1359 of the field-effect transistor Tr2 provided in the second substrate 1320 by a through-wiring line 1360 provided to penetrate the separation insulating layer 1353 in an unillustrated region.

Here, the second semiconductor substrate 1321 results in generating parasitic capacitance between the second semiconductor substrate 1321 and the through-wiring line 1360, for example, on lateral side. In addition, the second semiconductor substrate 1321 results in generating parasitic capacitance between the second semiconductor substrate 1321 and the transfer gate TG of the transfer transistor, for example, on lower side. In particular, in a case where the second semiconductor substrate 1321 is made thinner and where the thickness of the first insulating layer 1342 is decreased, the second semiconductor substrate 1321 and the transfer gate TG come closer to each other in distance. In such a case, back bias and parasitic capacitance generated between the field-effect transistor Tr2 and the transfer gate TG result in exerting a large influence on characteristics of the field-effect transistor Tr2.

The technique according to the present embodiment has been conceived in view of such circumstances. In order to reduce the magnitude of the parasitic capacitance described above, the technique according to the present embodiment provides a low-permittivity region on the lateral side or on the lower side of the second semiconductor substrate 1321.

More specific description is given of the technique according to the present embodiment with reference to FIGS. 27 and 28. FIG. 27 is a longitudinal cross-sectional view of a region where the low-permittivity region is provided in a first aspect of the present embodiment. FIG. 28 is a longitudinal cross-sectional view of a region where the low-permittivity region is provided in a second aspect of the present embodiment.

As illustrated in FIG. 27, the imaging device 1 according to the present embodiment includes, as the first aspect, a low-permittivity region 1391 on the lateral side of the second semiconductor substrate 1321 (corresponding to the second semiconductor substrate 21). Specifically, the low-permittivity region 1391 is provided, in an in-plane direction, at least in a region between the second semiconductor substrate 1321 and the through-wiring line 1360 provided in the separation insulating layer 1353. This enables the low-permittivity region 1391 to reduce the magnitude of parasitic capacitance generated between the second semiconductor substrate 1321 and the through-wiring line 1360.

The low-permittivity region 1391 is a region having a lower permittivity than that of a material included in the separation insulating layer 1353. For example, the low-permittivity region 1391 may be configured as an air gap region of which the inside is a vacuum, or as an air gap region in which air is enclosed. In addition, the low-permittivity region 1391 may be a region formed by a material having a lower relative permittivity than that of a material included in the separation insulating layer 1353. Further, the low-permittivity region 1391 may be configured by an air gap region and a region where a portion of the air gap region is filled with a low-permittivity material. It is to be noted that, as the low-permittivity material, for example, a dielectric material known as a Low-k material such as carbon-doped silicon (SiOC) or porous silica may be used.

In addition, as illustrated in FIG. 28, the imaging device 1 according to the present embodiment includes, as a second aspect, a low-permittivity region 1392 is provided on the lower side of a second semiconductor substrate (corresponding to the second semiconductor substrate 21). Specifically, the low-permittivity region 1392 is provided, in the stacking direction, in a region between the second semiconductor substrate 1321 and the transfer gate TG of the transfer transistor. For example, the low-permittivity region 1392 is provided at least in a region where the second semiconductor substrate 1321 and the transfer gate TG are overlapped each other in a plan view of the second semiconductor substrate 1321 in the stacking direction. This enables the low-permittivity region 1392 to reduce the magnitude of parasitic capacitance generated between the second semiconductor substrate 1321 and the transfer gate TG.

The low-permittivity region 1392 is a region having a lower permittivity than that of a material included in the first insulating layer 1342. For example, the low-permittivity region 1392 may be configured as an air gap region of which the inside is a vacuum, or as an air gap region in which air is enclosed. In addition, the low-permittivity region 1392 may be a region formed by a material having a lower relative permittivity than that of a material included in the first insulating layer 1342. Further, the low-permittivity region 1392 may be configured by an air gap region and a region where a portion of the air gap region is filled with a low-permittivity material. It is to be noted that, as the low-permittivity material, for example, a dielectric material known as a Low-k material such as carbon-doped silicon (SiOC) or porous silica may be used.

It is to be noted that, in a case where the second substrate 20 includes a plurality of stacked semiconductor substrates in the thickness direction, the low-permittivity region 1391 may be provided on lateral sides of the plurality of stacked semiconductor substrates (i.e., the second semiconductor substrate 21, and at least one or more semiconductor substrates provided on the second semiconductor substrate 21) (First Aspect). In addition, the low-permittivity region 1392 may be provided on lower side of the plurality of stacked semiconductor substrates (i.e., the second semiconductor substrate 21, and at least one or more semiconductor substrates provided on the second semiconductor substrate 21) (Second Aspect). This enables the imaging device 1 according to the present embodiment to more efficiently reduce parasitic capacitance generated between the semiconductor substrate included in the second substrate 20 and the wiring line or the electrode.

(First Aspect)

Hereinafter, description is given in more detail of the first aspect of the technique according to the present embodiment with reference to FIGS. 29A, 29B, 29C, 30, 31A, 31B, 31C, 31D, 31E, 31F, 32A, 32B, 32C, 33A, 33B, 33C, 34A, 34B, 34C, 35A, 35B, 35C, 35D, 36A, 36B, and 36C.

FIGS. 29A, 29B, and 29C each include a plan view and a longitudinal cross-sectional view that describe a first method of forming the low-permittivity region 1391 in the first aspect.

As illustrated in FIG. 29A, the first insulating layer 1342 is configured by stacking films including a plurality of insulating materials having different etching rates. Specifically, the first insulating layer 1342 is configured by alternately stacking an $SiO_2$ film and an SiN film having etching rates different from each other.

The second semiconductor substrate 1321 and the separation insulating layer 1353 are provided on the first insulating layer 1342. The gate electrode 1322 is provided over the second semiconductor substrate 1321 with an unillustrated gate insulating film interposed therebetween, thereby allowing the field-effect transistor Tr2 to be disposed. A gate contact 1359 is electrically coupled to the gate electrode 1322 of the field-effect transistor Tr2, and a source or drain contact 1358 is electrically coupled to a source or drain region of the second semiconductor substrate 1321. It is to be noted that an SiN film 1365 that functions as a stress liner film or an etching stopper film may be formed on front surfaces of the second semiconductor substrate 1321 and the gate electrode 1322.

The separation insulating layer 1353 includes the through-wiring line 1360 that penetrates the separation insulating layer 1353 and the first insulating layer 1342. The through-wiring line 1360 electrically couples various wiring lines of the first substrate 10 and various wiring lines of the second substrate 20 together in an unillustrated region.

The first method of forming the low-permittivity region 1391 involves first sequentially performing lithography using a hard mask, dry etching of the second insulating layer 1352, removal of the SiN film 1365, and dry etching of the separation insulating layer 1353, thereby allowing for formation of an opening 1393 in a region between the second semiconductor substrate 1321 and the through-wiring line 1360. At this time, the first insulating layer 1342 includes an SiN film having an etching rate different from that of an $SiO_2$ film, thus stopping the etching of the first insulating layer 1342 in the stacking direction at the SiN film.

Next, as illustrated in FIG. 29B, a liner film 1366 including SiN is formed on a side surface and a bottom surface inside the opening 1393. The liner film 1366 is able to enhance strength of each of the side surface and the bottom surface inside the opening 1393; thus, the liner film 1366 is a film that prevents the opening 1393 from collapsing or deforming due to internal stress or the like.

Subsequently, as illustrated in FIG. 29C, a low-permittivity layer 1354 is deposited on the liner film 1366 by using CVD (Chemical Vapor Deposition) or the like under a condition of low embedding property to thereby occlude an upper portion of the opening 1393 before the bottom portion of the opening 1393 is embedded. This enables formation of the low-permittivity region 1391 including an air gap in a region where the opening 1393 has been formed. It is to be noted that, as a material used to form the low-permittivity layer 1354, a material publicly known as a Low-k material may be appropriately used. Thereafter, CMP (Chemical Mechanical Polish) is used to planarize the low-permittivity layer 1354, thereby enabling further formation of a wiring layer or the like on the low-permittivity layer 1354.

FIG. 30 includes a plan view and a longitudinal cross-sectional view that describe a variation in formation of the opening 1393 illustrated in FIG. 29A. As illustrated in FIG. 30, the first insulating layer 1342 may be provided as a single layer film of an $SiO_2$ film including no SiN film. In such a case, there is no SiN film serving as an etching stopper, and thus a termination of the etching in the method of stacking the separation insulating layer 1353 and the first insulating layer 1342 is controlled by etching time.

Accordingly, in a case where there is no request to strictly control the termination of the etching in the stacking direction of the first insulating layer 1342, it is possible to more simplify the process of forming the first insulating layer 1342 by omitting the formation of the SiN film in the first insulating layer 1342.

FIGS. 31A, 31B, 31C, 31D, 31E, and 31F each include a plan view and a longitudinal cross-sectional view of a variation in a shape of the low-permittivity region 1391 in the first aspect.

As illustrated in FIG. 31A, the low-permittivity region 1391 is provided as an air gap. The low-permittivity region 1391 is provided in at least a portion of a region between the second semiconductor substrate 1321 and the through-wiring line 1360. A length of the low-permittivity region 1391 in a direction orthogonal to the arrangement direction of the through-wiring line 1360 and the second semiconductor substrate 1321 in a plane of the second semiconductor substrate 1321 is preferably longer than those of both of the through-wiring line 1360 and the second semiconductor substrate 1321. In addition, a length of the low-permittivity region 1391 in the stacking direction is preferably longer than a thickness of the second semiconductor substrate 1321. That is, a cross-section of the low-permittivity region 1391 taken along a plane perpendicular to the arrangement direction of the through-wiring line 1360 and the second semiconductor substrate 1321 preferably has a size encompassing the plane of the second semiconductor substrate 1321 opposed to the through-wiring line 1360. This enables the low-permittivity region 1391 to further reduce the magnitude of parasitic capacitance between the second semiconductor substrate 1321 and the through-wiring line 1360.

As illustrated in FIG. 31B, the low-permittivity region 1391 may be provided as an air gap, and may be provided to have a slit-shaped planar shape. In such a case, an upper portion of an opening formed in the separation insulating layer 1353 is occluded more easily, thus making it easier to form the low-permittivity region 1391.

As illustrated in FIG. 31C, the low-permittivity region 1391 may be provided as an air gap, and may be provided close to the through-wiring line 1360. As long as the low-permittivity region 1391 is a space between the second semiconductor substrate 1321 and the through-wiring line 1360, it is possible for the low-permittivity region 1391 to achieve similar effects regardless of whether the low-permittivity region 1391 is provided on side of the second semiconductor substrate 1321 or side of the through-wiring line 1360.

As illustrated in FIG. 31D, the low-permittivity region 1391 may be provided as an air gap, and may be provided to have a substantially square shape. The low-permittivity region 1391 having a larger size is able to reduce parasitic capacitance generated between the second semiconductor substrate 1321 and the through-wiring line 1360. However, in a case where the size of the low-permittivity region 1391 is excessively large, the low-permittivity region 1391 results in decreasing the total strength of the first substrate 10 and the second substrate. For this reason, in a case where the total strength of the first substrate 10 and the second substrate is prioritized, the low-permittivity region 1391 is provided in such a shape as not to be excessively large.

As illustrated in FIG. 31E, the low-permittivity region 1391 may be provided as an air gap, and may be provided in a region around the through-wiring line 1360. Even in such a case, the low-permittivity region 1391 is provided between the second semiconductor substrate 1321 and the through-wiring line 1360, thus making it possible for the low-permittivity region 1391 to reduce the magnitude of parasitic capacitance between the second semiconductor substrate 1321 and the through-wiring line 1360.

As illustrated in FIG. 31F, in a case where a plurality of through-wiring lines 1360 are provided, the low-permittivity region 1391 may be provided in a region between the through-wiring lines 1360, in addition to a region between the second semiconductor substrate 1321 and the through-wiring line 1360. In such a case, it is possible for the low-permittivity region 1391 to also reduce the magnitude of parasitic capacitance generated between the plurality of through-wiring lines 1360.

Subsequently, FIGS. 32A, 32B, and 32C each include a plan view and a longitudinal cross-sectional view that describe a second method of forming the low-permittivity region 1391 in the first aspect.

As illustrated in FIG. 32A, the second forming method differs from the first forming method in that wet etching is used as etching of the separation insulating layer 1353.

As illustrated in FIG. 32A, specifically, lithography using a hard mask and removal of the second insulating layer 1352 are first performed, and thereafter the opening 1393 is provided in the SiN film 1365.

Next, as illustrated in FIG. 32B, a wet etchant (e.g., an aqueous hydrogen fluoride solution) is caused to act on the separation insulating layer 1353 through the opening 1393 formed in the SiN film 1365. This enables the separation insulating layer 1353 to be wet-etched to form an air gap in a region between the second semiconductor substrate 1321 and the through-wiring line 1360.

In the wet etching, an etching region is isotropically spread as compared with dry etching, and thus a shape of the air gap is a circular shape or a spherical shape in an in-plane direction of the second semiconductor substrate 1321 and in the stacking direction. For this reason, even in a case where a size of the opening 1393 provided in the SiN film 1365 is small, it is possible to form a large air gap in the separation insulating layer 1353.

A depth of the wet etching to the first insulating layer 1342 may be controlled by a position of formation of an SiN film having an etching rate different from that of an $SiO_2$ film in the first insulating layer 1342. Meanwhile, the spread of the wet etching in an in-plane direction of the separation insulating layer 1353 may be controlled by etching time.

Subsequently, as illustrated in FIG. 32C, the low-permittivity layer 1354 is deposited on the SiN film 1365 by using CVD or the like under a condition of low embedding property to thereby occlude the opening 1393. This enables an air gap formed in the separation insulating layer 1353 to be the low-permittivity region 1391. It is to be noted that, as a material used to form the low-permittivity layer 1354, a material publicly known as a Low-k material may be appropriately used. Thereafter, CMP (Chemical Mechanical Polish) is used to planarize the low-permittivity layer 1354, thereby enabling further formation of a wiring layer or the like on the low-permittivity layer 1354.

In the second forming method, an opening plane of the opening provided for the formation of an air gap is small, thus enabling suppression of the Low-k material or the like entering an air gap in forming the low-permittivity layer 1354. In addition, in the second forming method, it is possible to occlude an upper portion of the air gap more easily.

FIGS. 33A, 33B, and 33C include plan views and longitudinal cross-sectional views illustrating variations of the formation of the opening 1393 illustrated in FIGS. 32A, 32B, and 32C.

As described above, the wet etching results in the etching region being spread isotropically. For this reason, as illustrated in FIGS. 33A, 33B, and 33C, in a case where an area to be wet-etched is strictly controlled, a region for formation of the low-permittivity region 1391 is defined in advance by an SiN film 1367.

Specifically, lithography using a hard mask and film formation of the SiN film 1367 are sequentially performed to thereby form, in the separation insulating layer 1353, a region of which a bottom surface and a side surface are covered with the SiN film 1367. Thereafter, as illustrated in FIG. 33A, the opening 1393 is formed in the SiN film 1365 by lithography.

Next, as illustrated in FIG. 33B, a wet etchant (e.g., an aqueous hydrogen fluoride solution) is caused to act on the separation insulating layer 1353 through the opening 1393 formed in the SiN film 1365. This enables the separation insulating layer 1353 to be wet-etched to form an air gap in a region between the second semiconductor substrate 1321 and the through-wiring line 1360. At this time, the region where the wet etchant acts on the separation insulating layer 1353 is defined by the SiN film 1367, thus making it possible to prevent the wet etchant from acting on an unintended region due to overetching.

Subsequently, as illustrated in FIG. 33C, the low-permittivity layer 1354 is deposited on the SiN film 1365 by using CVD or the like under a condition of low embedding property to thereby occlude the opening 1393. This enables an air gap formed in the separation insulating layer 1353 to be the low-permittivity region 1391. Thereafter, CMP (Chemical Mechanical Polish) is used to planarize the low-permittivity layer 1354, thereby enabling further formation of a wiring layer or the like on the low-permittivity layer 1354.

FIGS. 34A, 34B, and 34C each include a plan view and a longitudinal cross-sectional view of a variation in the shape of the low-permittivity region 1391 in the first aspect.

As illustrated in FIG. 34A, the low-permittivity region 1391 is provided as an air gap. The low-permittivity region 1391 is provided in at least a portion of a region between the second semiconductor substrate 1321 and the through-wiring line 1360. A length of the low-permittivity region 1391 in a direction orthogonal to the arrangement direction of the through-wiring line 1360 and the second semiconductor substrate 1321 in the plane of the second semiconductor substrate 1321 is preferably longer than those of both of the through-wiring line 1360 and the second semiconductor substrate 1321. In addition, a formation depth of the low-permittivity region 1391 in the stacking direction is preferably longer than the thickness of the second semiconductor substrate 1321.

As illustrated in FIG. 34B, the low-permittivity region 1391 may be provided as an air gap, and may be provided close to the through-wiring line 1360. As long as the low-permittivity region 1391 is a space between the second semiconductor substrate 1321 and the through-wiring line 1360, it is possible for the low-permittivity region 1391 to achieve similar effects regardless of whether the low-permittivity region 1391 is provided on the side of the second semiconductor substrate 1321 or the side of the through-wiring line 1360.

As illustrated in FIG. 34C, the low-permittivity region 1391 may be provided as an air gap, and may be provided close to both of the through-wiring line 1360 and the second semiconductor substrate 1321. In such a case, the low-permittivity region 1391 is provided across the entire region between the through-wiring line 1360 and the second semiconductor substrate 1321.

As illustrated in FIGS. 34A, 34B, and 34C, the position of the low-permittivity region 1391 may be controlled by the position of the opening 1393 in wet-etching the separation insulating layer 1353. In addition, the size and depth of the low-permittivity region 1391 may be controlled by process time of the wet etching. It is to be noted that arranging a configuration not easily wet-etched such as an SiN film as needed also makes it possible to control the size and depth of a region where the low-permittivity region 1391 is to be formed.

FIGS. 35A, 35B, 35C, and 35D are each a longitudinal cross-sectional view that describes a third method of forming the low-permittivity region 1391 in the first aspect. As illustrated in FIG. 35A, first, a portion of a region of the second semiconductor substrate 1321, an SiN film 1371, and an $SiO_2$ film 1372 formed across the entire surface on the first insulating layer 1342 is removed by etching to form the opening 1393. A region where the opening 1393 is formed is a region where the separation insulating layer 1353 is to be formed.

Next, as illustrated in FIG. 35B, an $SiO_2$ film 1373 is formed along a shape of the opening 1393 to improve adhesiveness of an organic resin 1394. Thereafter, the organic resin 1394 is embedded in a region of the opening 1393 where the low-permittivity region 1391 is to be formed, and an $SiO_2$ film (unillustrated) is embedded in the region of the opening 1393 where the separation insulating layer 1353 is to be formed. That is, the organic resin 1394 to be removed in a subsequent stage process and to be an air gap is embedded in a portion of a region between the through-wiring line 1360 and the second semiconductor substrate 1321, among the region where the opening 1393 is formed. As the organic resin 1394, an organic Low-k material may be used; for example, a polyallyl ether (PAE) resin represented by SiLK (registered trademark, Dow Corning Co., Ltd.) may be used.

Subsequently, as illustrated in FIG. 35C, providing the gate electrode 1322 over the second semiconductor substrate 1321 with an unillustrated gate insulating film interposed therebetween allows for formation of the field-effect transistor Tr2. In addition, the gate contact 1359 and the source or drain contact 1358 are electrically coupled, respectively, to the gate electrode 1322 of the field-effect transistor Tr2 and the source or drain region of the second semiconductor substrate 1321. The SiN film 1365 that functions as a stress liner film or an etching stopper film is formed on front surfaces of the second semiconductor substrate 1321 and the gate electrode 1322.

Further, the through-wiring line 1360 that electrically couples various wiring lines of the first substrate 10 and various wiring lines of the second substrate 20 together in an unillustrated region is formed in the separation insulating layer 1353. For example, the through-wiring line 1360 may be provided to penetrate the separation insulating layer 1353 and the first insulating layer 1342.

Next, as illustrated in FIG. 35D, the organic resin 1394 embedded in the separation insulating layer 1353 is removed using reactive ion etching (Reactive Ion Etching: RIE) through a through-hole reaching the organic resin 1394. This enables formation of an air gap to be the low-permittivity region 1391 in the region where the organic resin 1394 is embedded. According to the third forming method, it is possible to form an air gap that selectively becomes the low-permittivity region 1391, in the region where the organic resin 1394 is embedded.

FIGS. 36A, 36B, and 36C are each a longitudinal cross-sectional view that describes a variation in the third method of forming the low-permittivity region 1391 in the first aspect.

First, as illustrated in FIG. 35A, a portion of the region of the second semiconductor substrate 1321, the SiN film 1371, and the $SiO_2$ film 1372 formed across the entire surface on the first insulating layer 1342 is removed by etching to form the opening 1393. Next, as illustrated in FIG. 36A, the opening 1393 is once embedded by the separation insulating layer 1353, and thereafter the separation insulating layer 1353 in a region where the low-permittivity region 1391 is to be formed is selectively removed by lithography and etching to allow the organic resin 1394 to be embedded.

Subsequently, as illustrated in FIG. 36C, similarly to the process illustrated in FIG. 35C, the field-effect transistor Tr2 is formed on the second semiconductor substrate 1321, and the gate contact 1359 and the source or drain contact 1358 are electrically coupled to respective terminals of the field-effect transistor Tr2. Further, in the separation insulating layer 1353, the through-wiring line 1360 that electrically couples the various wiring lines of the first substrate 10 and the various wiring lines of the second substrate 20 together in an unillustrated region is formed to penetrate the separation insulating layer 1353 and the first insulating layer 1342.

Subsequently, as illustrated in FIG. 36D, similarly to the process illustrated in FIG. 35D, the organic resin 1394 embedded in the separation insulating layer 1353 is removed using reactive ion etching (Reactive Ion Etching: RIE) through a through-hole reaching the organic resin 1394. This enables formation of an air gap to be the low-permittivity region 1391 in the region where the organic resin 1394 is embedded.

The variations of the third forming method described in FIGS. 36A, 36B, 36C, and 36D enable more strict control of the region where the organic resin 1394 is embedded. Accordingly, it is possible to prevent the difficulty in forming the through-wiring line 1360 from being increased because of the presence of the organic resin 1394.

FIGS. 37A, 37B, and 37C are each a longitudinal cross-sectional view that describes a fourth method of forming the low-permittivity region 1391 in the first aspect.

As illustrated in FIGS. 37A, 37B, and 37C, the fourth method of forming the low-permittivity region 1391 involves forming the low-permittivity region 1391 in a region surrounded by the SiN film 1365 around the through-wiring line 1360 that electrically couples the first substrate 10 and the second substrate 20 together.

Specifically, the first substrate 10 is configured by stacking the first insulating layer 1342 on the first semiconductor substrate 1311, and the second substrate 20 is configured by stacking the second insulating layer 1352 on the second semiconductor substrate 1321. The first substrate 10 includes a photodiode (unillustrated), and the second substrate 20 includes the field-effect transistor Tr2 (also referred to as a pixel transistor) that performs signal processing on signal charges having been photoelectrically converted by the photodiode. Each wiring line or each terminal provided in the first substrate 10 is electrically coupled to the gate electrode 1359 by the through-wiring line 1360 passing through the separation insulating layer 1353 provided to penetrate the second semiconductor substrate 1321, and, for example, via the gate contact 1359. A region around the through-wiring line 1360 provided on the lateral side of the second semiconductor substrate 1321 is surrounded by the SiN film 1365, and the low-permittivity region 1391 is provided in the region surrounded by the SiN film 1365.

Description is given of such a method of forming the low-permittivity region 1391 with reference to FIGS. 37A, 37B, and 37C.

For example, as illustrated in FIG. 37A, the SiN film 1365 is formed to surround a portion of or the entire region of the separation insulating layer 1353 of the second substrate 20. Thereafter, the through-wiring line 1360 is formed to penetrate the region surrounded by the SiN film 1365. This allows the SiN film 1365 to be provided, which surrounds the region around the through-wiring line 1360, on the lateral side of the second semiconductor substrate 1321. It is to be noted that the SiN film 1365 may be provided continuously with a sidewall insulating film 1322S of the gate electrode 1322 of the field-effect transistor Tr2, for example.

Next, as illustrated in FIG. 37B, lithography and reactive ion etching (Reactive Ion Etching: RIE) is used to form the opening 1393 that penetrates the second insulating layer 1352 and the SiN film 1365 on upper side to reach the inside of the region surrounded by the SiN film 1365. Thereafter, the SiN film 1366 is formed along an inner surface of the opening 1393 exposing the second insulating layer 1352.

Subsequently, as illustrated in FIG. 37C, wet etching is performed by flowing an etchant into the region surrounded by the SiN film 1365 through the opening 1393, and the separation insulating layer 1353 inside the region surrounded by the SiN film 1365 is removed. This allows for formation of the low-permittivity region 1391 which is an air gap around the through-wiring line 1360. It is to be noted that the low-permittivity region 1391 may remain as an air gap, or may be filled with a Low-k material such as carbon-doped silicon (SiOC) or porous silica.

According to the fourth method of forming the low-permittivity region 1391, a region where the low-permittivity region 1391 is to be formed is able to be limited to the region surrounded by the SiN film 1365, thus making it possible to suppress dispersion in the shape or size of the low-permittivity region 1391.

In addition, in the fourth forming method, forming the region surrounded by the SiN film 1365 in advance in the separation insulating layer 1353 enables only lithography, RIE etching, and wet etching to be employed, as additional processes in forming the low-permittivity region 1391. Accordingly, the fourth forming method enables formation of the low-permittivity region 1391 at lower cost.

(Second Aspect)

Hereinafter, description is given in more detail of a second aspect of the technique according to the present embodiment with reference to FIGS. 38A, 38B, 38C, 38D, 39A, 39B, 39C, 39D, 40A, 40B, 40C, 40D, 41A, 41B, 41C, 41D, 41E, 42A, 42B, 42C, 42D, and 42E.

FIGS. 38A, 38B, 38C, and 38D are each a longitudinal cross-sectional view that describes a first method of forming the low-permittivity region 1392 in the second aspect.

As illustrated in FIG. 38A, first, a portion of the first insulating layer 1342 of the first substrate 10 is opened, and an SiN film 1343 is deposited along a shape of the opening.

Next, as illustrated in FIG. 38B, the second semiconductor substrate 1321 held by a support substrate 1380 and an insulating layer 1344 are attached onto the first insulating layer 1342 in which the opening is formed. A surface of the insulating layer 1344 facing the opening formed in the first insulating layer 1342 is planar, thus allowing for formation of the low-permittivity region 1392 including an air gap between the opening formed in the first insulating layer 1342 and the insulating layer 1344.

Thereafter, as illustrated in FIG. 38C, after the support substrate 1380 is detached, the SiN film 1371 and the $SiO_2$ film 1372 are formed on the second semiconductor substrate 1321. Subsequently, a portion of a region of the second semiconductor substrate 1321, the SiN film 1371, and the $SiO_2$ film 1372 is removed by etching.

Next, as illustrated in FIG. 38D, the region removed by etching is embedded by the separation insulating layer 1353 to form the field-effect transistor Tr2 and the through-wiring line 1360. Specifically, providing the gate electrode 1322 over the second semiconductor substrate 1321 with an unillustrated gate insulating film interposed therebetween allows for formation of the field-effect transistor Tr2. In addition, the gate contact 1359 and the source or drain contact 1358 are electrically coupled, respectively, to the gate electrode 1322 of the field-effect transistor Tr2 and the source or drain region of the second semiconductor substrate 1321. The SiN film 1365 that functions as a stress liner film or an etching stopper film is formed on front surfaces of the second semiconductor substrate 1321 and the gate electrode 1322.

Further, the through-wiring line 1360 that electrically couples various wiring lines of the first substrate 10 and various wiring lines of the second substrate 20 together in an unillustrated region is formed in the separation insulating layer 1353. For example, the through-wiring line 1360 may be provided to penetrate the separation insulating layer 1353 and the first insulating layer 1342.

This enables formation of the low-permittivity region 1392 including an air gap below the second semiconductor substrate 1321 with relatively few additional processes. The low-permittivity region 1392 has, for example, a rectangular shape, and may be formed in a region inside a planar region of the second semiconductor substrate 1321.

FIGS. 39A, 39B, 39C, and 39D are each a plan view of a variation in the shape of the low-permittivity region 1392 in the second aspect.

As illustrated in FIG. 39A, the low-permittivity region 1392 provided as an air gap may be provided to extend to the outside of the planar region of the second semiconductor substrate 1321. In addition, as illustrated in FIG. 39B, the low-permittivity region 1392 provided as an air gap may be provided to have a plurality of rectangular shapes arranged in parallel to one another. In addition, as illustrated in FIG. 39C, the low-permittivity region 1392 provided as an air gap may be provided in a region larger than the planar region of the second semiconductor substrate 1321. Further, as illustrated in FIG. 39D, the low-permittivity region 1392 provided as an air gap may be provided to have a plurality of rectangular shapes arranged in parallel to one another, and to extend to the outside of the planar region of the second semiconductor substrate 1321.

In the first forming method, the insulating layer 1344 is provided between the low-permittivity region 1392 and the second semiconductor substrate 1321. For this reason, the low-permittivity region 1392 and the second semiconductor substrate 1321 may have planar shapes independent of each other.

Next, FIGS. 40A, 40B, 40C, and 40D are each a longitudinal cross-sectional view that describes a second method of forming the low-permittivity region 1392 in the second aspect.

As illustrated in FIGS. 40A and 40B, the second semiconductor substrate 1321 held by the support substrate 1380 and the insulating layer 1344 are attached onto the first substrate 10 in which the SiN film 1343 is formed on the first insulating layer 1342. Here, a portion of the insulating layer 1344 provided on the second semiconductor substrate 1321 is opened; the low-permittivity region 1392 including an air gap is formed among a back surface of the second semiconductor substrate 1321, the opening formed in the insulating layer 1344, and the SiN film 1343 on the first insulating layer 1342.

Thereafter, as illustrated in FIG. 40C, after the support substrate 1380 is detached, the SiN film 1371 and the $SiO_2$ film 1372 are formed on the second semiconductor substrate 1321. Subsequently, a portion of a region of the second semiconductor substrate 1321, the SiN film 1371, and the $SiO_2$ film 1372 is removed by etching.

Next, as illustrated in FIG. 40D, the region removed by etching is embedded by the separation insulating layer 1353 to form the field-effect transistor Tr2 and the through-wiring line 1360. Specifically, providing the gate electrode 1322 over the second semiconductor substrate 1321 with an unillustrated gate insulating film interposed therebetween allows for formation of the field-effect transistor Tr2. In addition, the gate contact 1359 and the source or drain contact 1358 are electrically coupled, respectively, to the gate electrode 1322 of the field-effect transistor Tr2 and the source or drain region of the second semiconductor substrate 1321. The SiN film 1365 that functions as a stress liner film or an etching stopper film is formed on front surfaces of the second semiconductor substrate 1321 and the gate electrode 1322.

Further, the through-wiring line 1360 that electrically couples various wiring lines of the first substrate 10 and various wiring lines of the second substrate 20 together in an unillustrated region is formed in the separation insulating layer 1353. For example, the through-wiring line 1360 may be provided to penetrate the separation insulating layer 1353 and the first insulating layer 1342.

This enables formation of the low-permittivity region 1392 including an air gap below the second semiconductor substrate 1321, similarly to the first forming method. The low-permittivity region 1392 has, for example, a rectangular shape, and may be formed in a region inside a planar region of the second semiconductor substrate 1321.

In the second forming method, the back surface of the second semiconductor substrate 1321 is exposed to a low-permittivity region 1390. For this reason, the low-permittivity region 1392 may have any planar shape except the case where a planar region of the low-permittivity region 1392 is larger than the planar region of the second semiconductor substrate 1321 as illustrated in FIG. 39C.

Subsequently, FIGS. 41A, 41B, 41C, 41D, and 41E are each a longitudinal cross-sectional view that describes a third method of forming the low-permittivity region 1932 in the second aspect.

As illustrated in FIGS. 41A and 41B, the second semiconductor substrate 1321 held by the support substrate 1380 and the insulating layer 1344 including the organic resin 1394 are attached onto the first substrate 10 in which the SiN film 1343 is formed on the first insulating layer 1342.

Here, an opening is formed in the insulating layer 1344 provided on the second semiconductor substrate 1321, and the formed opening is embedded by the organic resin 1394 including an organic Low-k material. As the organic Low-k material, for example, a polyallyl ether (PAE) resin represented by SiLK (registered trademark, Dow Corning Co., Ltd.) may be used. The organic resin 1394 including the organic Low-k material is selectively removed in a subsequent stage to thereby form the low-permittivity region 1390 including an air gap.

Thereafter, as illustrated in FIG. 41C, after the support substrate 1380 is detached, the SiN film 1371 and the $SiO_2$ film 1372 are formed on the second semiconductor substrate 1321. Subsequently, a portion of a region of the second semiconductor substrate 1321, the SiN film 1371, and the $SiO_2$ film 1372 is removed by etching. This allows the organic resin 1394 provided on the second semiconductor substrate 1321 to be exposed from a side surface of the second semiconductor substrate 1321.

Subsequently, as illustrated in FIG. 41D, reactive ion etching (Reactive Ion Etching: RIE) is used to remove the exposed organic resin 1394. This allows for formation of the low-permittivity region 1392 including an air gap below the second semiconductor substrate 1321.

Next, as illustrated in FIG. 41E, the region removed by etching in the process illustrated in FIG. 41C is embedded by the separation insulating layer 1353 to form the field-effect transistor Tr2 and the through-wiring line 1360. Specifically, providing the gate electrode 1322 over the second semiconductor substrate 1321 with an unillustrated gate insulating film interposed therebetween allows for formation of the field-effect transistor Tr2. In addition, the gate contact 1359 and the source or drain contact 1358 are electrically coupled, respectively, to the gate electrode 1322 of the field-effect transistor Tr2 and the source or drain region of the second semiconductor substrate 1321. The SiN film 1365 that functions as a stress liner film or an etching stopper film is formed on front surfaces of the second semiconductor substrate 1321 and the gate electrode 1322.

Further, the through-wiring line 1360 that electrically couples various wiring lines of the first substrate 10 and various wiring lines of the second substrate 20 together in an unillustrated region is formed in the separation insulating layer 1353. For example, the through-wiring line 1360 may be provided to penetrate the separation insulating layer 1353 and the first insulating layer 1342.

This enables formation of the low-permittivity region 1392 including an air gap below the second semiconductor substrate 1321, similarly to the first forming method. The low-permittivity region 1392 may be formed, for example, as a plurality of rectangular shapes extending from one side to the other side of the planar region of the second semiconductor substrate 1321.

In the third forming method, the organic resin 1394 is exposed by etching in forming the separation insulating layer 1353, thereby removing the organic resin 1394 by RIE in a subsequent stage. For this reason, the low-permittivity region 1392 may have any planar shape except the case where the planar region of the low-permittivity region 1392 is included inside the planar region of the second semiconductor substrate 1321 as illustrated in FIGS. 38D and 39B and except the case where the planar region of the low-permittivity region 1392 is larger than the planar region of the second semiconductor substrate 1321 as illustrated in FIG. 39C.

Subsequently, FIGS. 42A, 42B, 42C, 42D, and 42E are each a longitudinal cross-sectional view that describes a fourth method of forming the low-permittivity region 1932 in the second aspect.

As illustrated in FIGS. 42A and 42B, the second semiconductor substrate 1321 held by the support substrate 1380 and the insulating layer 1344 including the organic resin 1394 are attached onto the first substrate 10 in which the SiN film 1343 is formed on the first insulating layer 1342.

Here, an opening is formed in the insulating layer 1344 provided on the second semiconductor substrate 1321, and the formed opening is embedded by the organic resin 1394 including an organic Low-k material. As the organic Low-k material, for example, a polyallyl ether (PAE) resin represented by SiLK (registered trademark, Dow Corning Co., Ltd.) may be used. The organic resin 1394 including the organic Low-k material is selectively removed in a subsequent stage to thereby form the low-permittivity region 1390 including an air gap. The fourth forming method differs from the third forming method in that a region where the organic resin 1394 is to be formed is located only below the second semiconductor substrate 1321.

Thereafter, as illustrated in FIG. 42C, after the support substrate 1380 is detached, the SiN film 1371 and the $SiO_2$ film 1372 are formed on the second semiconductor substrate 1321. Subsequently, a portion of a region of the second semiconductor substrate 1321, the SiN film 1371, and the $SiO_2$ film 1372 is removed by etching. This allows the organic resin 1394 provided on the second semiconductor substrate 1321 to be exposed from the side surface of the second semiconductor substrate 1321.

Subsequently, as illustrated in FIG. 42D, reactive ion etching (Reactive Ion Etching: RIE) is used to remove the exposed organic resin 1394. This allows for formation of the low-permittivity region 1392 including an air gap below the second semiconductor substrate 1321.

Next, as illustrated in FIG. 42E, the region removed by etching in the process illustrated in FIG. 42C is embedded by the separation insulating layer 1353 to form the field-effect transistor Tr2 and the through-wiring line 1360. Specifically, providing the gate electrode 1322 over the second semiconductor substrate 1321 with an unillustrated gate insulating film interposed therebetween allows for formation of the field-effect transistor Tr2. In addition, the gate contact 1359 and the source or drain contact 1358 are electrically coupled, respectively, to the gate electrode 1322 of the field-effect transistor Tr2 and the source or drain region of the second semiconductor substrate 1321. The SiN film 1365 that functions as a stress liner film or an etching stopper film is formed on front surfaces of the second semiconductor substrate 1321 and the gate electrode 1322.

Further, the through-wiring line 1360 that electrically couples various wiring lines of the first substrate 10 and various wiring lines of the second substrate 20 together in an unillustrated region is formed in the separation insulating layer 1353. For example, the through-wiring line 1360 may be provided to penetrate the separation insulating layer 1353 and the first insulating layer 1342.

This enables formation of the low-permittivity region 1392 including an air gap below the second semiconductor substrate 1321, similarly to the first forming method. The low-permittivity region 1392 may be formed, for example, as a rectangular shape extending from one side to the other side of the planar region of the second semiconductor substrate 1321.

In the fourth forming method, the organic resin 1394 is exposed by etching in forming the separation insulating layer 1353, thereby removing the organic resin 1394 by RIE in a subsequent stage. For this reason, the low-permittivity region 1392 may have any planar shape except the case where the planar region of the low-permittivity region 1392 is included inside the planar region of the second semiconductor substrate 1321 as illustrated in FIGS. 38D and 39B and except the case where the planar region of the low-permittivity region 1392 is larger than the planar region of the second semiconductor substrate 1321 as illustrated in FIG. 39C.

The detailed description has been given above of the technique according to the third embodiment of the present disclosure. According to the technique of the present embodiment, it is possible to reduce the magnitude of parasitic capacitance generated between the second semiconductor substrate 21 and the through-wiring line 54, the transfer gate TG, or the like. Therefore, according to the technique of the present embodiment, it is possible for the three-dimensionally structured imaging device 1 to improve electric characteristics of the field-effect transistor provided in the second semiconductor substrate 21.

5. Modification Examples

Hereinafter, description is given of modification examples of the imaging device 1 to which the technique according to the present disclosure is applied.

First Modification Example

First, description is given, with reference to FIG. 43, of a first modification example which is a modification example of the cross-sectional configuration in the stacking direction of the imaging device 1. FIG. 43 is a longitudinal cross-sectional view of a modification example of the cross-sectional configuration illustrated in FIG. 7.

As illustrated in FIG. 43, in the imaging device 1 according to the first modification example, the transfer transistor TR includes the transfer gate TG of a planar type. Therefore, the transfer gate TG does not penetrate the p-well layer 42, and is formed on the front surface of the first semiconductor substrate 11. Even in a case where the transfer gate TG of the planar type is used for the transfer transistor TR, it is possible for the imaging device 1 to achieve effects similar to those described above.

Second Modification Example

Next, description is given, with reference to FIG. 44, of a second modification example which is a modification example of the cross-sectional configuration in the stacking direction of the imaging device 1. FIG. 44 is a longitudinal cross-sectional view of a modification example of the cross-sectional configuration illustrated in FIG. 7.

As illustrated in FIG. 44, in the imaging device 1 according to the second modification example, electrical coupling between the second substrate 20 and the third substrate 30 is formed in a region corresponding to a peripheral region 14 in the first substrate 10. The peripheral region 14 is a region corresponding to a frame region provided along the rim of the pixel region 13 of the first substrate 10. In the imaging device 1 according to the second modification example, the second substrate 20 includes the plurality of pad electrodes 58 in a region corresponding to the peripheral region 14, and the third substrate 30 includes the plurality of pad electrodes 64 in a region corresponding to the peripheral region 14. This allows the second substrate 20 and the third substrate 30 to be electrically coupled to each other through bonding between the pad electrodes 58 and 64 provided in the region corresponding to the peripheral region 14. Accordingly, it is possible for the imaging device 1 according to the second modification example to reduce the possibility that an influence by the bonding between the pad electrodes 58 and 64 may exert on the pixel region 13, as compared with the case of bonding the pad electrodes 58 and 64 together in a region corresponding to the pixel region 13.

Third Modification Example

Further, description is given of a configuration example of an imaging device 1B according to a third modification example with reference to FIGS. 45 to 50. FIGS. 45 to 47 are each a cross-sectional view of a configuration example in a thickness direction of the imaging device 1B according to the third modification example. FIGS. 48 to 50 are each a cross-sectional view of a layout example in the horizontal direction of a plurality of pixel units PU of the imaging device 1B according to the third modification example. It is to be noted that each cross-sectional view illustrated in FIGS. 48 to 50 is merely a schematic view, and is not a diagram intended to illustrate the actual structure strictly and precisely. In each cross-sectional view illustrated in FIGS. 48 to 50, in order to describe the configuration of the imaging device 1B in a plain manner on the sheet, positions in the horizontal direction of transistors and impurity diffusion layers are intentionally changed at positions sec1 to sec3.

Specifically, in the pixel unit PU of the imaging device 1B illustrated in FIG. 45, a cross-section at the position sec1 corresponds to a cross-section taken along a line A1-A1' in FIG. 48; a cross-section at the position sec2 corresponds to a cross-section taken along a line B1-B1' in FIG. 49; and a cross-section at the position sec3 corresponds to a cross-section taken along a line C1-C1' in FIG. 50. Likewise, in the imaging device 1B illustrated in FIG. 46, a cross-section at the position sec1 corresponds to a cross-section taken along a line A2-A2' in FIG. 48; a cross-section at the position sec2 corresponds to a cross-section taken along a line B2-B2' in FIG. 49; and a cross-section at the position sec3 corresponds to a cross-section taken along a line C2-C2' in FIG. 50. In the imaging device 1B illustrated in FIG. 47, a cross-section at the position sec1 corresponds to a cross-section taken along a line A3-A3' in FIG. 48; a cross-section at the position sec2 corresponds to a cross-section taken along a line B3-B3' in FIG. 49; and a cross-section at the position sec3 corresponds to a cross-section taken along a line C3-C3' in FIG. 50.

As illustrated in FIGS. 45 to 50, the second substrate 20 is stacked on side of a front surface 10*a* (one surface) of the first substrate (bottom substrate) 10. The photodiode PD, the transfer transistor TR, and the floating diffusion FD are provided on the side of the front surface 10*a* of the first substrate 10. The photodiode PD, the transfer transistor TR, and the floating diffusion FD are provided for each sensor pixel 12.

The other side (e.g., back surface) of the first substrate 10 is a light incident surface. The imaging device 1B is a back-illuminated imaging device, and includes a color filter and a light-receiving lens on the back surface. The color filter and the light-receiving lens are provided for each sensor pixel 12.

The first semiconductor substrate 11 of the first substrate 10 includes, for example, a silicon substrate. The first semiconductor substrate 11 includes a well layer WE of a first electrically-conductive type (e.g., p-type) in a portion of a front surface and a vicinity thereof, and includes the photodiode PD of a second electrically-conductive type (e.g., n-type) in a region deeper than the well layer WE. In addition, the well layer WE includes therein a well contact layer having a higher p-type concentration than that of the well layer WE, and the floating diffusion FD of the n-type. The well contact layer is provided to reduce contact resistance between the well layer WE and a wiring line.

The first semiconductor substrate 11 includes an element separation layer 16 that electrically separates adjacent sensor pixels 12 from each other. The element separation layer 16 includes, for example, an STI (Shallow Trench Isolation) structure, and extends in a depth direction of the first semiconductor substrate 11. The element separation layer 16 includes, for example, silicon oxide. In addition, the first semiconductor substrate 11 includes an impurity diffusion layer 17 between the element separation layer 16 and the photodiode PD. For example, the impurity diffusion layer 17 includes a p-type layer and an n-type layer provided to extend in the thickness direction of the first semiconductor substrate 11. The p-type layer is positioned on side of the element separation layer 16, and the n-type layer is positioned on side of the photodiode PD.

An insulating film 2015 is provided on side of a front surface 11*a* of the first semiconductor substrate 11. The insulating film 2015 is, for example, a film in which one of or two or more of a silicon oxide film (SiO), a silicon nitride film (SiN), a silicon oxynitride film (SiON), and a silicon carbonitride film (SiCN) are stacked.

The second substrate 20 includes a lower substrate 2210 and an upper substrate 2220. The lower substrate 2210 includes a semiconductor substrate 2211. The semiconductor substrate 2211 is a silicon substrate including, for example, single-crystal silicon. The amplification transistor AMP and an element separation layer 2213 surrounding a periphery of the amplification transistor AMP are provided on side of one surface (e.g., a front surface 2211*a*) of the semiconductor substrate 2211. The element separation layer 2213 electrically separates one amplification transistor AMP and the other amplification transistor AMP of the adjacent pixel unit PU from each other.

The lower substrate 2210 includes an insulating film 2215 that covers the front surface 2211*a* of the semiconductor substrate 2211. The insulating film 2215 covers the amplification transistor AMP and the element separation layer 2213. In addition, the lower substrate 2210 includes an insulating film 2217 that covers the other surface (e.g., a back surface 2211*b*) of the semiconductor substrate 2211. The insulating films 2215 and 2217 are each, for example, a film in which one of or two or more of SiO, SiN, SiON, and SiCN are stacked. The insulating film 2015 of the first substrate 10 and the insulating film 2217 of the lower substrate 2210 are bonded to each other to configure an interlayer insulating film 2051.

The upper substrate 2220 includes a semiconductor substrate 2221. The semiconductor substrate 2221 is a silicon substrate including, for example, single-crystal silicon. The reset transistor RST, the selection transistor SEL, and an element separation layer 2223 are provided on side of one surface (e.g., a front surface 2221*a*) of the semiconductor substrate 2221. For example, the element separation layer 2223 is provided both between the reset transistor RST and the selection transistor SEL, and between the selection transistor SEL and a well layer of the semiconductor substrate 2221.

The upper substrate 2220 includes an insulating film 2225 that covers the front surface 2221*a*, a back surface 2221*b*, and a side surface of the semiconductor substrate 2221. The insulating film 2225 is, for example, a film in which one of or two or more of SiO, SiN, SiON, and SiCN are stacked. The insulating film 2215 of the lower substrate 2210 and the insulating film 2225 of the upper substrate 2220 are bonded to each other to configure an interlayer insulating film 2053.

The imaging device 1B includes a plurality of wiring lines L1 to L10 provided in the interlayer insulating films 2051 and 2053 and electrically coupled to at least one of the first substrate 10 or the second substrate 20. The wiring line L1 electrically couples the drain of the amplification transistor AMP and the power source line VDD. The wiring line L2 electrically couples four floating diffusions FD included in one pixel unit PU and a gate electrode AG of the amplification transistor AMP together. The wiring line L3 electrically couples the source of the amplification transistor AMP and the drain of the selection transistor SEL together. The wiring line L4 electrically couples a gate electrode SG of the selection transistor SEL and a pixel drive line together.

The wiring line L5 electrically couples the source of the selection transistor SEL and a vertical signal line together. The wiring line L6 electrically couples the drain of the reset transistor RST and the power source line VDD together. The wiring line L7 electrically couples a gate electrode RG of the reset transistor RST and the pixel drive line together. The wiring line L8 electrically couples the source of the reset transistor RST and the wiring line L2 together. The wiring line L9 electrically couples a gate electrode TG of the transfer transistor TR and the pixel drive line together. The wiring line L10 electrically couples a well contact layer and a reference potential line that supplies a reference potential (e.g., ground potential: 0 V) together.

In the wiring lines L1 to L10, a portion provided to extend in a thickness direction of the stack includes tungsten (W), and a portion provided to extend in a direction (e.g., horizontal direction) orthogonal to the thickness direction of the stack includes copper (Cu) or a Cu alloy mainly including Cu. However, a material included in the wiring lines L1 to L10 is not limited thereto; another material may be included.

The second substrate 20 includes a plurality of pad electrodes 2227 coupled to any wiring line (e.g., the wiring lines L1, L4 to L7, L9, and L10) of the wiring lines L1 to L10 described above. The plurality of pad electrodes 2227 each include, for example, Cu or a Cu alloy.

The third substrate 30 is disposed on side (e.g., front surface side), of the second substrate 20, opposite to a surface facing the first substrate 10. The third substrate 30 includes a semiconductor substrate 2301, an insulating film 2304 that covers side of a front surface 2301*a* of the semiconductor substrate 2301, a plurality of wiring lines L30 provided on the side of the front surface 2301*a* of the semiconductor substrate 2301, and pad electrodes 2305 coupled to respective wiring lines L30. It is to be noted that front surfaces of the second substrate 20 and the front surface of 30 are attached together as described later. For this reason, the front surface 2301*a* of the semiconductor substrate 2301 faces downward.

The semiconductor substrate 2301 is a silicon substrate including, for example, single-crystal silicon. The semiconductor substrate 2301 includes, on the side of the front surface 2301*a*, an impurity diffusion layer and a plurality of transistors included in a logic circuit. The insulating film 2304 covers the impurity diffusion layer and the plurality of transistors included in the logic circuit. The insulating film 2304 includes a contact hole coupled to the transistors and the impurity diffusion layer.

The wiring line L30 is provided in the contact hole. In the wiring line L30, a portion provided to extend in a thickness direction of the third substrate 30 includes titanium (Ti) or cobalt (Co), and a portion provided to extend in a direction (e.g., horizontal direction) orthogonal to the thickness direction of the third substrate 30 includes Cu or a Cu alloy mainly including Cu. However, a material included in the wiring line L30 is not limited thereto; another material may be included.

A silicide 2303 (e.g., titanium silicide (TiSi) or cobalt silicide ($CoSi_2$)) is formed at a coupling section between the wiring line L30 and the semiconductor substrate 2301. The silicide 2303 allows the coupling between the wiring line L30 and the semiconductor substrate 2301 to be close to ohmic contact, thus reducing the contact resistance. This achieves higher operation speed of the logic circuit.

It is to be noted that no silicide is formed in the first substrate 10 and the second substrate 20. This enables heat treatment or the like at a temperature exceeding a heat resistance temperature of a silicide in forming the first substrate 10 and the second substrate 20. However, a silicide may be formed in at least one of the first substrate 10 or the second substrate 20.

The plurality of pad electrodes 2305 each include, for example, Cu or a Cu alloy. In the thickness direction of the imaging device 1B, the pad electrode 2305 of the third substrate 30 faces the pad electrode 2227 of the second substrate 20 to allow for electrical coupling. For example, the pad electrodes 2305 and 2227 are integrated together by Cu—Cu bonding in a state of facing each other. This allows for electrical coupling between the second substrate 20 and the third substrate 30, and allows for enhancement of strength of attaching between the second substrate 20 and the third substrate 30.

In the imaging device 1B according to the third modification example, one floating diffusion contact may be disposed for each plurality of sensor pixels 12. For example, four sensor pixels 12 adjacent to one another may share one floating diffusion contact. Likewise, one well contact may be disposed for each plurality of sensor pixels 12. For example, four sensor pixels 12 adjacent to one another may share one well contact.

Specifically, as illustrated in FIGS. 46 and 50, the imaging device 1B may share a common pad electrode 2102 disposed to straddle the plurality of sensor pixels 12, and one wiring line L2 provided on the common pad electrode 2102. For example, in the imaging device 1B, in a plan view, there are regions where floating diffusions FD1 to FD4 of the four sensor pixels 12 are adjacent to each other with the element separation layer 16 interposed therebetween. The common pad electrode 2102 is provided in this region. The common pad electrode 2102 is disposed to straddle the four floating diffusions FD1 to FD4, and is electrically coupled to each of the four floating diffusions FD1 to FD4. The common pad electrode 2102 includes, for example, a polysilicon film doped with n-type impurities or p-type impurities.

In addition, one wiring line L2 (i.e., floating diffusion contact) is provided on a center part of the common pad electrode 2102. As illustrated in FIGS. 46 and 48 to 50, the wiring line L2 provided on the center part of the common pad electrode 2102 is provided to extend from the first substrate 10 through the lower substrate 2210 of the second substrate 20 to the upper substrate 2220 of the second substrate 20; the wiring line L2 is coupled to the gate electrode AG of the amplification transistor AMP via a wiring line or the like provided in the upper substrate 2220.

As illustrated in FIGS. 45 and 50, the imaging device 1B may share a common pad electrode 2110 disposed to straddle the plurality of sensor pixels 12, and one wiring line L10 provided on the common pad electrode 2110. For example, in the imaging device 1B, in a plan view, there are regions where respective well layers WE of the four sensor pixels 12 are adjacent to each other with the element separation layer 16 interposed therebetween. The common pad electrode 2110 is provided in this region. The common pad electrode 2110 is disposed to straddle the respective well layers WE of the four sensor pixels 12, and is electrically coupled to each of the well layers WE of the four sensor pixels 12. By way of example, the common pad electrode 2110 is disposed between one common pad electrode 2102 and the other common pad electrode 2102 arranged in a Y-axis direction. In the Y-axis direction, the common pad electrodes 2102 and 2110 are alternately arranged side by side. The common pad electrode 2110 includes, for example, a polysilicon film doped with n-type impurities or p-type impurities.

In addition, one wiring line L10 (i.e., well contact) is provided on a center part of the common pad electrode 2110. As illustrated in FIGS. 45 and 48 to 50, the wiring line L10 provided on the center part of the common pad electrode 2110 is provided to extend from the first substrate 10 through the lower substrate 2210 of the second substrate 20 to the upper substrate 2220 of the second substrate 20; the wiring line L10 is coupled to a reference potential line that supplies a reference potential (e.g., ground potential: 0 V) via a wiring line or the like provided in the upper substrate 2220.

The wiring line L10 provided on the center part of the common pad electrode 2110 is electrically coupled to each of a top surface of the common pad electrode 2110, an inner surface of a through-hole provided in the lower substrate 2210, and an inner surface of a through-hole provided in the upper substrate 2220. This allows the well layer WE of the first semiconductor substrate 11 of the first substrate 10, and a well layer of the lower substrate 2210 and a well layer of the upper substrate 2220 of the second substrate 20 to be coupled to the reference potential (e.g., the ground potential: 0 V).

The imaging device 1B according to the third modification example further includes the common pad electrodes 2102 and 2110 provided on side of the front surface 11*a* of the first semiconductor substrate 11 included in the first substrate 10 and disposed to straddle the plurality of (e.g., four) sensor pixels 12 adjacent to each other. The common pad electrode 2102 is electrically coupled to the floating diffusions FD of the four sensor pixels 12, and thus the wiring line L2 coupled to the floating diffusions FD is able to be common to every four sensor pixels 12. In addition, the common pad electrode 2110 is electrically coupled to the well layers WE of the four sensor pixels 12, and thus the wiring line L10 coupled to the well layers WE is able to be common to every four sensor pixels 12. This reduces the number of the wiring lines L2 and L10, thus making it possible to reduce the areas of the sensor pixels 12 and to miniaturize the imaging device 1B.

Fourth Modification Example

Subsequently, description is given, with reference to FIGS. 51 and 52, of a fourth modification example which is a modification example of the cross-sectional configuration in the horizontal direction of the imaging device 1. The diagrams on upper side of FIGS. 51 and 52 are each a schematic view of a modification example of a cross-sectional configuration along the cut plane Sec1 in FIG. 7, and diagrams on lower side of FIGS. 51 and 52 are each a schematic view of a modification example of a cross-sectional configuration along the cut plane Sec2 in FIG. 7.

As illustrated in FIGS. 51 and 52, the plurality of through-wiring lines 54, the plurality of through-wiring lines 48, and the plurality of through-wiring lines 47 are arranged side by side in a strip shape in the first direction V1 (horizontal direction in FIGS. 51 and 52) in the plane of the first substrate 10. FIGS. 51 and 52 each exemplify a case where the plurality of through-wiring lines 54, the plurality of through-wiring lines 48, and the plurality of through-wiring lines 47 are arranged side by side in two rows in the first direction V1.

In four sensor pixels 12 sharing the pixel circuit 22, four floating diffusions FD are arranged close to each other with the element separation section 43 interposed therebetween, for example. In the four sensor pixels 12 sharing the pixel circuit 22, four transfer gates TG (TG1, TG2, TG3, and TG4) are arranged to surround the four floating diffusions FD. For example, the four transfer gates TG are arranged to form an annular shape.

The separation insulating layer 53 includes a plurality of blocks extending in the first direction V1. The second semiconductor substrate 21 includes a plurality of island-shaped blocks 21A extending in the first direction V1 and arranged side by side in the first direction V1. Each of the blocks 21A includes, for example, the reset transistor RST, the amplification transistor AMP, and the selection transistor SEL. The one pixel circuit 22 shared by the four sensor pixels 12 is not disposed to correspond to the four sensor pixels 12, for example, but is disposed to be shifted in the second direction V2.

In FIG. 51, the one pixel circuit 22 shared by the four sensor pixels 12 includes the reset transistor RST, the amplification transistor AMP, and the selection transistor SEL in a region, of the second substrate 20, corresponding to the four sensor pixels 12 shifted in the second direction V2. For example, the one pixel circuit 22 shared by the four sensor pixels 12 includes the amplification transistor AMP, the reset transistor RST, and the selection transistor SEL in one block 21A.

In FIG. 52, the one pixel circuit 22 shared by the four sensor pixels 12 includes the reset transistor RST, the amplification transistor AMP, the selection transistor SEL, and the FD conversion gain switching transistor FDG in a region, of the second substrate 20, corresponding to the four sensor pixels 12 shifted in the second direction V2. For example, the one pixel circuit 22 shared by the four sensor pixels 12 includes the amplification transistor AMP, the reset transistor RST, the selection transistor SEL, and the FD conversion gain switching transistor FDG in one block 21A.

In the imaging device 1 according to the fourth modification example, the one pixel circuit 22 shared by the four sensor pixels 12 is not arranged to squarely face the four sensor pixels 12, but is disposed to be shifted in the second direction V2 from a position squarely facing the four sensor pixels 12. According to this configuration, it is possible for the imaging device 1 according to the fourth modification example to shorten the wiring line 25, or to omit the wiring line 25 and to configure the source of the amplification transistor AMP and the drain of the selection transistor SEL using an impurity region in common. Accordingly, it is possible for the imaging device 1 according to the fourth modification example to reduce a size of the pixel circuit 22.

Fifth Modification Example

Next, description is given, with reference to FIG. 53, of a fifth modification example which is a modification example of the cross-sectional configuration in the horizontal direction of the imaging device 1. FIG. 53 is a schematic view of a modification example of the cross-sectional configurations along the cut plane Sec1 and the cut plane Sec2 in FIG. 7.

As illustrated in FIG. 53, the second semiconductor substrate 21 includes a plurality of island-shaped blocks 21A arranged side by side in the first direction V1 and the second direction V2 with the separation insulating layer 53 interposed therebetween. Each of the blocks 21A includes, for example, a set of the reset transistor RST, the amplification transistor AMP, and the selection transistor SEL. In such a case, it is possible for the imaging device 1 according to the fifth modification example to cause the separation insulating layer 53 to suppress a crosstalk between the pixel circuits 22 adjacent to each other, thus making it possible to suppress a decrease in image resolution or image quality deterioration due to color mixing.

Sixth Modification Example

Subsequently, description is given, with reference to FIG. 54, of a sixth modification example which is a modification example of the cross-sectional configuration in the horizontal direction of the imaging device 1. FIG. 54 is a schematic view of a modification example of the cross-sectional configurations along the cut plane Sec1 and the cut plane Sec2 in FIG. 7.

In FIG. 54, in the second semiconductor substrate 21, one pixel circuit 22 shared by four sensor pixels 12 is not disposed to correspond to the four sensor pixels 12, for example, but is disposed to be shifted in the first direction V1. In addition, in the imaging device 1 according to the sixth modification example, the second semiconductor substrate 21 includes a plurality of island-shaped blocks 21A arranged side by side in the first direction V1 and the second direction V2 with the separation insulating layer 53 interposed therebetween. Each of the blocks 21A includes, for example, a set of the reset transistor RST, the amplification transistor AMP, and the selection transistor SEL. Further, in the imaging device 1 according to the sixth modification example, the plurality of through-wiring lines 47 and the plurality of through-wiring lines 54 are arranged in the second direction V2.

This allows the plurality of through-wiring lines 47 to be arranged between four through-wiring lines 54 sharing one pixel circuit 22 and four through-wiring lines 54 sharing the other pixel circuit 22 adjacent to this pixel circuit 22 in the second direction V2. This makes it possible for the imaging device 1 according to the sixth modification example to cause the separation insulating layer 53 and the through-wiring line 47 to suppress a crosstalk between the pixel circuits 22 adjacent to each other, thus making it possible to suppress a decrease in image resolution or image quality deterioration due to color mixing.

Seventh Modification Example

Next, description is given, with reference to FIGS. 55 to 57, of a seventh modification example which is a modification example of the cross-sectional configuration in the horizontal direction of the imaging device 1. FIG. 55 is a schematic view of a modification example of the cross-sectional configurations along the cut plane Sec1 and the cut plane Sec2 in FIG. 7.

As illustrated in FIG. 55, in the imaging device 1 according to the seventh modification example, the first substrate 10 includes the photodiode PD and the transfer transistor TR (i.e., transfer gate TG) for each sensor pixel 12, and the floating diffusion FD is shared by every four sensor pixels 12. For this reason, the imaging device 1 according to the seventh modification example includes one through-wiring line 54 for every four sensor pixels 12.

In addition, in the imaging device 1 according to the seventh modification example, the through-wiring line 47 is provided for each unit region, corresponding to the four sensor pixels 12 sharing one floating diffusion FD, shifted in the second direction V2 by one sensor pixel 12. That is, in the imaging device 1 according to the seventh modification example, the through-wiring line 47 is provided between the unit region corresponding to the four sensor pixels 12 sharing the one floating diffusion FD and an adjacent unit region adjacent to this unit region in the second direction V2. In addition, the through-wiring line 47 is shared by two sensor pixels 12 of a unit region around the through-wiring line 47 and two sensor pixels 12 of an adjacent unit region around the through-wiring line 47.

Further, in the imaging device 1 according to the seventh modification example, the first substrate 10 includes the element separation section 43 that separates the photodiodes PD and the transfer transistors TR for each sensor pixel 12. In the case of a plan view of a main surface of the first semiconductor substrate 11 in the normal direction, the element separation section 43 does not completely surround a periphery of the sensor pixel 12, and thus there is an air gap (unformed region) in the vicinity of the floating diffusion FD (i.e., through-wiring line 54) and in the vicinity of the through-wiring line 47. This air gap enables the four sensor pixels 12 to share the through-wiring line 54, and enables the four sensor pixels 12 to share the through-wiring line 47 between the unit region and the adjacent unit region. It is to be noted that, in the imaging device 1 according to the seventh modification example, the second substrate 20 includes the pixel circuit 22 for every four sensor pixels 12 sharing the floating diffusion FD.

FIGS. 56 and 57 are each a schematic view of another example of the cross-sectional configuration along the cut plane Sec2 of the imaging device 1 according to the seventh modification example. As illustrated in FIG. 56, the first substrate 10 may include the photodiode PD and the transfer transistor TR for each sensor pixel 12, and the floating diffusion FD may be shared by every four sensor pixels 12. Further, the first substrate 10 may include the element separation section 43 that separates the photodiodes PD and the transfer transistors TR for each sensor pixel 12. In addition, as illustrated in FIG. 57, the photodiode PD and the transfer transistor TR may be included for each sensor pixel 12, and the floating diffusion FD may be shared by every four sensor pixels 12. Further, the first substrate 10 may include the element separation section 43 that separates the photodiodes PD and the transfer transistors TR for each sensor pixel 12.]

Eighth Modification Example

Subsequently, description is given, with reference to FIG. 58, of an eighth modification example which is a modification example of the circuit configuration of the imaging device 1. FIG. 58 is a schematic view of a circuit configuration of a CMOS image sensor mounted with a column parallel ADC (Analog to Digital Converter).

As illustrated in FIG. 58, the imaging device 1 according to the eighth modification example includes the pixel region 13 in which the plurality of sensor pixels 12 each including a photoelectric conversion element are two-dimensionally arranged in matrix (i.e., in a matrix shape), the vertical drive circuit 33, the column signal processing circuit 34, a reference voltage supply section 38, the horizontal drive circuit 35, a horizontal output line 37, and the system control circuit 36.

On the basis of a master clock MCK, the system control circuit 36 generates a clock signal, a control signal, and the like that serve as criteria for an operation of the vertical drive circuit 33, the column signal processing circuit 34, the reference voltage supply section 38, the horizontal drive circuit 35, and the like. The system control circuit 36 further supplies the generated clock signal, control signal, and the like to the vertical drive circuit 33, the column signal processing circuit 34, the reference voltage supply section 38, and the horizontal drive circuit 35.

The vertical drive circuit 33 is formed in each of the first substrate 10 in which each sensor pixel 12 of the pixel region 13 is formed, and the second substrate 20 in which the pixel circuit 22 is formed. The column signal processing circuit 34, the reference voltage supply section 38, the horizontal drive circuit 35, the horizontal output line 37, and the system control circuit 36 are formed in the third substrate 30.

The sensor pixel 12 includes, for example, the photodiode PD, and the transfer transistor TR that transfers electric charges photoelectrically converted in the photodiode PD to the floating diffusion FD, although illustration is omitted here. The pixel circuit 22 includes, for example, the reset transistor RST that controls a potential of the floating diffusion FD, the amplification transistor AMP that outputs a signal corresponding to a potential of the floating diffusion FD, and the selection transistor SEL for selecting a pixel.

The sensor pixels 12 are two-dimensionally arranged in the pixel region 13. For example, in the pixel region 13 in which the sensor pixels 12 are arranged in matrix in n-row and m-column, the pixel drive lines 23 are wired for respective rows, and the vertical signal lines 24 are wired for respective columns. A corresponding output end of the rows of the vertical drive circuit 33 is coupled to each one end of the plurality of pixel drive lines 23. The vertical drive circuit 33 includes a shift register or the like, and controls row address or row scanning of the pixel region 13 via the plurality of pixel drive lines 23.

The column signal processing circuit 34 includes, for example, ADCs (analog-to-digital conversion circuits) 34-1 to **34-*m* provided for respective pixel columns, i.e., for the respective vertical signal lines 24 of the pixel region 13. The column signal processing circuit 34 causes the ADC to convert analog signals outputted for respective columns from the sensor pixels 12 of the pixel region 13** into digital signals for outputting.

The reference voltage supply section 38 includes, for example, a DAC (digital-to-analog conversion circuit) 38A, and generates a reference voltage Vref of a so-called ramp (RAMP) waveform having a level that changes in an inclined manner as time elapses. It is to be noted that the reference voltage supply section 38 may use a means other than the DAC 38A to generate the reference voltage Vref of the ramp waveform.

On the basis of a control signal CS1 and a clock CK from the system control circuit 36, the DAC 38A generates the reference voltage Vref of the ramp waveform to supply the generated reference voltage Vref to the ADCs 34-1 to 34-*m* of the column signal processing circuit 34.

It is to be noted that each of the ADCs 34-1 to 34-*m* is configured to be able to selectively execute an AD conversion operation corresponding to each operation mode of a normal frame rate mode in a progressive scanning system for reading information on all of the sensor pixels 12, and a high-speed frame rate mode for setting exposure time of the sensor pixel 12 to 1/N to thereby increase a frame rate by N times (e.g., by twice) as compared with the time of the normal frame rate mode. The switching between the operation modes is performed by controls of control signals CS2 and CS3 from the system control circuit 36. In addition, on the basis of instruction information from an external system controller (unillustrated), the system control circuit 36 generates the control signals CS2 and CS3 for switching between the operation modes of the normal frame rate mode and the high-speed frame rate mode.

All of the ADCs 34-1 to 34-*m* have the same configuration, and thus description is given here referring to the example of the ADC 34-*m*.

The ADC 34-*m* includes a comparator 34A, an up/down counter (U/D CNT) 34B, a transfer switch 34C, and a memory 34D.

The comparator 34A compares a signal voltage Vx of the vertical signal line 24 corresponding to a signal outputted from each sensor pixel 12 of an m-th column of the pixel region 13 and the reference voltage Vref of the ramp waveform supplied from the reference voltage supply section 38 with each other. For example, the comparator 34A sets an output Vco to an "H" level in a case where the reference voltage Vref is larger than the signal voltage Vx, and sets the output Vco to an "L" level in a case where the reference voltage Vref is equal to or less than the signal voltage Vx.

An up/down counter 34B is an asynchronous counter. On the basis of the control signal CS2 provided from the system control circuit 36, the up/down counter 34B is supplied with the clock CK from the system control circuit 36. The up/down counter 34B performs down (DOWN)-counting or up (UP)-counting in synchronization with the clock CK to thereby measure a comparison period from the start to the end of a comparison operation in the comparator 34A.

Specifically, in the normal frame rate mode, the up/down counter 34B performs the down-counting upon a first reading operation from one sensor pixel 12 to thereby measure comparison time upon the first reading. In addition, the up/down counter 34B performs the up-counting upon a second reading operation to thereby measure comparison time upon the second reading.

Meanwhile, in the high-speed frame rate mode, the up/down counter 34B holds a count result for the sensor pixel 12 of a certain row as it is. Thereafter, the up/down counter 34B performs the down-counting upon the first reading operation by succeeding the previous count result for the sensor pixel 12 of the next row to thereby measure comparison time upon the first reading. In addition, the up/down counter 34B performs the up-counting upon the second reading operation to thereby measure comparison time upon the second reading.

The transfer switch 34C operates on the basis of the control signal CS3 provided from the system control circuit 36. In the normal frame rate mode, the transfer switch 34C is brought into an ON (closed) state upon completion of the counting operation of the up/down counter 34B for the sensor pixel 12 of the certain row to thereby transfer, to the memory 34D, the count results of the up/down counter 34B.

Meanwhile, for example, in the high-speed frame rate of N=2, the transfer switch 34C remains being in an OFF (open) state upon completion of the counting operation of the up/down counter 34B for the sensor pixel 12 of the certain row. Thereafter, the transfer switch 34C is brought into an ON state upon completion of the counting operation of the up/down counter 34B for the sensor pixel 12 of the next row to thereby transfer, to the memory 34D, the count results of the up/down counter 34B for the vertical two pixels.

In this manner, analog signals supplied for respective columns from the respective sensor pixels 12 of the pixel region 13 via the vertical signal lines 24 are converted into N-bit digital signals by respective operations of the comparators 34A and the up/down counters 34B in the ADCs 34-1 to 34-*m*, and are stored in the memories 34D.

The horizontal drive circuit 35 includes a shift register or the like, and controls column address and column scanning of the ADCs 34-1 to 34-*m* in the column signal processing circuit 34. The horizontal drive circuit 35 controls each of the ADCs 34-1 to 34-*m* to thereby cause the horizontal output line 37 to read in order the N-bit digital signals having been subjected to the AD conversion. The read N-bit digital signals are outputted as imaging data via the horizontal output line 37.

It is to be noted that it is also possible to provide, in addition to the above-described components, a circuit or the like that performs various types of signal processing on the imaging data outputted via the horizontal output line 37, although no particular illustration is given.

In the imaging device 1 according to the eighth modification example, the count results of the up/down counter 34B are able to be selectively transferred to the memory 34D via the transfer switch 34C. This makes it possible for the imaging device 1 according to the eighth modification example to control the counting operation of the up/down counter 34B and the reading operation of the count results of the up/down counter 34B to the horizontal output line 37 independently of each other.

Ninth Modification Example

Next, description is given, with reference to FIG. 59, of a ninth modification example which is a modification example of the stacked structure of the imaging device 1. FIG. 59 is a schematic view of an example of a configuration in which the imaging device 1 illustrated in FIG. 58 includes three substrates that are stacked.

As illustrated in FIG. 59, the imaging device 1 according to the ninth modification example has a configuration in which the first substrate 10, the second substrate 20, and third substrate are stacked. The pixel region 13 including the plurality of sensor pixels 12 is formed in the middle part of the first substrate 10, and the vertical drive circuit 33 is formed around the pixel region 13. In addition, a pixel circuit region 15 including the plurality of pixel circuits 22 is formed in the middle part of the second substrate 20, and the vertical drive circuit 33 is formed around the pixel circuit region 15. Further, the column signal processing circuit 34, the horizontal drive circuit 35, the system control circuit 36, the horizontal output line 37, and the reference voltage supply section 38 are formed in the third substrate 30. It is to be noted that the vertical drive circuit 33 may be formed in both of the first substrate 10 and the second substrate 20 as described above, may be formed only in the first substrate 10, or may be formed only in the second substrate 20.

The imaging device 1 according to the ninth modification example is able to suppress an increase in chip size or an increase in a pixel area due to the structure of electrical coupling between substrates. This makes it possible for the imaging device 1 according to the ninth modification example to more miniaturize an area per pixel.

Tenth Modification Example

Subsequently, description is given, with reference to FIGS. 60 and 61, of a tenth modification example which is a modification example of the cross-sectional configuration of the imaging device 1. FIG. 60 is a schematic view of an example of a cross-sectional configuration of the imaging device 1 according to the tenth modification example.

The embodiments and modification examples described above exemplify the configuration in which the imaging device 1 includes the three substrates of the first substrate 10, the second substrate 20, and the third substrate 30 that are stacked. However, the technique according to the present disclosure is not limited to the above exemplification. For example, the imaging device 1 may be configured by stacking two substrates of the first substrate 10 and the second substrate 20.

As illustrated in FIG. 60, in such a case, the processing circuit 32 is formed separately in the first substrate 10 and the second substrate 20, for example.

A circuit 32A, of the processing circuit 32, provided on side of the first substrate 10 includes a transistor having a gate structure, in which a high-permittivity film including a material (e.g., high-k material) that is able to withstand a high-temperature process and a metal gate electrode are stacked.

Meanwhile, in a circuit 32B, of the processing circuit 32, provided on side of the second substrate 20, a low-resistance region 26 is formed, which includes a silicide such as $CoSi_2$ or NiSi, on a front surface of an impurity diffusion region in contact with a source electrode and a drain electrode. The low-resistance region including a silicide is formed by a compound of a semiconductor substrate material and a metal, and has high heat resistance. Accordingly, it becomes possible to use a high-temperature process such as thermal oxidation in forming the sensor pixel 12. In addition, the low-resistance region 26 including a silicide such as $CoSi_2$ or NiSi is able to reduce contact resistance, thus making it possible to achieve higher operation speed in the processing circuit 32.

It is to be noted that the low-resistance region 26 including a silicide such as $CoSi_2$ or NiSi may be provided in the imaging device 1 according to any of the embodiments and modification example described above. Specifically, the imaging device 1 configured by stacking the three substrates of the first substrate 10, the second substrate 20, and the third substrate 30 also includes the low-resistance region 26 including a silicide such as $CoSi_2$ or NiSi. FIG. 61 is a schematic view of an example in which the low-resistance region 26 including a silicide such as $CoSi_2$ or NiSi is applied to the imaging device 1 having the configuration in which the three substrates are stacked.

As illustrated in FIG. 61, the low-resistance region 26 including a silicide such as $CoSi_2$ or NiSi may be formed on the front surface of the impurity diffusion region in contact with the source electrode and the drain electrode in the processing circuit 32 of the third substrate 30. This makes it possible to use a high-temperature process such as thermal oxidation in forming the sensor pixel 12. In addition, the low-resistance region 26 including a silicide such as $CoSi_2$ or NiSi is able to reduce contact resistance, thus making it possible to achieve higher operation speed in the processing circuit 32.

6. Specific Examples

The technique according to the present disclosure described above is applicable to various imaging devices and the like. Hereinafter, description is given, referring to specific examples, of an imaging device to which the technique according to the present disclosure is applied and an apparatus including the imaging device.

6.1. Embodiment

[Functional Configuration of Imaging Device 1]

FIG. 62 is a block diagram illustrating an example of a functional configuration of an imaging device (imaging device 1) according to an embodiment of the present disclosure.

The imaging device 1 of FIG. 62 includes, for example, an input section 510A, a row driving section 520, a timing controller 530, a pixel array section 540, a column signal processor 550, an image signal processor 560, and an output section 510B. In the pixel array section 540, pixels 541 are repeatedly arranged in an array. More specifically, pixel sharing units 539 each including a plurality of pixels are repeating units, and are repeatedly arranged in an array in a row direction and a column direction. It is to be noted that, in the present specification, for the sake of convenience, the row direction and the column direction orthogonal to the row direction are sometimes referred to as an "H direction" and a "V direction", respectively. In an example in FIG. 62, one pixel sharing unit 539 includes four pixels (pixels 541A, 541B, 541C, and 541D). The pixels 541A, 541B, 541C, and 541D each include a photodiode PD (illustrated in FIG. 67 and the like described later). The pixel sharing unit 539 is a unit sharing one pixel circuit (a pixel circuit 210 in FIG. 64 described later). In other words, one pixel circuit (the pixel circuit 210 described later) is included for every four pixels (the pixels 541A, 541B, 541C, and 541D). The pixel circuit is driven in a time division manner to sequentially read pixel signals of the respective pixels 541A, 541B, 541C, and 541D. The pixels 541A, 541B, 541C, and 541D are arranged in two rows by two columns, for example. The pixel array section 540 includes a plurality of row drive signal lines 542 and a plurality of vertical signal lines (column readout lines) 543 together with the pixels 541A, 541B, 541C, and 541D. The row drive signal lines 542 drive the pixels 541 that are included in the plurality of pixel sharing units 539 and arranged in the row direction in the pixel array section 540. The row drive signal lines 542 drive each of pixels arranged in the row direction in the pixel sharing units 539. As described in detail later with reference to FIG. 65, a plurality of transistors is provided in the pixel sharing unit 539. In order to drive each of the plurality of transistors, a plurality of row drive signal lines 542 is coupled to one pixel sharing unit 539. The pixel sharing units 539 are coupled to the vertical signal lines (column readout lines) 543. The pixel signals are read from the respective pixels 541A, 541B, 541C, and 541D included in the pixel sharing units 539 through the vertical signal lines (column readout lines) 543.

The row driving section 520 includes, for example, a row address controller that determines the position of a row for driving pixels, that is, a row decoder section, and a row drive circuit section that generates a signal for driving the pixels 541A, 541B, 541C, and 541D.

The column signal processor 550 is coupled to, for example, the vertical signal lines 543, and includes a load circuit section that forms a source follower circuit with the pixels 541A, 541B, 541C, and 541D (the pixel sharing unit 539). The column signal processor 550 may include an amplifier circuit section that amplifies a signal read from the pixel sharing unit 539 through the vertical signal line 543. The column signal processor 550 may include a noise processor. The noise processor removes, for example, a noise level of a system from a signal read as a result of photoelectric conversion from the pixel sharing unit 539.

The column signal processor 550 includes, for example, an analog-to-digital converter (ADC). The analog-to-digital converter converts a signal read from the pixel sharing unit 539 or an analog signal having been subjected to noise processing described above into a digital signal. The ADC includes, for example, a comparator section and a counter section. The comparator section compares an analog signal as a conversion target with a reference signal as a comparison target. The counter section measures time until inverting a comparison result in the comparator section. The column signal processor 550 may include a horizontal scanning circuit section that controls scanning of readout columns.

The timing controller 530 supplies a signal that controls a timing to the row driving section 520 and the column signal processor 550 on the basis of a reference clock signal and a timing control signal inputted to the device.

The image signal processor 560 is a circuit that performs various types of signal processing on data obtained as a result of photoelectric conversion, that is, data obtained as a result of an imaging operation in the imaging device 1. The image signal processor 560 includes, for example, an image signal processing circuit section and a data holding section. The image signal processor 560 may include a processor section.

One example of the signal processing to be executed in the image signal processor 560 is tone curve correction processing in which gray scales are increased in a case where AD-converted imaging data is data obtained by shooting a dark subject, and gray scales are decreased in a case where the AD-converted imaging data is data obtained by shooting a bright subject. In this case, it is desirable that characteristic data of tone curves about which tone curve is to be used to correct gray scales of imaging data be stored in advance in a data holding section of the image signal processor 560.

The input section 510A inputs, for example, the reference clock signal, the timing control signal, characteristic data, and the like described above from outside the device to the imaging device 1. Examples of the timing control signal include a vertical synchronization signal, a horizontal synchronization signal, and the like. The characteristic data is to be stored in the data holding section of the image signal processor 560, for example. The input section 510A includes, for example, an input terminal 511, an input circuit section 512, an input amplitude changing section 513, an input data conversion circuit section 514, and a power supply section (unillustrated).

The input terminal 511 is an external terminal for inputting data. The input circuit section 512 takes a signal inputted to the input terminal 511 into the imaging device 1. The input amplitude changing section 513 changes amplitude of the signal taken by the input circuit section 512 into amplitude easy to be used inside the imaging device 1. The input data conversion circuit section 514 changes the order of data columns of input data. The input data conversion circuit section 514 includes, for example, a serial-parallel conversion circuit. The serial-parallel conversion circuit converts a serial signal received as input data into a parallel signal. It is to be noted that in the input section 510A, the input amplitude changing section 513 and the input data conversion circuit section 514 may be omitted. The power supply section supplies power that is set to various types of voltages necessary inside the imaging device 1, with use of power supplied from outside to the imaging device 1.

When the imaging device 1 is coupled to an external memory device, a memory interface circuit that receives data from the external memory device may be provided in the input section 510A. Examples of the external memory device include a flash memory, an SRAM, a DRAM, and the like.

The output section 510B outputs image data to the outside of the device. Examples of the image data include image data captured by the imaging device 1, image data having been subjected to signal processing by the image signal processor 560, and the like. The output section 510B includes, for example, an output data conversion circuit section 515, an output amplitude changing section 516, an output circuit section 517, and an output terminal 518.

The output data conversion circuit section 515 includes, for example, a parallel-serial conversion circuit. The output data conversion circuit section 515 converts a parallel signal used inside the imaging device 1 into a serial signal. The output amplitude changing section 516 changes amplitude of a signal used inside the imaging device 1. The signal having changed amplitude is easily used in an external device coupled to the outside of the imaging device 1. The output circuit section 517 is a circuit that outputs data from inside the imaging device 1 to the outside of the device, and the output circuit section 517 drives a wiring line outside the imaging deice 1 coupled to the output terminal 518. At the output terminal 518, data is outputted from the imaging device 1 to the outside of the device. In the output section 510B, the output data conversion circuit section 515 and the output amplitude changing section 516 may be omitted.

When the imaging device 1 is coupled to an external memory device, the output section 510B may include a memory interface circuit that outputs data to the external memory device. Examples of the external memory device include a flash memory, an SRAM, a DRAM, and the like.

[Outline Configuration of Imaging Device 1]

FIGS. 63 and 64 each illustrate an example of an outline configuration of the imaging device 1. The imaging device 1 includes three substrates (a first substrate 100, a second substrate 200, and a third substrate 300). FIG. 63 schematically illustrates a planar configuration of each of the first substrate 100, the second substrate 200, and the third substrate 300, and FIG. 64 schematically illustrates a cross-sectional configuration of the first substrate 100, the second substrate 200, and the third substrate 300 that are stacked on each other. FIG. 64 corresponds to a cross-sectional configuration taken along a line III-III' illustrated in FIG. 63. The imaging device 1 is a three-dimensionally structured imaging device in which the three substrates (the first substrate 100, the second substrate 200, and the third substrate 300) are attached together. The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, for the sake of convenience, a combination of a wiring line included in each of the first substrate 100, the second substrate 200, and the third substrate 300 and its surrounding interlayer insulating film is referred to as a wiring layer (100T, 200T, or 300T) provided in each substrate (each of the first substrate 100, the second substrate 200, and the third substrate 300). The first substrate 100, the second substrate 200, and the third substrate 300 are stacked in this order, and the semiconductor layer 100S, the wiring layer 100T, the semiconductor layer 200S, the wiring layer 200T, the wiring layer 300T, and the semiconductor layer 300S are disposed in this order along a stacking direction. Specific configurations of the first substrate 100, the second substrate 200, and the third substrate 300 are described later. An arrow illustrated in FIG. 64 indicates an incident direction of light L onto the imaging device 1. In the present specification, for the sake of convenience, in the following cross-sectional views, light incident side in the imaging device 1 is sometimes referred to as "bottom", "lower side", or "below", and side opposite to the light incident side is sometimes referred to as "top", "upper side", or "above". In addition, in the present specification, for the sake of convenience, in a substrate including a semiconductor layer and a wiring layer, side of the wiring layer is sometimes referred to as a front surface, and side of the semiconductor layer is sometimes referred to as a back surface. It is to be noted that references in the specification are not limited to those described above. The imaging device 1 is, for example, a back-illuminated imaging device in which light enters from back surface side of the first substrate 100 including a photodiode.

The pixel array section 540 and the pixel sharing units 539 included in the pixel array section 540 are both configured with use of both the first substrate 100 and the second substrate 200. The first substrate 100 includes a plurality of pixels 541A, 541B, 541C, and 541D included in the pixel sharing units 539. Each of the pixels 541 includes a photodiode (photodiode PD described later) and a transfer transistor (transfer transistor TR described later). The second substrate 200 includes pixel circuits (pixel circuits 210 described later) included in the pixel sharing units 539. The pixel circuit reads the pixel signal transferred from the photodiode of each of the pixels 541A, 541B, 541C, and 541D through a transfer transistor, or resets the photodiode. The second substrate 200 includes, in addition to such pixel circuits, a plurality of row drive signal lines 542 extending in the row direction and a plurality of vertical signal lines 543 extending in the column direction. The second substrate 200 further includes a power source line 544 (a power source line VDD described later and the like) extending in the row direction. The third substrate 300 includes, for example, the input section 510A, the row driving section 520, the timing controller 530, the column signal processor 550, the image signal processor 560, and the output section 510B. The row driving section 520 is provided in, for example, a region partially overlapping the pixel array section 540 in a stacking direction of the first substrate 100, the second substrate 200, and the third substrate 300 (hereinafter simply referred to as a stacking direction). More specifically, the row driving section 520 is provided in a region overlapping the vicinity of an end portion in an H direction of the pixel array section 540 in the stacking direction (FIG. 63). The column signal processor 550 is provided in, for example, a region partially overlapping the pixel array section 540 in the stacking direction. More specifically, the column signal processor 550 is provided in a region overlapping the vicinity of an end portion in a V direction of the pixel array section 540 in the stacking direction (FIG. 63). Although illustration is omitted, the input section 510A and the output section 510B may be disposed in a portion other than the third substrate 300, and may be disposed in the second substrate 200, for example. Alternatively, the input section 510A and the output section 510B may be provided on the back surface (light incident surface) side of the first substrate 100. It is to be noted that the pixel circuit provided in the second substrate 200 described above is also referred to as a pixel transistor circuit, a pixel transistor group, a pixel transistor, a pixel readout circuit, or a readout circuit. In the present specification, the designation of "pixel circuit" is used.

The first substrate 100 and the second substrate 200 are electrically coupled to each other by, for example, a through-electrode (through-electrodes 120E and 121E in FIG. 67 described later). The second substrate 200 and the third substrate 300 are electrically coupled to each other through, for example, contact sections 201, 202, 301, and 302. The second substrate 200 is provided with the contact sections 201 and 202, and the third substrate 300 is provided with the contact sections 301 and 302. The contact section 201 of the second substrate 200 is in contact with the contact section 301 of the third substrate 300, and the contact section 202 of the second substrate 200 is in contact with the contact section 302 of the third substrate 300. The second substrate 200 includes a contact region 201R provided with a plurality of contact sections 201 and a contact region 202R provided with a plurality of contact sections 202. The third substrate 300 includes a contact region 301R provided with a plurality of contact sections 301 and a contact region 302R provided with a plurality of contact sections 302. The contact regions 201R and 301R are provided in the stacking direction between the pixel array section 540 and the row driving section 520 (FIG. 64). In other words, the contact regions 201R and 301R are provided in, for example, a region where the row driving section 520 (the third substrate 300) and the pixel array section 540 (the second substrate 200) are overlapped on each other in the stacking direction, or a region close to the region. The contact regions 201R and 301R are disposed in an end portion in the H direction of such a region, for example (FIG. 63). In the third substrate 300, the contact region 301R is provided in a portion of the row driving section 520, specifically at a position overlapped on an end portion in the H direction of the row driving section 520 (FIGS. 63 and 64). The contact sections 201 and 301 couple, for example, the row driving section 520 provided in the third substrate 300 and the row drive signal line 542 provided in the second substrate 200 to each other. The contact sections 201 and 301 may couple, for example, the input section 510A provided in the third substrate 300 to the power source line 544 and a reference potential line (reference potential line VSS described later). The contact regions 202R and 302R are provided in the stacking direction between the pixel array section 540 and the column signal processor 550 (FIG. 64). In other words, the contact regions 202R and 302R are provided in, for example, a region overlapped on the column signal processor 550 (the third substrate 300) and the pixel array section 540 (the second substrate 200) in the stacking direction, or a region close to the region. The contact regions 202R and 302R are disposed in an end portion in the V direction of such a region (FIG. 63). In the third substrate 300, the contact region 301R is provided in, for example, a portion of the column signal processor 550, specifically at a position overlapped on an end portion in the V direction of the column signal processor 550 (FIGS. 63 and 64). The contact sections 202 and 302 couple, for example, a pixel signal outputted from each of the plurality of pixel sharing units 539 included in the pixel array section 540 (a signal corresponding to the amount of electric charges generated as a result of photoelectric conversion by the photodiode) to the column signal processor 550 provided in the third substrate 300. The pixel signal is transmitted from the second substrate 200 to the third substrate 300.

FIG. 64 is an example of a cross-sectional view of the imaging device 1 as described above. The first substrate 100, the second substrate 200, and the third substrate 300 are electrically coupled to each other through the wiring layers 100T, 200T, and 300T. For example, the imaging device 1 includes an electrical coupling section that electrically couples the second substrate 200 and the third substrate 300 to each other. Specifically, the contact sections 201, 202, 301, and 302 are each formed with use of an electrode formed by an electrically-conductive material. The electrically-conductive material is formed by, for example, a metal material such as copper (Cu), aluminum (Al), and gold (Au). The contact regions 201R, 202R, 301R, and 302R electrically couple the second substrate and the third substrate to each other by directly bonding wiring lines formed as electrodes, for example, which makes it possible to input and/or output signals to and from the second substrate 200 and the third substrate 300.

It is possible to provide, at a desired position, the electrical coupling section that electrically couples the second substrate 200 and the third substrate 300 to each other. For example, as described as the contact regions 201R, 202R, 301R, and 302R in FIG. 64, the electrical coupling section may be provided in a region overlapped on the pixel array section 540 in the stacking direction. In addition, the electrical coupling section may be provided in a region not overlapped on the pixel array section 540 in the stacking direction. Specifically, the electrical coupling section may be provided in a region overlapped in the stacking direction on a peripheral portion disposed outside the pixel array section 540.

The first substrate 100 and the second substrate 200 are provided with a coupling hole sections H1 and H2, for example. The coupling hole sections H1 and H2 penetrate the first substrate 100 and the second substrate 200 (FIG. 64). The coupling hole sections H1 and H2 are provided outside the pixel array section 540 (or a portion overlapped on the pixel array section 540) (FIG. 63). For example, the coupling hole section H1 is disposed in the H direction outside the pixel array section 540, and the coupling hole section H2 is disposed in the V direction outside the pixel array section 540. For example, the coupling hole section H1 reaches the input section 510A provided in the third substrate 300, and the coupling hole section H2 reaches the output section 510B provided in the third substrate 300. The coupling hole sections H1 and H2 may be hollows, or may at least partially include an electrically-conductive material. For example, there is a configuration in which a bonding wire is coupled to an electrode formed as the input section 510A and/or the output section 510B. Alternatively, there is a configuration in which the electrode formed as the input section 510A and/or the output section 510B and the electrically-conductive material provided in the coupling hole sections H1 and H2 are coupled to each other. The electrically-conductive material provided in the coupling hole sections H1 and H2 may be embedded in a portion or the entirety of the coupling hole sections H1 and H2, or the electrically-conductive material may be formed on a sidewall of each of the coupling hole sections H1 and H2.

It is to be noted that FIG. 64 illustrates a structure in which the third substrate 300 is provided with the input section 510A and the output section 510B, but this is not limitative. For example, transmitting a signal of the third substrate 300 to the second substrate 200 through the wiring layers 200T and 300T makes it possible to provide the input section 510A and/or the output section 510B in the second substrate 200. Likewise, transmitting a signal of the second substrate 200 to the first substrate 100 through the wiring layers 100T and 200T makes it possible to provide the input section 510A and/or the output section 510B in the first substrate 100.

FIG. 65 is an equivalent circuit diagram illustrating an example of a configuration of the pixel sharing unit 539. The pixel sharing unit 539 includes a plurality of pixels 541 (FIG. 65 illustrates four pixels 541, that is, the pixels 541A, 541B, 541C, and 541D), one pixel circuit 210 coupled to the plurality of pixels 541, and the vertical signal line 543 coupled to the pixel circuit 210. The pixel circuit 210 includes, for example, four transistors, specifically, the amplification transistor AMP, the selection transistor SEL, the reset transistor RST, and the FD conversion gain switching transistor FDG. As described above, the pixel sharing unit 539 drives one pixel circuit 210 in a time division manner to sequentially output pixel signals of four pixels 541 (the pixels 541A, 541B, 541C, and 541D) included in the pixel sharing unit 539 to the vertical signal line 543. One pixel circuit 210 is coupled to the plurality of pixels 541, and a mode in which the pixel signals of the plurality of pixels 541 are outputted by one pixel circuit 210 in a time division manner refer to "one pixel circuit 210 is shared by the plurality of pixels 541".

The pixels 541A, 541B, 541C, and 541D include components common to each other. Hereinafter, in order to distinguish components of the pixels 541A, 541B, 541C, and 541D from one another, an identification number 1 is assigned at the end of a symbol of the component of the pixel 541A, an identification number 2 is assigned at the end of a symbol of the component of the pixel 541B, an identification number 3 is assigned at the end of a symbol of the component of the pixel 541C, and an identification number 4 is assigned at the end of a symbol of the component of the pixel 541D. In a case where the components of the pixels 541A, 541B, 541C, and 541D do not need to be distinguished from one another, the identification number at the end of the symbol of the component of each of the pixels 541A, 541B, 541C, and 541D is omitted.

The pixels 541A, 541B, 541C, and 541D each include, for example, the photodiode PD, the transfer transistor TR electrically coupled to the photodiode PD, and the floating diffusion FD electrically coupled to the transfer transistor TR. In the photodiode PD (PD1, PD2, PD3, and PD4), a cathode is electrically coupled to a source of the transfer transistor TR, and an anode is electrically coupled to a reference potential line (e.g., a ground). The photodiode PD photoelectrically converts incident light, and generates electric charges corresponding to the amount of received light. The transfer transistor TR (transfer transistors TR1, TR2, TR3, and TR4) is, for example, an n-type CMOS (Complementary Metal Oxide Semiconductor) transistor. In the transfer transistor TR, a drain is electrically coupled to the floating diffusion FD, and a gate is electrically coupled to a drive signal line. The drive signal line is some of the plurality of row drive signal lines 542 (see FIG. 62) coupled to one pixel sharing unit 539. The transfer transistor TR transfers electric charges generated by the photodiode PD to the floating diffusion FD. The floating diffusion FD (floating diffusions FD1, FD2, FD3, and FD4) is an n-type diffusion layer region formed in a p-type semiconductor layer. The floating diffusion FD is an electric charge holding means that temporarily holds electric charges transferred from the photodiode PD, as well as an electric charge-voltage conversion means that generates a voltage corresponding to the amount of the electric charges.

The four floating diffusions FD (the floating diffusions FD1, FD2, FD3, and FD4) included in one pixel sharing unit 539 are electrically coupled to one another, and are electrically coupled to a gate of the amplification transistor AMP and a source of the FD conversion gain switching transistor FDG. A drain of the FD conversion gain switching transistor FDG is coupled to a source of the reset transistor RST, and a gate of the FD conversion gain switching transistor FDG is coupled to a drive signal line. The drive signal line is some of the plurality of row drive signal lines 542 coupled to the one pixel sharing unit 539. A drain of the reset transistor RST is coupled to the power source line VDD, and a gate of the reset transistor RST is coupled to a drive signal line. The drive signal line is some of the plurality of row drive signal lines 542 coupled to the one pixel sharing unit 539. A gate of the amplification transistor AMP is coupled to the floating diffusion FD, a drain of the amplification transistor AMP is coupled to the power source line VDD, and a source of the amplification transistor AMP is coupled to a drain of the selection transistor SEL. A source of the selection transistor SEL is coupled to the vertical signal line 543, and a gate of the selection transistor SEL is coupled to a drive signal line. The drive signal line is some of the plurality of row drive signal lines 542 coupled to the one pixel sharing unit 539.

When the transfer transistor TR is brought into an ON state, the transfer transistor TR transfers electric charges of the photodiode PD to the floating diffusion FD. The gate (transfer gate TG) of the transfer transistor TR includes, for example, a so-called vertical electrode, and is provided to extend from a front surface of a semiconductor layer (semiconductor layer 100S in FIG. 67 described later) to a depth reaching the PD, as illustrated in FIG. 67 described later. The reset transistor RST resets the potential of the floating diffusion FD to a predetermined potential. When the reset transistor RST is brought into an ON state, the potential of the floating diffusion FD is reset to the potential of the power source line VDD. The selection transistor SEL controls an output timing of the pixel signal from the pixel circuit 210. The amplification transistor AMP generates, as the pixel signal, a signal of a voltage corresponding to the level of electric charges held by the floating diffusion FD. The amplification transistor AMP is coupled to the vertical signal line 543 through the selection transistor SEL. The amplification transistor AMP configures a source follower together with a load circuit section (see FIG. 62) coupled to the vertical signal line 543 in the column signal processor 550. When the selection transistor SEL is brought into an ON state, the amplification transistor AMP outputs the voltage of the floating diffusion FD to the column signal processor 550 through the vertical signal line 543. The reset transistor RST, the amplification transistor AMP, and the selection transistor SEL are, for example, N-type CMOS transistors.

The FD conversion gain switching transistor FDG is used in changing a gain of electric charge-voltage conversion in the floating diffusion FD. In general, a pixel signal is small when shooting in a dark place. In performing electric charge-voltage conversion on the basis of Q=CV, larger capacity of the floating diffusion FD (FD capacity C) causes the value V to be smaller upon conversion to a voltage at the amplification transistor AMP. Meanwhile, the pixel signal becomes large in a bright place; it is therefore not possible, for the floating diffusion FD, to receive the electric charges of the photodiode PD unless the FD capacity C is large. Further, the FD capacity C needs to be large to allow the value V not to be too large (in other words, to be small) upon the conversion to a voltage at the amplification transistor AMP. Taking these into account, when the FD conversion gain switching transistor FDG is brought into an ON state, a gate capacity for the FD conversion gain switching transistor FDG is increased, thus causing the entire FD capacity C to be large. Meanwhile, when the FD conversion gain switching transistor FDG is turned off, the entire FD capacity C becomes small. In this manner, performing ON/OFF switching of the FD conversion gain switching transistor FDG enables the FD capacity C to be variable, thus making it possible to switch conversion efficiency. The FD conversion gain switching transistor FDG is, for example, an N-type CMOS transistor.

It is to be noted that a configuration is also possible in which the FD conversion gain switching transistor FDG is not provided. At this time, the pixel circuit 210 includes, for example, three transistors, that is, the amplification transistor AMP, the selection transistor SEL, and the reset transistor RST. The pixel circuit 210 includes, for example, at least one of the amplification transistor AMP, the selection transistor SEL, the reset transistor RST, the FD conversion gain switching transistor FDG, or the like.

The selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the row drive signal line 542 (see FIG. 62). The source (an output end of the pixel circuit 210) of the amplification transistor AMP is electrically coupled to the vertical signal line 543, and the gate of the amplification transistor AMP is electrically coupled to the source of the reset transistor RST. It is to be noted that, although illustration is omitted, the number of pixels 541 sharing one pixel circuit 210 may be other than four. For example, two or eight pixels 541 may share one pixel circuit 210.

FIG. 66 illustrates an example of a coupling mode between a plurality of pixel sharing units 539 and the vertical signal lines 543. For example, four pixel sharing units 539 arranged in the column direction are divided into four groups, and the vertical signal line 543 is coupled to each of the four groups. For ease of explanation, FIG. 66 illustrates an example in which each of the four groups include one pixel sharing unit 539; however, each of the four groups may include a plurality of pixel sharing units 539. As described above, in the imaging device 1, the plurality of pixel sharing units 539 arranged in the column direction may be divided into groups including one or a plurality of pixel sharing units 539. For example, the vertical signal line 543 and the column signal processor 550 are coupled to each of the groups, which makes it possible to simultaneously read the pixel signals from the respective groups. Alternatively, in the imaging device 1, one vertical signal line 543 may be coupled to the plurality of pixel sharing units 539 arranged in the column direction. At this time, the pixel signals are sequentially read from the plurality of pixel sharing units 539 coupled to the one vertical signal line 543 in a time division manner.

[Specific Configuration of Imaging Device 1]

FIG. 67 illustrates an example of a cross-sectional configuration in a vertical direction with respect to a main surface of the first substrate 100, the second substrate 200, and the third substrate 300 of the imaging device 1. FIG. 67 schematically illustrates a positional relationship of components for ease of understanding, and may be different from an actual cross section. In the imaging device 1, the first substrate 100, the second substrate 200, and the third substrate 300 are stacked in this order. The imaging device 1 further includes a light-receiving lens 401 on back surface side (light incident surface side) of the first substrate 100. A color filter layer (unillustrated) may be provided between the light-receiving lens 401 and the first substrate 100. The light-receiving lens 401 is provided for each of the pixels 541A, 541B, 541C, and 541D, for example. The imaging device 1 is, for example, a back-illuminated imaging device. The imaging device 1 includes the pixel array section 540 disposed in a middle part and a peripheral portion 540B disposed outside the pixel array section 540.

The first substrate 100 includes an insulating film 111, a fixed electric charge film 112, the semiconductor layer 100S, and the wiring layer 100T in order from side of the light-receiving lens 401. The semiconductor layer 100S includes, for example, a silicon substrate. The semiconductor layer 100S includes, for example, a p-well layer 115 in a portion of the front surface (a surface on side of the wiring layer 100T) and its vicinity, and includes an n-type semiconductor region 114 in a region other than the p-well layer 115 (a region deeper than the p-well layer 115). For example, the n-type semiconductor region 114 and the p-well layer 115 are included in the pn-junction photodiode PD. The p-well layer 115 is a p-type semiconductor region.

FIG. 68A illustrates an example of a planar configuration of the first substrate 100. FIG. 68A mainly illustrates a planar configuration of a pixel separation section 117, the photodiode PD, the floating diffusion FD, a VSS contact region 118, and the transfer transistor TR of the first substrate 100. Description is given of the configuration of the first substrate 100 with use of FIG. 68A together with FIG. 67.

The floating diffusion FD and the VSS contact region 118 are provided in the vicinity of the front surface of the semiconductor layer 100S. The floating diffusion FD includes an n-type semiconductor region provided in the p-well layer 115. The floating diffusions FD (the floating diffusions FD1, FD2, FD3, and FD4) of the pixels 541A, 541B, 541C, and 541D are provided close to each other in a middle part of the pixel sharing unit 539, for example (FIG. 68A). As described in detail later, the four floating diffusions (floating diffusions FD1, FD2, FD3, and FD4) included in the pixel sharing unit 539 are electrically coupled to each other through an electrical coupling means (a pad section 120 described later) in the first substrate (more specifically in the wiring layer 100T). Further, the floating diffusions FD are coupled from the first substrate 100 to the second substrate 200 (more specifically, from the wiring layer 100T to the wiring layer 200T) through an electrical means (a through-electrode 120E described later). In the second substrate 200 (more specifically inside the wiring layer 200T), the floating diffusions FD are electrically coupled to the gate of the amplification transistor AMP and the source of the FD conversion gain switching transistor FDG by the electrical means.

The VSS contact region 118 is a region electrically coupled to the reference potential line VSS, and is disposed apart from the floating diffusion FD. For example, in the pixels 541A, 541B, 541C, and 541D, the floating diffusion FD is disposed at one end in the V direction of each pixel, and the VSS contact region 118 is disposed at another end (FIG. 68A). The VSS contact region 118 includes, for example, a p-type semiconductor region. The VSS contact region 118 is coupled to a ground potential and a fixed potential, for example. Thus, a reference potential is supplied to the semiconductor layer 100S.

The first substrate 100 includes the transfer transistor TR together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on front surface side (side opposite to the light incident surface side, side of the second substrate 200) of the semiconductor layer 100S. The transfer transistor TR includes the transfer gate TG. The transfer gate TG includes, for example, a horizontal portion TGb opposed to the front surface of the semiconductor layer 100S, and a vertical portion TGa provided inside the semiconductor layer 100S. The vertical portion TGa extends in a thickness direction of the semiconductor layer 100S. The vertical portion TGa has one end in contact with the horizontal portion TGb, and another end provided inside the n-type semiconductor region 114. The transfer transistor TR is configured using such a vertical transistor, which hinders occurrence of a failure in transferring the pixel signal, thus making it possible to improve readout efficiency of the pixel signal.

The horizontal portion TGb of the transfer gate TG extends from a position opposed to the vertical portion TGa toward, for example, the middle part of the pixel sharing unit 539 in the H direction (FIG. 68A). This makes it possible to bring the position in the H direction of a through-electrode (the through-electrode TGV described later) reaching the transfer gate TG close to the position in the H direction of a through-electrode (through-electrodes 120E and 121E described later) coupled to the floating diffusion FD and the VSS contact region 118. For example, the plurality of pixel sharing units 539 provided in the first substrate 100 have the same configuration as each other (FIG. 68A).

The semiconductor layer 100S includes the pixel separation section 117 that separates the pixels 541A, 5411B, 541C, and 541D from each other. The pixel separation section 117 is formed to extend in a direction normal to the semiconductor layer 100S (a direction perpendicular to the front surface of the semiconductor layer 100S). The pixel separation section 117 is provided to partition the pixels 541A, 541B, 541C, and 541D from each other, and has a planar grid shape (FIGS. 68A and 68B). The pixel separation section 117 electrically and optically separate, for example, the pixels 541A, 541B, 541C, and 541D from each other. The pixel separation section 117 includes, for example, a light-shielding film 117A and an insulating film 117B. For example, tungsten (W) or the like is used for the light-shielding film 117A. The insulating film 117B is provided between the light-shielding film 117A and the p-well layer 115 or the n-type semiconductor region 114. The insulating film 117B includes, for example, silicon oxide (SiO). The pixel separation section 117 has, for example, a FTI (Full Trench Isolation) structure, and penetrates the semiconductor layer 100S. Although not illustrated, the pixel separation section 117 is not limited to the FTI structure that penetrates the semiconductor layer 100S. For example, the pixel separation section 117 may have a DTI (Deep Trench Isolation) structure that does not penetrate the semiconductor layer 100S. The pixel separation section 117 extends in the direction normal to the semiconductor layer 100S, and is formed in a portion of a region of the semiconductor layer 100S.

The semiconductor layer 100S includes, for example, a first pinning region 113 and a second pinning region 116. The first pinning region 113 is provided close to the back surface of the semiconductor layer 100S, and is disposed between the n-type semiconductor region 114 and the fixed electric charge film 112. The second pinning region 116 is provided on the side surface of the pixel separation section 117, specifically, between the pixel separation section 117 and the p-well layer 115 or the n-type semiconductor region 114. The first pinning region 113 and the second pinning region 116 each include, for example, a p-type semiconductor region.

The fixed electric charge film 112 having negative fixed electric charges is provided between the semiconductor layer 100S and the insulating film 111. The first pinning region 113 of a hole accumulation layer is formed at an interface on side of a light-receiving surface (back surface) of the semiconductor layer 100S by an electric field induced by the fixed electric charge film 112. This suppresses generation of a dark current resulting from an interface state on the side of the light-receiving surface of the semiconductor layer 100S. The fixed electric charge film 112 is formed using, for example, an insulating film having negative fixed electric charges. Examples of a material of the insulating film having negative fixed electric charges include hafnium oxide, zirconium oxide, aluminum oxide, titanium oxide, and tantalum oxide.

The light-shielding film 117A is provided between the fixed electric charge film 112 and the insulating film 111. The light-shielding film 117A may be provided continuously to the light-shielding film 117A included in the pixel separation section 117. The light-shielding film 117A between the fixed electric charge film 112 and the insulating film 111 is selectively provided at a position opposed to the pixel separation section 117 in the semiconductor layer 100S, for example. The insulating film 111 is provided to cover the light-shielding film 117A. The insulating film 111 includes, for example, silicon oxide.

The wiring layer 100T provided between the semiconductor layer 100S and the second substrate 200 includes an interlayer insulating film 119, pad sections 120 and 121, a passivation film 122, an interlayer insulating film 123, and a bonding film 124 in this order from side of the semiconductor layer 100S. The horizontal portion TGb of the transfer gate TG is provided in the wiring layer 100T, for example. The interlayer insulating film 119 is provided throughout the front surface of the semiconductor layer 100S, and is in contact with the semiconductor layer 100S. The interlayer insulating film 119 includes, for example, a silicon oxide film. It is to be noted that the configuration of the wiring layer 100T is not limited to the configuration described above, and it is sufficient for the wiring layer 100T to have a configuration including a wiring line and an insulating film.

FIG. 68B illustrates configurations of the pad sections 120 and 121 together with the planar configuration illustrated in FIG. 68A. The pad sections 120 and 121 are provided in a selective region on the interlayer insulating film 119. The pad section 120 couples the floating diffusions FD (the floating diffusions FD1, FD2, FD3, and FD4) of the pixels 541A, 541B, 541C, and 541D to each other. The pad section 120 is disposed for each pixel sharing unit 539 in the middle part of the pixel sharing unit 539 in a plan view (FIG. 68B). The pad section 120 is provided to straddle the pixel separation section 117, and is disposed to be superimposed at least partially on each of the floating diffusions FD1, FD2, FD3, and FD4 (FIGS. 67 and 68B). Specifically, the pad section 120 is formed in a region overlapping at least a portion of each of the plurality of floating diffusions FD (the floating diffusions FD1, FD2, FD3, and FD4) sharing the pixel circuit 210 and at least a portion of the pixel separation section 117 formed between the plurality of photodiodes PD (the photodiodes PD1, PD2, PD3, and PD4) sharing the pixel circuit 210 in a direction perpendicular to the front surface of the semiconductor layer 100S. The interlayer insulating film 119 includes a coupling via 120C for electrically coupling the pad section 120 and the floating diffusions FD1, FD2, FD3, and FD4 to each other. The coupling via 120C is provided in each of the pixels 541A, 541B, 541C, and 541D. For example, a portion of the pad section 120 is embedded in the coupling via 120C, thereby electrically coupling the pad section 120 and the floating diffusions FD1, FD2, FD3, and FD4 to each other.

The pad section 121 couples a plurality of VSS contact regions 118 to each other. For example, the VSS contact region 118 provided in the pixels 541C and 541D of one of the pixel sharing units 539 adjacent to each other in the V direction, and the VSS contact region 118 provided in the pixels 541A and 541B of another one of the pixel sharing units 539 are electrically coupled to each other by the pad section 121. The pad section 121 is provided to straddle the pixel separation section 117, for example, and is disposed to be superimposed at least partially on each of the four VSS contact regions 118. Specifically, the pad section 121 is formed in a region overlapping at least a portion of each of the plurality of VSS contact regions 118 and at least a portion of the pixel separation section 117 formed between the plurality of VSS contact regions 118 in a direction perpendicular to the front surface of the semiconductor layer 100S. The interlayer insulating film 119 includes a coupling via 121C for electrically coupling the pad section 121 and the VSS contact region 118 to each other. The coupling via 121C is provided in each of the pixels 541A, 541B, 541C, and 541D. For example, a portion of the pad section 121 is embedded in the coupling via 121C, thereby electrically coupling the pad section 121 and the VSS contact region 118. For example, the pad sections 120 and 121 of each of the plurality of pixel sharing units 539 arranged in the V direction are disposed at substantially the same position in the H direction (FIG. 68B).

Providing the pad section 120 makes it possible to reduce the number of wiring lines for coupling from each of the floating diffusions FD to the pixel circuit 210 (e.g., the gate electrode of the amplification transistor AMP) in the entirety of a chip. Likewise, providing the pad section 121 makes it possible to reduce the number of wiring lines that supply a potential to each of the VSS contact regions 118 in the entirety of the chip. This makes it possible to achieve a decrease in the area of the entire chip, suppression of electrical interference between wiring lines in a miniaturized pixel, cost reduction by reduction in the number of components and/or the like.

It is possible to provide the pad sections 120 and 121 at desired positions of the first substrate 100 and the second substrate 200. Specifically, it is possible to provide the pad sections 120 and 121 in one of the wiring layer 100T and the insulating region 212 of the semiconductor layer 200S. In a case where the pad sections 120 and 121 are provided in the wiring layer 100T, the pad sections 120 and 121 may be in direct contact with the semiconductor layer 100S. Specifically, the pad sections 120 and 121 may have a configuration that is directly coupled to at least a portion of each of the floating diffusions FD and/or the VSS contact regions 118. In addition, a configuration may be adopted in which the coupling vias 120C and 121C are provided from each of the floating diffusions FD and/or the VSS contact regions 118 coupled to the pad sections 120 and 121 and the pad sections 120 and 121 are provided at desired positions of the wiring layer 100T and the insulating region 212 of the semiconductor layer 200S.

In particular, in a case where the pad sections 120 and 121 are provided in the wiring layer 100T, it is possible to reduce the number of wiring lines coupled to the floating diffusions FD and/or the VSS contact regions 118 in the insulating region 212 of the semiconductor layer 200S. This makes it possible to reduce the area of the insulating region 212, for forming a through-wiring line for coupling the floating diffusions FD to the pixel circuit 210, of the second substrate 200 forming the pixel circuit 210. This consequently makes it possible to secure a large area of the second substrate 200 forming the pixel circuit 210. Securing the area of the pixel circuit 210 makes it possible to form a large pixel transistor, and contribute to an improvement in image quality resulting from noise reduction and the like.

In particular, in a case where the pixel separation section 117 uses a FTI structure, the floating diffusions FD and/or the VSS contact regions 118 are preferably provided in the respective pixels 541; therefore, using the configurations of the pad sections 120 and 121 makes it possible to significantly reduce the number of wiring lines that couples the first substrate 100 and the second substrate 200 to each other.

In addition, as illustrated in FIG. 68B, for example, the pad section 120 to which the plurality of floating diffusions FD is coupled and the pad section 121 to which the plurality of VSS contact regions 118 is coupled are alternately linearly arranged in the V direction. In addition, the pad sections 120 and 121 are formed at positions surrounded by a plurality of photodiodes PD, a plurality of transfer gates TG, and a plurality of floating diffusions FD. This makes it possible to freely dispose an element other than the floating diffusions FD and the VSS contact regions 118 in the first substrate 100 that forms a plurality of elements, and enhance efficiency of a layout of the entire chip. In addition, symmetry in a layout of elements formed in each of the pixel sharing units 539 is secured, which makes it possible to suppress dispersion in characteristics of the pixels 541.

The pad sections 120 and 121 include, for example, polysilicon (Poly Si), more specifically, a doped polysilicon doped with impurities. The pad sections 120 and 121 preferably include an electrically-conductive material having high heat resistance such as polysilicon, tungsten (W), titanium (Ti), and titanium nitride (TiN). This makes it possible to form the pixel circuit 210 after attaching the semiconductor layer 200S of the second substrate 200 to the first substrate 100. A reason for this is described below. It is to be noted that, in the following description, a method of forming the pixel circuit 210 after attaching the first substrate 100 and the semiconductor layer 200S of the second substrate 200 is referred to as a first manufacturing method.

Here, a method may be conceivable in which the pixel circuit 210 is formed in the second substrate 200, and thereafter the pixel circuit 210 is attached to the first substrate 100 (which is hereinafter referred to as a second manufacturing method). In the second manufacturing method, an electrode for electrical coupling is formed in advance on each of the front surface of the first substrate 100 (the front surface of the wiring layer 100T) and the front surface of the second substrate 200 (the front surface of the wiring layer 200T). When the first substrate 100 and the second substrate 200 are attached together, the electrodes for electrical coupling formed on the front surface of the first substrate 100 and the front surface of the second substrate 200 are brought into contact with each other simultaneously with this. Thus, electrical coupling is formed between a wiring line included in the first substrate 100 and a wiring line included in the second substrate 200. Accordingly, the imaging device 1 is configured with use of the second manufacturing method, which makes it possible to manufacture the imaging device 1 with use of, for example, appropriate processes corresponding to the configuration of the first substrate 100 and the second substrates 200, and manufacture an imaging device having high quality and high performance.

In such a second manufacturing method, upon attaching the first substrate 100 and the second substrate 200 together, an error in alignment may be caused by a manufacturing apparatus for attaching. In addition, the first substrate 100 and the second substrate 200 each have, for example, a diameter of about several tens cm, and upon bonding the first substrate 100 and the second substrate 200 together, expansion and contraction of the substrate may occur in a microscopic region of each part of the first substrate 100 and the second substrate 200. The expansion and contraction of the substrate result from a slight deviation of a timing when the substrates come into contact with each other. An error may occur at the positions of the electrodes for electrical coupling formed on the front surface of the first substrate 100 and the front surface of the second substrate 200 due to such expansion and contraction of the first substrate 100 and the second substrate 200. In the second manufacturing method, it is preferable that the electrodes of the first substrate 100 and the second substrate 200 be in contact with each other even when such an error occurs. Specifically, at least one, preferably both of the electrodes of the first substrate 100 and the second substrate 200 are made large in consideration of the error described above. Accordingly, when the second manufacturing method is used, for example, the size (the size in a substrate plane direction) of the electrode formed on the front surface of the first substrate 100 or the second substrate 200 becomes larger than the size of an internal electrode extending in the thickness direction from the inside to the front surface of the first substrate 100 or the second substrate 200.

Meanwhile, the pad sections 120 and 121 include an electrically-conductive material having heat resistance, which makes it possible to use the first manufacturing method described above. In the first manufacturing method, after the first substrate 100 including the photodiode PD and the transfer transistor TR is formed, the first substrate 100 and the second substrate 200 (a semiconductor layer 2000S) are attached together. At this time, the second substrate 200 is in a state in which a pattern such as an active element and a wiring layer included in the pixel circuit 210 is not yet formed. The second substrate 200 is in a state before forming the pattern; therefore, even when an error occurs in an attaching position upon attaching the first substrate 100 and the second substrate 200 together, an error in alignment between a pattern of the first substrate 100 and the pattern of the second substrate 200 may not be caused by this attaching error. One reason for this is that the pattern of the second substrate 200 is formed after attaching the first substrate 100 and the second substrate 200 together. It is to be noted that, upon forming the pattern on the second substrate, for example, in an exposure apparatus for formation of the pattern, the pattern is formed to be aligned with the pattern formed in the first substrate. For this reason, the error in the attaching position between the first substrate 100 and the second substrate 200 is not an issue in manufacturing of the imaging device 1 in the first manufacturing method. For a similar reason, an error resulting from expansion and contraction of the substrate caused in the second manufacturing method is not an issue in manufacturing of the imaging device 1.

In the first manufacturing method, the active element is formed on the second substrate 200 in such a manner after attaching the first substrate 100 and the second substrate 200 (the semiconductor layer 200S) together. Thereafter, the through-electrodes 120E and 121E and the through-electrode TGV (FIG. 67) are formed. In the formation of the through-electrodes 120E, 121E, and TGV, for example, a pattern of a through-electrode is formed from above the second substrate 200 with use of reduction-projection exposure by an exposure apparatus. The reduction-projection exposure is used; therefore, even if an error occurs in alignment between the second substrate 200 and the exposure apparatus, magnitude of the error in the second substrate 200 is only a fraction (the inverse number of reduction-projection exposure magnification) of the error in the second manufacturing method described above. Accordingly, the imaging device 1 is configured with use of the first manufacturing method, which facilitates alignment between elements formed in each of the first substrate 100 and the second substrate 200, and makes it possible to manufacture an imaging device having high quality and high performance.

The imaging device 1 manufactured with use of such a first manufacturing method has characteristics different from those of an imaging device manufactured by the second manufacturing method. Specifically, in the imaging device 1 manufactured by the first manufacturing method, for example, the through-electrodes 120E, 121E, and TGV each have a substantially constant thickness (size in the substrate plane direction) from the second substrate 200 to the first substrate 100. Alternatively, when the through-electrodes 120E, 121E, and TGV each have a tapered shape, they have a tapered shape having a constant slope. In the imaging device 1 including such through-electrodes 120E, 121E, and TGV, the pixels 541 are easily miniaturized.

Here, when the imaging device 1 is manufactured by the first manufacturing method, the active element is formed in the second substrate 200 after attaching the first substrate 100 and the second substrate 200 (the semiconductor layer 200S) together; therefore, heating treatment necessary for formation of the active element also affects the first substrate 100. Accordingly, as described above, the pad sections 120 and 121 provided in the first substrate 100 preferably use an electrically-conductive material having higher heat resistance. For example, the pad sections 120 and 121 preferably use a material having a higher melting point (that is, higher heat resistance) than that of at least a portion of a wiring material included in the wiring layer 200T of the second substrate 200. For example, the pad sections 120 and 121 uses an electrically-conductive material having high heat resistance such as doped polysilicon, tungsten, titanium, and titanium nitride. This makes it possible to manufacture the imaging device 1 with use of the first manufacturing method described above.

The passivation film 122 is provided throughout the entire front surface of the semiconductor layer 100S to cover the pad sections 120 and 121, for example, (FIG. 67). The passivation film 122 includes, for example, a silicon nitride (SiN) film. The interlayer insulating film 123 covers the pad sections 120 and 121 with the passivation film 122 interposed therebetween. The interlayer insulating film 123 is provided throughout the front surface of the semiconductor layer 100S, for example. The interlayer insulating film 123 includes, for example, silicon oxide (SiO) film. The bonding film 124 is provided at a bonding surface between the first substrate 100 (specifically the wiring layer 100T) and the second substrate 200. That is, the bonding film 124 is in contact with the second substrate 200. The bonding film 124 is provided throughout the main surface of the first substrate 100. The bonding film 124 includes, for example, a silicon nitride film.

The light-receiving lens 401 is opposed to the semiconductor layer 100S with the fixed electric charge film 112 and the insulating film 111 interposed therebetween, for example (FIG. 67). The light-receiving lens 401 is provided at a position opposed to the photodiode PD of each of the pixels 541A, 541B, 541C, and 541D, for example.

The second substrate 200 includes the semiconductor layer 200S and the wiring layer 200T in order from side of the first substrate 100. The semiconductor layer 200S includes a silicon substrate. In the semiconductor layer 200S, a well region 211 is provided in the thickness direction. The well region 211 is, for example, a p-type semiconductor region. In the second substrate 200, the pixel circuit 210 disposed for each of the pixel sharing units 539 is provided. The pixel circuit 210 is provided on side of the front surface (side of the wiring layer 200T) of the semiconductor layer 200S, for example. In the imaging device 1, the second substrate 200 is attached to the first substrate 100 to allow the side of back surface (the side of the semiconductor layer 200S) of the second substrate 200 to be opposed to the side of the front surface (the side of the wiring layer 100T) of the first substrate 100. That is, the second substrate 200 is attached face-to-back to the first substrate 100.

FIGS. 69 to 73 each schematically illustrate an example of a planar configuration of the second substrate 200. FIG. 69 illustrates a configuration of the pixel circuit 210 provided close to the front surface of the semiconductor layer 200S. FIG. 70 schematically illustrates a configuration of each of the wiring layer 200T (specifically, a first wiring layer W1 described later), the semiconductor layer 200S coupled to the wiring layer 200T, and the first substrate 100. FIGS. 71 to 73 each illustrate an example of a planar configuration of the wiring layer 200T. Description is given below of the configuration of the second substrate 200 with use of FIGS. 69 to 73 together with FIG. 67. In FIGS. 69 and 70, the contour of the photodiode PD (a boundary between the pixel separation section 117 and the photodiode PD) is indicated by a broken line, and a boundary between the semiconductor layer 200S in a portion overlapping the gate electrode of each of the transistors included in the pixel circuit 210 and the element separation region 213 or the insulating region 212 is indicated by a dotted line. In a portion overlapping the gate electrode of the amplification transistor AMP, a boundary between the semiconductor layer 200S and the element separation region 213 and a boundary between the element separation region 213 and the insulating region 212 are provided in one channel width direction.

The second substrate 200 includes the insulating region 212 that divides the semiconductor layer 200S, and the element separation region 213 that is provided in a portion in the thickness direction of the semiconductor layer 200S (FIG. 67). For example, in the insulating region 212 provided between two pixel circuits 210 adjacent to each other in the H direction, the through-electrodes 120E and 121E of two pixel sharing units 539 and the through-electrodes TGV (through-electrodes TGV1, TGV2, TGV3, and TGV4) coupled to the two pixel circuits 210 are disposed (FIG. 70).

The insulating region 212 has substantially the same thickness as the thickness of the semiconductor layer 200S (FIG. 67). The semiconductor layer 200S is divided by the insulating region 212. The through-electrodes 120E and 121E and the through-electrodes TGV are disposed in the insulating region 212. The insulating region 212 includes, for example, silicon oxide.

The through-electrodes 120E and 121E are provided to penetrate the insulating region 212 in the thickness direction. Upper ends of the through-electrodes 120E and 121E are coupled to wiring lines (the first wiring layer W1, a second wiring layer W2, a third wiring layer W3, and a fourth wiring layer W4 that are described later) of the wiring layer 200T. The through-electrodes 120E and 121E are provided to penetrate the insulating region 212, the bonding film 124, the interlayer insulating film 123, and the passivation film 122, and lower ends thereof are coupled to the pad sections 120 and 121 (FIG. 67). The through-electrode 120E electrically couples the pad section 120 and the pixel circuit 210 to each other. That is, the floating diffusion FD of the first substrate 100 is electrically coupled to the pixel circuit 210 of the second substrate 200 by the through-electrode 120E. The through-electrode 121E electrically couples the pad section 121 and the reference potential line VSS of the wiring layer 200T to each other. That is, the VSS contact region 118 of the first substrate 100 is electrically coupled to the reference potential line VSS of the second substrate 200 by the through-electrode 121E.

The through-electrode TGV is provided to penetrate the insulating region 212 in the thickness direction. An upper end of the through-electrode TGV is coupled to a wiring line of the wiring layer 200T. The through-electrode TGV is provided to penetrate the insulating region 212, the bonding film 124, the interlayer insulating film 123, the passivation film 122, and the interlayer insulating film 119, and a lower end thereof is coupled to the transfer gate TG (FIG. 67). Such a through-electrode TGV electrically couples the transfer gates TG (transfer gates TG1, TG2, TG3, and TG4) of the pixels 541A, 541B, 541C, and 541D and wiring lines (portions of the row drive signal line 542, specifically wiring lines TRG1, TRG2, TRG3, and TRG4 in FIG. 72 described later) of the wiring layer 200T to each other. That is, the transfer gates TG of the first substrate 100 are electrically coupled to the wiring lines TRG of the second substrate 200 by the through-electrode TGV to transmit a drive signal to each of the transfer transistors TR (transfer transistors TR1, TR2, TR3, and TR4).

The insulating region 212 is a region for insulating the through-electrodes 120E and 121E and the through-electrode TGV for electrically coupling the first substrate 100 and the second substrate 200 to each other from the semiconductor layer 200S. For example, in the insulating region 212 provided between two pixel circuits 210 (the pixel sharing units 539) adjacent to each other in the H direction, the through-electrodes 120E and 121E, and the through-electrodes TGV (the through-electrodes TGV1, TGV2, TGV3, and TGV4) that are coupled to the two pixel circuits 210 are disposed. The insulating region 212 is provided to extend in the V direction, for example (FIGS. 69 and 70). Here, the disposition of the horizontal portion TGb of the transfer gate TG is devised, thereby disposing the position in the H direction of the through-electrode TGV closer to the positions in the H direction of the through-electrodes 120E and 121E, as compared with the position of the vertical portion TGa (FIGS. 68A and 70). For example, the through-electrode TGV is disposed at substantially the same position in the H direction as the through-electrodes 120E and 120E. This makes it possible to collectively provide the through-electrodes 120E and 121E and the through-electrode TGV in the insulating region 212 that extends in the V direction. As another arrangement example, it may be conceivable that the horizontal portion TGb is provided only in a region superimposed on the vertical portion TGa. In this case, the through-electrode TGV is formed substantially directly above the vertical portion TGa, and the through-electrode TGV is disposed in a substantially middle part in the H direction and the Y direction of each of the pixels 541, for example. At this time, the position in the H direction of the through-electrode TGV is significantly deviated from the positions in the H direction of the through-electrodes 120E and 121E. For example, the insulating region 212 is provided around the through-electrode TGV and the through-electrodes 120E and 121E to electrically insulate them from the semiconductor layer 200S close to them. In a case where the position in the H direction of the through-electrode TGV and the positions in the H direction of the through-electrodes 120E and 121E are greatly separated from each other, it is necessary to independently provide the insulating region 212 around each of the through-electrodes 120E, 121E, and TGV. Accordingly, the semiconductor layer 200S is finely divided. In contrast, a layout in which the through-electrodes 120E and 121E and the through-electrode TGV are collectively disposed in the insulating region 212 that extends in the V direction makes it possible to increase the size in the H direction of the semiconductor layer 200S. This makes it possible to secure a large area of a semiconductor element formation region in the semiconductor layer 200S. Accordingly, it is possible to increase the size of the amplification transistor AMP and reduce noise, for example.

As described with reference to FIG. 65, the pixel sharing unit 539 electrically couples together the floating diffusions FD provided in the respective pixels 541, and has a structure in which the plurality of pixels 541 share one pixel circuit 210. In addition, the electrical coupling between the floating diffusions FD is made by the pad section 120 provided in the first substrate 100 (FIGS. 67 and 68B). The electrical coupling section (the pad section 120) provided in the first substrate 100 and the pixel circuit 210 provided in the second substrate 200 are electrically coupled together via one through-electrode 120E. Alternatively, it may be also conceivable, as an alternative structure example, that an electrical coupling section between the floating diffusions FD is provided in the second substrate 200. In this case, the pixel sharing unit 539 includes four through-electrodes coupled respectively to the floating diffusions FD1, FD2, FD3, and FD4. Accordingly, in the second substrate 200, the number of the through-electrodes penetrating the semiconductor layer 200S is increased, and the insulating region 212 insulating the periphery of the through-electrodes is made larger. In contrast, it is possible for the structure of the first substrate 100 including the pad section 120 (FIGS. 67 and 68B) to reduce the number of the through-electrodes and to make the insulating region 212 smaller. Thus, it is possible to secure a large area of a semiconductor element formation region in the semiconductor layer 200S. This makes it possible, for example, to increase the size of the amplification transistor AMP, and thus to suppress the noise.

The element separation region 213 is provided on front surface side of the semiconductor layer 200S. The element separation region 213 has an STI (Shallow Trench Isolation) structure. In the element separation region 213, the semiconductor layer 200S is engraved in the thickness direction (a direction perpendicular to the main surface of the second substrate 200), and an insulating film is embedded in the engraved part. The insulating film includes, for example, silicon oxide. The element separation region 213 performs element separation between a plurality of transistors included in the pixel circuit 210 in accordance with the layout of the pixel circuit 210. The semiconductor layer 200S (specifically, the well region 211) extends below the element separation region 213 (a deep part of the semiconductor layer 200S).

Here, description is given of a difference between a contour shape (a contour shape in the substrate plane direction) of the pixel sharing unit 539 in the first substrate 100 and a contour shape of the pixel sharing unit 539 in the second substrate 200 with reference to FIGS. 68A, 68B, and 69.

In the imaging device 1, the pixel sharing units 539 are provided over both the first substrate 100 and the second substrate 200. For example, the contour shape of the pixel sharing unit 539 provided in the first substrate 100 and the contour shape of the pixel sharing unit 539 provided in the second substrate 200 are different from each other.

In FIGS. 68A and 68B, a contour line of each of the pixels 541A, 541B, 541C, and 541D is indicated by an alternate long and short dashed line, and a contour line of the pixel sharing unit 539 is indicated by a thick line. For example, the pixel sharing unit 539 of the first substrate 100 includes two pixels 541 (the pixels 541A and 541B) arranged adjacent to each other in the H direction and two pixels 541 (the pixels 541C and 541D) arranged adjacent to each other in the V direction. That is, the pixel sharing unit 539 of the first substrate 100 includes four adjacent pixels 541 in two rows by two columns, and the pixel sharing unit 539 of the first substrate 100 has a substantially square contour shape. In the pixel array section 540, such pixel sharing units 539 are arranged adjacent to each other with two-pixel pitches (pitches corresponding to two pixels 541) in the H direction and two-pixel pitches (pitches corresponding to tow pixels 541) in the V direction.

In FIGS. 69 and 70, the contour line of each of the pixels 541A, 541B, 541C, and 541D is indicated by an alternate long and short dashed line, and a contour line of the pixel sharing unit 539 is indicated by a thick line. For example, the contour shape of the pixel sharing unit 539 of the second substrate 200 is smaller in the H direction than that of the pixel sharing unit 539 of the first substrate 100, and is larger in the V direction than that of the pixel sharing unit 539 of the first substrate 100. For example, the pixel sharing unit 539 of the second substrate 200 is formed to have a size (a region) corresponding to one pixel in the H direction, and is formed to have a size corresponding to four pixels in the V direction. That is, the pixel sharing unit 539 of the second substrate 200 is formed to have a size corresponding to adjacent pixels arranged in one row by four columns, and the pixel sharing unit 539 of the second substrate 200 has a substantially rectangular contour shape.

For example, in each of the pixel circuits 210, the selection transistor SEL, the amplification transistor AMP, the reset transistor RST, and the FD conversion gain switching transistor FDG are arranged in this order side by side in the V direction (FIG. 69). The contour shape of each of the pixel circuits 210 is a substantially rectangular shape as described above, which makes it possible to arrange four transistors (the selection transistor SEL, the amplification transistor AMP, the reset transistor RST, and the FD conversion gain switching transistor FDG) side by side in one direction (the V direction in FIG. 69). This makes it possible to share the drain of the amplification transistor AMP and the drain of the reset transistor RST in one diffusion region (a diffusion region coupled to the power source line VDD). For example, it is possible to provide the formation region of each of the pixel circuit 210 having a substantially square shape (see FIG. 82 described later). In this case, two transistors are disposed in one direction, which makes it difficult to share the drain of the amplification transistor AMP and the drain of the reset transistor RST in one diffusion region. Accordingly, providing the formation region of the pixel circuit 210 having a substantially rectangular shape makes it easy to dispose four transistors close to each other, and makes it possible to downsize the formation region of the pixel circuit 210. That is, it is possible to miniaturize the pixels. In addition, in a case where it is unnecessary to make the formation region of the pixel circuit 210 smaller, the formation region of the amplification transistor AMP is made larger, which makes it possible to suppress the noise.

For example, in addition to the selection transistor SEL, the amplification transistor AMP, the reset transistor RST, and the FD conversion gain switching transistor FDG, the VSS contact region 218 coupled to the reference potential line VSS is provided close to the front surface of the semiconductor layer 200S. The VSS contact region 218 includes, for example, a p-type semiconductor region. The VSS contact region 218 is electrically coupled to the VSS contact region 118 of the first substrate 100 (the semiconductor layer 100S) through a wiring line of the wiring layer 200T and the through-electrode 121E. The VSS contact region 218 is provided at a position adjacent to the source of the FD conversion gain switching transistor FDG with the element separation region 213 interposed therebetween, for example (FIG. 69).

Next, description is given of a positional relationship between the pixel sharing unit 539 provided in the first substrate 100 and the pixel sharing unit 539 provided in the second substrate 200 with reference to FIGS. 68B and 69. For example, one (e.g., on upper side of the sheet of FIG. 68B) pixel sharing unit 539 of two pixel sharing units 539 arranged in the V direction of the first substrate 100 is coupled to one (e.g., on left side of the sheet of FIG. 69) pixel sharing unit 539 of two pixel sharing units 539 arranged in the H direction of the second substrate 200. For example, the other (e.g., on lower side of the sheet of FIG. 68B) pixel sharing unit 539 of the two pixel sharing units 539 arranged in the V direction of the first substrate 100 is coupled to the other (e.g., on right side of the sheet of FIG. 69) pixel sharing unit 539 of the two pixel sharing units 539 arranged in the H direction of the second substrate 200.

For example, in the two pixel sharing units 539 arranged in the H direction of the second substrate 200, an internal layout (arrangement of transistors and the like) of the one pixel sharing unit 539 is substantially equal to a layout obtained by inverting an internal layout of the other pixel sharing unit 539 in the V direction and the H direction. Effects achieved by this layout are described below.

In the two pixel sharing units 539 arranged in the V direction of the first substrate 100, each of the pad sections 120 is disposed in a middle part of the contour shape of the pixel sharing unit 539, that is, a middle part in the V direction and the H direction of the pixel sharing unit 539 (FIG. 68B). Meanwhile, the pixel sharing unit 539 of the second substrate 200 has a substantially rectangular contour shape that is long in the V direction as described above; therefore, for example, the amplification transistor AMP coupled to the pad section 120 is disposed at a position deviated from the middle in the V direction of the pixel sharing unit 539 toward an upper part of the sheet. For example, in a case where internal layouts of the two pixel sharing units 539 arranged in the H direction of the second substrate 200 are the same, a distance between the amplification transistor AMP of the one pixel sharing unit 539 and the pad section 120 (e.g., the pad section 120 of the pixel sharing unit 539 on upper side of the sheet of FIG. 7) is relatively short. However, a distance between the amplification transistor AMP of the other pixel sharing unit 539 and the pad section 120 (e.g., the pad section 120 of the pixel sharing unit 539 on lower side of the sheet of FIG. 7) is long. Accordingly, an area of a wiring line necessary for coupling between the amplification transistor AMP and the pad section 120 is increased, which may possibly complicate a wiring layout of the pixel sharing unit 539. There is a possibility that this may affect miniaturization of the imaging device 1.

In contrast, internal layouts of the two pixel sharing units 539 arranged in the H direction of the second substrate 200 are inverted in at least the V direction, which makes it possible to shorten distances between the amplification transistors AMP of both the two pixel sharing units 539 and the pad section 120. Accordingly, as compared with a configuration in which the internal layouts of the two pixel sharing units 539 arranged in the H direction of the second substrate 200 are the same, miniaturization of the imaging device 1 is easily executed. It is to be noted that a planar layout of each of the plurality of pixel sharing units 539 of the second substrate 200 is bilaterally symmetrical in a range illustrated in FIG. 69; however, a layout including a layout of the first wiring layer W1 illustrated in FIG. 70 described later is bilaterally asymmetrical.

In addition, the internal layouts of the two pixel sharing units 539 arranged in the H direction of the second substrate 200 are preferably inverted to each other also in the H direction. A reason for this is described below. As illustrated in FIG. 70, the two pixel sharing units 539 arranged in the H direction of the second substrate 200 are each coupled to the pad sections 120 and 121 of the first substrate 100. For example, the pad sections 120 and 121 are disposed in a middle part in the H direction (between the two pixel sharing units 539 arranged in the H direction) of the two pixel sharing units 539 arranged in the H direction of the second substrate 200. Accordingly, the internal layouts of the two pixel sharing units 539 arranged in the H direction of the second substrate 200 are inverted to each other also in the H direction, which makes it possible to decrease distances between each of the plurality of pixel sharing units 539 of the second substrate 200 and the pad sections 120 and 121. That is, this further facilitates the miniaturization of the imaging device 1.

In addition, the position of the contour line of the pixel sharing unit 539 of the second substrate 200 may not be aligned with the position of a contour line of one of the pixel sharing units 539 of the first substrate 100. For example, in one (e.g., left side of the sheet of FIG. 70) pixel sharing unit 539 of the two pixel sharing units 539 arranged in the H direction of the second substrate 200, one (e.g., upper side of the sheet of FIG. 70) contour line in the V direction is disposed outside one contour line in the V direction of a corresponding pixel sharing unit 539 (e.g., on upper side of the sheet of FIG. 68B) of the first substrate 100. In addition, in the other (e.g., on right side of the sheet of FIG. 70) pixel sharing unit 539 of the two pixel sharing units 539 arranged in the H direction of the second substrate 200, the other (e.g., the lower side of the sheet of FIG. 70) contour line in the V direction is disposed outside the other contour line in the V direction of a corresponding pixel sharing unit 539 (e.g., on the lower side of the sheet of FIG. 68B) of the first substrate 100. Disposing the pixel sharing units 539 of the second substrate 200 and the pixel sharing units 539 of the first substrate 100 each other makes it possible to shorten a distance between the amplification transistor AMP and the pad section 120. This facilitates the miniaturization of the imaging device 1.

In addition, the positions of contour lines of the plurality of pixel sharing units 539 of the second substrate 200 may not be aligned. For example, the two pixel sharing units 539 arranged in the H direction of the second substrate 200 are disposed to allow the positions of the contour lines in the V direction to be deviated. This makes it possible to shorten the distance between the amplification transistor AMP and the pad section 120. Thus, the miniaturization of the imaging device 1 is facilitated.

Description is given of repeated arrangement of the pixel sharing units 539 in the pixel array section 540 with reference to FIGS. 68B and 70. The pixel sharing unit 539 of the first substrate 100 has a size corresponding to two pixels 541 in the H direction and a size corresponding to two pixels 541 in the V direction (FIG. 68B). For example, in the pixel array section 540 of the first substrate 100, the pixel sharing units 539 having a size corresponding to the four pixels 541 are repeatedly arranged adjacent to each other with two-pixel pitches (pitches corresponding to two pixels 541) in the H direction and two-pixel pitches (pitches corresponding to two pixels 541) in the V direction. Alternatively, in the pixel array section 540 of the first substrate 100, a pair of pixel sharing units 539 that are two pixel sharing units 539 adjacent to each other in the V direction may be provided. In the pixel array section 540 of the first substrate 100, for example, the pair of pixel sharing units 539 are repeatedly arranged adjacent to each other with two-pixel pitches (pitches corresponding to two pixels 541) in the H direction and four-pixel pitches (pitches corresponding to four pixels 541) in the V direction. The pixel sharing unit 539 of the second substrate 200 has a size corresponding to one pixel 541 in the H direction and a size corresponding to four pixels 541 in the V direction (FIG. 70). For example, in the pixel array section 540 of the second substrate 200, a pair of pixel sharing units 539 including two pixel sharing units 539 having a size corresponding to the four pixels 541 are provided. The pixel sharing units 539 are disposed adjacent to each other in the H direction and are disposed to be deviated in the V direction. In the pixel array section 540 of the second substrate 200, for example, the pair of pixel sharing units 539 are repeatedly arranged adjacent to each other without space with two-pixel pitches (pitches corresponding to two pixels 541) in the H direction and four-pixel pitches (pitches corresponding to four pixels 541) in the V direction. Such repeated arrangement of the pixel sharing units 539 makes it possible to arrange the pixel sharing units 539 without space. Thus, the miniaturization of the imaging device 1 is facilitated.

The amplification transistor AMP preferably has, for example, a three-dimensional structure such as a Fin type (FIG. 67). This increases a size of an effective gate width, thus making it possible to suppress the noise. The selection transistor SEL, the reset transistor RST, and the FD conversion gain switching transistor FDG have, for example, a planar structure. The amplification transistor AMP may have the planar structure. Alternatively, the selection transistor SEL, the reset transistor RST, or the FD conversion gain switching transistor FDG may have the three-dimensional structure.

The wiring layer 200T includes, for example, a passivation film 221, an interlayer insulating film 222, and a plurality of wiring lines (the first wiring layer W1, the second wiring layer W2, the third wiring layer W3, and the fourth wiring layer W4). The passivation film 221 is, for example, in contact with the front surface of the semiconductor layer 200S, and covers the entire front surface of the semiconductor layer 200S. The passivation film 221 covers the respective gate electrodes of the selection transistor SEL, the amplification transistor AMP, the reset transistor RST, and the FD conversion gain switching transistor FDG. The interlayer insulating film 222 is provided between the passivation film 221 and the third substrate 300. The plurality of wiring lines (the first wiring layer W1, the second wiring layer W2, the third wiring layer W3, and the fourth wiring layer W4) are separated by the interlayer insulating film 222. The interlayer insulating film 222 includes, for example, silicon oxide.

In the wiring layer 200T, for example, the first wiring layer W1, the second wiring layer W2, the third wiring layer W3, the fourth wiring layer W4, and the contact sections 201 and 202 are provided in this order from side of the semiconductor layer 200S, and are insulated from each other by the interlayer insulating film 222. The interlayer insulating film 222 includes a plurality of coupling sections that couples the first wiring layer W1, the second wiring layer W2, the third wiring layer W3, or the fourth wiring layer W4 and a layer therebelow to each other. The coupling sections are portions in which an electrically-conductive material is embedded in a coupling hole provided in the interlayer insulating film 222. For example, the interlayer insulating film 222 includes a coupling section 218V that couples the first wiring layer W1 and the VSS contact region 218 of the semiconductor layer 200S to each other. For example, the hole diameter of such a coupling section that couples elements of the second substrate 200 to each other differs from hole diameters of the through-electrodes 120E and 121E and the through-electrode TGV. Specifically, the hole diameter of the coupling hole that couples the elements of the second substrate 200 to each other is preferably smaller than the hole diameters of the through-electrodes 120E and 121E and the through-electrode TGV. A reason for this is described below. The depth of the coupling section (such as the coupling section 218V) provided in the wiring layer 200T is smaller than the depths of the through-electrodes 120E and 121E and the through-electrode TGV. Accordingly, in the coupling section, the electrically-conductive material is able to be embedded in the coupling hole more easily than the through-electrodes 120E and 121E and the through-electrode TGV. Making the hole diameter of the coupling section smaller than the hole diameters of the through-electrodes 120E and 121E and the through-electrode TGV facilitates the miniaturization of the imaging device 1.

For example, the through-electrode 120E, and the gate of the amplification transistor AMP and the source of the FD conversion gain switching transistor FDG (specifically, a coupling hole reaching the source of the FD conversion gain switching transistor FDG) are coupled to each other by the first wiring layer W1. The first wiring layer W1 couples, for example, the through-electrode 121E and the coupling section 218V to each other, which causes the VSS contact region 218 of the semiconductor layer 200S and the VSS contact region 118 of the semiconductor layer 100S to be electrically coupled to each other.

Next, description is given of the planar configuration of the wiring layer 200T with reference to FIGS. 71 to 73. FIG. 71 illustrates an example of a planar configuration of the first wiring layer W1 and the second wiring layer W2. FIG. 72 illustrate an example of a planar configuration of the second wiring layer W2 and the third wiring layer W3. FIG. 73 illustrates an example of a planar configuration of the third wiring layer W3 and the fourth wiring layer W4.

For example, the third wiring layer W3 includes wiring lines TRG1, TRG2, TRG3, and TRG4, SELL, RSTL, and FDGL that extend in the H direction (the row direction) (FIG. 72). These wiring lines correspond to the plurality of row drive signal lines 542 described with reference to FIG. 65. The wiring lines TRG1, TRG2, TRG3, and TRG4 respectively transmit drive signals to the transfer gates TG1, TG2, TG3, and TG4. The wiring lines TRG1, TRG2, TRG3, and TRG4 are respectively coupled to the transfer gates TG1, TG2, TG3, and TG4 through the second wiring layer W2, the first wiring layer W1, and the through-electrode 120E. The wiring line SELL transmits a drive signal to the gate of the selection transistor SEL, the wiring line RSTL transmits a drive signal to the gate of the reset transistor RST, and the wiring line FDGL transmits a drive signal to the gate of the FD conversion gain switching transistor FDG. The wiring lines SELL, RSTL, and FDGL are respectively coupled to the gates of the selection transistor SEL, the reset transistor RST, and the FD conversion gain switching transistor FDG through the second wiring layer W2, the first wiring layer W1, and the coupling section.

For example, the fourth wiring layer W4 includes the power source line VDD, the reference potential line VSS, and the vertical signal line 543 that extend in the V direction (the column direction) (FIG. 73). The power source line VDD is coupled to the drain of the amplification transistor AMP and the drain of the reset transistor RST through the third wiring layer W3, the second wiring layer W2, the first wiring layer W1, and the coupling section. The reference potential line VSS is coupled to the VSS contact region 218 through the third wiring layer W3, the second wiring layer W2, the first wiring layer W1, and the coupling section 218V. In addition, the reference potential line VSS is coupled to the VSS contact region 118 of the first substrate 100 through the third wiring layer W3, the second wiring layer W2, the first wiring layer W1, the through-electrode 121E, and the pad section 121. The vertical signal line 543 is coupled to the source (Vout) of the selection transistor SEL through the third wiring layer W3, the second wiring layer W2, the first wiring layer W1, and the coupling section.

The contact sections 201 and 202 may be provided at positions overlapping the pixel array section 540 in a plan view (e.g., FIG. 64), or may be provided in the peripheral portion 540B outside the pixel array section 540 (e.g., FIG. 67). The contact sections 201 and 202 are provided on the front surface (a surface on side of the wiring layer 200T) of the second substrate 200. The contact sections 201 and 202 include, for example, a metal such as Cu (copper) and Al (aluminum). The contact sections 201 and 202 are exposed to the front surface (a surface on side of the third substrate 300) of the wiring layer 200T. The contact sections 201 and 202 are used for electrical coupling between the second substrate 200 and the third substrate 300 and attaching between the second substrate 200 and the third substrate 300.

FIG. 67 illustrates an example in which a peripheral circuit is provided in the peripheral portion 540B of the second substrate 200. The peripheral circuit may include a portion of the row driving section 520 or a portion of the column signal processor 550. In addition, as illustrated in FIG. 64, a peripheral circuit may not be disposed in the peripheral portion 540B of the second substrate 200, and the coupling hole sections H1 and H2 may be disposed close to the pixel array section 540.

The third substrate 300 includes, for example, the wiring layer 300T and the semiconductor layer 300S in this order from the side of the second substrate 200. For example, the front surface of the semiconductor layer 300S is provided on the side of the second substrate 200. The semiconductor layer 300S includes a silicon substrate. A circuit is provided in a portion on front surface side of the semiconductor layer 300S. Specifically, for example, at least a portion of the input section 510A, the row driving section 520, the timing controller 530, the column signal processor 550, the image signal processor 560, and the output section 510B is provided in the portion on the front surface side of the semiconductor layer 300S. The wiring layer 300T provided between the semiconductor layer 300S and the second substrate 200 includes, for example, an interlayer insulating film, a plurality of wiring layers separated by the interlayer insulating film, and the contact sections 301 and 302. The contact sections 301 and 302 are exposed to the front surface (a surface on the side of the second substrate 200) of the wiring layer 300T. The contact section 301 is coupled to the contact section 201 of the second substrate 200, and the contact section 302 is coupled to the contact section 202 of the second substrate 200. The contact sections 301 and 302 are electrically coupled to a circuit (e.g., at least one of the input section 510A, the row driving section 520, the timing controller 530, the column signal processor 550, the image signal processor 560, or the output section 510B) formed in the semiconductor layer 300S. The contact sections 301 and 302 include, for example, a metal such as Cu (copper) and aluminum (Al). For example, an external terminal TA is coupled to the input section 510A through the coupling hole section H1, and an external terminal TB is coupled to the output section 510B through the coupling hole section H2.

Here, description is given of characteristics of the imaging device 1.

In general, an imaging device includes a photodiode and a pixel circuit as main components. Here, when the area of the photodiode is increased, electric charges resulting from photoelectric conversion are increased, which consequently makes it possible to improve a signal-to-noise ratio (S/N ratio) of a pixel signal, thereby enabling the imaging device to output more favorable image data (image information). Meanwhile, when the size of the transistor included in the pixel circuit (specifically, the size of the amplification transistor) is increased, noise generated in the pixel circuit is reduced, which consequently makes it possible to improve an S/N ratio of an imaging signal, thereby allowing the imaging device to output more favorable image data (image information).

However, in an imaging device in which the photodiode and the pixel circuit are provided in the same semiconductor substrate, it is conceivable that when the area of the photodiode is increased within a limited area of the semiconductor substrate, the size of the transistor included in the pixel circuit is decreased. In addition, it is conceivable that when the size of the transistor included in the pixel circuit is increased, the area of the photodiode is decreased.

In order to solve these issues, for example, the imaging device 1 according to the present embodiment uses a structure in which a plurality of pixels 541 share one pixel circuit 210, and the shared pixel circuit 210 is disposed to be superimposed on the photodiode PD. This makes it possible to make the area of the photodiode PD within the limited area of the semiconductor substrate as large as possible and make the size of the transistor included in the pixel circuit 210 as large as possible. This makes it possible to improve the S/N ratio of the pixel signal, thereby allowing the imaging device 1 to output more favorable image data (image information).

In achieving the structure in which a plurality of pixels 541 shares one pixel circuit 210 and the pixel circuit 210 is disposed to be superimposed on the photodiode PD, a plurality of wiring lines extends, which couples from the floating diffusion FD of each of the plurality of pixels 541 to one pixel circuit 210. In order to secure a large area of the semiconductor substrate 200 that forms the pixel circuit 210, for example, it is possible to form a coupling wiring line that couples the plurality of extending wiring lines to each other to combine them into one. For a plurality of wiring lines extending from the VSS contact region 118, it is possible to form a coupling wiring line that couples the plurality of extending wiring lines to each other to combine them into one.

For example, it is conceivable that, when a coupling wiring line that couples the plurality of wiring lines extending from the floating diffusion FD of each of the plurality of pixels 541 to each other is formed in the semiconductor substrate 200 that forms the pixel circuit 210, an area where the transistors included in the pixel circuit 210 are to be formed is decreased. Likewise, it is conceivable that when a coupling wiring line that couples the plurality of wiring lines extending from the VSS contact region 118 of each of the plurality of pixels 541 to each other to combine them into one is formed in the semiconductor substrate 200 that forms the pixel circuit 210, an area where the transistors included in the pixel circuit 210 are to be formed is decreased.

In order to solve these issues, for example, the imaging device 1 according to the present embodiment is able to have a structure in which a plurality of pixels 541 share one pixel circuit 210, and the shared pixel circuit 210 is disposed to be superimposed on the photodiode PD, as well as a structure in which a coupling wiring line that couples the respective floating diffusions FD of the plurality of pixels 541 to each other to combine them into one and a coupling wiring line that couples the VSS contact regions 118 included in the respective pixels 541 to each other to combine them into one are included in the first substrate 100.

Here, when the second manufacturing method described above is used as a manufacturing method for providing, in the first substrate 100, the coupling wiring line that couples the respective floating diffusions FD of the plurality of pixels 541 to each other to combine them into one and the coupling wiring line that couples the respective VSS contact regions 118 of the plurality of pixels 541 to each other to combine them into one, it is possible to perform manufacturing with use of appropriate processes corresponding to the respective configurations of the first substrate 100 and the second substrate 200 and manufacture an imaging device having high quality and high performance. In addition, it is possible to form the coupling wiring lines of the first substrate 100 and the second substrate 200 by an easy process. Specifically, in a case where the second manufacturing method described above is used, an electrode coupled to the floating diffusion FD and an electrode coupled to the VSS contact region 118 are provided on each of the front surface of the first substrate 100 and the front surface of the second substrate 200 that form an attaching boundary surface between the first substrate 100 and the second substrate 200. Further, sizes of the electrodes formed on the front surfaces of the two substrates are preferably made large to cause the electrodes formed on the front surfaces of the two substrates to be in contact with each other even when positional displacement occurs between the electrodes provided on the front surfaces of the two substrates upon attaching the first substrate 100 and the second substrate 200 together. In this case, it is considered difficult to dispose the electrode described above in the limited area of each pixel included in the imaging device 1.

In order to solve an issue in that a large electrode is necessary on the attaching boundary surface between the first substrate 100 and the second substrate 200, for example, in the imaging device 1 according to the present embodiment, it is possible to use the first manufacturing method described above as a manufacturing method in which a plurality of pixels 541 share one pixel circuit 210 and the shared pixel circuit 210 is disposed to be superimposed on the photodiode PD. This makes it possible to facilitate alignment of elements formed in each of the first substrate 100 and the second substrate 200 and to manufacture an imaging device having high quality and high performance. Further, it is possible to have a unique structure formed by using the manufacturing method. That is, a structure in which the semiconductor layer 100S and the wiring layer 100T of the first substrate 100, and the semiconductor layer 200S and the wiring layer 200T of the second substrate 200 are stacked in this order, in other words, a structure in which the first substrate 100 and the second substrate 200 are stacked face-to-back is included, and the through-electrodes 120E and 121E are included that penetrate the semiconductor layer 200S and the wiring layer 100T of the first substrate 100 from the front surface side of the semiconductor layer 200S of the second substrate 200 to reach the front surface of the semiconductor layer 100S of the first substrate 100.

When, in a structure in which a coupling wiring line that couples the respective floating diffusions FD of the plurality of pixels 541 to each other to combine them into one and a coupling wiring line that couples the respective VSS contact regions 118 of the plurality of pixels 541 to each other to combine them into one are provided in the first substrate 100, this structure and the second substrate 200 are stacked with use of the first manufacturing method to form the pixel circuit 210 in the second substrate 200, there is a possibility that heating treatment necessary to form an active element included in the pixel circuit 210 may affect the coupling wiring line described above formed in the first substrate 100.

Therefore, in order to solve an issue in that heating treatment for forming the active element described above affects the coupling wiring line described above, in the imaging device 1 according to the present embodiment, it is desirable that an electrically-conductive material having high heat resistance be used for the coupling wiring line that couples the respective floating diffusions FD of the plurality of pixels 541 to each other to combine them into one and the coupling wiring line that couples the respective VSS contact regions 118 of the plurality of pixels 541 to each other to combine them into one. Specifically, as the electrically-conductive material having high heat resistance, it is possible to use a material having a higher melting point than that of at least a portion of a wiring material included in the wiring layer 200T of the second substrate 200.

As described above, for example, the imaging device 1 according to the present embodiment has (1) the structure in which the first substrate 100 and the second substrate 200 are stacked face-to-back (specifically, the structure in which the semiconductor layer 100S and the wiring layer 100T of the first substrate 100 and the semiconductor layer 200S and the wiring layer 200T of the second substrate 200 are stacked in this order), (2) the structure in which the through-electrodes 120E and 121E are provided that penetrate the semiconductor layer 200S and the wiring layer 100T of the first substrate 100 from the front surface side of the semiconductor layer 200S of the second substrate 200 to reach the front surface of the semiconductor layer 100S of the first substrate 100, and (3) the structure in which the coupling wiring line that couples the respective floating diffusions FD included in the plurality of pixels 541 to each other to combine them into one and the coupling wiring line that couples the respective VSS contact regions 118 included in the plurality of pixels 541 are formed with use of an electrically-conductive material having high heat resistance, which makes it possible to provide, in the first substrate 100, a coupling wiring line that couples the respective floating diffusions FD included in the plurality of pixels 541 to each other to combine them into one and a coupling wiring line that couples the respective VSS contact regions 118 included in the plurality of pixels 541 to each other to combine them into one, without providing a large electrode at an interface between the first substrate 100 and the second substrate 200.

[Operation of Imaging Device 1]

Next, description is given of an operation of the imaging device 1 with use of FIGS. 74 and 75. FIGS. 74 and 75 correspond to FIG. 64 with an arrow indicating a path of each signal. FIG. 74 illustrates an input signal to be inputted from outside to the imaging device 1 and paths of a power source potential and a reference potential indicated by arrows. FIG. 75 illustrates a signal path of a pixel signal to be outputted from the imaging device 1 to the outside indicated by an arrow. For example, the input signal (e.g., a pixel clock and a synchronization signal) inputted to the imaging device 1 through the input section 510A is transmitted to the row driving section 520 of the third substrate 300, and a row drive signal is formed in the row driving section 520. The row drive signal is transmitted to the second substrate 200 through the contact sections 301 and 201. Further, the row drive signal reaches each of the pixel sharing units 539 of the pixel array section 540 through the row drive signal line 542 in the wiring layer 200T. A drive signal other than the transfer gate TG of the row drive signal having reached the pixel sharing unit 539 of the second substrate 200 is inputted to the pixel circuit 210 to drive each of the transistors included in the pixel circuit 210. A drive signal of the transfer gate TG is inputted to the transfer gates TG1, TG2, TG3, and TG4 of the first substrate 100 through the through-electrode TGV to drive the pixels 541A, 541B, 541C, and 541D (FIG. 74). In addition, the power source potential and the reference potential supplied from outside of the imaging device 1 to the input section 510A (the input terminal 511) of the third substrate 300 are transmitted to the second substrate 200 through the contact sections 301 and 201 to be supplied to the pixel circuit 210 of each of the pixel sharing units 539 through a wiring line in the wiring layer 200T. The reference potential is further supplied to the pixels 541A, 5411B, 541C, and 541D of the first substrate 100 through the through-electrode 121E. Meanwhile, the pixel signal photoelectrically converted in the pixels 541A, 541B, 541C, and 541D of the first substrate 100 is transmitted to the pixel circuit 210 of the second substrate 200 for each pixel sharing unit 539 through the through-electrode 120E. A pixel signal based on the pixel signal is transmitted from the pixel circuit 210 to the third substrate 300 through the vertical signal line 543 and the contact sections 202 and 302. The pixel signal is processed in the column signal processor 550 and the image signal processor 560 of the third substrate 300, and then outputted to the outside through the output section 510B.

Effects

In the present embodiment, the pixels 541A, 541B, 541C, and 541D (the pixel sharing units 539) and the pixel circuit 210 are provided in different substrates (the first substrate 100 and the second substrate 200). This makes it possible to increase the areas of the pixels 541A, 541B, 541C, and 541D and the pixel circuit 210, as compared with a case where the pixels 541A, 541B, 541C, and 541D and the pixel circuit 210 are formed in the same substrate. This consequently makes it possible to increase the amount of pixel signals obtained by photoelectric conversion and reduce transistor noise of the pixel circuit 210. Accordingly, it is possible to improve the signal-to-noise ratio of the pixel signal, thereby allowing the imaging device 1 to output more favorable pixel data (image information). In addition, it is possible to miniaturize the imaging device 1 (in other words, reduce the pixel size and downsize the imaging device 1). Reduction in the pixel size makes it possible to increase the number of pixels per unit area, and it is possible for the imaging device 1 to output an image having high image quality.

In addition, in the imaging device 1, the first substrate 100 and the second substrate 200 are electrically coupled to each other by the through-electrodes 120E and 121E provided in the insulating region 212. For example, a method of coupling the first substrate 100 and the second substrate 200 to each other by bonding pad electrodes together and a method of coupling the first substrate 100 and the second substrate 200 to each other by a through-wiring line (e.g., a TSV ((Thorough Si Via)) penetrating a semiconductor layer may be conceivable. As compared with such methods, providing the through-electrodes 120E and 121E in the insulating region 212 makes it possible to reduce an area necessary for coupling between the first substrate 100 and the second substrate 200. This makes it possible to reduce the pixel size and further downsize the imaging device 1. In addition, further miniaturization of an area per pixel makes it possible to further enhance resolution. When reduction in a chip size is unnecessary, it is possible to enlarge formation regions of the pixels 541A, 541B, 541C, and 541D and the pixel circuit 210. This consequently makes it possible to increase the amount of the pixel signals obtained by photoelectric conversion and to reduce noise of the transistors included in the pixel circuit 210. Accordingly, it is possible to improve the signal-to-noise ratio of the pixel signal, thereby allowing the imaging device 1 to output more favorable pixel data (image information).

In addition, in the imaging device 1, the pixel circuit 210, and the column signal processor 550 and the image signal processor 560 are provided in different substrates (the second substrate 200 and third substrate 300). Accordingly, as compared with a case where the pixel circuit 210, the column signal processor 550, and the image signal processor 560 are formed in the same substrate, it is possible to increase the area of the pixel circuit 210 and the areas of the column signal processor 550 and the image signal processor 560. This makes it possible to reduce noise generated in the column signal processor 550 and mount a more advanced image processing circuit by the image signal processor 560. Accordingly, it is possible to improve the signal-to-noise ratio of the pixel signal, thereby allowing the imaging device 1 to output more favorable pixel data (image information).

In addition, in the imaging device 1, the pixel array section 540 is provided in the first substrate 100 and the second substrate 200, and the column signal processor 550 and the image signal processor 560 are provided in the third substrate 300. In addition, the contact sections 201, 202, 301, and 302 that couple the second substrate 200 and the third substrate 300 to each other are formed above the pixel array section 540. This makes it possible to freely lay out the contact sections 201, 202, 301, and 302 without interference on layout by various types of wiring lines included in a pixel array. Accordingly, it is possible to use the contact sections 201, 202, 301, and 302 for electrical coupling between the second substrate 200 and the third substrate 300. The use of the contact sections 201, 202, 301, and 302 increases flexibility in layout of the column signal processor 550 and the image signal processor 560, for example. This makes it possible to reduce noise generated in the column signal processor 550 and mount a more advanced image processing circuit in the image signal processor 560. Accordingly, it is possible to improve the signal-to-noise ratio of the pixel signal, thereby allowing the imaging device 1 to output more favorable pixel data (image information).

In addition, in the imaging device 1, the pixel separation section 117 penetrates the semiconductor layer 100S. Accordingly, even in a case where a distance between adjacent pixels (the pixels 541A, 541B, 541C, and 541D) is decreased by miniaturization of an area per pixel, it is possible to suppress color mixture among the pixels 541A, 5411B, 541C, and 541D. Accordingly, it is possible to improve the signal-to-noise ratio of the pixel signal, thereby allowing the imaging device 1 to output more favorable pixel data (image information).

In addition, in the imaging device 1, the pixel circuit 210 is provided for each pixel sharing unit 539. Accordingly, as compared with a case where the pixel circuit 210 is provided for each of the pixels 541A, 541B, 541C, and 541D, it is possible to increase formation regions of the transistors (the amplification transistor AMP, the reset transistor RST, the selection transistor SEL, and the FD conversion gain switching transistor FDG) included in the pixel circuit 210. For example, increasing the formation region of the amplification transistor AMP makes it possible to suppress the noise. Accordingly, it is possible to improve the signal-to-noise ratio of the pixel signal, thereby allowing the imaging device 1 to output more favorable pixel data (image information).

Further, in the imaging device 1, the pad section 120 that electrically couples the floating diffusions FD (the floating diffusions FD1, FD2, FD3, and FD4) of four pixels (the pixels 541A, 541B, 541C, and 541D) together is included in the first substrate 100. Accordingly, as compared with a case where such a pad section 120 is provided in the second substrate 200, it is possible to reduce the number of through-electrodes (the through-electrodes 120E) that couple the first substrate 100 and the second substrate 200 to each other. This makes it possible to reduce the size of the insulating region 212 and secure a sufficiently large formation region (the semiconductor layer 200S) of the transistors included in the pixel circuit 210. This makes it possible to reduce noise of the transistors included in the pixel circuit 210, which makes it possible to improve the signal-to-noise ratio of the pixel signal, thereby allowing the imaging device 1 to output more favorable pixel data (image information).

Description is given below of modification examples of the imaging device 1 according to the above embodiment. In the following modification examples, common components to those in the above embodiment are denoted by the same reference numerals.

6.2. Modification Example 1

FIGS. 76 to 80 illustrate a modification example of a planar configuration of the imaging device 1 according to the above embodiment. FIG. 76 schematically illustrates a planar configuration close to the front surface of the semiconductor layer 200S of the second substrate 200, and corresponds to FIG. 69 described in the above embodiment. FIG. 77 schematically illustrates a configuration of each of the first wiring layer W1, the semiconductor layer 200S coupled to the first wiring layer W1, and components of the first substrate 100, and corresponds to FIG. 70 described in the above embodiment. FIG. 78 illustrates an example of planar configurations of the first wiring layer W1 and the second wiring layer W2, and corresponds to FIG. 71 described in the above embodiment. FIG. 79 illustrates an example of planar configurations of the second wiring layer W2 and the third wiring layer W3, and corresponds to FIG. 72 described in the above embodiment. FIG. 80 illustrates an example of planar configurations of the third wiring layer W3 and the fourth wiring layer W4, and corresponds to FIG. 73 described in the above embodiment.

In the present modification example, as illustrated in FIG. 77, in the two pixel sharing units 539 arranged in the H direction of the second substrate 200, an internal layout of one pixel sharing unit 539 (e.g., on the right side of the sheet) has a configuration obtained by inverting an internal layout of the other pixel sharing unit 539 (e.g., on the left side of the sheet) only in the H direction. In addition, a deviation in the V direction between the contour line of the one pixel sharing unit 539 and the contour line of the other pixel sharing unit 539 is larger than the deviation (FIG. 70) described in the above embodiment. In such a manner, increasing the deviation in the V direction makes it possible to decrease a distance between the amplification transistor AMP of the other pixel sharing unit 539 and the pad section 120 coupled to the amplification transistor AMP (the pad section 120 of the other (on the lower side of the sheet) of the two pixel sharing units 539 arranged in the V direction illustrated in FIG. 7). Such a layout allows the modification example 1 of the imaging device 1 illustrated in FIG. 76 to 80 to make its area the same as the area of the pixel sharing unit 539 of the second substrate 200 described in the above embodiment without inverting, to each other in the V direction, planar layouts of the two pixel sharing units 539 arranged in the H direction. It is to be noted that the planar layout of the pixel sharing unit 539 of the first substrate 100 is the same as the planar layout described in the above embodiment (FIGS. 68A and 68B). Thus, the imaging device 1 according to the present modification example is able to achieve effects similar to those of the imaging device 1 described in the above embodiment. The arrangement of the pixel sharing units 539 of the second substrate 200 is not limited to the arrangements described in the above embodiment and the present modification example.

6.3. Modification Example 2

FIGS. 81 to 86 illustrate a modification example of a planar configuration of the imaging device 1 according to the above embodiment. FIG. 81 schematically illustrates a planar configuration of the first substrate 100, and corresponds to FIG. 68A described in the above embodiment. FIG. 82 schematically illustrates a planar configuration close to the front surface of the semiconductor layer 200S of the second substrate 200, and corresponds to FIG. 69 described in the above embodiment. FIG. 83 schematically illustrates a configuration of each of the first wiring layer W1, the semiconductor layer 200S coupled to the first wiring layer W1, and components of the first substrate 100, and corresponds to FIG. 70 described in the above embodiment. FIG. 84 illustrates an example of planar configurations of the first wiring layer W1 and the second wiring layer W2, and corresponds to FIG. 71 described in the above embodiment. FIG. 85 illustrates an example of planar configurations of the second wiring layer W2 and the third wiring layer W3, and corresponds to FIG. 72 described in the above embodiment. FIG. 86 illustrates an example of planar configurations of the third wiring layer W3 and the fourth wiring layer W4, and corresponds to FIG. 73 described in the above embodiment.

In the present modification example, the contour of each of the pixel circuits 210 has a substantially square planar shape (FIG. 82 and the like). The planar configuration of the imaging device 1 according to the present modification example differs from the planar configuration of the imaging device 1 described in the above embodiment in this point.

For example, the pixel sharing unit 539 of the first substrate 100 are formed over a pixel region of two rows by two columns in a manner similar to that described in the above embodiment, and has a substantially square planar shape (FIG. 81). For example, in each of the pixel sharing units 539, the horizontal portions TGb of the transfer gates TG1 and TG3 of the pixel 541A and the pixel 541C in one pixel column extend in a direction from positions superimposed on the vertical portions TGa toward a middle part of the pixel sharing unit 539 in the H direction (more specifically, in a direction toward outer edges of the pixels 541A and 541C and a direction toward the middle part of the pixel sharing unit 539), and the horizontal portions TGb of the transfer gates TG2 and TG4 of the pixels 541B and the pixel 541D in the other pixel column extend in a direction from positions superimposed on the vertical portions TGa toward outside of the pixel sharing unit 539 in the H direction (more specifically, in a direction toward outer edges of the pixels 541B and 541D and a direction toward outside of the pixel sharing unit 539). The pad section 120 coupled to the floating diffusion FD is provided in the middle part of the pixel sharing unit 539 (a middle part in the H direction and the V direction of the pixel sharing unit 539), and the pad section 121 coupled to the VSS contact region 118 is provided in an end portion of the pixel sharing unit 539 at least in the H direction (in the H direction and the V direction in FIG. 81).

As another arrangement example, it is also conceivable that the horizontal portions TGb of the transfer gates TG1, TG2, TG3, and TG4 are provided only in regions opposed to the vertical portions TGa. At this time, in a manner similar to that described in the above embodiment, the semiconductor layer 200S is easily divided finely. Accordingly, it is difficult to make the transistors of the pixel circuit 210 large. In contrast, when the horizontal portions TGb of the transfer gates TG1, TG2, TG3, and TG4 extend from the positions superimposed on the vertical portion TGa in the H direction as with the modification example described above, it is possible to increase the width of the semiconductor layer 200S. Specifically, it is possible to dispose the positions in the H direction of the through-electrodes TGV1 and TGV3 coupled to the transfer gates TG1 and TG3 close to the position in the H direction of the through-electrode 120E, and dispose the positions in the H direction of the through-electrodes TGV2 and TGV4 coupled to the transfer gates TG2 and TG4 close to the position in the H direction of the through-electrode 121E (FIG. 83). This makes it possible to increase the width (a size in the H direction) of the semiconductor layer 200S extending in the V direction in a manner similar to that described in the above embodiment. Accordingly, it is possible to increase the sizes of the transistors of the pixel circuit 210, specifically the size of the amplification transistor AMP. This consequently makes it possible to improve the signal-to-noise ratio of the pixel signal, thereby allowing the imaging device 1 to output more favorable pixel data (image information).

The pixel sharing unit 539 of the second substrate 200 has, for example, substantially the same size as the size in the H direction and the V direction of the pixel sharing unit 539 of the first substrate 100, and is provided over a region substantially corresponding to a pixel region of two rows by two columns. For example, in each of the pixel circuits 210, the selection transistor SEL and the amplification transistor AMP are arranged side by side in the V direction in one semiconductor layer 200S extending in the V direction, and the FD conversion gain switching transistor FDG and the reset transistor RST are arranged side by side in the V direction in one semiconductor layer 200S extending in the V direction. The one semiconductor layer 200S provided with the selection transistor SEL and the amplification transistor AMP and the one semiconductor layer 200S provided with the FD conversion gain switching transistor FDG and the reset transistor RST are arranged in the H direction with the insulating region 212 interposed therebetween. The insulating region 212 extends in the V direction (FIG. 82).

Here, description is given of the contour of the pixel sharing unit 539 of the second substrate 200 with reference to FIGS. 82 and 83. For example, the pixel sharing unit 539 of the first substrate 100 illustrated in FIG. 81 is couple to the amplification transistor AMP and the selection transistor SEL provided on one side (on left side of the sheet of FIG. 83) in the H direction of the pad section 120 and to the FD conversion gain switching transistor FDG and the reset transistor RST provided on the other side (on right side of the sheet of FIG. 83) in the H direction of the pad section 120. The contour of the pixel sharing unit 539 of the second substrate 200 including the amplification transistor AMP, the selection transistor SEL, the FD conversion gain switching transistor FDG, and the reset transistor RST is determined by the following four outer edges.

A first outer edge is an outer edge of one end (an end on upper side of the sheet of FIG. 83) in the V direction of the semiconductor layer 200S including the selection transistor SEL and the amplification transistor AMP. The first outer edge is provided between the amplification transistor AMP included in that pixel sharing unit 539 and the selection transistor SEL included in the pixel sharing unit 539 adjacent in the V direction (on upper side of the sheet of FIG. 83) to one side of that pixel sharing unit 539. More specifically, the first outer edge is provided in a middle part in the V direction of the element separation region 213 between the amplification transistor AMP and the selection transistor SEL. A second outer edge is an outer edge of another end (an end on lower side of the sheet of FIG. 83) in the V direction of the semiconductor layer 200S including the selection transistor SEL and the amplification transistor AMP. The second outer edge is provided between the selection transistor SEL included in that pixel sharing unit 539 and the amplification transistor AMP included in the pixel sharing unit 539 adjacent in the V direction to another side (lower side of the sheet of FIG. 83) of that pixel sharing unit 539. More specifically, the second outer edge is provided in a middle part in the V direction of the element separation region 213 between the selection transistor SEL and the amplification transistor AMP. A third outer edge is an outer edge of another end (an end on the lower side of the sheet of FIG. 83) in the V direction of the semiconductor layer 200S including the reset transistor RST and the FD conversion gain switching transistor FDG. The third outer edge is provided between the FD conversion gain switching transistor FDG included in that pixel sharing unit 539 and the reset transistor RST included in the pixel sharing unit 539 adjacent in the V direction to another side (lower side of the sheet of FIG. 83) of that pixel sharing unit 539. More specifically, the third outer edge is provided in a middle part in the V direction of the element separation region 213 between the FD conversion gain switching transistor FDG and the reset transistor RST. A fourth outer edge is an outer edge of one end (an end on upper side of the sheet of FIG. 83) in the V direction of the semiconductor layer 200S including the reset transistor RST and the FD conversion gain switching transistor FDG. The fourth outer edge is provided between the reset transistor RST included in that pixel sharing unit 539 and the FD conversion gain switching transistor FDG (unillustrated) included in the pixel sharing unit 539 adjacent in the V direction (on upper side of the sheet of FIG. 83) to one side of that pixel sharing unit 539. More specifically, the fourth outer edge is provided in a middle part in the V direction of the element separation region 213 (unillustrated) between the reset transistor RST and the FD conversion gain switching transistor FDG.

In the contour of the pixel sharing unit 539 of the second substrate 200 including such first, second, third, and fourth outer edges, the third and fourth outer edges are disposed to be deviated on one side in the V direction from the first and second outer edges (in other words, to be offset to one side in the V direction). Using such a layout makes it possible to dispose both the gate of the amplification transistor AMP and the source of the FD conversion gain switching transistor FDG as close as possible to the pad section 120. This makes it easier to decrease the area of wiring lines to which they are coupled, and miniaturize the imaging device 1. It is to be noted that the VSS contact region 218 is provided between the semiconductor layer 200S including the selection transistor SEL and the amplification transistor AMP and the semiconductor layer 200S including the reset transistor RST and the FD conversion gain switching transistor FDG. For example, a plurality of pixel circuits 210 has the same arrangement as each other.

The imaging device 1 including such a second substrate 200 also achieve effects similar to those described in the above embodiment. The arrangement of the pixel sharing units 539 of the second substrate 200 is not limited to the arrangements described in the above embodiment and the present modification example.

6.4. Modification Example 3

FIGS. 87 to 92 illustrate a modification example of the planar configuration of the imaging device 1 according to the above embodiment. FIG. 87 schematically illustrates a planar configuration of the first substrate 100, and corresponds to FIG. 68B described in the above embodiment. FIG. 88 schematically illustrates a planar configuration close to the front surface of the semiconductor layer 200S of the second substrate 200, and corresponds to FIG. 69 described in the above embodiment. FIG. 89 schematically illustrates a configuration of each of the first wiring layer W1, the semiconductor layer 200S coupled to the first wiring layer W1, and components of the first substrate 100, and corresponds to FIG. 70 described in the above embodiment. FIG. 90 illustrates an example of planar configurations of the first wiring layer W1 and the second wiring layer W2, and corresponds to FIG. 71 described in the above embodiment. FIG. 91 illustrates an example of planar configurations of the second wiring layer W2 and the third wiring layer W3, and corresponds to FIG. 72 described in the above embodiment. FIG. 92 illustrates an example of planar configurations of the third wiring layer W3 and the fourth wiring layer W4, and corresponds to FIG. 73 described in the above embodiment.

In the present modification example, the semiconductor layer 200S of the second substrate 200 extends in the H direction (FIG. 89). That is, the present modification example substantially corresponds to a configuration obtained by rotating, by 90 degrees, the planar configuration of the imaging device 1 illustrated in FIG. 82 described above and the like.

For example, the pixel sharing unit 539 of the first substrate 100 is formed over a pixel region of two rows by two columns in a manner similar to that described in the above embodiment, and has a substantially square planar shape (FIG. 87). For example, in each of the pixel sharing units 539, the transfer gates TG1 and TG2 of the pixel 541A and the pixel 541B in one pixel row extend in the V direction toward the middle part of the pixel sharing unit 539, and the transfer gates TG3 and TG4 of the pixel 541C and the pixel 541D in the other pixel row extend in the V direction toward outside of the pixel sharing unit 539. The pad section 120 coupled to the floating diffusion FD is provided in the middle part of the pixel sharing unit 539, and the pad section 121 coupled to the VSS contact region 118 is provided in an end portion of the pixel sharing unit 539 at least in the V direction (in the V direction and the H direction in FIG. 87). At this time, the positions in the V direction of the through-electrodes TGV1 and TGV2 of the transfer gates TG1 and TG2 are close to the position in the V direction of the through-electrode 120E, and the positions in the V direction of the through-electrodes TGV3 and TGV4 of the transfer gates TG3 and TG4 are close to the position in the V direction of the through-electrode 121E (FIG. 89). Accordingly, it is possible to increase the width (the size in the V direction) of the semiconductor layer 200S extending in the H direction for a reason similar to that described in the above embodiment. This makes it possible to increase the size of the amplification transistor AMP and suppress the noise.

In each of the pixel circuits 210, the selection transistor SEL and the amplification transistor AMP are arranged side by side in the H direction, and the reset transistors RST are arranged at adjacent positions in the V direction with the selection transistor SEL and the insulating region 212 interposed therebetween (FIG. 88). The FD conversion gain switching transistor FDG is disposed side by side in the H direction with the reset transistor RST. The VSS contact region 218 is provided in an island shape in the insulating region 212. For example, the third wiring layer W3 extends in the H direction (FIG. 91), and the fourth wiring layer W4 extends in the V direction (FIG. 92).

The imaging device 1 having such a second substrate 200 also achieves effects similar to those described in the above embodiment. The arrangement of the pixel sharing units 539 of the second substrate 200 is not limited to the arrangements described in the above embodiment and the present modification example. For example, the semiconductor layer 200S described in the above embodiment and the modification example 1 may extend in the H direction.

6.5. Modification Example 4

FIG. 93 schematically illustrates a modification example of the cross-sectional configuration of the imaging deice 1 according to the above embodiment. FIG. 93 corresponds to FIG. 64 described in the above embodiment. In the present modification example, the imaging device 1 includes contact sections 203, 204, 303, and 304 in addition to the contact sections 201, 202, 301, and 302. The imaging device 1 according to the present modification example differs from the imaging device 1 described in the above embodiment in this point.

The contact sections 203 and 204 are provided in the second substrate 200, and are exposed to a bonding surface with the third substrate 300. The contact sections 303 and 304 are provided in the third substrate 300, and are exposed to a bonding surface with the second substrate 200. The contact section 203 is in contact with the contact section 303, and the contact section 204 is in contact with the contact section 304. That is, in the imaging device 1, the second substrate 200 and the third substrate 300 are coupled to each other by the contact sections 203, 204, 303, and 304 in addition to the contact sections 201, 202, 301, and 302.

Next, description is given of an operation of the imaging device 1 with use of FIGS. 94 and 95. FIG. 94 illustrates an input signal to be inputted from outside to the imaging device 1 and paths of a power source potential and a reference potential indicated by arrows. FIG. 95 illustrates a signal path of a pixel signal to be outputted from the imaging device 1 to the outside indicated by arrows. For example, the input signal inputted to the imaging device 1 through the input section 510A is transmitted to the row driving section 520 of the third substrate 300, and a row drive signal is produced in the row driving section 520. The row drive signal is transmitted to the second substrate 200 through the contact sections 303 and 203. Further, the row drive signal reaches each of the pixel sharing units 539 of the pixel array section 540 through the row drive signal line 542 in the wiring layer 200T. A drive signal other than the transfer gate TG of the row drive signal having reached the pixel sharing unit 539 of the second substrate 200 is inputted to the pixel circuit 210 to drive each of the transistors included in the pixel circuit 210. A drive signal of the transfer gate TG is inputted to the transfer gates TG1, TG2, TG3, and TG4 of the first substrate 100 through the through-electrode TGV to drive the pixels 541A, 541B, 541C, and 541D. In addition, the power source potential and the reference potential supplied from outside of the imaging device 1 to the input section 510A (the input terminal 511) of the third substrate 300 are transmitted to the second substrate 200 through the contact sections 303 and 203 to be supplied to the pixel circuit 210 of each of the pixel sharing units 539 through a wiring line in the wiring layer 200T. The reference potential is further supplied to the pixels 541A, 541B, 541C, and 541D of the first substrate 100 through the through-electrode 121E. Meanwhile, the pixel signal photoelectrically converted in the pixels 541A, 541B, 541C, and 541D of the first substrate 100 is transmitted to the pixel circuit 210 of the second substrate 200 for each pixel sharing unit 539. A pixel signal based on the pixel signal is transmitted from the pixel circuit 210 to the third substrate 300 through the vertical signal line 543 and the contact sections 204 and 304. The pixel signal is processed in the column signal processor 550 and the image signal processor 560 of the third substrate 300, and then outputted to the outside through the output section 510B.

The imaging device 1 including such contact sections 203, 204, 303, and 304 also achieves effects similar to those described in the above embodiment. It is possible to change the positions, the number and the like of contact sections depending on design of the circuit and the like of the third substrate 300, which is a coupling target of wiring lines through the contact sections 303 and 304.

6.6. Modification Example 5

FIG. 96 illustrates a modification example of the cross-sectional configuration of the imaging device 1 according to the above embodiment. FIG. 96 corresponds to FIG. 67 described in the above embodiment. In the present modification example, the transfer transistor TR having a planar structure is provided in the first substrate 100. The imaging device 1 according to the present modification example differs from the imaging device 1 described in the above embodiment in this point.

In the transfer transistor TR, only the horizontal portion TGb is included in the transfer gate TG. In other words, the transfer gate TG does not include the vertical portion TGa, and is provided opposed to the semiconductor layer 100S.

The imaging device 1 including the transfer transistor TR having such a planar structure also achieves effects similar to those described in the above embodiment. Further, it is also conceivable that providing the planar transfer gate TG in the first substrate 100 allows for formation of the photodiode PD closer to the front surface of the semiconductor layer 100S, as compared with a case where a vertical transfer gate TG is provided in the first substrate 100, to thereby increase a saturation signal amount (Qs). In addition, it is also conceivable that the method of forming the planar transfer gate TG in the first substrate 100 involves a smaller number of manufacturing processes, as compared with the method of forming the vertical transfer gate TG in the first substrate 100, which hinders the photodiode PD from being adversely affected due to the manufacturing processes.

6.7. Modification Example 6

FIG. 97 illustrates a modification example of the pixel circuit of the imaging device according to the above embodiment. FIG. 97 corresponds to FIG. 65 described in the above embodiment. In the present modification example, the pixel circuit 210 is provided for each pixel (pixel 541A). That is, the pixel circuit 210 is not shared by a plurality of pixels. The imaging device 1 according to the present modification example differs from the imaging device 1 described in the above embodiment in this point.

The imaging device 1 according to the present modification example is the same as the imaging device 1 described in the above embodiment in that the pixel 541A and the pixel circuit 210 are provided in different substrates (the first substrate 100 and the second substrate 200). Accordingly, the imaging device 1 according to the present modification example is also able to achieve effects similar to those described in the above embodiment.

6.8. Modification Example 7

FIG. 98 illustrates a modification example of the planar configuration of the pixel separation section 117 described in the above embodiment. A clearance may be provided in the pixel separation section 117 surrounding each of the pixels 541A, 541B, 541C, and 541D. That is, the entire periphery of each of the pixels 541A, 541B, 541C, and 541D may not be surrounded by the pixel separation section 117. For example, the clearance of the pixel separation section 117 is provided close to the pad sections 120 and 121 (see FIG. 68B).

In the above embodiment, an example in which the pixel separation section 117 has the FTI structure that penetrates the semiconductor layer 100S (see FIG. 67) has been described; however, the pixel separation section 117 may have a structure other than the FTI structure. For example, the pixel separation section 117 may not be provided to completely penetrate the semiconductor layer 100S, and may have a so-called DTI (Deep Trench Isolation) structure.

6.9. Application Example

FIG. 99 illustrates an example of an outline configuration of an imaging system 7 including the imaging device 1 according to any of the embodiment described above and the modification examples thereof.

The imaging system 7 is an electronic apparatus including, for example, an imaging device such as a digital still camera or a video camera, or a portable terminal apparatus such as a smartphone or a tablet-type terminal. The imaging system 7 includes, for example, the imaging device 1 according to any of the embodiment described above and the modification examples thereof, a DSP circuit 243, a frame memory 244, a display unit 245, a storage unit 246, an operation unit 247, and a power source unit 248. In the imaging system 7, the imaging device 1 according to any of the embodiment described above and the modification examples thereof, the DSP circuit 243, the frame memory 244, the display unit 245, the storage unit 246, the operation unit 247, and the power source unit 248 are coupled to one another via a bus line 249.

The imaging device 1 according to any of the embodiment described above and the modification examples thereof outputs image data corresponding to incident light. The DSP circuit 243 is a signal processing circuit that processes a signal (image data) outputted from the imaging device 1 according to any of the embodiment described above and the modification examples thereof. The frame memory 244 temporarily holds the image data processed by the DSP circuit 243 in a frame unit. The display unit 245 includes, for example, a panel-type display device such as a liquid crystal panel or an organic EL (Electro Luminescence) panel, and displays a moving image or a still image captured by the imaging device 1 according to any of the embodiment described above and the modification examples thereof. The storage unit 246 records image data of a moving image or a still image captured by the imaging device 1 according to any of the embodiment described above and the modification examples thereof in a recording medium such as a semiconductor memory or a hard disk. The operation unit 247 issues an operation command for various functions of the imaging system 7 in accordance with an operation by a user. The power source unit 248 appropriately supplies various types of power for operation to the imaging device 1 according to any of the embodiment described above and the modification examples thereof, the DSP circuit 243, the frame memory 244, the display unit 245, the storage unit 246, and the operation unit 247 which are supply targets.

Next, description is given of an imaging procedure in the imaging system 7.

FIG. 100 illustrates an example of a flowchart of an imaging operation in the imaging system 7. A user instructs start of imaging by operating the operation unit 247 (step S101). Then, the operation unit 247 transmits an imaging command to the imaging device 1 (step S102). The imaging device 1 (specifically, the system control circuit 36) executes imaging in a predetermined imaging method upon receiving the imaging command (step S103).

The imaging device 1 outputs image data obtained by imaging to the DSP circuit 243. As used herein, the image data refers to data for all pixels of pixel signals generated on the basis of electric charges temporarily held in the floating diffusions FD. The DSP circuit 243 performs predetermined signal processing (e.g., noise reduction processing, etc.) on the basis of the image data inputted from the imaging device 1 (step S104). The DSP circuit 243 causes the frame memory 244 to hold the image data having been subjected to the predetermined signal processing, and the frame memory 244 causes the storage unit 246 to store the image data (step S105). In this manner, the imaging in the imaging system 7 is performed.

In the present application example, the imaging device 1 according to any of the embodiment described above and the modification examples thereof is applied to the imaging system 7. This enables smaller size or higher definition of the imaging device 1, thus making it possible to provide a small or high-definition imaging system 7.

6.10. Practical Application Examples

Practical Application Example 1

The technology according to the present disclosure (the present technology) is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 101 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 101, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 101, an audio speaker 12061, a display section 12062, and an instrument panel 12063 are illustrated as the output device. The display section 12062 may, for example, include at least one of an on-board display and a head-up display.

FIG. 102 is a diagram depicting an example of the installation position of the imaging section 12031.

In FIG. 102, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 102 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to the present disclosure may be applied. The technology according to the present disclosure may be applied to the imaging section 12031 among the configurations described above. Specifically, the imaging device 1 according to any of the embodiment described above and modification examples thereof is applicable to the imaging section 12031. Applying the technology according to the present disclosure to the imaging section 12031 allows for a high-definition captured image with less noise, thus making it possible to perform highly accurate control utilizing the captured image in the mobile body control system.

Practical Application Example 2

FIG. 103 is a view depicting an example of a schematic configuration of an endoscopic surgery system to which the technology according to an embodiment of the present disclosure (present technology) can be applied.

In FIG. 103, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 104 is a block diagram depicting an example of a functional configuration of the camera head 11102 and the CCU 11201 depicted in FIG. 103.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to the present disclosure may be applied. The technology according to the present disclosure may be suitably applied to, for example, the image pickup unit 11402 provided in the camera head 11102 of the endoscope 11100, among the configurations described above. Applying the technology according to the present disclosure to the image pickup unit 11402 enables miniaturization or higher definition of the image pickup unit 11402, thus making it possible to provide the miniaturized or high-definition endoscope 11100.

The description has been given hereinabove of the technology according to the present disclosure with reference to the first to third embodiments, the modification examples, and the specific examples. However, the technology according to the present disclosure is not limited to the embodiments and the like described above, and may be modified in a variety of ways.

Furthermore, not all of the constituent elements and operations described in the embodiments are essential as constituent elements and operations of the present disclosure. For example, among the constituent elements of the embodiments, those that are not recited in any of the independent claims, which represent the broadest concepts of the present disclosure, are to be considered optional constituent elements.

The terms used throughout the present specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items.

It is to be noted that the terms used herein include a term that is simply used for convenience of description and does not limit a configuration and an operation. For example, the terms "right", "left", "upper", and "lower" only indicate directions in the drawing that is referred to. Furthermore, the terms "inward" and "outward" respectively indicate a direction toward the center of a focused element and a direction away from the center of the focused element. The same applies to terms similar thereto and terms having similar meanings.

It is to be noted that the technique according to the present disclosure may also have the following configurations. According to the technique of the present disclosure having the following configurations, it is possible to reduce permittivity of a wiring line included in a second insulating layer or of a space around a second semiconductor substrate, in a second substrate including the second semiconductor substrate on which the second insulating layer is stacked. Thus, it is possible for the technique according to the present disclosure to reduce a capacity component caused by a three-dimensional structure of an imaging device and thus to improve characteristics of the imaging device. The effects achieved by the technique according to the present disclosure are not necessarily limited to the effects described herein, and may be any of the effects described in the present disclosure.

(1)

An imaging device including:

a first substrate including a sensor pixel that performs photoelectric conversion;

a second substrate including a pixel circuit that outputs a pixel signal on a basis of electric charges outputted from the sensor pixel; and a third substrate including a processing circuit that performs signal processing on the pixel signal, the first substrate, the second substrate, and the third substrate being stacked in this order, and a low-permittivity region being provided in at least any region around a circuit that reads electric charges from the sensor pixel and outputs the pixel signal.

(2)

The imaging device according to (1), in which the sensor pixel includes a photoelectric conversion element, a transfer transistor electrically coupled to the photoelectric conversion element, and a floating diffusion that temporarily holds the electric charges outputted from the photoelectric conversion element via the transfer transistor, and the pixel circuit includes a reset transistor that resets a potential of the floating diffusion to a predetermined potential, an amplification transistor that generates, as the pixel signal, a signal of a voltage corresponding to a level of the electric charges held in the floating diffusion, and a selection transistor that controls an output timing of the pixel signal from the amplification transistor.

(3)

The imaging device according to (2), in which the first substrate includes a first semiconductor substrate including, on side of a front surface, the photoelectric conversion element, the transfer transistor, and the floating diffusion, the second substrate includes a second semiconductor substrate including, on side of a front surface, the reset transistor, the amplification transistor, and the selection transistor, and the second substrate is attached, with side of a back surface opposite to the front surface of the second semiconductor substrate being opposed to the side of the front surface of the first semiconductor substrate.

(4)

The imaging device according to (3), in which the sensor pixel and the pixel circuit are electrically coupled to each other by a through-wiring line provided inside a through-hole that penetrates the second semiconductor substrate, and the low-permittivity region is provided at least in a region around the through-wiring line inside the through-hole.

(5)

The imaging device according to (4), in which the through-wiring line electrically couples the floating diffusion and the amplification transistor to each other.

(6)

The imaging device according to (4) or (5), in which the first substrate includes the photoelectric conversion element and the transfer transistor for each sensor pixel, and includes the floating diffusion shared by each plurality of the sensor pixels, the second substrate includes the pixel circuit for each plurality of the sensor pixels sharing the floating diffusion, and the through-wiring line electrically couples the floating diffusion shared by each plurality of the sensor pixels and the amplification transistor to each other.

(7)

The imaging device according to any one of (4) to (6), in which the low-permittivity region is provided at least in a region between the through-wiring line and the second semiconductor substrate.

(8)

The imaging device according to (7), in which the low-permittivity region is provided in a region surrounding the through-wiring line over an entire periphery thereof.

(9)

The imaging device according to any one of (4) to (8), in which the low-permittivity region is provided in a region along an inner periphery of the through-hole.

(10)

The imaging device according to (9), in which the low-permittivity region is provided in a region corresponding to a sidewall on an inner surface of the through-hole.

(11)

The imaging device according to (9) or (10), in which a plurality of the through-wiring lines is provided inside the through-hole.

(12)

The imaging device according to any one of (4) to (11), in which the low-permittivity region is provided in a region on lateral side of any one or more of the reset transistor, the amplification transistor, or the selection transistor.

(13)

The imaging device according to (12), in which the low-permittivity region is provided at least in a region corresponding to lateral side of the second semiconductor substrate.

(14)

The imaging device according to (13), in which the low-permittivity region is provided in a region surrounded by an insulating material having an etching rate different from an insulating material to fill the through-hole.

(15)

The imaging device according to any one of (4) to (14), in which the low-permittivity region is provided in a region below any one or more of the reset transistor, the amplification transistor, or the selection transistor.

(16)

The imaging device according to (15), in which, in a case of a plan view in a stacking direction, the low-permittivity region is provided at least in a planar region where the amplification transistor provided in the second semiconductor substrate and a gate electrode of the transfer transistor provided in the first semiconductor substrate are overlapped each other.

(17)

The imaging device according to (15) or (16), in which the low-permittivity region is provided to be adjacent to the back surface of the second semiconductor substrate.

(18)

The imaging device according to any one of (4) to (17), in which the low-permittivity region is provided in a region around a wiring line electrically coupled to the through-wiring line, among wiring lines provided in the second substrate.

(19)

The imaging device according to any one of (1) to (18), in which the low-permittivity region has a rectangular planar shape.

(20)

The imaging device according to any one of (1) to (19), in which the low-permittivity region includes an air gap region.

This application claims the benefit of Japanese Priority Patent Application JP2019-118647 filed with the Japan Patent Office on Jun. 26, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:

a first substrate that includes a sensor pixel, wherein the sensor pixel is configured to:

execute photoelectric conversion; and output electric charges based on the photoelectric conversion;

a second substrate that includes a pixel circuit, wherein the pixel circuit is configured to output a pixel signal based on the electric charges;

a third substrate that includes a processing circuit, wherein the processing circuit is configured to execute a signal processing operation on the pixel signal, and the second substrate is on the first substrate, and the third substrate is on the second substrate; and a low-permittivity region in a region around a specific circuit, wherein the specific circuit reads the electric charges from the sensor pixel and outputs the pixel signal.

2. The imaging device according to claim 1, wherein the sensor pixel includes:

a photoelectric conversion element;

a transfer transistor electrically coupled to the photoelectric conversion element, wherein the sensor pixel is further configured to output the electric charges from the photoelectric conversion element via the transfer transistor; and a floating diffusion configured to temporarily hold the electric charges, and the pixel circuit includes:

a reset transistor configured to reset a potential of the floating diffusion to a specific potential;

an amplification transistor configured to output, as the pixel signal, a signal of a voltage corresponding to a level of the electric charges that are held in the floating diffusion; and a selection transistor configured to control an output timing of the pixel signal output from the amplification transistor.

3. The imaging device according to claim 2, wherein the first substrate further includes a first semiconductor substrate, the first semiconductor substrate includes the photoelectric conversion element, the transfer transistor, and the floating diffusion on a side of a front surface of the first semiconductor substrate, the second substrate further includes a second semiconductor substrate, the second semiconductor substrate includes the reset transistor, the amplification transistor, and the selection transistor on a side of a front surface of the second semiconductor substrate, the second substrate is attached to the first substrate, a back surface of the second semiconductor substrate is opposed to the side of the front surface of the first semiconductor substrate, based on the attachment of the second substrate to the first substrate, and the back surface of the second semiconductor substrate is opposite to the front surface of the second semiconductor substrate.

4. The imaging device according to claim 3, wherein
the sensor pixel is electrically coupled to the pixel circuit by a through-wiring line,
the through-wiring line is inside a through-hole that penetrates the second semiconductor substrate, and
the low-permittivity region is in a region around the through-wiring line inside the through-hole.

5. The imaging device according to claim 4, wherein the through-wiring line electrically couples the floating diffusion to the amplification transistor.

6. The imaging device according to claim 4, wherein
the first substrate further includes:
a plurality of sensor pixels that includes the sensor pixel;
the photoelectric conversion element and the transfer transistor for each sensor pixel of the plurality of sensor pixels; and
the floating diffusion shared by each sensor pixel of the plurality of sensor pixels,
the second substrate further includes the pixel circuit for each sensor pixel of the plurality of sensor pixels, and
the through-wiring line is configured to electrically couple the floating diffusion to the amplification transistor.

7. The imaging device according to claim 4, wherein the low-permittivity region is in a region between the through-wiring line and the second semiconductor substrate.

8. The imaging device according to claim 7, wherein the low-permittivity region is in a region that surrounds the through-wiring line over an entire periphery.

9. The imaging device according to claim 4, wherein the low-permittivity region is in a region along an inner periphery of the through-hole.

10. The imaging device according to claim 9, wherein the low-permittivity region is in a region corresponding to a sidewall on an inner surface of the through-hole.

11. The imaging device according to claim 9, wherein
the through-hole includes a plurality of through-wiring lines, and
the plurality of through-wiring lines includes the through-wiring line.

12. The imaging device according to claim 4, wherein the low-permittivity region is in a region on a lateral side of at least one of the reset transistor, the amplification transistor, or the selection transistor.

13. The imaging device according to claim 12, wherein the low-permittivity region is at least in a region corresponding to a lateral side of the second semiconductor substrate.

14. The imaging device according to claim 13, wherein
the low-permittivity region is in a region surrounded by a first insulating material,
an etching rate of the first insulating material is different from an etching rate of a second insulating material, and
the second insulating material fills the through-hole.

15. The imaging device according to claim 4, wherein the low-permittivity region is in a region below at least one of the reset transistor, the amplification transistor, or the selection transistor.

16. The imaging device according to claim 15, wherein
the low-permittivity region is provided at least in a planar region, and
in a plan view of the second semiconductor substrate and in a stacking direction of the first substrate, the second substrate, and the third substrate, the amplification transistor and a gate electrode of the transfer transistor are overlapped in the planar region.

17. The imaging device according to claim 15, wherein the low-permittivity region is adjacent to the back surface of the second semiconductor substrate.

18. The imaging device according to claim 4, wherein
the low-permittivity region is in a region around a specific wiring line that is electrically coupled to the through-wiring line,
the second substrate includes a plurality of wiring lines, and
the plurality of wiring lines includes the specific wiring line.

19. The imaging device according to claim 1, wherein the low-permittivity region has a rectangular planar shape.

20. The imaging device according to claim 1, wherein the low-permittivity region comprises an air gap region.

* * * * *